(12) United States Patent
Leipold et al.

(10) Patent No.: US 10,562,765 B2
(45) Date of Patent: Feb. 18, 2020

(54) QUANTUM SHIFT REGISTER INCORPORATING BIFURCATION

(71) Applicant: equal1.labs Inc., Fremont, CA (US)

(72) Inventors: Dirk Robert Walter Leipold, Fremont, CA (US); George Adrian Maxim, Saratoga, CA (US); Michael Albert Asker, San Jose, CA (US)

(73) Assignee: Equal1.Labs Inc., Fremont, CA (US)

( * ) Notice: Subject to any disclaimer, the term of this patent is extended or adjusted under 35 U.S.C. 154(b) by 0 days.

(21) Appl. No.: 16/446,325

(22) Filed: Jun. 19, 2019

(65) Prior Publication Data
US 2019/0392913 A1    Dec. 26, 2019

Related U.S. Application Data

(60) Provisional application No. 62/687,779, filed on Jun. 20, 2018, provisional application No. 62/687,800, filed on Jun. 20, 2018, provisional application No. 62/687,803, filed on Jun. 21, 2018, provisional application No. 62/689,035, filed on Jun. 22, 2018, provisional application No. 62/689,100, filed on Jun.
(Continued)

(51) Int. Cl.
*B82Y 10/00* (2011.01)
*G02F 1/017* (2006.01)
*G06N 10/00* (2019.01)

(52) U.S. Cl.
CPC .......... *B82Y 10/00* (2013.01); *G02F 1/01725* (2013.01); *G06N 10/00* (2019.01); *G02F 2001/01791* (2013.01)

(58) Field of Classification Search
CPC ..... B82Y 10/00; G06N 10/00; G02F 1/01725; G02F 2001/01791
See application file for complete search history.

(56) References Cited

U.S. PATENT DOCUMENTS 6,635,898 B2 * 10/2003 Williams ............... G06N 10/00
257/14
7,655,850 B1    2/2010 Ahn
(Continued)

OTHER PUBLICATIONS

Zajac et al, "Resonantly driven CNOT gate for electron spins", Science 359, pp. 439-442, 2018.
Veldhorst et al, "A Two Qubit Logic Gate in Silicon", 2014.

*Primary Examiner* — Patrick O Neill
(74) *Attorney, Agent, or Firm* — Zaretsky Group PC; Howard Zaretsky

(57) ABSTRACT

A novel and useful controlled quantum shift register for transporting particles from one quantum dot to another in a quantum structure. The shift register incorporates a succession of qdots with tunneling paths and control gates. Applying appropriate control signals to the control gates, a particle or a split quantum state is made to travel along the shift register. The shift register also includes ancillary double interaction where two pairs of quantum dots provide an ancillary function where the quantum state of one pair is replicated in the second pair. The shift register also provides bifurcation where an access path is split into two or more paths. Depending on the control pulse signals applied, quantum dots are extended into multiple paths. Control of the shift register is provided by electric control pulses. An optional auxiliary magnetic field provides additional control of the shift register.

20 Claims, 66 Drawing Sheets

Related U.S. Application Data 23, 2018, provisional application No. 62/689,166, filed on Jun. 24, 2018, provisional application No. 62/692,745, filed on Jun. 30, 2018, provisional application No. 62/692,804, filed on Jul. 1, 2018, provisional application No. 62/692,844, filed on Jul. 1, 2018, provisional application No. 62/694,022, filed on Jul. 5, 2018, provisional application No. 62/695,842, filed on Jul. 10, 2018, provisional application No. 62/698,278, filed on Jul. 15, 2018, provisional application No. 62/726,290, filed on Sep. 2, 2018, provisional application No. 62/689,291, filed on Jun. 25, 2018, provisional application No. 62/687,793, filed on Jun. 20, 2018, provisional application No. 62/688,341, filed on Jun. 21, 2018, provisional application No. 62/703,888, filed on Jul. 27, 2018, provisional application No. 62/726,271, filed on Sep. 2, 2018, provisional application No. 62/726,397, filed on Sep. 3, 2018, provisional application No. 62/731,810, filed on Sep. 14, 2018, provisional application No. 62/788,865, filed on Jan. 6, 2019, provisional application No. 62/791,818, filed on Jan. 13, 2019, provisional application No. 62/794,591, filed on Jan. 19, 2019, provisional application No. 62/794,655, filed on Jan. 20, 2019.

(56) References Cited

U.S. PATENT DOCUMENTS

| | | | |
|---|---|---|---|
| 7,659,538 B2 * | 2/2010 | Snyder | B82Y 10/00 257/14 |
| 8,035,540 B2 | 10/2011 | Berkley | |
| 2002/0190249 A1 | 12/2002 | Williams et al. | |
| 2017/0147939 A1 | 5/2017 | Dzurak et al. | |

\* cited by examiner

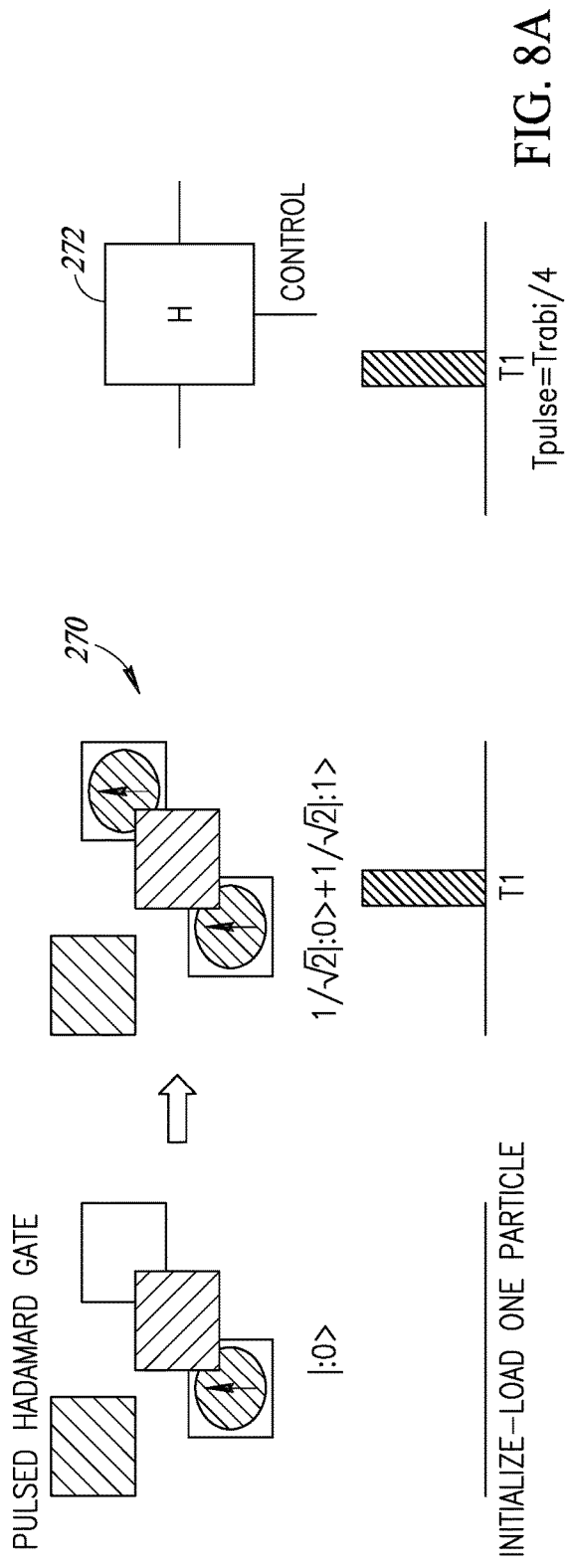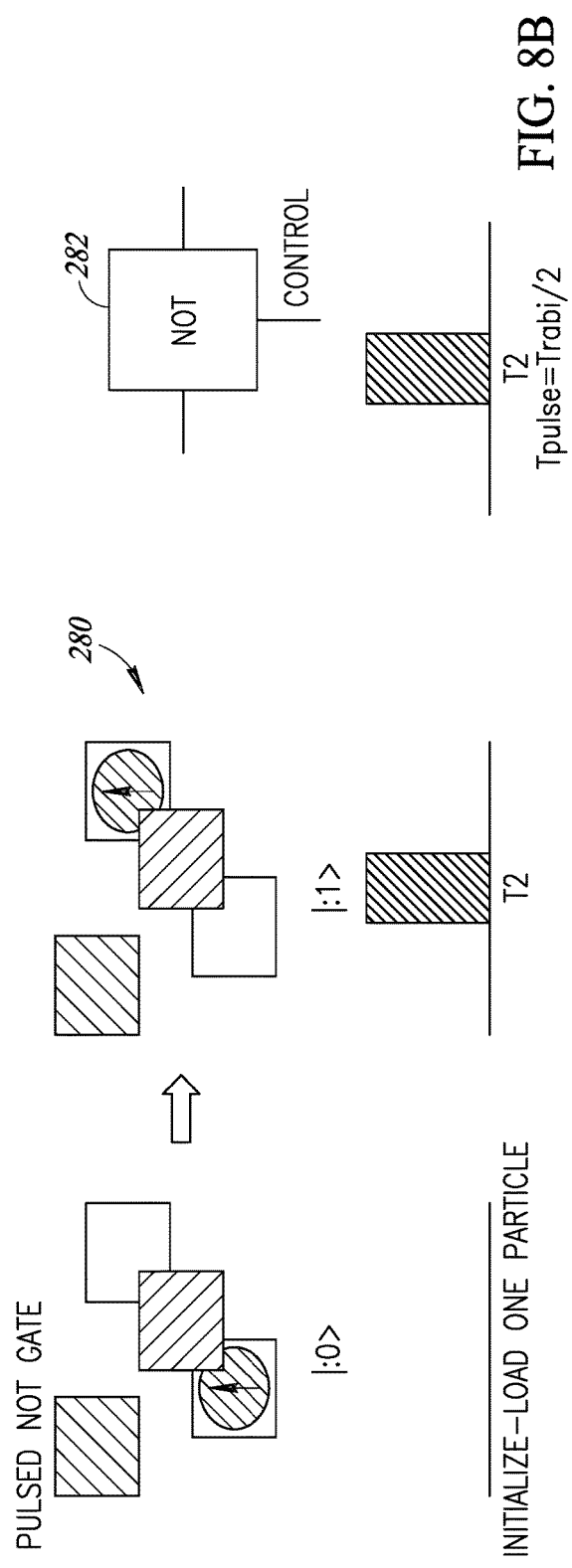

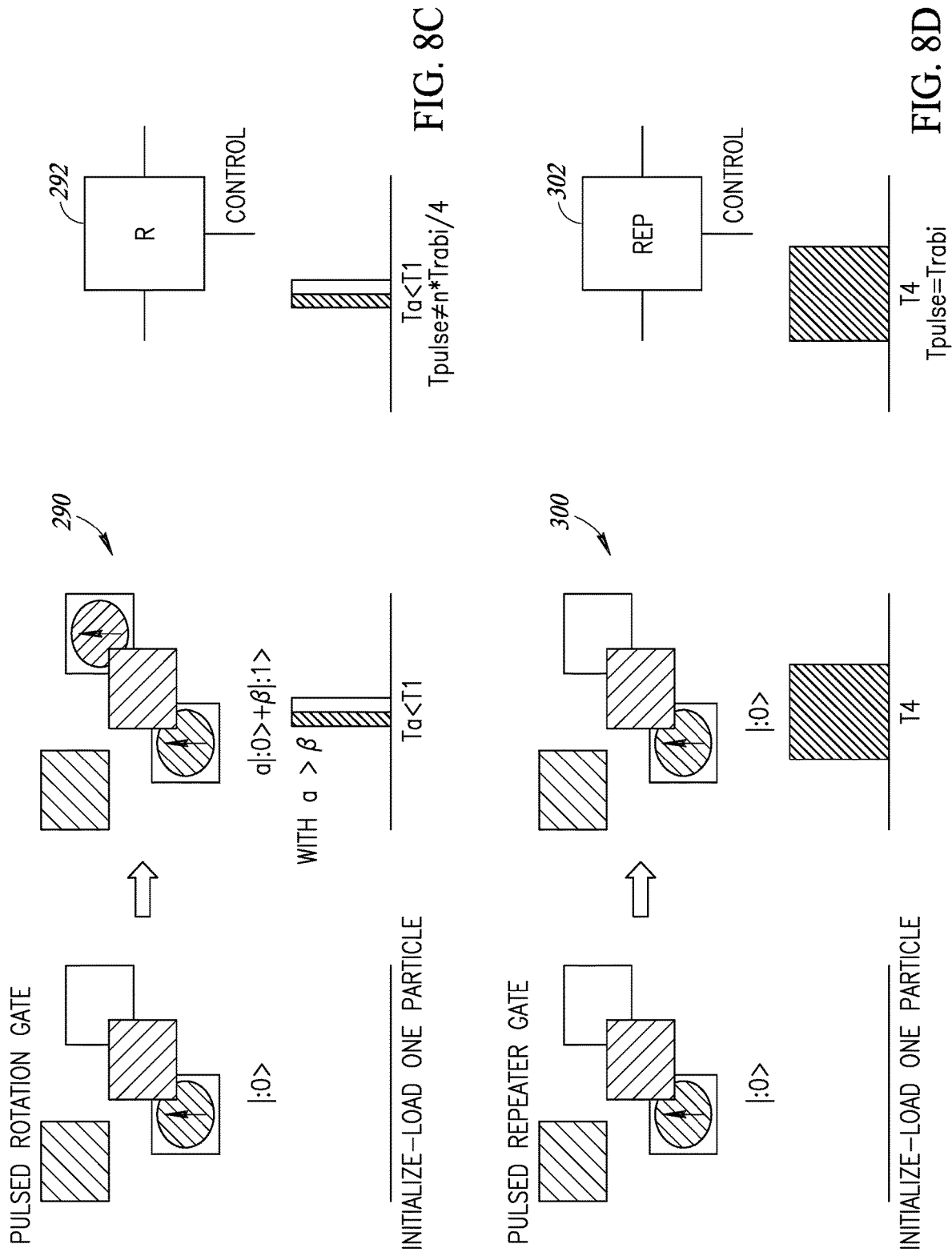

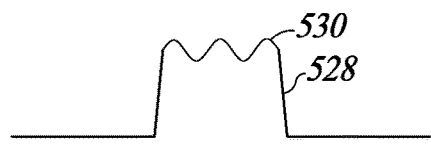
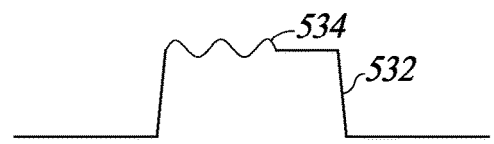
FIG. 15M          FIG. 15N
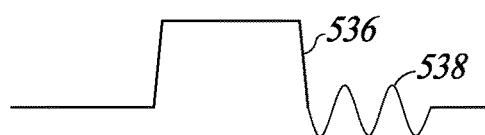
FIG. 15O          FIG. 15P
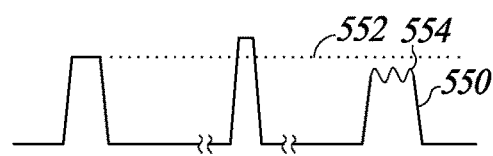
FIG. 15Q          FIG. 15R
FIG. 16A          FIG. 16B
FIG. 16C          FIG. 16D SHIFTING THE QUANTUM STATE
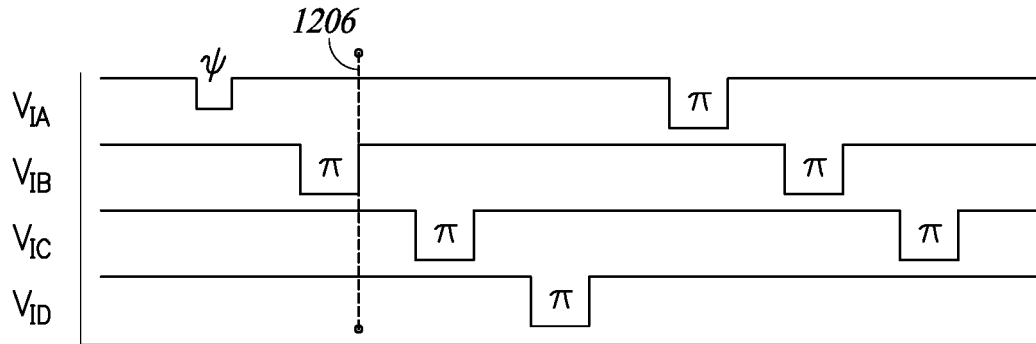
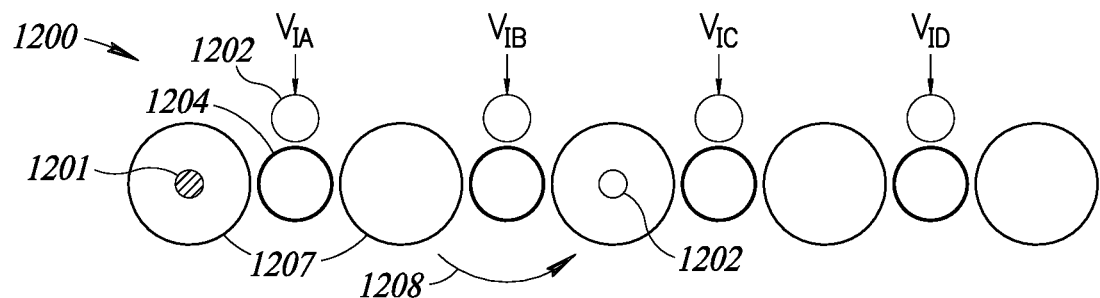
FIG. 20C
SHIFTING THE SECOND PART OF THE QUANTUM STATE
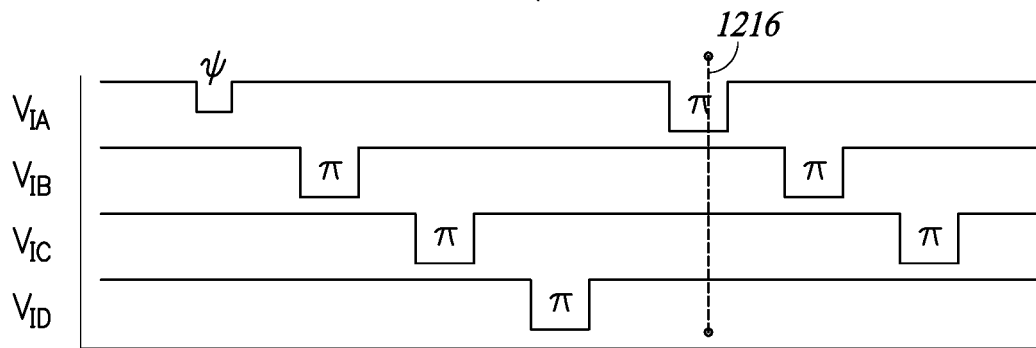
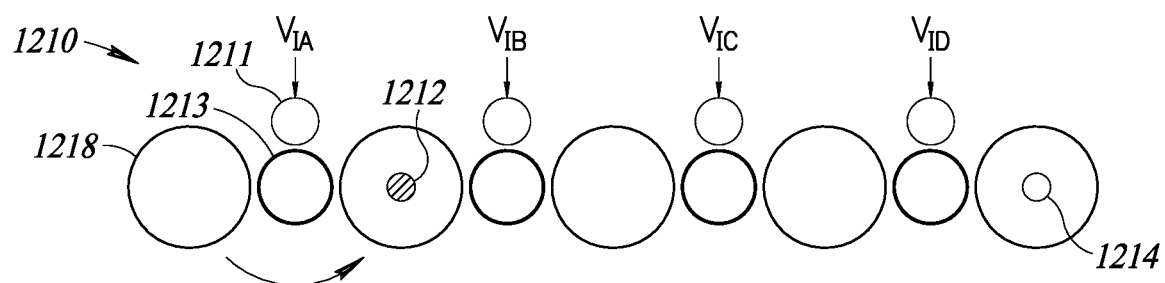
FIG. 20D

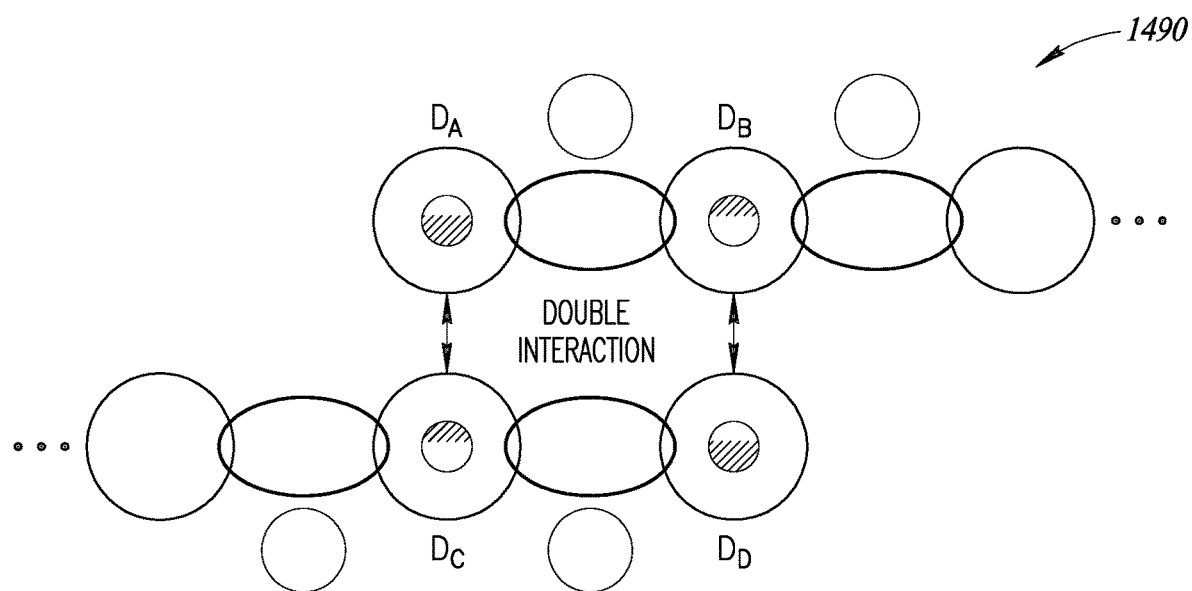
FIG. 33
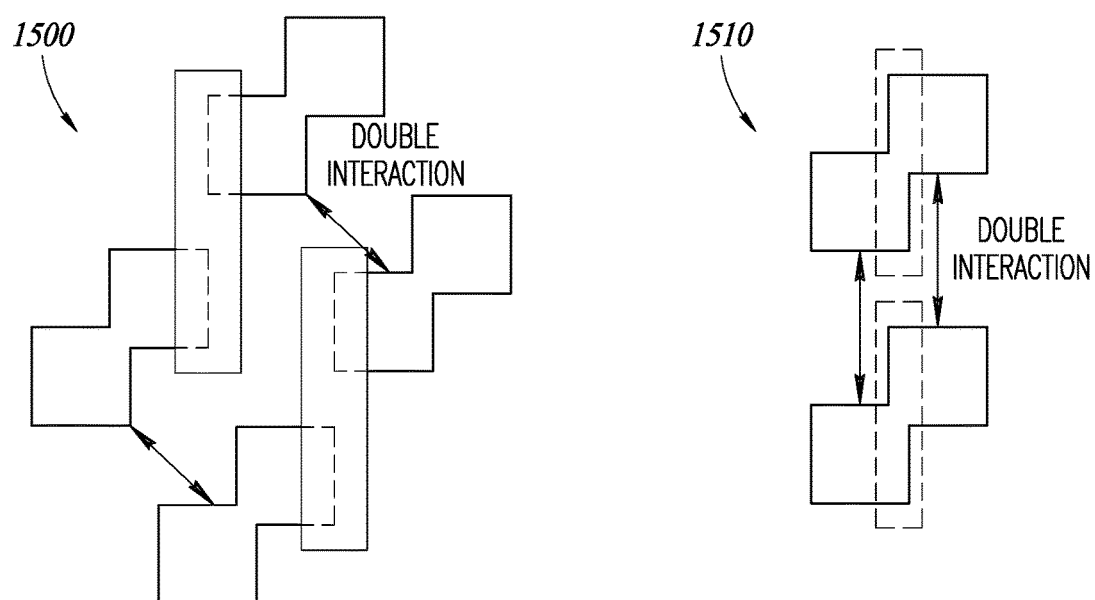
FIG. 34A
FIG. 34B

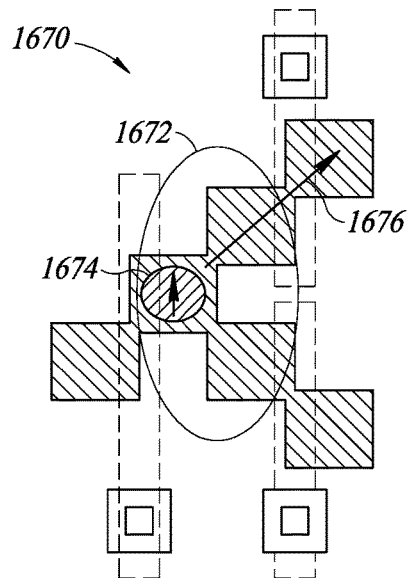
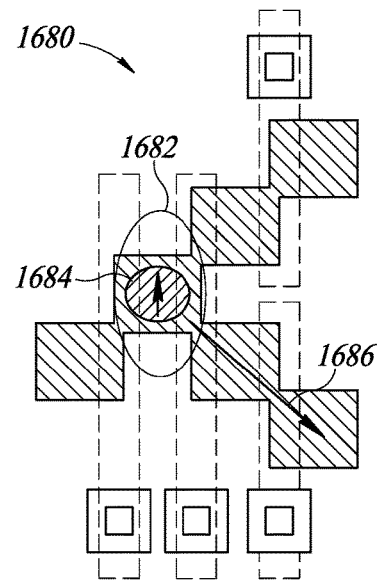
FIG. 45A  FIG. 45B
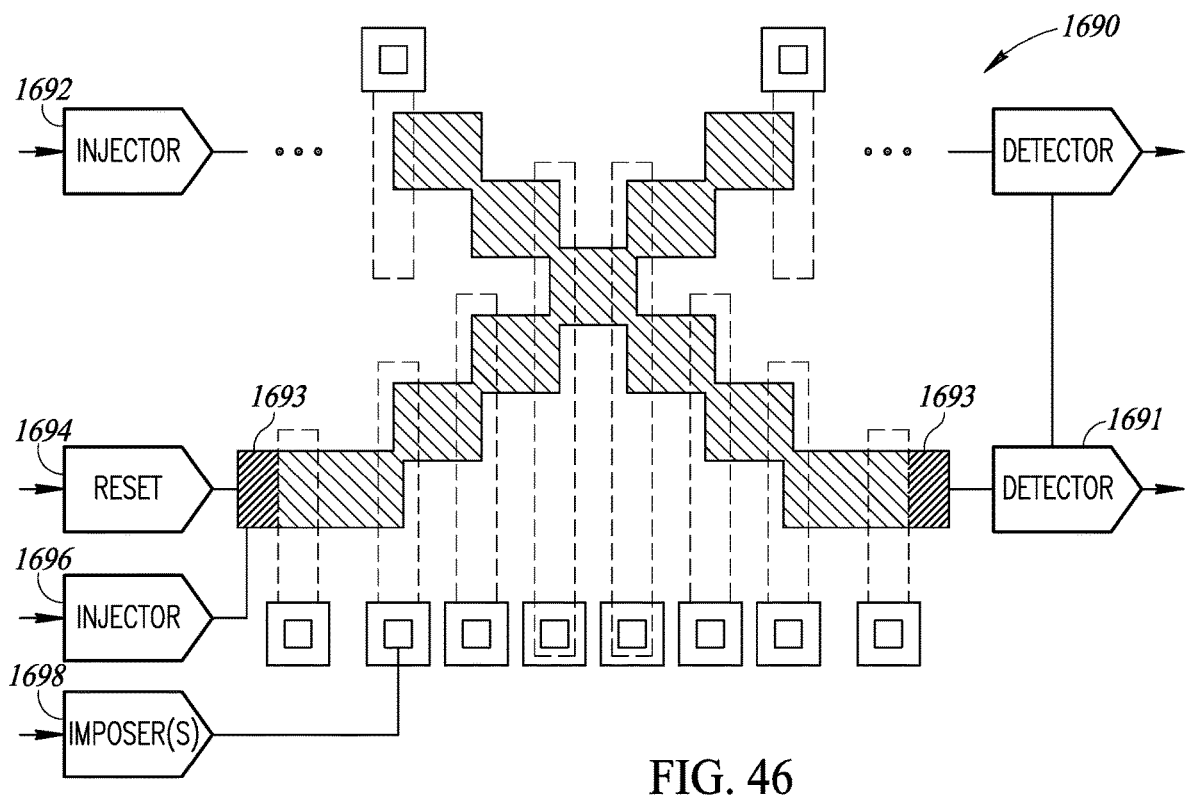
FIG. 46

QUANTUM SHIFT REGISTER INCORPORATING BIFURCATION

REFERENCE TO PRIORITY APPLICATIONS

This application claims the benefit of U.S. Provisional Application No. 62/687,800, filed Jun. 20, 2018, entitled "Electric Signal Pulse-Width And Amplitude Controlled And Re-Programmable Semiconductor Quantum Rotation Gates," U.S. Provisional Application No. 62/687,803, filed Jun. 21, 2018, entitled "Semiconductor Quantum Structures and Computing Circuits Using Local Depleted Well Tunneling," U.S. Provisional Application No. 62/689,100, filed Jun. 23, 2018, entitled "Semiconductor Controlled Entangled-Aperture-Logic Quantum Shift Register," U.S. Provisional Application No. 62/694,022, filed Jul. 5, 2018, entitled "Double-V Semiconductor Entangled-Aperture-Logic Parallel Quantum Interaction Path," U.S. Provisional Application No. 62/687,779, filed Jun. 20, 2018, entitled "Semiconductor Quantum Structures And Gates Using Through-Thin-Oxide Well-To-Gate Aperture Tunneling," U.S. Provisional Application No. 62/687,793, filed Jun. 20, 2018, entitled "Controlled Semiconductor Quantum Structures And Computing Circuits Using Aperture Well-To-Gate Tunneling," U.S. Provisional Application No. 62/688,341, filed Jun. 21, 2018, entitled "3D Semiconductor Quantum Structures And Computing Circuits Using Fin-To-Gate Tunneling," U.S. Provisional Application No. 62/689,035, filed Jun. 22, 2018, entitled "3D Semiconductor Quantum Structures And Computing Circuits Using Controlled Tunneling Through Local Fin Depletion Regions," U.S. Provisional Application No. 62/689,291, filed Jun. 25, 2018, entitled "Semiconductor Quantum Dot And Qubit Structures Using Aperture-Tunneling Through Oxide Layer," U.S. Provisional Application No. 62/689,166, filed Jun. 24, 2018, entitled "Semiconductor Entangled-Aperture-Logic Quantum Ancillary Gates," U.S. Provisional Application No. 62/692,745, filed Jun. 20, 2018, entitled "Re-Programmable And Re-Configurable Quantum Processor Using Pulse-Width Based Rotation Selection And Path Access Or Bifurcation Control," U.S. Provisional Application No. 62/692,804, filed Jul. 1, 2018, entitled "Quantum Processor With Dual-Path Quantum Error Correction," U.S. Provisional Application No. 62/692,844, filed Jul. 1, 2018, entitled "Quantum Computing Machine With Partial Data Readout And Re-Injection Into The Quantum State," U.S. Provisional Application No. 62/726,290, filed Jun. 20, 2018, entitled "Controlled-NOT and Tofolli Semiconductor Entangled-Aperture-Logic Quantum Gates," U.S. Provisional Application No. 62/695,842, filed Jul. 10, 2018, entitled "Entangled Aperture-Logic Semiconductor Quantum Computing Structure with Intermediary Interactor Path," U.S. Provisional Application No. 62/698,278, filed Jul. 15, 2018, entitled "Entangled Aperture-Logic Semiconductor Quantum Bifurcation and Merging Gate," U.S. Provisional Application No. 62/726,397, filed Sep. 3, 2018, entitled "Semiconductor Quantum Structure With Simultaneous Shift Into Entangled State," U.S. Provisional Application No. 62/791,818, filed Jan. 13, 2019, entitled "Semiconductor Process for Quantum Structures with Staircase Active Well," U.S. Provisional Application No. 62/788,865, filed Jan. 6, 2018, entitled "Semiconductor Process For Quantum Structures Without Inner Contacts And Doping Layers," U.S. Provisional Application No. 62/794,591, filed Jan. 19, 2019, entitled "Semiconductor Quantum Structures Using Localized Aperture Channel Tunneling Through Controlled Depletion Region," U.S. Provisional Application No. 62/703,888, filed Jul. 27, 2018, entitled "Aperture Tunneling Semiconductor Quantum Dots and Chord-Line Quantum Computing Structures," U.S. Provisional Application No. 62/726,271, filed Sep. 2, 2018, entitled "Controlled Local Thermal Activation Of Freeze-Out Semiconductor Circuits For Cryogenic Operation," U.S. Provisional Application No. 62/731,810, filed Sep. 14, 2018, entitled "Multi-Stage Semiconductor Quantum Detector with Anti-Correlation Merged With Quantum Core," and U.S. Provisional Application No. 62/794,655, filed Jan. 20, 2019, entitled "Semiconductor Quantum Structures Using Preferential Tunneling Direction Through Thin Insulator Layers." All of which are incorporated herein by reference in their entirety.

FIELD OF THE DISCLOSURE

The subject matter disclosed herein relates to the field of quantum computing and more particularly relates to a controlled quantum shift register for transporting particles from one quantum dot to another.

BACKGROUND OF THE INVENTION

Quantum computers are machines that perform computations using the quantum effects between elementary particles, e.g., electrons, holes, ions, photons, atoms, molecules, etc. Quantum computing utilizes quantum-mechanical phenomena such as superposition and entanglement to perform computation. Quantum computing is fundamentally linked to the superposition and entanglement effects and the processing of the resulting entanglement states. A quantum computer is used to perform such computations which can be implemented theoretically or physically.

Currently, analog and digital are the two main approaches to physically implementing a quantum computer. Analog approaches are further divided into quantum simulation, quantum annealing, and adiabatic quantum computation. Digital quantum computers use quantum logic gates to do computation. Both approaches use quantum bits referred to as qubits.

Qubits are fundamental to quantum computing and are somewhat analogous to bits in a classical computer. Qubits can be in a |0> or |1> quantum state but they can also be in a superposition of the |0> and |1> states. When qubits are measured, however, they always yield a |0> or a |1> based on the quantum state they were in.

The key challenge of quantum computing is isolating such microscopic particles, loading them with the desired information, letting them interact and then preserving the result of their quantum interaction. This requires relatively good isolation from the outside world and a large suppression of the noise generated by the particle itself. Therefore, quantum structures and computers operate at very low temperatures (e.g., cryogenic), close to the absolute zero kelvin (K), in order to reduce the thermal energy/movement of the particles to well below the energy/movement coming from their desired interaction. Current physical quantum computers, however, are very noisy and quantum error correction is commonly applied to compensate for the noise.

Most existing quantum computers use superconducting structures to realize quantum interactions. Their main drawbacks, however, are the fact that superconducting structures are very large and costly and have difficulty in scaling to quantum processor sizes of thousands or millions of quantum-bits (qubits). Furthermore, they need to operate at few tens of milli-kelvin (mK) temperatures, that are difficult to achieve and where it is difficult to dissipate significant power to operate the quantum machine.

SUMMARY OF THE INVENTION

The present invention describes a controlled quantum shift register for transporting particles from one quantum dot to another in a quantum structure. The shift register incorporates a succession of qdots with tunneling paths and control gates. By applying the appropriate control signals to the control gates a particle or a split quantum state can be made to travel along the quantum shift register. Quantum shift registers are used to transport particles and quantum states from one position to another. To enable quantum operations and calculations, the particles are moved to interaction qdots where they are in close enough proximity to interaction with each other. From there, they are moved away using shift registers. Shift registers are also used in quantum interaction gates and quantum cores within a quantum processing unit. Once a calculation is performed in one core, the results may be transported to another core using shift registers.

The shift register also includes ancillary double interaction where two pairs of quantum dots provide an ancillary function. One pair of quantum dots has some quantum state while the second pair is placed in the Hadamard state. Applying appropriate control pulses to the quantum structure replicates the quantum state of the first pair of quantum dots in the second pair.

The shift register also provides bifurcation where an access path is split into two or more paths. Depending on the control pulse signals applied, quantum dots are extended into multiple paths.

Control of the shift register is provided by electric control pulses. An optional auxiliary magnetic field provides additional control of the shift register.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a quantum structure having bifurcation operation, comprising a semiconductor substrate, a plurality of qdots fabricated on said substrate and arranged sequentially, a bifurcation extending said plurality of qdots into at least a first path of one or more qdots and a second path of one or more qdots, a plurality of control gates fabricated on said substrate for controlling quantum transport between said plurality of qdots and said bifurcation, and a plurality of electric control gate pulses applied to said control gates, said control gate pulses configured such that one or more quantum particles and/or one or more quantum states within said qdots are transported sequentially from one qdot to another as well as to at least said first path and/or said second path.

There is also provided in accordance with the invention, a quantum shift register, comprising a semiconductor substrate, a plurality of qdots fabricated on said substrate and arranged sequentially, a bifurcation extending said plurality of qdots into at least a first path of one or more qdots and a second path of one or more qdots, a plurality of control gates fabricated on said substrate for controlling quantum transport between said plurality of qdots and said bifurcation, an auxiliary magnetic field covering at least said plurality of qdots, and a plurality of electric control gate pulses applied to said control gates, said control gate pulses and said auxiliary magnetic field operative to transport one or more quantum particles and/or one or more quantum states within said qdots sequentially from one qdot to another as well as to at least said first path and/or said second path.

There is further provided in accordance with the invention, a quantum shift register method, comprising providing a substrate, fabricating on said substrate a plurality of qdots arranged in sequential fashion, bifurcating said plurality of qdots into at least a first path of one or more qdots and a second path of one or more qdots, fabricating on said substrate a plurality of control gates for controlling quantum transport between said plurality of qdots and said bifurcation, and generating and applying electric control gate pulses to said control gates such that one or more quantum particles and/or one or more quantum states within said qdots are transported sequentially from one qdot to another as well as to at least said first path and/or said second path.

BRIEF DESCRIPTION OF THE DRAWINGS

FIG. 8A is a diagram illustrating an example pulsed Hadamard gate;

FIG. 8B is a diagram illustrating an example pulsed NOT gate;

FIG. 8C is a diagram illustrating an example pulsed rotation gate;

FIG. 8D is a diagram illustrating an example pulsed repeater gate;

FIG. 15M is a diagram illustrating a thirteenth example control gate signal;

FIG. 15N is a diagram illustrating a fourteenth example control gate signal;

FIG. 15O is a diagram illustrating a fifteenth example control gate signal;

FIG. 15P is a diagram illustrating a sixteenth example control gate signal;

FIG. 15Q is a diagram illustrating a seventeenth example control gate signal;

FIG. 15R is a diagram illustrating an eighteenth example control gate signal;

FIG. 16A is a diagram illustrating a first example pair of control gate signals $G_A$ and $G_B$;

FIG. 16B is a diagram illustrating a second example pair of control gate signals $G_A$ and $G_B$;

FIG. 16C is a diagram illustrating a third example pair of control gate signals $G_A$ and $G_B$;

FIG. 16D is a diagram illustrating a fourth example pair of control gate signals $G_A$ and $G_B$;

FIG. 20C is a diagram illustrating shifting of a first component of an example controlled semiconductor shift register;

FIG. 20D is a diagram illustrating shifting of a second component of an example controlled semiconductor shift register;

FIG. 33 is a diagram illustrating an example double interaction quantum structure;

FIG. 34A is a diagram illustrating an example double interaction quantum structure with planar semiconductor process using tunneling through oxide;

FIG. 34B is a diagram illustrating an example double interaction quantum structure with planar semiconductor process using tunneling through local depletion region;

FIG. 36D is a diagram illustrating an example controlled quantum shift register performing the ancillary operation;

FIG. 37A is a diagram illustrating an example quantum structure with double interaction using planar semiconductor qdots with tunneling through oxide layer;

FIG. 37B is a diagram illustrating an example quantum structure with double interaction using planar semiconductor qdots with tunneling through local depletion region;

FIG. 37C is a diagram illustrating an example quantum structure with double interaction using 3D semiconductor qdots with tunneling through oxide layer;

FIG. 37D is a diagram illustrating an example quantum structure with double interaction using 3D semiconductor qdots with tunneling through local depletion region;

FIG. 38A is a diagram illustrating an example quantum bifurcation gate using planar semiconductor qdots with tunneling through oxide layer and potential imposing on the qdot well;

FIG. 38B is a diagram illustrating an example quantum bifurcation gate using planar semiconductor qdots with tunneling through local depletion region induced by overlapping control gate;

FIG. 38C is a diagram illustrating an example quantum bifurcation gate using 3D semiconductor qdots with tunneling through oxide layer and potential imposing on the qdot well (or tunneling path);

FIG. 38D is a diagram illustrating an example quantum bifurcation gate using 3D semiconductor qdots with tunneling through local depletion region induced by an overlapping control gate;

FIG. 39 is a diagram illustrating an example grid based matrix or fabric quantum computation unit using quantum path merger and/or bifurcation implemented with a shared qdot and shared tunneling path;

FIG. 40 is a diagram illustrating an example reconfigurable quantum computing unit using memory based reconfiguration control for both reconfigurable access control and reconfigurable operation;

FIG. 41 is a diagram illustrating example quantum computing paths incorporating multiple merger and bifurcations;

Figure 42:
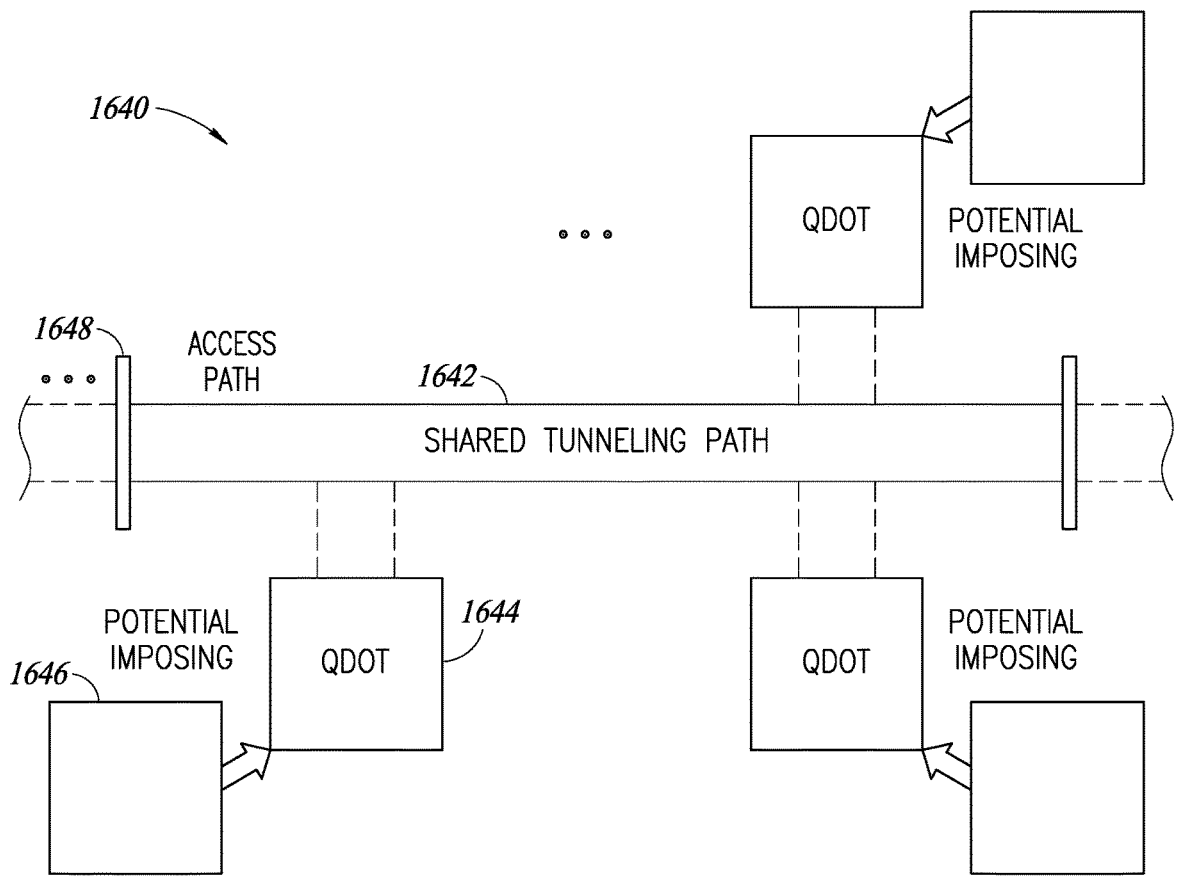
Figure 43:
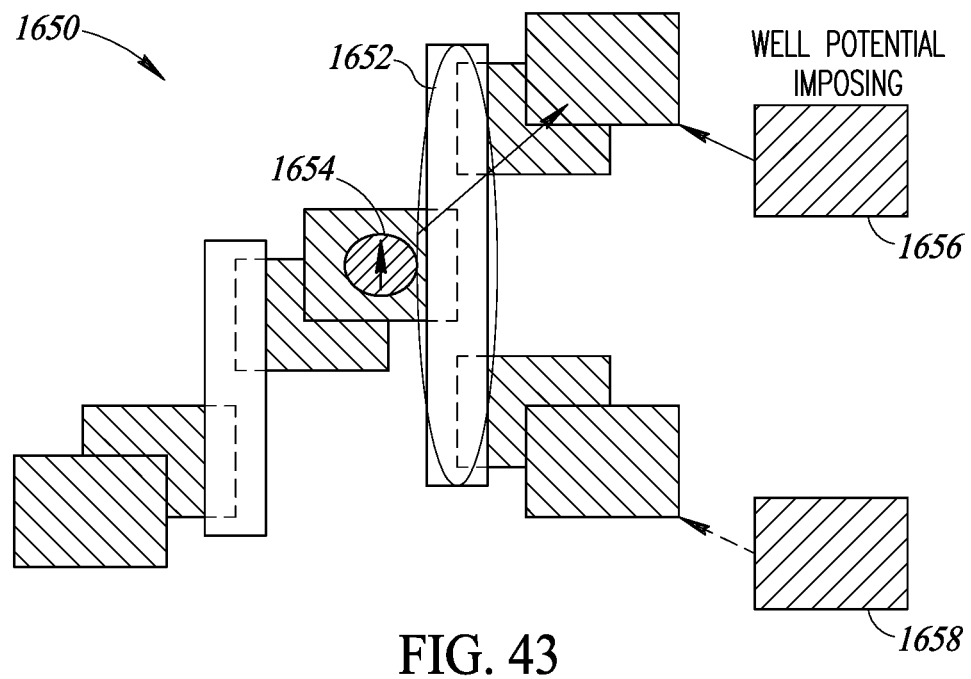
Figure 44:
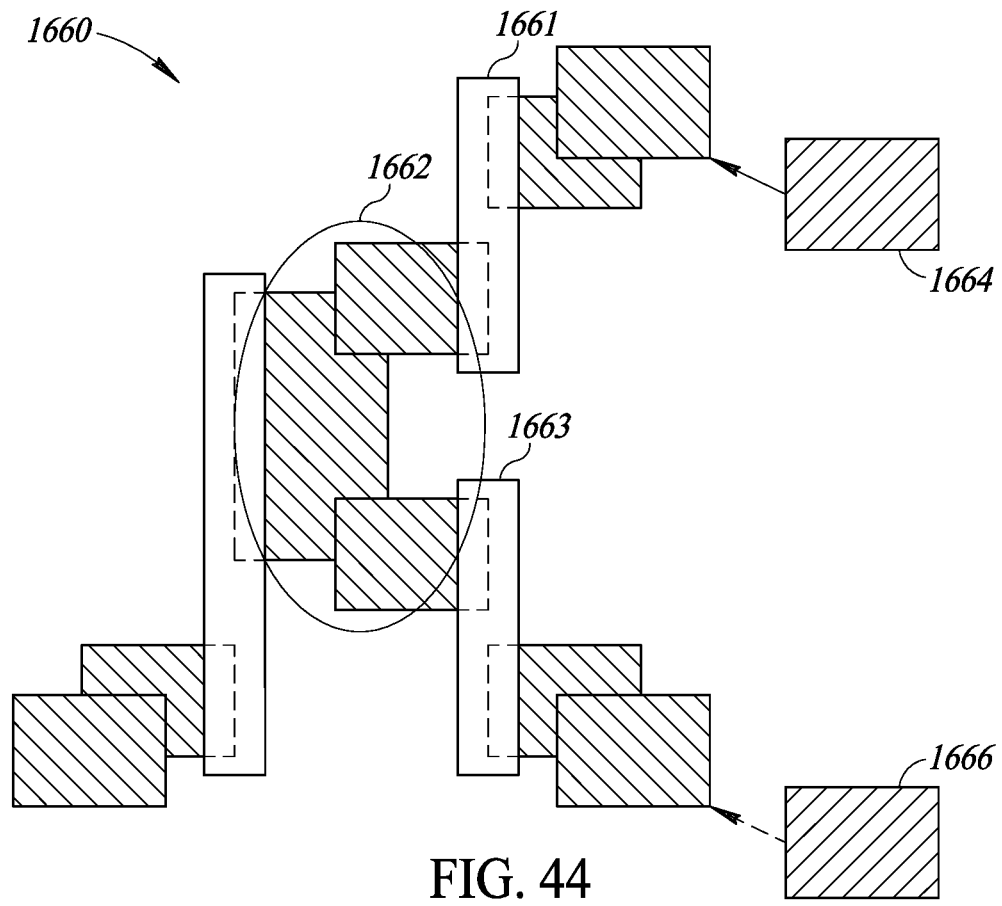
Figure 47:
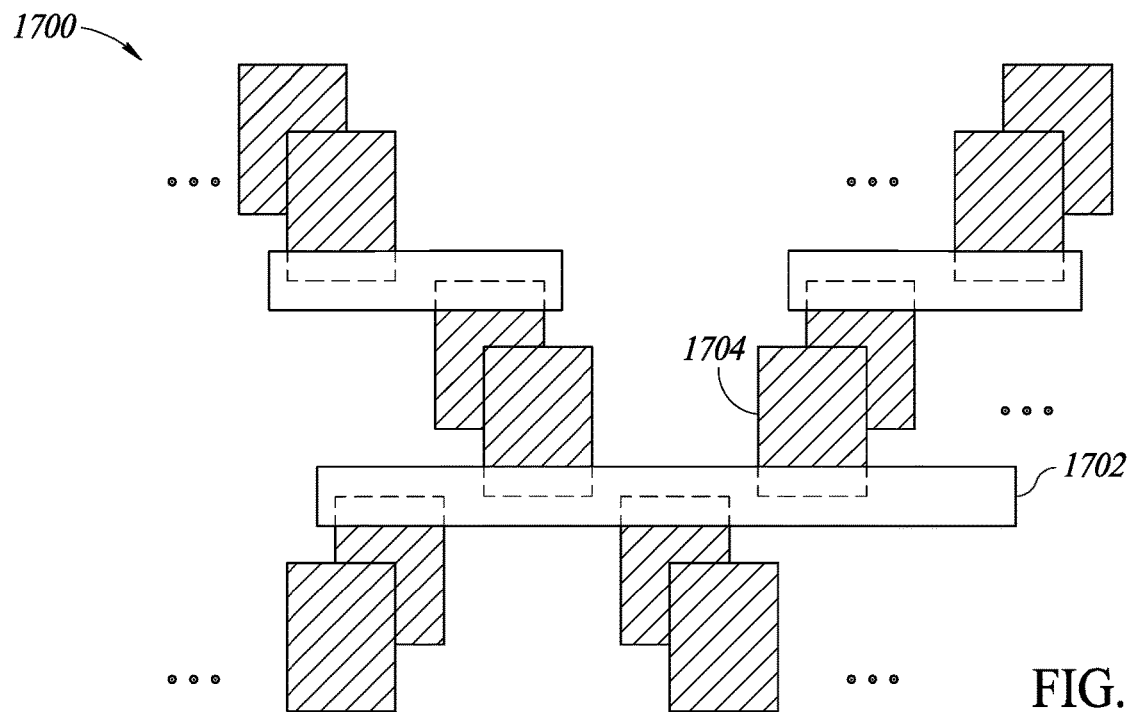
Figure 48:
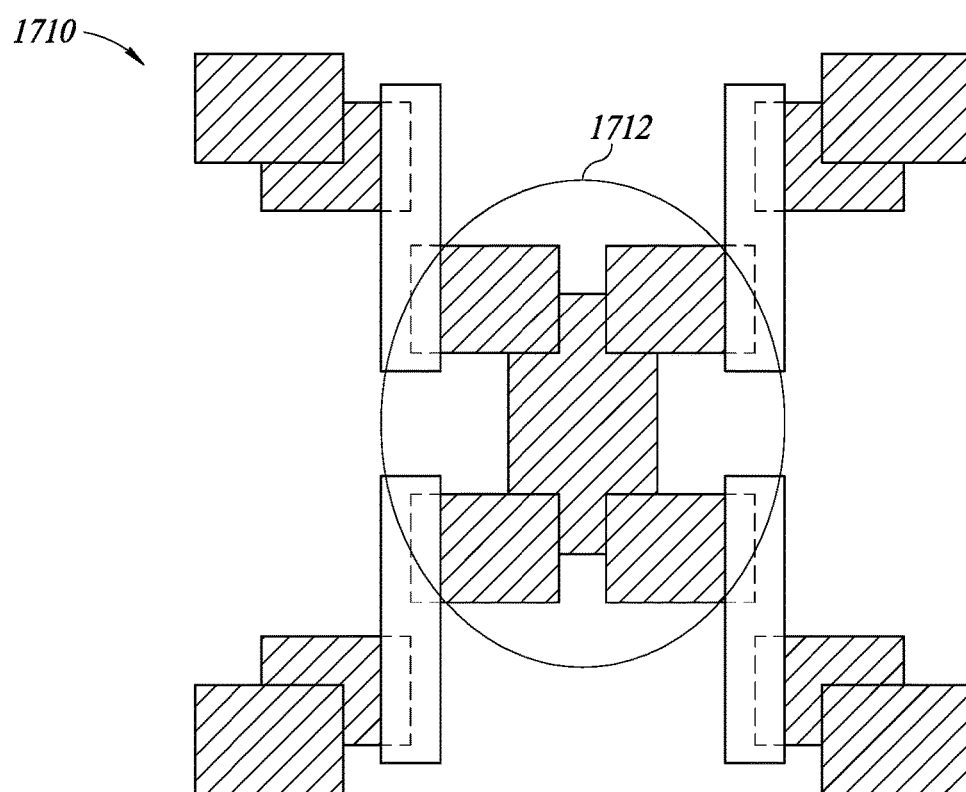
Figure 49:
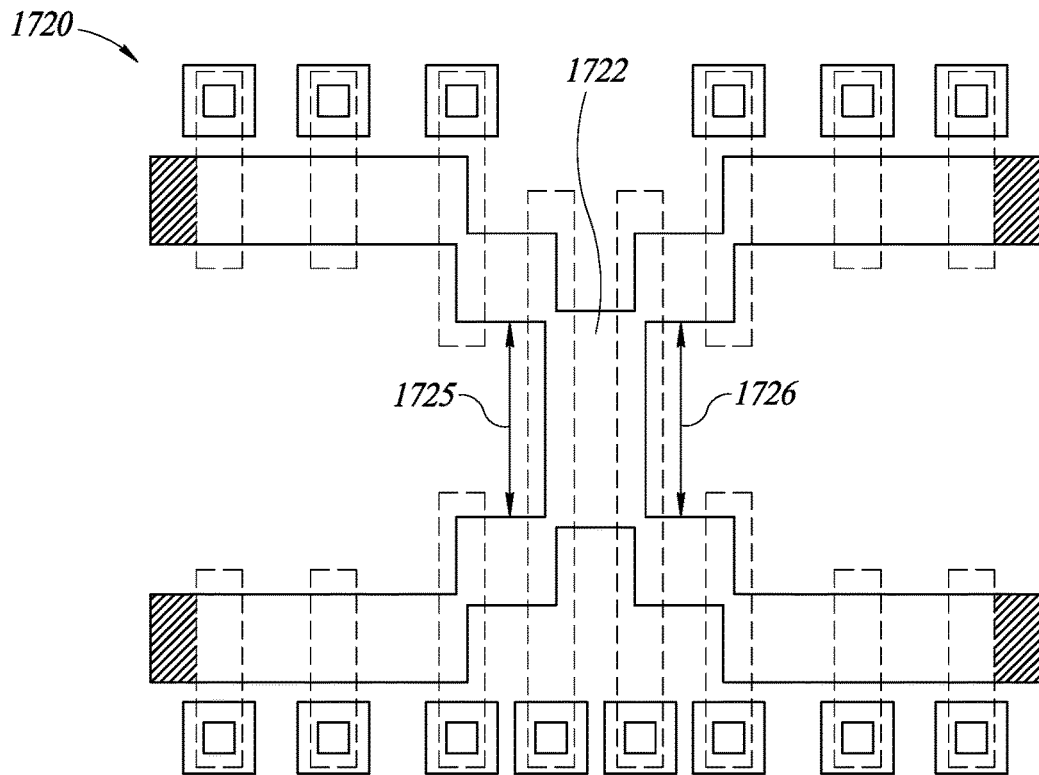
Figure 50:
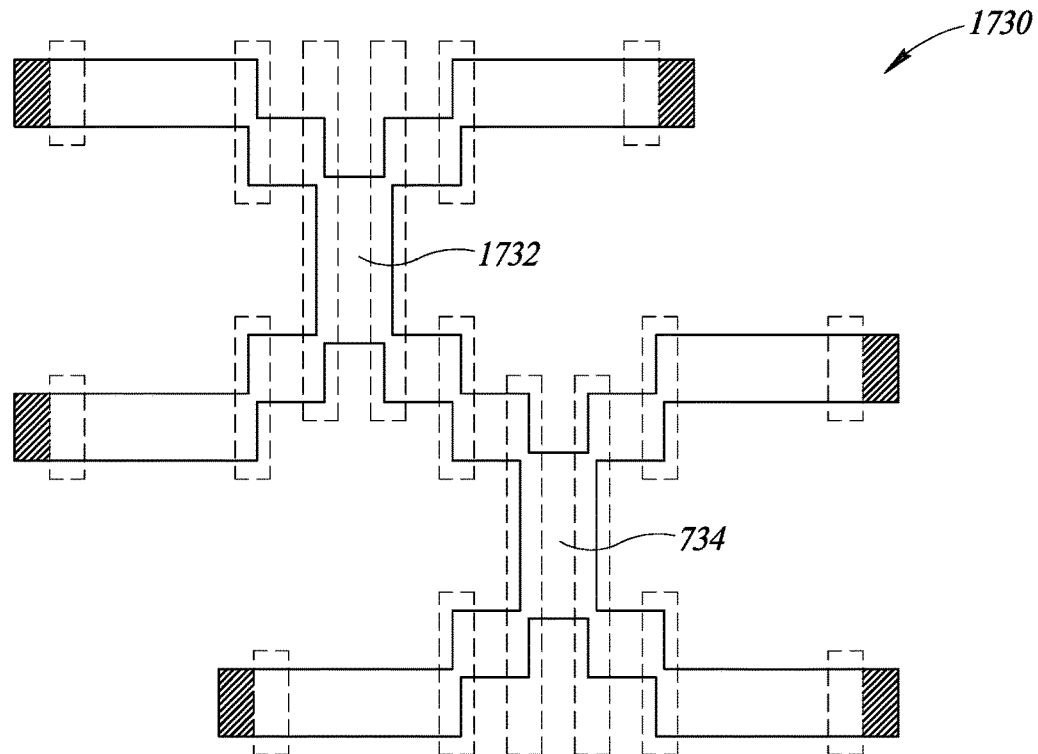
Figure 51A:
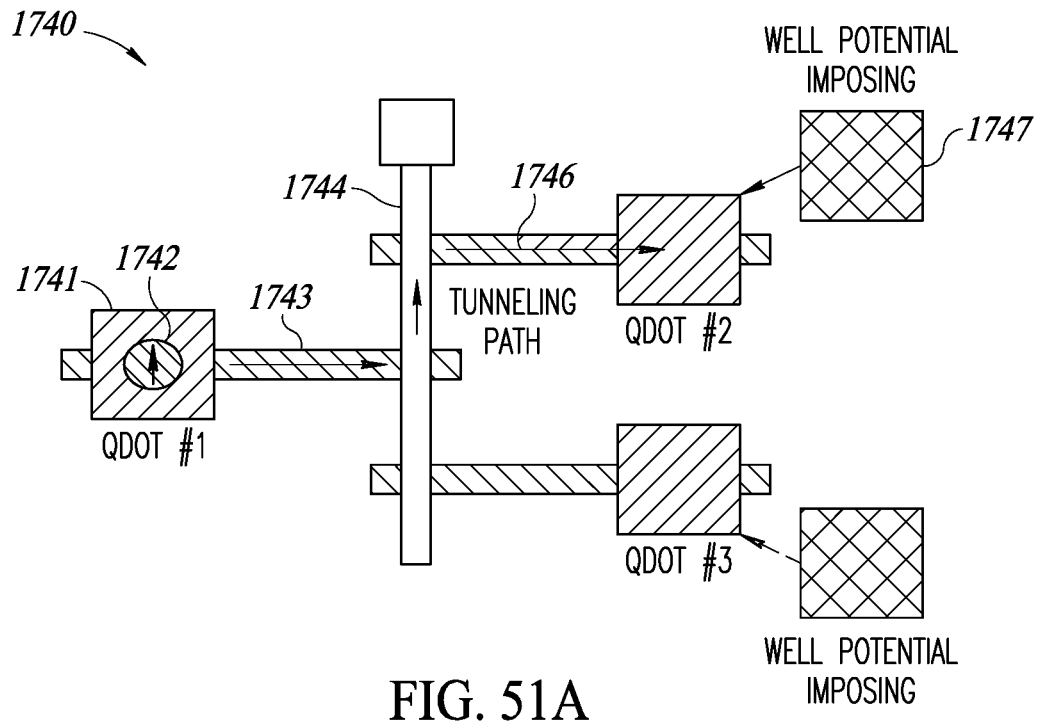
Figure 51B:
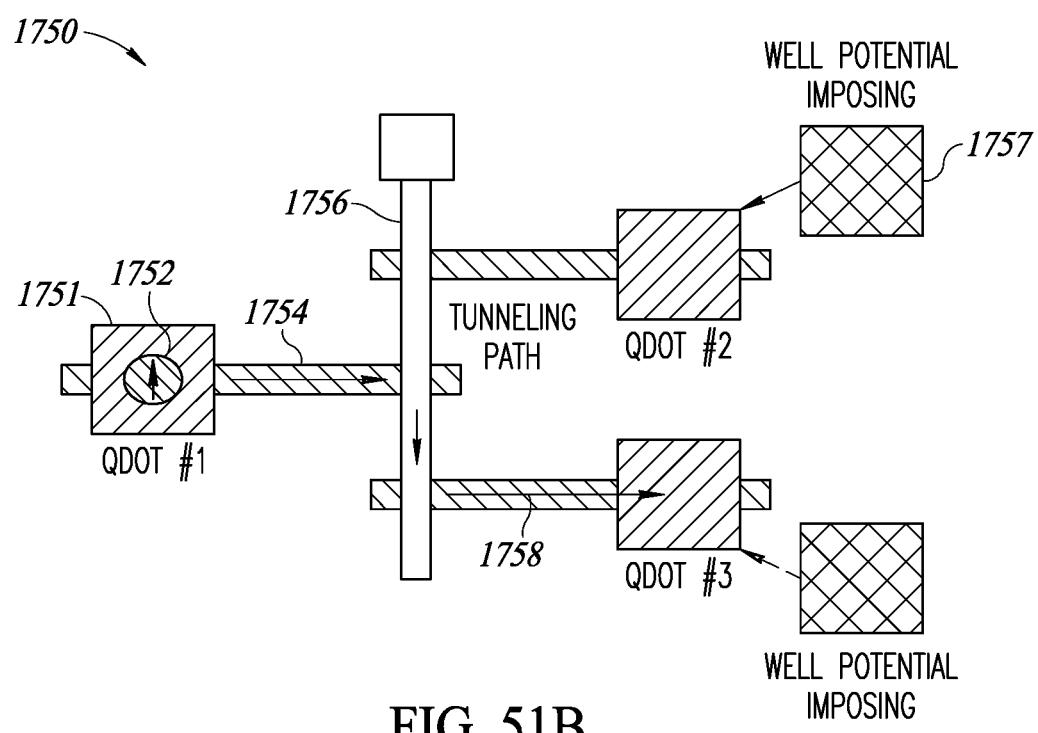
Figure 52A:
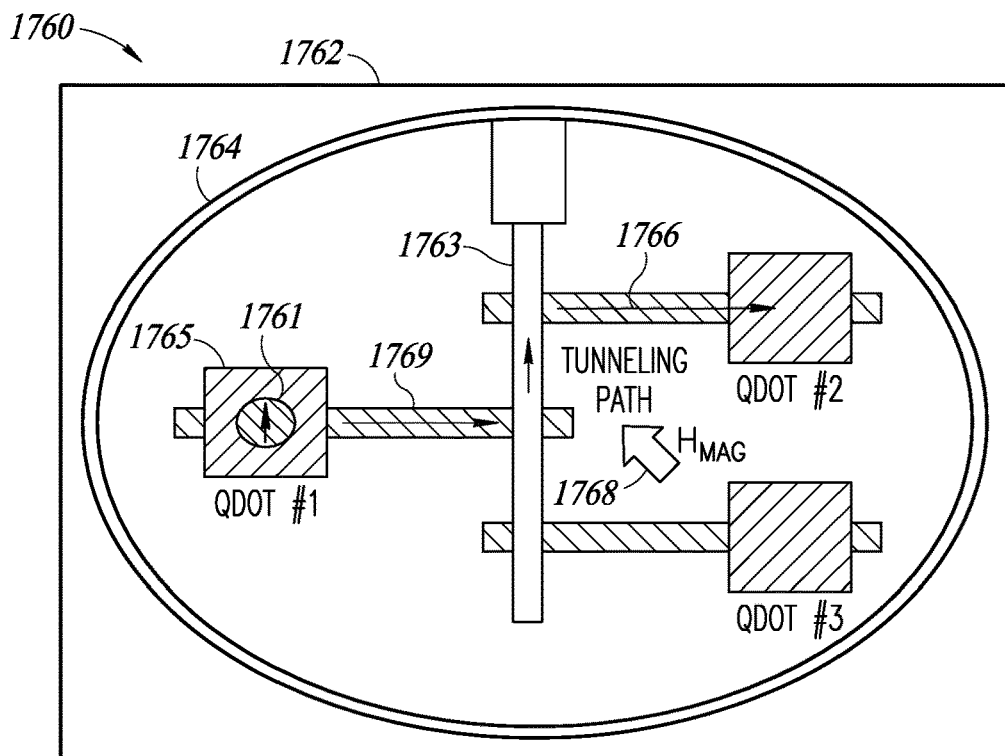
Figure 52B:
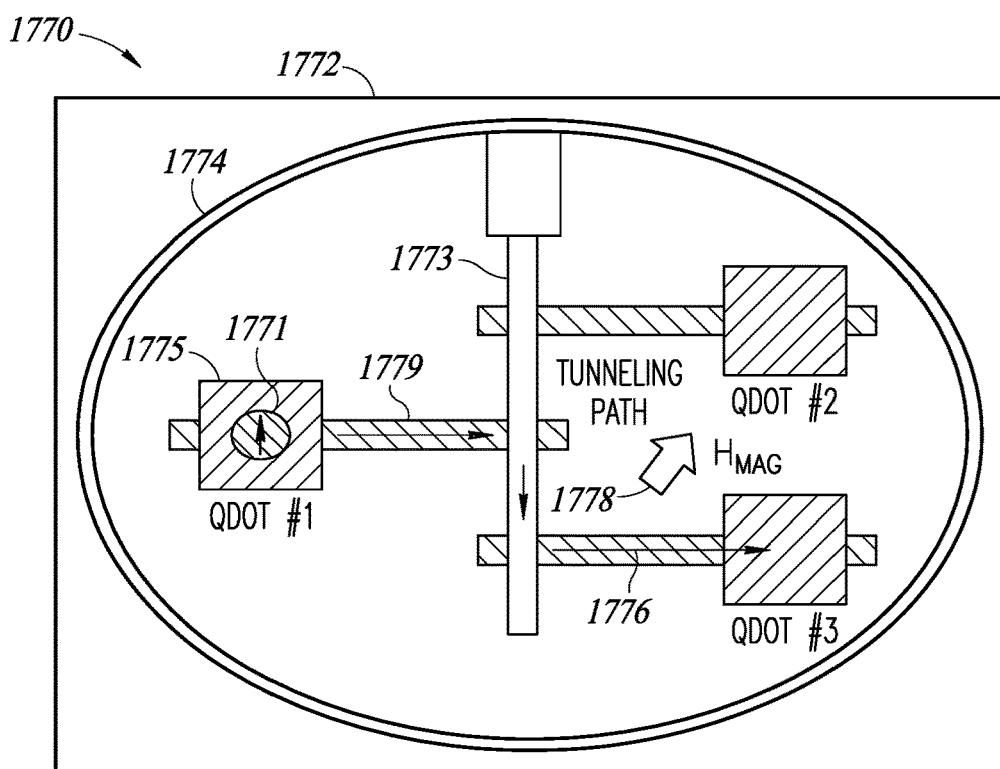
Figure 53:
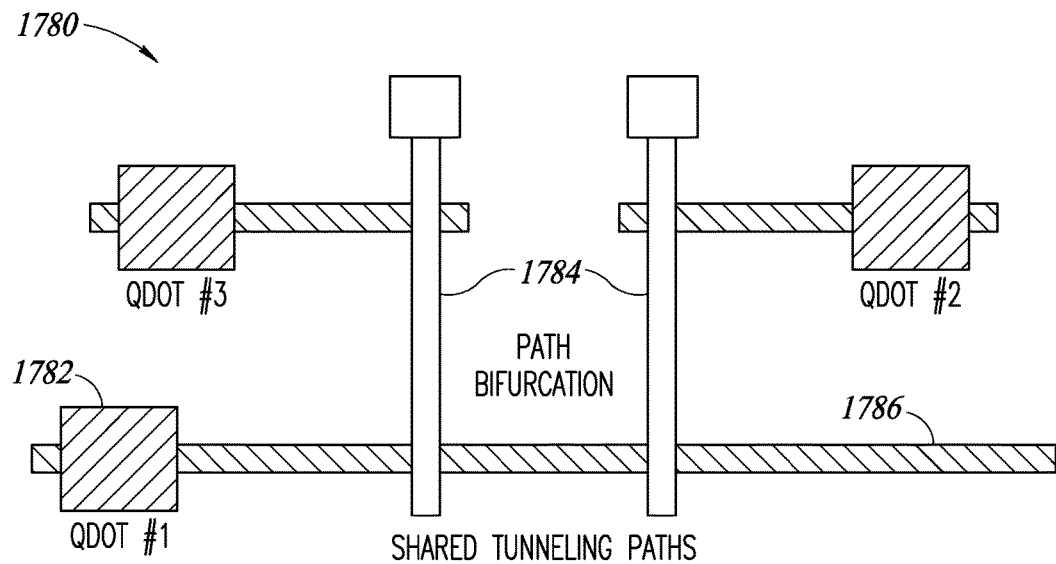
Figure 54:
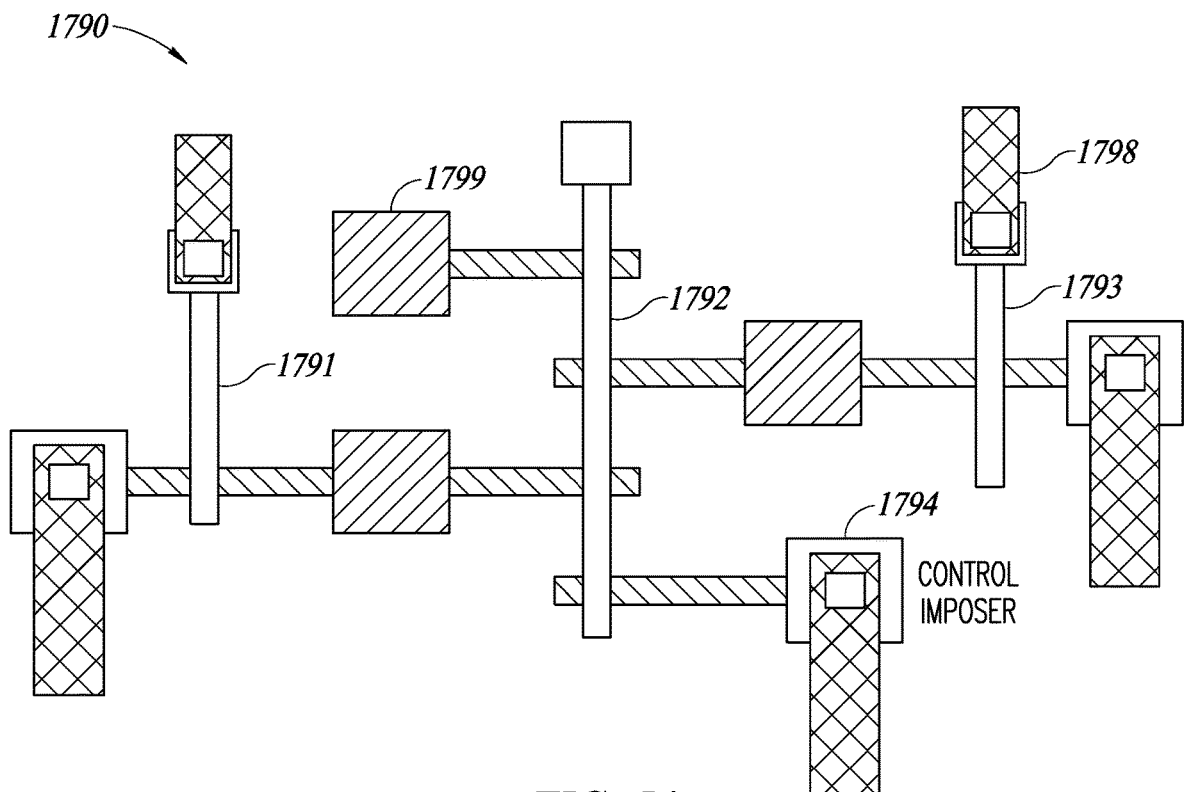
Figure 55:
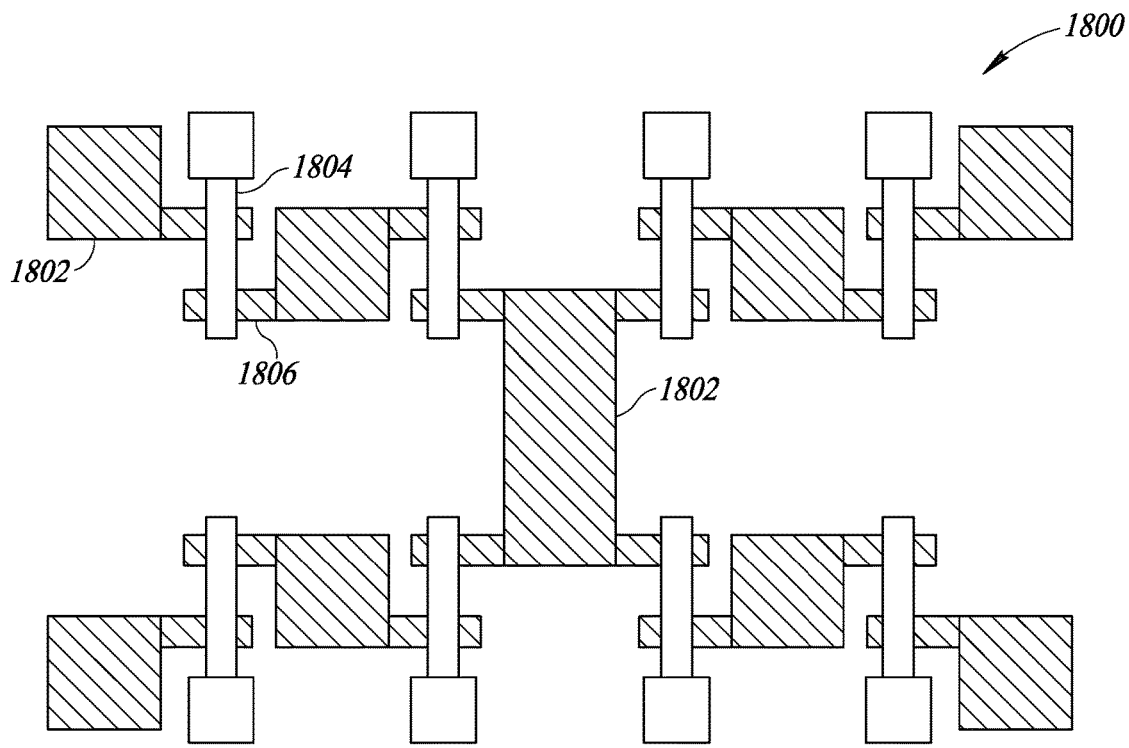
Figure 56:
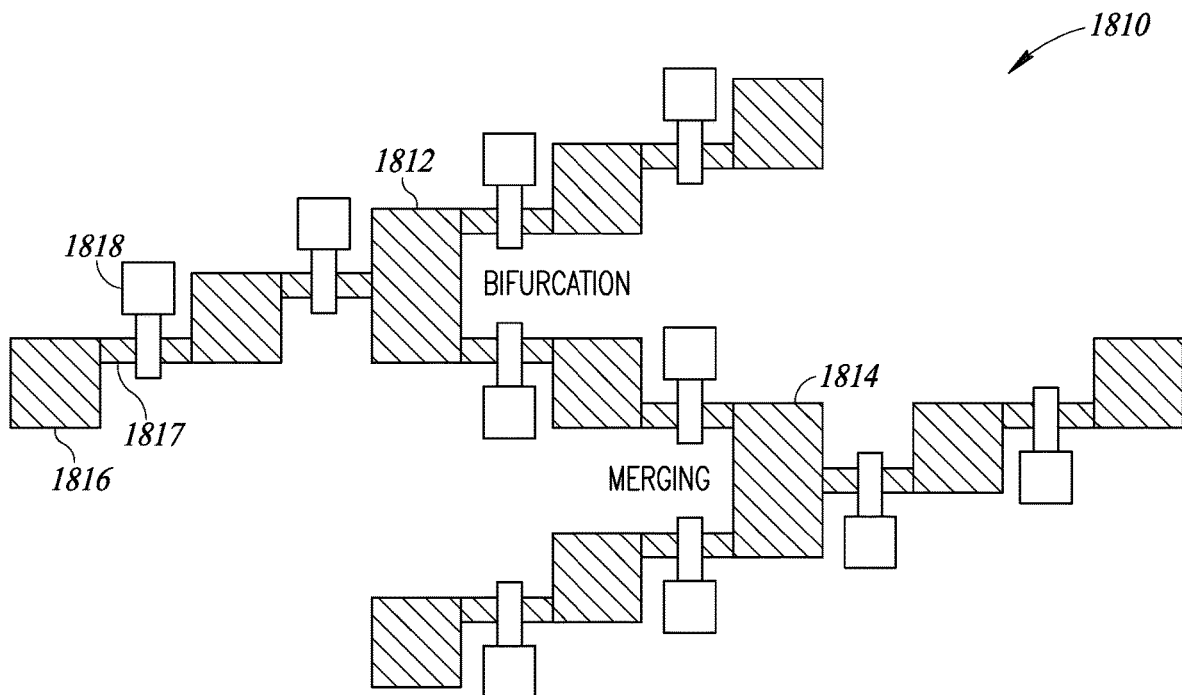
Figure 57:
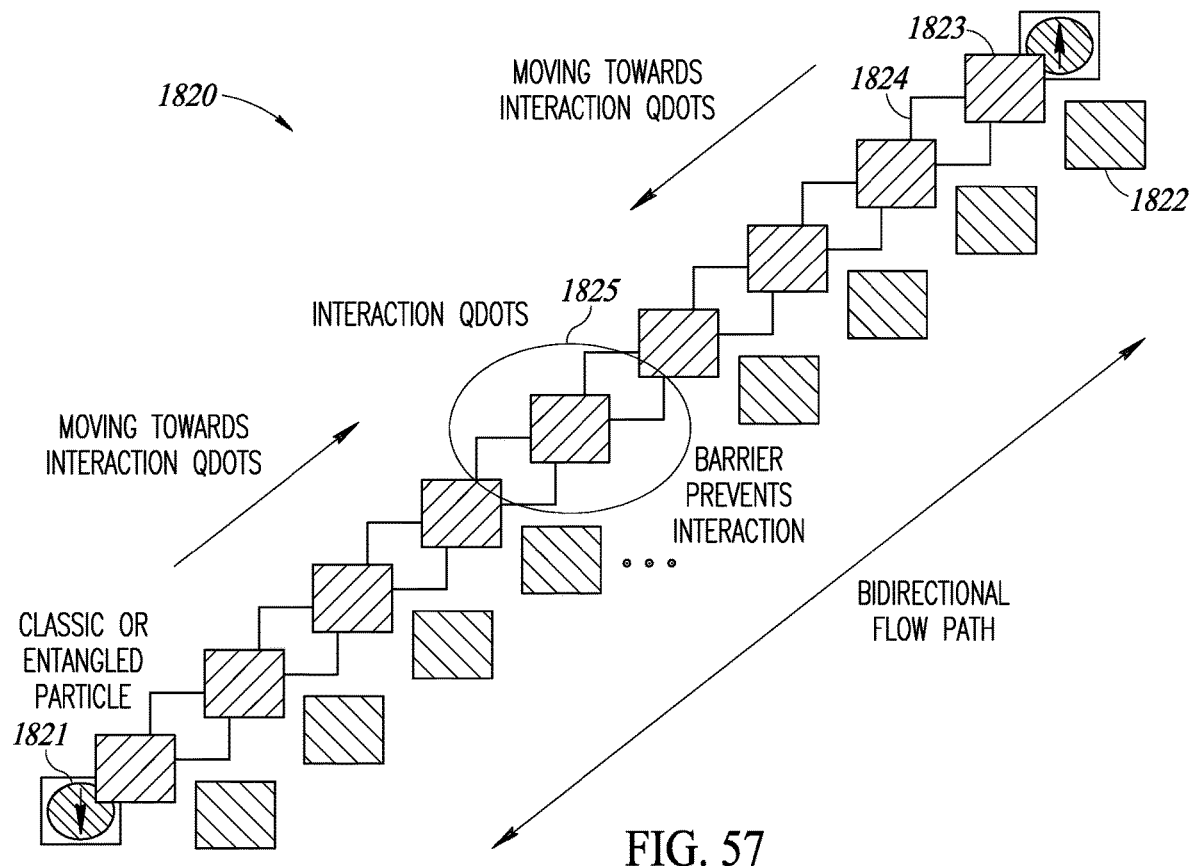
Figure 58:
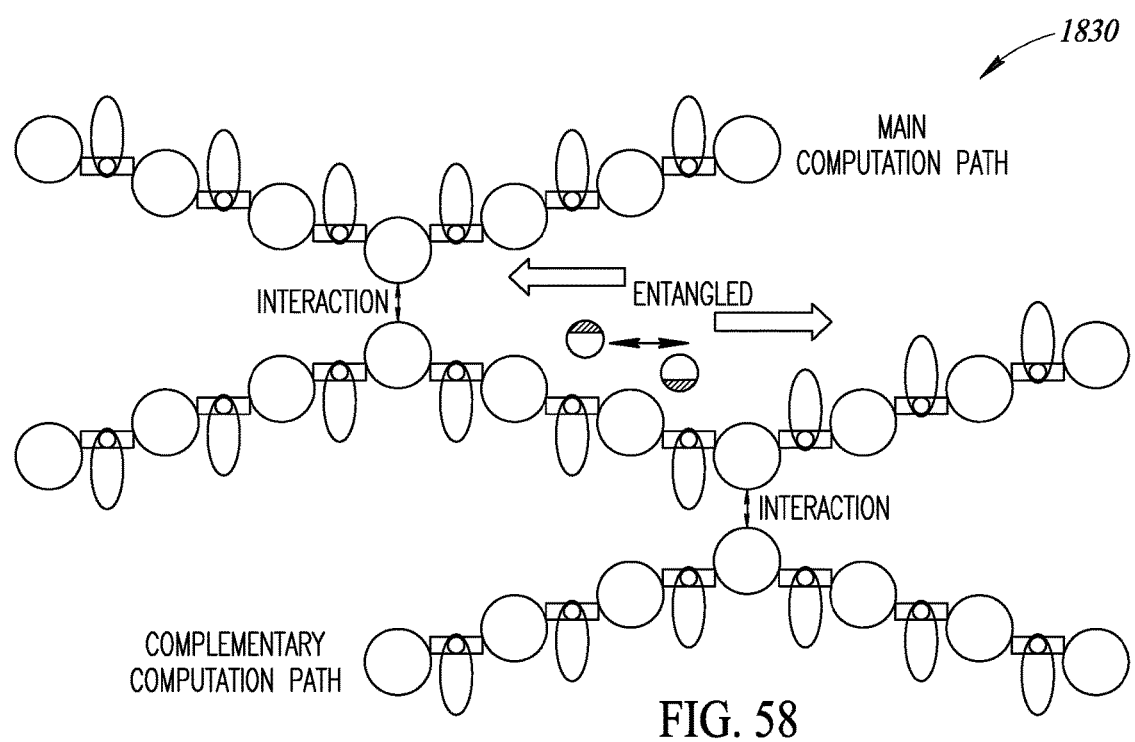
Figure 59:
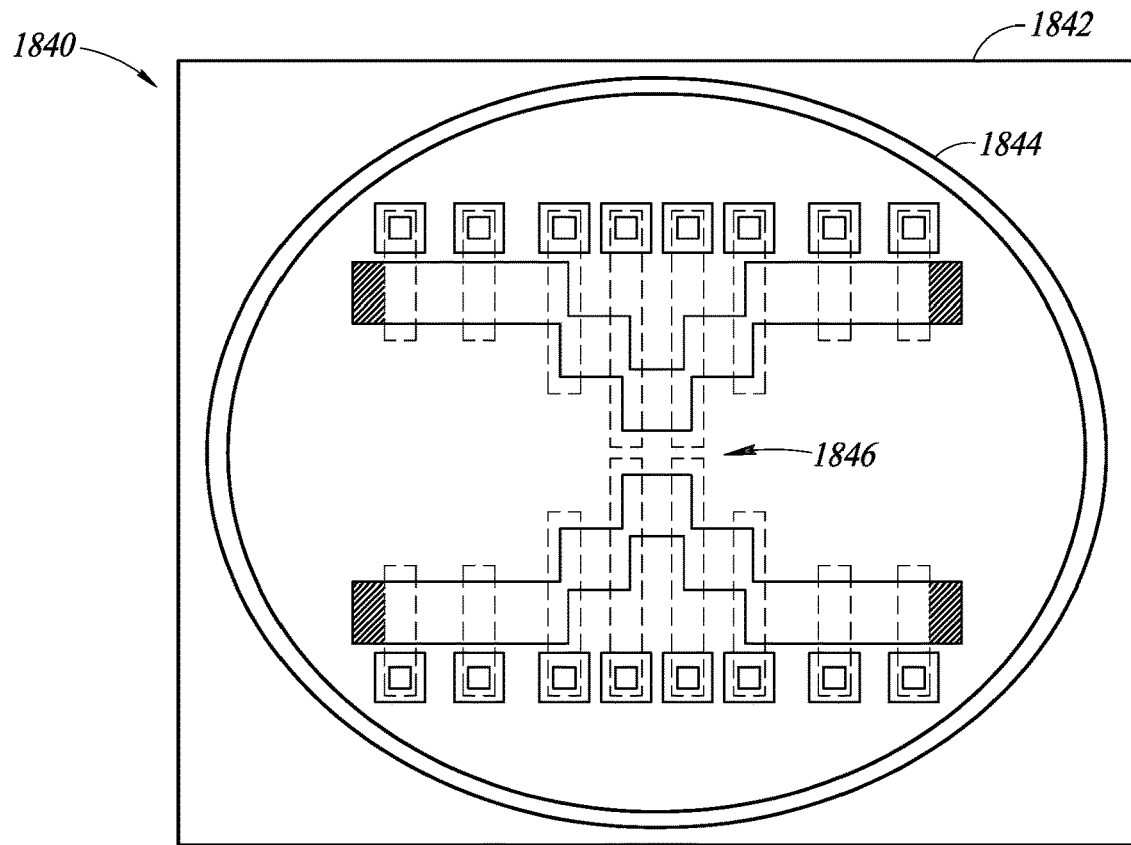
Figure 60:
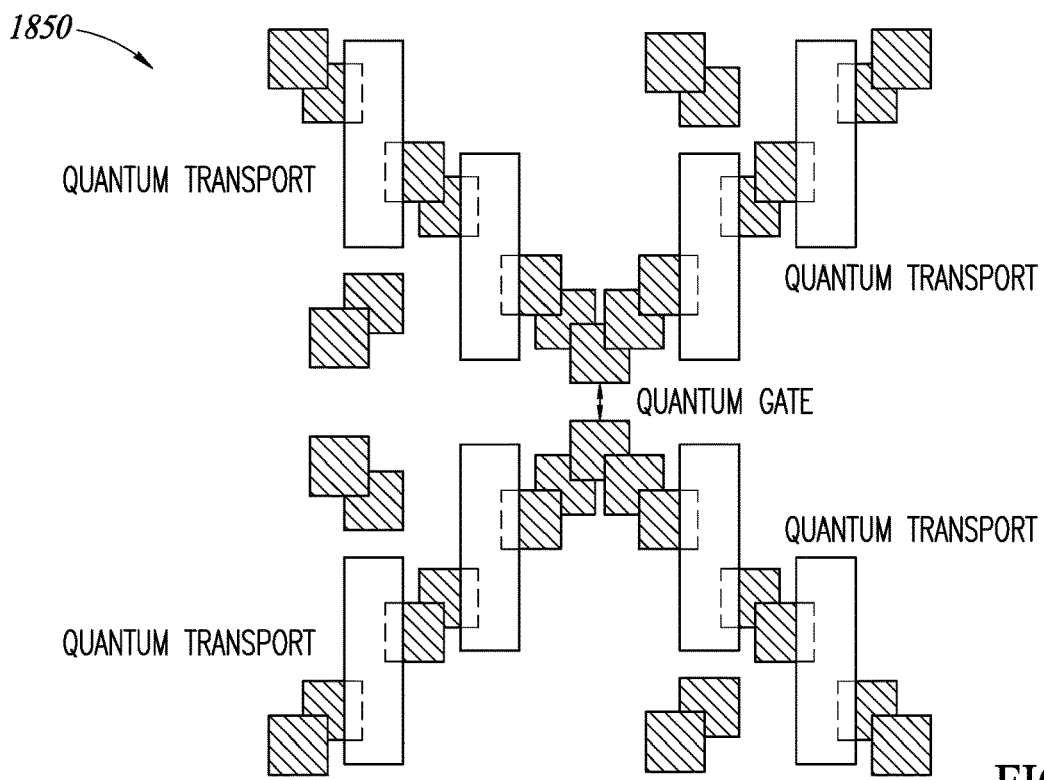
Figure 61:
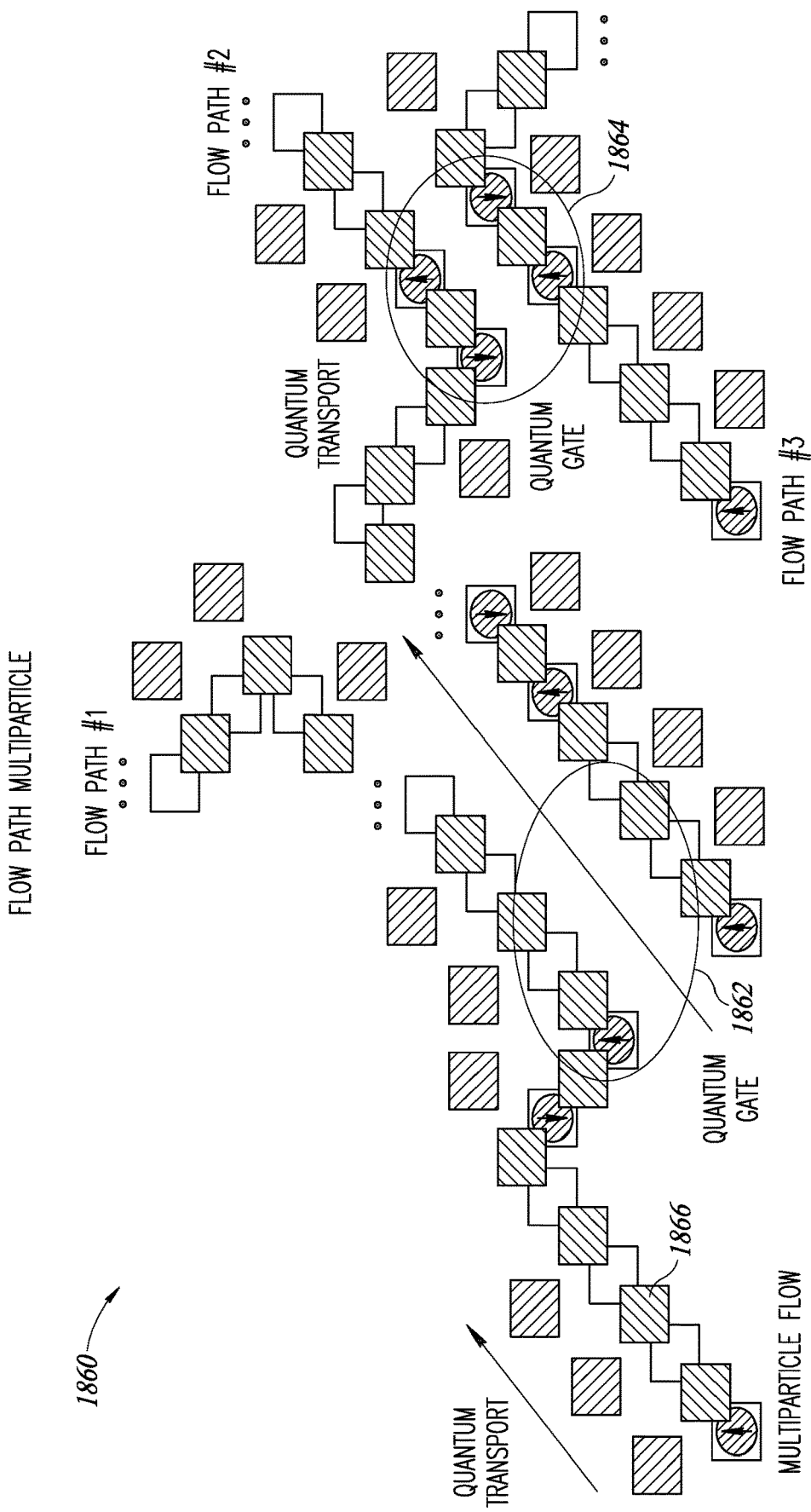
Figure 62:
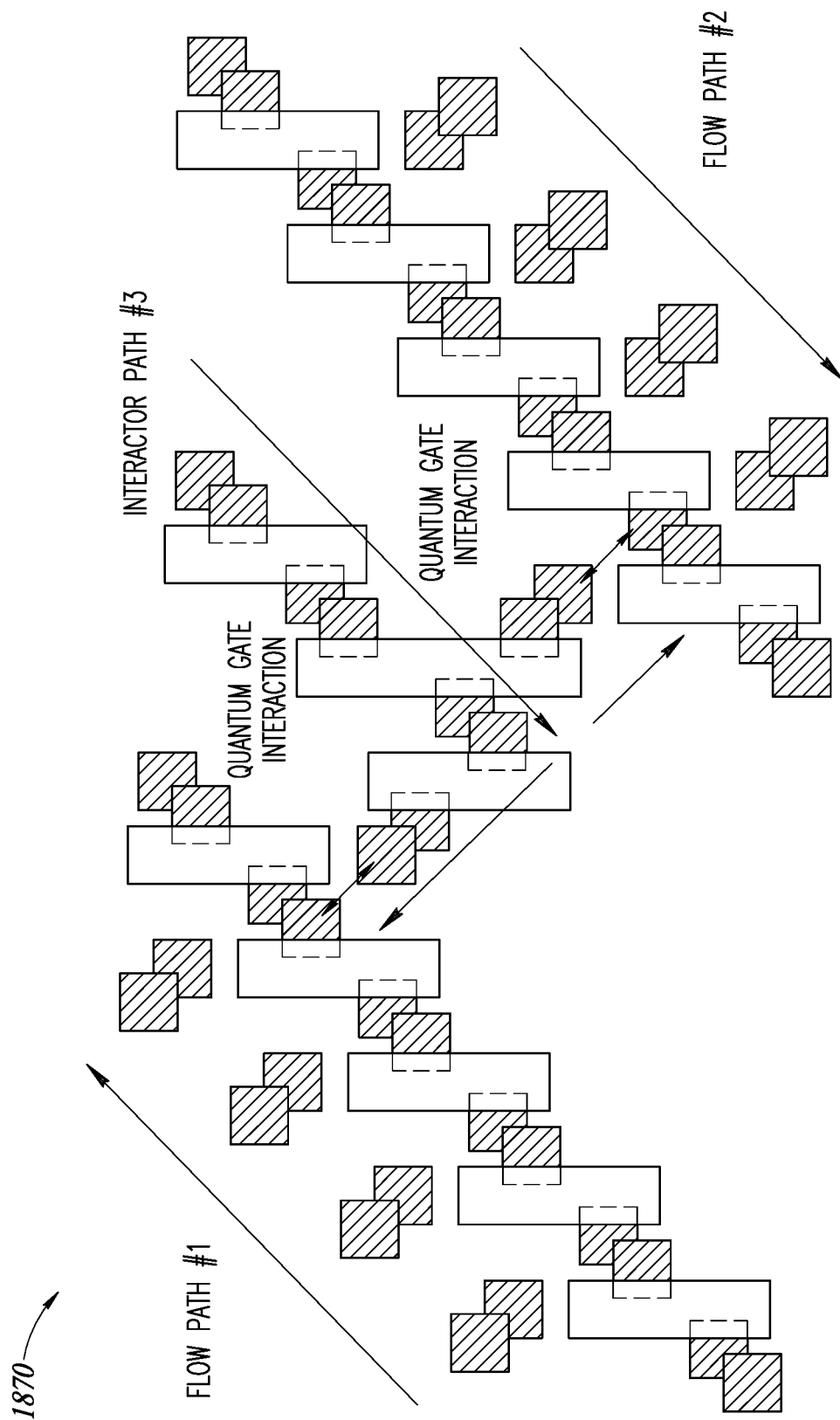
Figure 63:
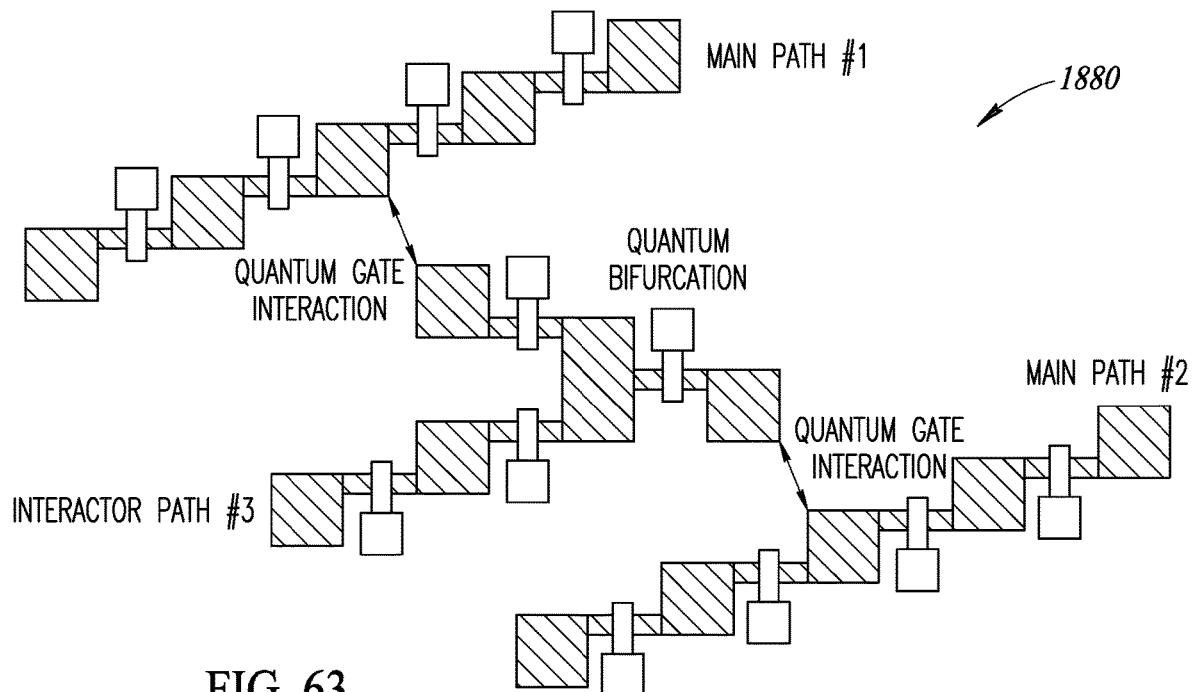
Figure 64:
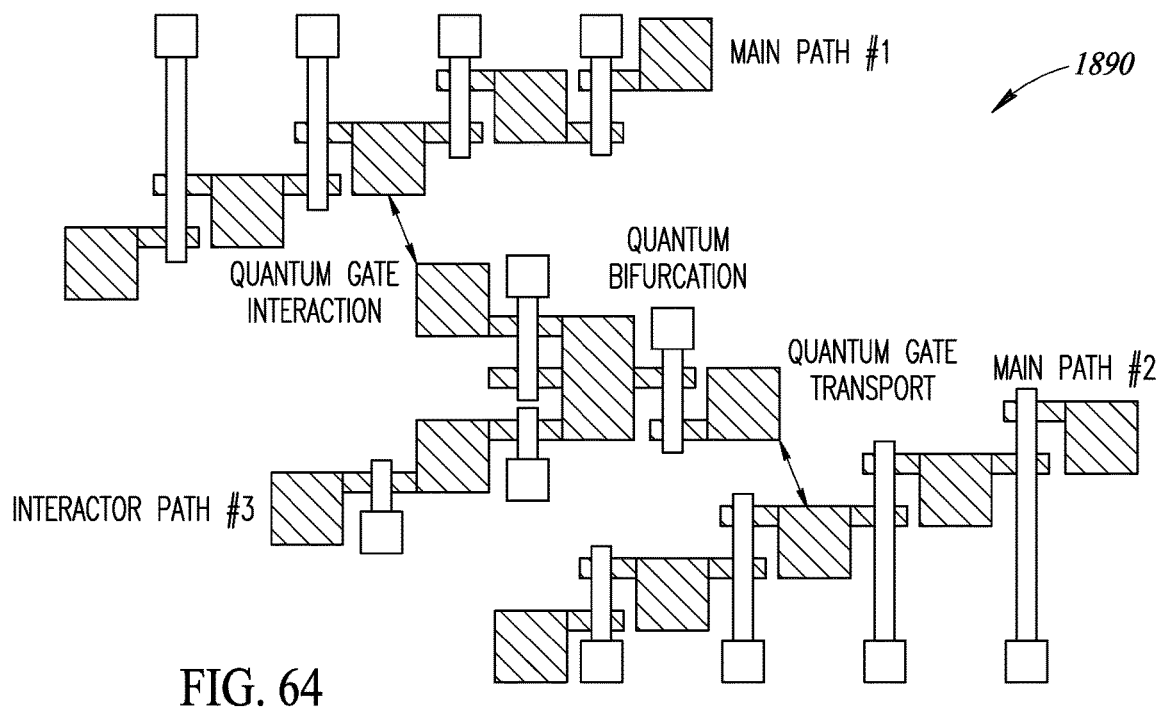

FIG. 42 is a diagram illustrating an example quantum computation path bifurcation and/or merger using a shared access path and indirect potential imposing on the quantum wells to determine the bifurcation/merger function;

FIG. 43 is a diagram illustrating an example quantum computation path bifurcation and/or merging using planar semiconductor qdots with tunneling through oxide layer;

FIG. 44 is a diagram illustrating an example quantum computation path bifurcation and/or merging using planar semiconductor qdots with tunneling through an oxide layer using shared quantum well with multiple overlapping gates;

FIG. 45A is a diagram illustrating a first example quantum computation path bifurcation/merging using a continuous well that extends in more than two directions;

FIG. 45B is a diagram illustrating a second example quantum computation path bifurcation/merging using a continuous well that extends in more than two directions;

FIG. 46 is a diagram illustrating an example quantum computation path with both bifurcation and merging using a continuous well that extends in more than two directions;

FIG. 47 is a diagram illustrating an example X shaped quantum computation path with bifurcation and/or merging using planar semiconductor qdots with tunneling through oxide layer and a common tunneling path shared by multiple quantum wells;

FIG. 48 is a diagram illustrating an example X shaped quantum computation path with bifurcation and/or merging using planar semiconductor qdots with tunneling through oxide layer and a common well shared by multiple tunneling paths;

FIG. 49 is a diagram illustrating an example X shaped quantum computation path with bifurcation and/or merging using planar semiconductor qdots with tunneling through local depletion region and a common well shared by multiple tunneling paths;

FIG. 50 is a diagram illustrating an example multiple X shaped quantum computation path with bifurcation and/or merging using planar semiconductor qdots with tunneling through local depletion region and a common well shared by multiple tunneling paths;

FIG. 51A is a diagram illustrating an example quantum computation path with bifurcation/merging using 3D semiconductor qdots and tunneling through oxide layer and sharing tunneling path with potential imposing on the well where electrical control of the tunneling causes bifurcation to the upper path;

FIG. 51B is a diagram illustrating an example quantum computation path with bifurcation/merging using 3D semiconductor qdots and tunneling through oxide layer and sharing tunneling path with potential imposing on the well where electrical control of the tunneling causes bifurcation to the lower path;

FIG. 52A is a diagram illustrating an example magnetically controlled quantum bifurcation gate using an inductor or resonator to create the control magnetic field to cause tunneling to the upper path;

FIG. 52B is a diagram illustrating an example magnetically controlled quantum bifurcation gate using an inductor or resonator to create the control magnetic field to cause tunneling to the lower path;

FIG. 53 is a diagram illustrating an example quantum computation path with bifurcation/merging using 3D semiconductor qdots and tunneling through oxide layer and both shared tunneling path and shared semiconductor fin;

FIG. 54 is a diagram illustrating an example quantum computation path with bifurcation/merging using 3D semiconductor qdots and tunneling through oxide layer and shared tunneling path with potential imposing on the tunneling path;

FIG. 55 is a diagram illustrating an example quantum computation path merging/bifurcation gate using 3D semiconductor qdots with tunneling through oxide layer;

FIG. 56 is a diagram illustrating an example quantum computation path with both merging/bifurcation using 3D semiconductor qdots with tunneling through local depletion region;

FIG. 57 is a diagram illustrating an example I shaped controlled quantum shift register with bidirectional flow;

FIG. 58 is a diagram illustrating an example multiple V controlled quantum shift register structure;

FIG. 59 is a diagram illustrating an example double V controlled quantum shift register in a resonator or inductor based magnetic field control;

FIG. 60 is a diagram illustrating an example double V controlled quantum shift register using planar semiconductor process with tunneling through oxide layer;

FIG. 61 is a diagram illustrating an example controlled quantum shift register using planar semiconductor process with tunneling through local depleted well;

FIG. 62 is a diagram illustrating an example controlled quantum shift register using planar semiconductor process with tunneling through oxide layer;

FIG. 63 is a diagram illustrating an example controlled quantum shift register using 3D semiconductor process with tunneling through local depleted well; and FIG. 64 is a diagram illustrating an example controlled quantum shift register using 3D semiconductor process with tunneling through oxide layer.

DETAILED DESCRIPTION

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The following definitions apply throughout this document.

A quantum particle is defined as any atomic or subatomic particle suitable for use in achieving the controllable quantum effect. Examples include electrons, holes, ions, photons, atoms, molecules, artificial atoms. A carrier is defined as an electron or a hole in the case of semiconductor electrostatic qubit. Note that a particle may be split and present in multiple quantum dots. Thus, a reference to a particle also includes split particles.

In quantum computing, the qubit is the basic unit of quantum information, i.e. the quantum version of the classical binary bit physically realized with a two-state device. A qubit is a two state quantum mechanical system in which the states can be in a superposition. Examples include (1) the spin of the particle (e.g., electron, hole) in which the two levels can be taken as spin up and spin down; (2) the polarization of a single photon in which the two states can be taken to be the vertical polarization and the horizontal polarization; and (3) the position of the particle (e.g., electron) in a structure of two qdots, in which the two states correspond to the particle being in one qdot or the other. In a classical system, a bit is in either one state or the other. Quantum mechanics, however, allows the qubit to be in a coherent superposition of both states simultaneously, a property fundamental to quantum mechanics and quantum computing. Multiple qubits can be further entangled with each other.

A quantum dot or qdot (also referred to in literature as QD) is a nanometer-scale structure where the addition or removal of a particle changes its properties is some ways. In one embodiment, quantum dots are constructed in silicon semiconductor material having typical dimension in nanometers. The position of a particle in a qdot can attain several states. Qdots are used to form qubits and qudits where multiple qubits or qudits are used as a basis to implement quantum processors and computers.

A quantum interaction gate is defined as a basic quantum logic circuit operating on a small number of qubits or qudits. They are the building blocks of quantum circuits, just like the classical logic gates are for conventional digital circuits.

A qubit or quantum bit is defined as a two state (two level) quantum structure and is the basic unit of quantum information. A qudit is defined as a d-state (d-level) quantum structure. A qubyte is a collection of eight qubits.

The terms control gate and control terminal are intended to refer to the semiconductor structure fabricated over a continuous well with a local depleted region and which divides the well into two or more qdots. These terms are not to be confused with quantum gates or classical FET gates.

Unlike most classical logic gates, quantum logic gates are reversible. It is possible, however, although cumbersome in practice, to perform classical computing using only reversible gates. For example, the reversible Toffoli gate can implement all Boolean functions, often at the cost of having to use ancillary bits. The Toffoli gate has a direct quantum equivalent, demonstrating that quantum circuits can perform all operations performed by classical circuits.

A quantum well is defined as a low doped or undoped continuous depleted semiconductor well that functions to contain quantum particles in a qubit or qudit. The quantum well may or may not have contacts and metal on top. A quantum well holds one free carrier at a time or at most a few carriers that can exhibit single carrier behavior.

A classic well is a medium or high doped semiconductor well contacted with metal layers to other devices and usually has a large number of free carriers that behave in a collective way, sometimes denoted as a "sea of electrons."

A quantum structure or circuit is a plurality of quantum interaction gates. A quantum computing core is a plurality of quantum structures. A quantum computer is a circuit having one or more computing cores. A quantum fabric is a collection of quantum structures, circuits, or interaction gates arranged in a grid like matrix where any desired signal path can be configured by appropriate configuration of access control gates placed in access paths between qdots and structures that make up the fabric.

In one embodiment, qdots are fabricated in low doped or undoped continuous depleted semiconductor wells. Note that the term 'continuous' as used herein is intended to mean a single fabricated well (even though there could be structures on top of them, such as gates, that modulate the local well's behavior) as well as a plurality of abutting contiguous wells fabricated separately or together, and in some cases might apparently look as somewhat discontinuous when 'drawn' using a computer aided design (CAD) layout tool.

The term classic or conventional circuitry (as opposed to quantum structures or circuits) is intended to denote conventional semiconductor circuitry used to fabricate transistors (e.g., FET, CMOS, BJT, FinFET, etc.) and integrated circuits using processes well-known in the art.

The term Rabi oscillation is intended to denote the cyclic behavior of a quantum system either with or without the presence of an oscillatory driving field. The cyclic behavior of a quantum system without the presence of an oscillatory driving field is also referred to as occupancy oscillation.

Throughout this document, a representation of the state of the quantum system in spherical coordinates includes two angles $\theta$ and $\varphi$. Considering a unitary sphere, as the Hilbert space is a unitary state, the state of the system is completely described by the vector $\Psi$. The vector $\Psi$ in spherical coordinates can be described in two angles $\theta$ and $\varphi$. The angle $\theta$ is between the vector $\Psi$ and the z-axis and the angle $\varphi$ is the angle between the projection of the vector on the XY plane and the x-axis. Thus, any position on the sphere is described by these two angles $\theta$ and $\varphi$. Note that for one qubit angle $\theta$ representation is in three dimensions. For multiple qubits $\theta$ representation is in higher order dimensions.

Quantum Computing System

Figure 1:
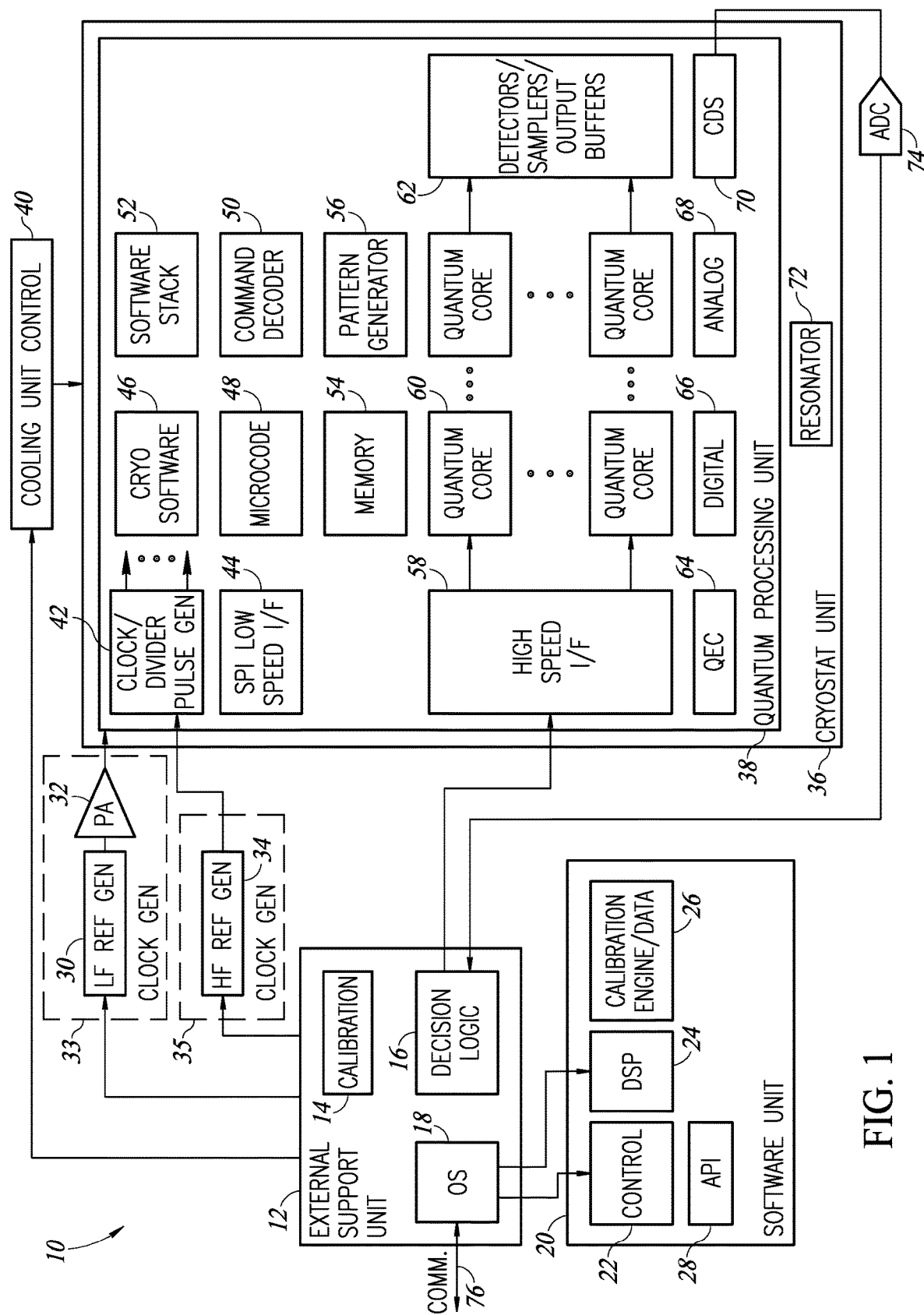
FIG. 1 is a high level block diagram illustrating a first example quantum computer system constructed in accordance with the present invention.

A high-level block diagram illustrating a first example quantum computer system constructed in accordance with the present invention is shown in FIG. 1. The quantum computer, generally referenced 10, comprises a conventional (i.e. not a quantum circuit) external support unit 12, software unit 20, cryostat unit 36, quantum processing unit 38, clock generation units 33, 35, and one or more communication busses between the blocks. The external support unit 12 comprises operating system (OS) 18 coupled to communication network 76 such as LAN, WAN, PAN, etc., decision logic 16, and calibration block 14. Software unit 20 comprises control block 22 and digital signal processor (DSP) 24 blocks in communication with the OS 18, calibration engine/data block 26, and application programming interface (API) 28.

Quantum processing unit 38 comprises a plurality of quantum core circuits 60, high speed interface 58, detectors/samplers/output buffers 62, quantum error correction (QEC) 64, digital block 66, analog block 68, correlated data sampler (CDS) 70 coupled to one or more analog to digital converters (ADCs) 74 as well as one or more digital to analog converters (DACs, not shown), clock/divider/pulse generator circuit 42 coupled to the output of clock generator 35 which comprises high frequency (HF) generator 34. The quantum processing unit 38 further comprises serial peripheral interface (SPI) low speed interface 44, cryostat software block 46, microcode 48, command decoder 50, software stack 52, memory 54, and pattern generator 56. The clock generator 33 comprises low frequency (LF) generator 30 and power amplifier (PA) 32, the output of which is input to the quantum processing unit (QPU) 38. Clock generator 33 also functions to aid in controlling the spin of the quantum particles in the quantum cores 60.

The cryostat unit 36 is the mechanical system that cools the QPU down to cryogenic temperatures. Typically, it is made from metal and it can be fashioned to function as a cavity resonator 72. It is controlled by cooling unit control 40 via the external support unit 12. The cooling unit control 40 functions to set and regulate the temperature of the cryostat unit 36. By configuring the metal cavity appropriately, it is made to resonate at a desired frequency. A clock is then driven via a power amplifier which is used to drive the resonator which creates a magnetic field. This magnetic field can function as an auxiliary magnetic field to aid in controlling one or more quantum structures in the quantum core.

The external support unit/software units may comprise any suitable computing device or platform such as an FPGA/SoC board. In one embodiment, it comprises one or more general purpose CPU cores and optionally one or more special purpose cores (e.g., DSP core, floating point, etc.) that that interact with the software stack that drives the hardware, i.e. the QPU. The one or more general purpose cores execute general purpose opcodes while the special purpose cores execute functions specific to their purpose. Main memory comprises dynamic random access memory (DRAM) or extended data out (EDO) memory, or other types of memory such as ROM, static RAM, flash, and non-volatile static random access memory (NVSRAM), bubble memory, etc. The OS may comprise any suitable OS capable of running on the external support unit and software units, e.g., Windows, MacOS, Linux, QNX, NetBSD, etc. The software stack includes the API, the calibration and management of the data, and all the necessary controls to operate the external support unit itself.

The clock generated by the high frequency clock generator 35 is input to the clock divider 42 that functions to generate the signals that drive the QPU. Low frequency clock signals are also input to and used by the QPU. A slow serial/parallel interface (SPI) 44 functions to handle the control signals to configure the quantum operation in the QPU. The high speed interface 58 is used to pump data from the classic computer, i.e. the external support unit, to the QPU. The data that the QPU operates on is provided by the external support unit.

Non-volatile memory may include various removable/non-removable, volatile/nonvolatile computer storage media, such as hard disk drives that reads from or writes to non-removable, nonvolatile magnetic media, a magnetic disk drive that reads from or writes to a removable, non-volatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

The computer may operate in a networked environment via connections to one or more remote computers. The remote computer may comprise a personal computer (PC), server, router, network PC, peer device or other common network node, or another quantum computer, and typically includes many or all of the elements described supra. Such networking environments are commonplace in offices, enterprise-wide computer networks, intranets and the Internet.

When used in a LAN networking environment, the computer is connected to the LAN via network interface 76. When used in a WAN networking environment, the computer includes a modem or other means for establishing communications over the WAN, such as the Internet. The modem, which may be internal or external, is connected to the system bus via user input interface, or other appropriate mechanism.

Computer program code for carrying out operations of the present invention may be written in any combination of one or more programming languages, including an object oriented programming language such as Java, Smalltalk, C++, C# or the like, conventional procedural programming languages, such as the "C" programming language, and functional programming languages such as Python, Hotlab, Prolog and Lisp, machine code, assembler or any other suitable programming languages.

Also shown in FIG. 1 is the optional data feedback loop between the quantum processing unit 38 and the external support unit 12 provided by the partial quantum data read out. The quantum state is stored in the qubits of the one or more quantum cores 60. The detectors 62 function to measure/collapse/detect some of the qubits and provide a measured signal through appropriate buffering to the output ADC block 74. The resulting digitized signal is sent to the decision logic block 16 of the external support unit 12 which functions to reinject the read out data back into the quantum state through the high speed interface 58 and quantum initialization circuits. In an alternative embodiment, the output of the ADC is fed back to the input of the QPU.

In one embodiment, quantum error correction (QEC) is performed via QEC block 64 to ensure no errors corrupt the read out data that is reinjected into the overall quantum state. Errors may occur in quantum circuits due to noise or inaccuracies similarly to classic circuits. Periodic partial reading of the quantum state function to refresh all the qubits in time such that they maintain their accuracy for relatively long time intervals and allow the complex computations required by a quantum computing machine.

It is appreciated that the architecture disclosed herein can be implemented in numerous types of quantum computing machines. Examples include semiconductor quantum computers, superconducting quantum computers, magnetic resonance quantum computers, optical quantum computers, etc. Further, the qubits used by the quantum computers can have any nature, including charge qubits, spin qubits, hybrid spin-charge qubits, etc.

In one embodiment, the quantum structure disclosed herein is operative to process a single particle at a time. In this case, the particle can be in a state of quantum superposition, i.e. distributed between two or more locations or charge qdots. In an alternative embodiment, the quantum structure processes two or more particles at the same time that have related spins. In such a structure, the entanglement between two or more particles could be realized. Complex quantum computations can be realized with such a quantum interaction gate/structure or circuit.

In alternative embodiments, the quantum structure processes (1) two or more particles at the same time having opposite spin, or (2) two or more particles having opposite spins but in different or alternate operation cycles at different times. In the latter embodiment, detection is performed for each spin type separately.

Figure 2:
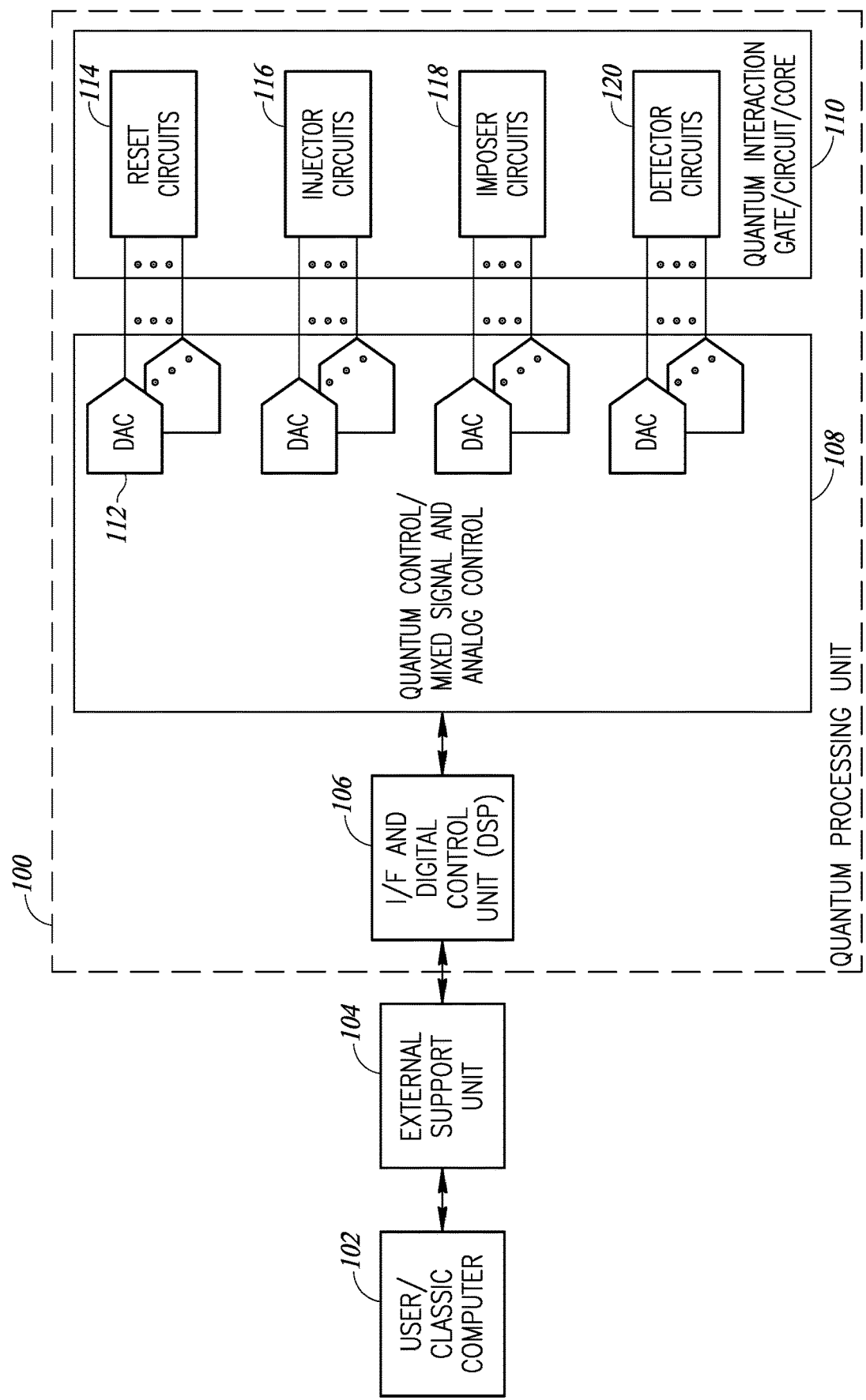
FIG. 2 is a diagram illustrating an example quantum processing unit incorporating a plurality of DAC circuits.

A diagram illustrating an example quantum processing unit incorporating a plurality of DAC circuits is shown in FIG. 2. The quantum processing unit, generally referenced 100, comprises interface and digital control unit (DSP) 106, quantum control/mixed signal and analog control block 108 having a plurality of DACs 112, and quantum interaction gate, circuit, or core 110 including reset circuits 114, injector circuits 116, imposer circuits 118, and detector circuits 120. The quantum processing unit is operative to receive control information from the external support unit 104 which is in communication with a user computing device 102 typically comprising a classic computer.

Note that the digital control unit 106 combined with the mixed signal and analog control circuit 108 provide a reprogrammable capability to the quantum interaction gates/circuits/cores 110. Thus, using the same physical structure realized in the circuitry different types of quantum operations can be achieved by changing the electronic control signals generated by the DACs 112. The quantum processing unit 100 can be appropriately programmed via software to realize numerous quantum operations depending on the particular application, similar to software that controls classic computers where a software stack determines multiple functionality operation of the computer circuit.

In one embodiment, the reset, injector, imposer, and detector circuits of the quantum interaction gate/circuit/core are controlled by analog signals generated by a plurality of digital to analog converters (DACs) 112. The digital command data that feed the DACs are generated by the quantum control/mixed signal and analog control circuit 108 in accordance with commands received from the external support unit 104 which are interpreted and processed by the I/F and digital control unit 106.

Figure 3:
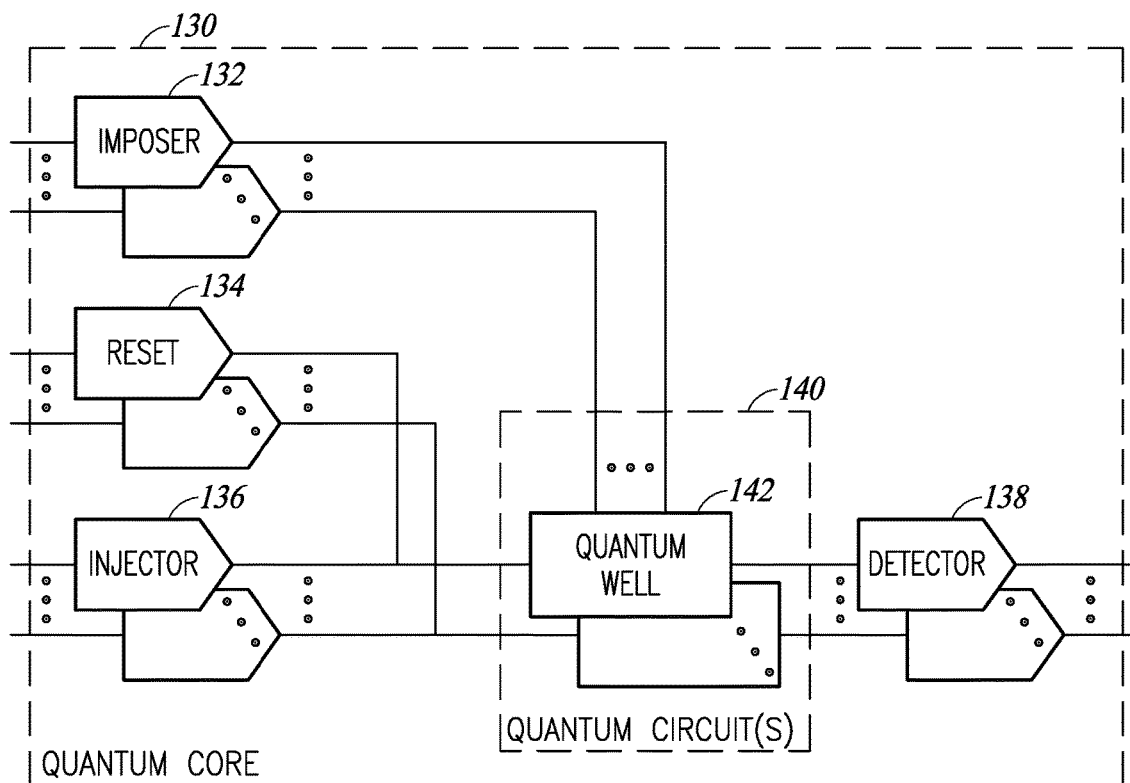
FIG. 3 is a diagram illustrating an example quantum core incorporating one or more quantum circuits.

A diagram illustrating an example quantum core incorporating one or more quantum circuits is shown in FIG. 3. The quantum core, generally referenced 130, comprises one or more quantum circuits 140 each comprising one or more quantum wells 142. Each quantum circuit has corresponding reset circuitry 134, injector circuitry 136, imposer circuitry 132, and detector circuitry 138 that together electronically control the operation of the semiconductor quantum circuit.

Figure 4:
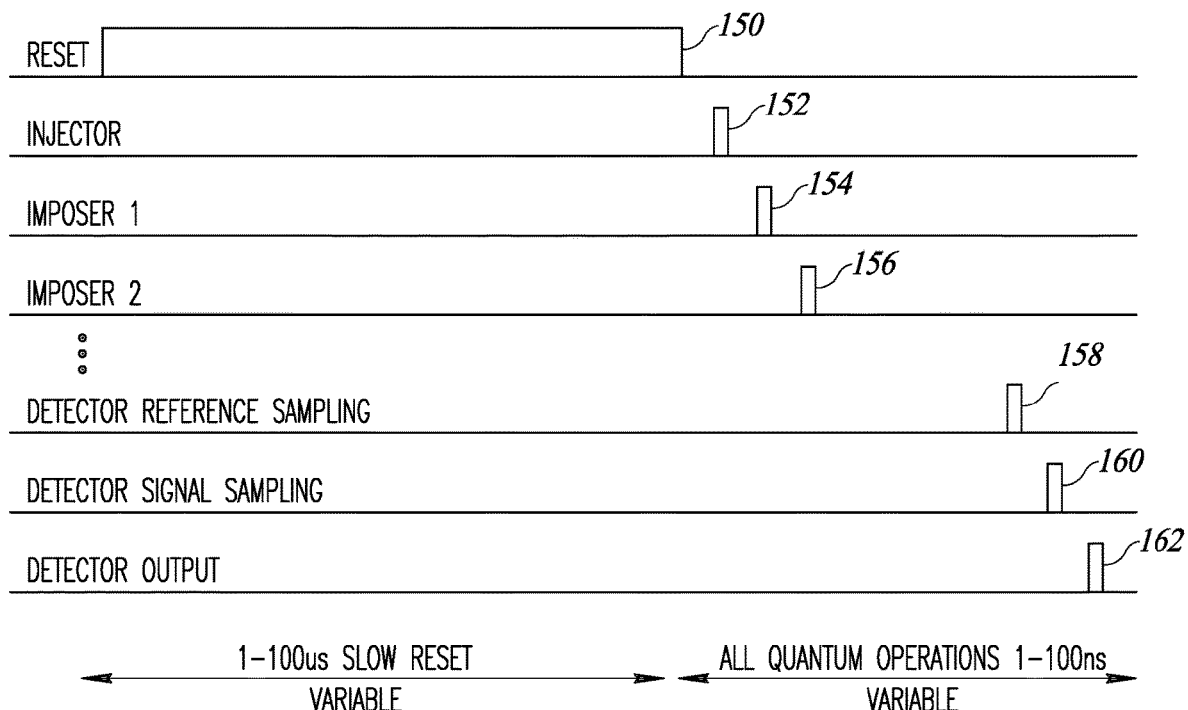
FIG. 4 is a diagram illustrating a timing diagram of n example reset, injector, imposer, and detection control signals.

A diagram illustrating a timing diagram of example reset, injector, imposer, and detection control signals is shown in FIG. 4. As described supra, the quantum circuits generally require reset, injecting, imposing, and detecting control signals to achieve the desired quantum operation. In one embodiment, the reset control signal 150 comprises a variable pulse that is between 1 and 100 microseconds. The reset pulse is followed by the injector pulse 152 that is typically operative to inject a single particle into the quantum circuit. One or more imposer pulses 154, 156 functions to move the particle to and from interaction qdots. Detector reference sampling pulse 158, detector signal sampling pulse 160, and detector output pulse 162 function to control the detection process that determines the presence or absence of a particle at the output of the quantum circuit.

Figure 5A:
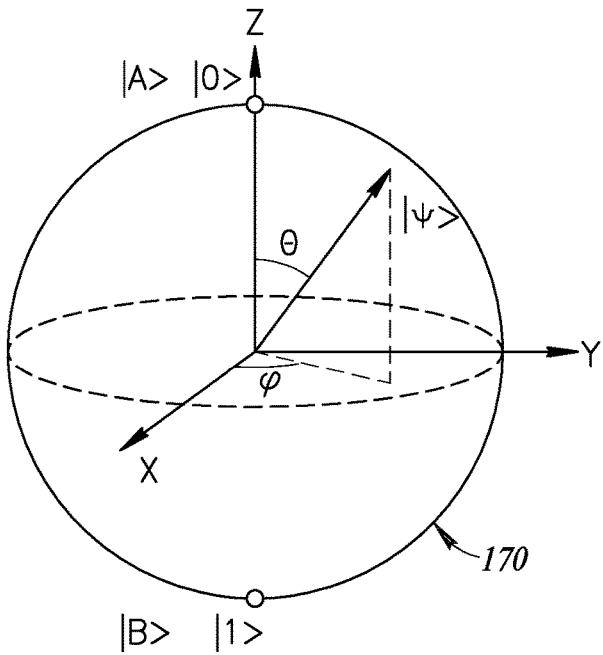
FIG. 5A is a diagram illustrating an example Bloch sphere.

A diagram illustrating an example Bloch sphere is shown in FIG. 5A. In quantum mechanics, the Bloch sphere 170 is a geometrical representation of the pure state of a two-level quantum system or qubit. The space of pure states of a quantum system is given by the one-dimensional subspaces of the corresponding Hilbert space. The north and south poles of the sphere correspond to the pure states of the system, e.g., |0> or |A> and |1> or |B>, whereas the other points on the sphere correspond to the mixed states. The Hilbert space is the mathematical space where operations are performed in the system. In general, the system can be described graphically by a vector in the x, y, z spherical coordinates. A representation of the state of the system in spherical coordinates includes two angles θ and φ. Considering a unitary sphere, as the Hilbert space is a unitary state, the state of the system is completely described by the vector Ψ. The vector Ψ in spherical coordinates can be described in two angles θ and φ. The angle θ is between the vector Ψ and the z-axis and the angle φ is the angle between the projection of the vector on the XY plane and the x-axis. Thus, any position on the sphere is described by these two angles θ and φ.

Note that to represent a multi-dimensional Hilbert space of a quantum system of two or more qubits, a graphical representation can no longer be used as four or more dimensions are difficult to visualize graphically. The precise position or the precise state in the Hilbert space cannot be determined. Consider the Heisenberg uncertainty law which states that you cannot know for sure both the position and the spin (or momentum) of an electron or a carrier. Thus, both the position and the spin of the electron cannot be determined simultaneously. Either the position can be known separately or the spin separately, but both cannot be known at the same time. Fundamentally, this means that there is no complete observability of a quantum system.

Figure 6A:
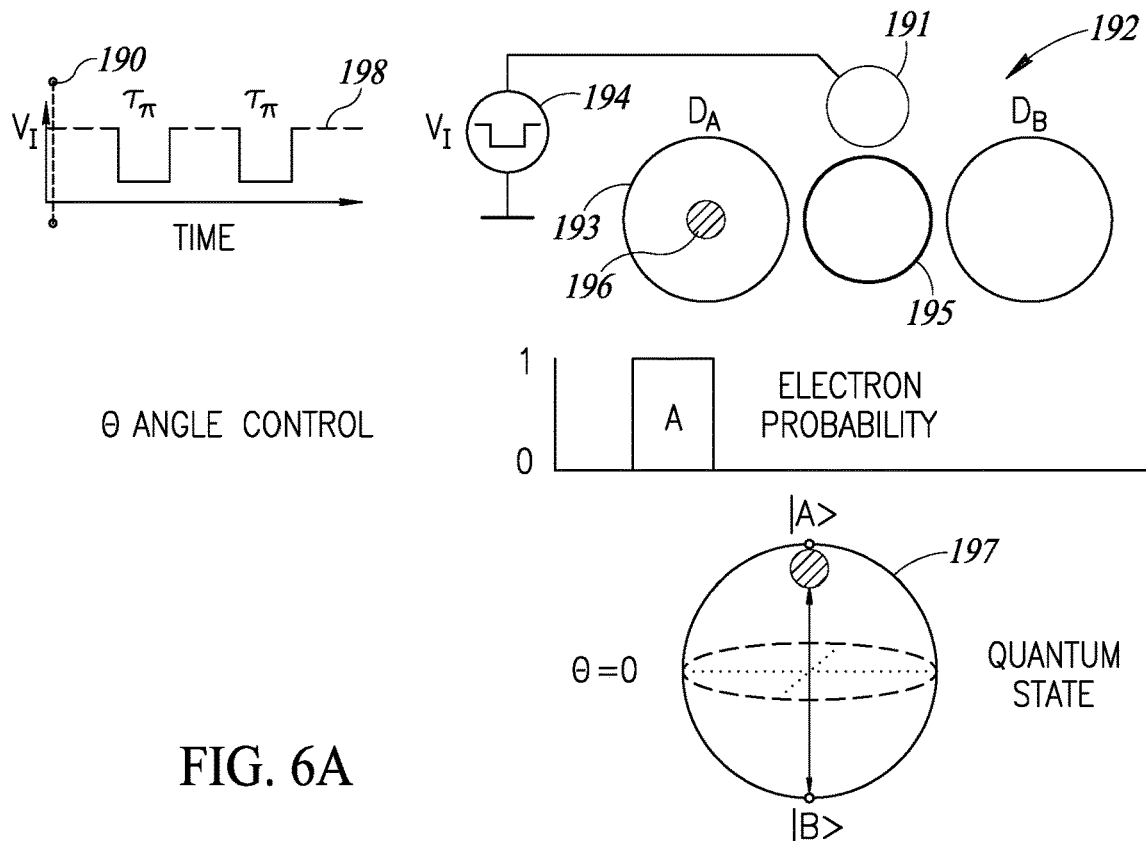
FIG. 6A is a diagram illustrating an example qubit with $\theta=0$ angle control.

Consider a quantum structure that has two or more qdots such as shown in FIG. 6A. The qubit 192 comprises two qdots 193 $D_A$ and $D_B$, a control terminal 191, and depleted tunneling path 195. The qubit, which can be implemented using any kind of technology, planar, 3D, etc., also comprises an injector (not shown) and a detector (not shown) and an attempt is made to detect whether an electron (or a hole) is present or not. The quantum superposition space is created by superposing two base states. There is one state which means that the electron is present in the left qdot and there is another state where the electron is present in the right qdot.

Note that whenever the quantum state is detected, the entire complex functionality or description of a quantum state cannot be measured. Only the projection of the Ψ vector on the |0> and |1> points of the z-axis can be determined. Thus, a measurement means projecting the Ψ vector onto the z-axis, which is the axis of the pure states or the base states of the quantum system.

The electron can be present on the left qdot $D_A$ or it can be present in the right qdot $D_B$. By adjusting the control voltage 198 provided by control pulse generator $V_I$ 194 applied to the control terminal, the tunneling barrier is modulated. If the barrier is high (at the time indicator line 190) then the electron will be locked into a given position, for example, in the left qdot $D_A$ as indicated by the electron probability graph showing a probability of one for the electron to be in qdot $D_A$. The corresponding Bloch sphere 197 is also shown representing the electron 196 in the base state |A> for θ=0 degrees.

Figure 6B:
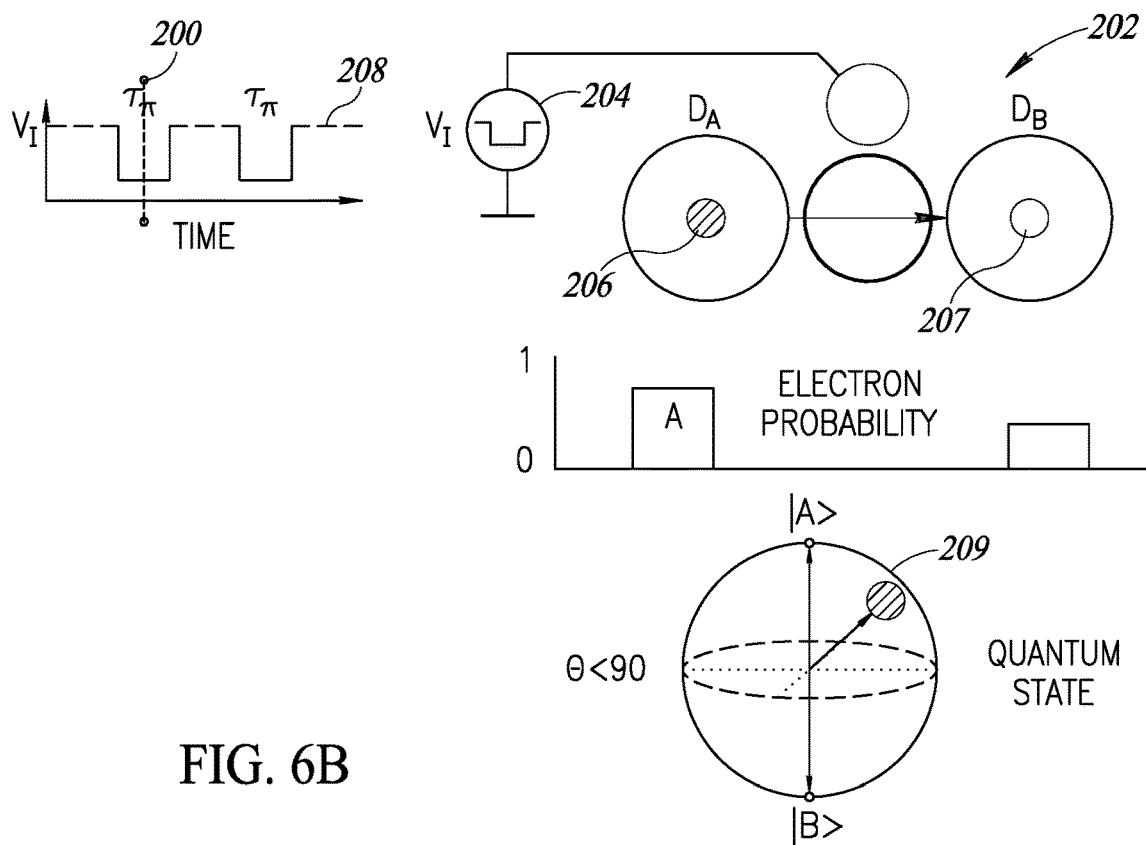
FIG. 6B is a diagram illustrating an example qubit with $\theta<90$ angle control.

As shown in FIG. 6B, as the tunneling barrier of the qubit 202 is lowered via the control voltage 208 provided by control pulse generator $V_I$ 204, the electron starts tunneling. Lowering the tunnel barrier causes the electron to start moving from the left qdot to the right qdot. The corresponding Bloch sphere 209 is also shown representing the electron 206/207 in a split quantum state for θ<90 degrees. How much and how fast the electron moves depends on the qubit geometry and two parameters of the control signal that controls the control terminal: amplitude and pulse width. In this example, a lower amplitude corresponds to a larger decrease of the tunnel barrier and the electron will tunnel faster. This means that it will go from one side to another faster. This also means that the Rabi oscillation frequency will be higher. If the voltage is such that the tunnel barrier is not that low, in a moderate position, then the tunneling current between the two qdots will be lower and the electron will travel slower. The Rabi oscillation frequency is also lower, depending on the amplitude. Thus, how much the electron travels from one qdot to the other depends on the height of the tunnel barrier. If the tunnel barrier is lowered only a little bit, then only a little bit of the electron will tunnel to the other side within an allotted time. Given enough time, more electrons will tunnel to the other side and if the port is wide, the entire electron will go to the other side, i.e. to $D_B$. Thus, the amount of splitting of the electrons between the two qdots depends both on the amplitude and on the pulse width. The invention provides a semiconductor quantum structure comprising an electronic control that controls the amplitude and the pulse width of the control signal which determines exactly what happens with the quantum state and the electron, i.e. how much it's wavefunction will be split between the two qdots.

Figure 6C:
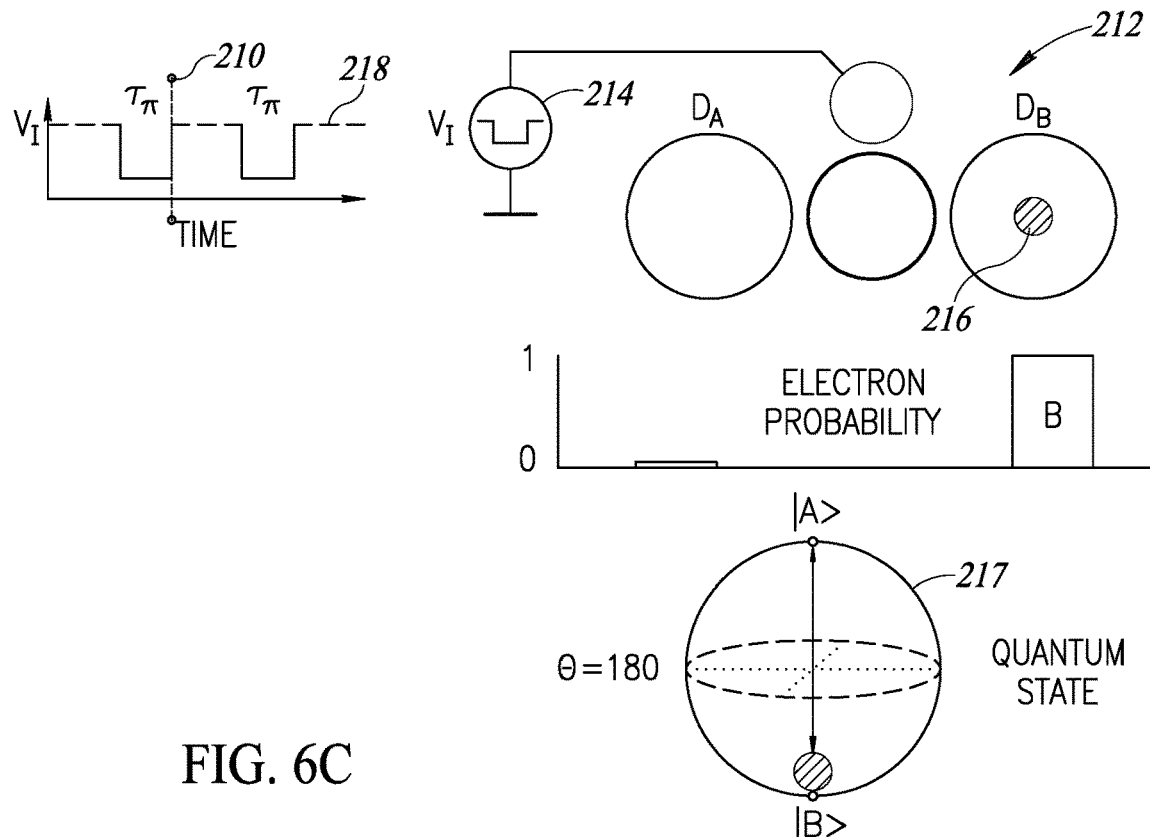
FIG. 6C is a diagram illustrating an example qubit with $\theta=180$ angle control.

Note that the electron tunnels only when the tunnel barrier is low. When the tunnel barrier is high, the electron cannot tunnel and it stays in whatever state it was left before the tunnel barrier was raised. If a control pulse is applied that is equal to the Rabi oscillation period, which is 2π, then the electron starts from the left side $D_A$, tunnels to $D_B$ and will come back to $D_A$. If a control pulse equal to π is applied, i.e. half the Rabi oscillation, the electron will travel from the left side to the right side, as shown in FIG. 6C. If control pulse $τ_π$ provided by control pulse generator $V_I$ 214 is applied to the control terminal that lowers the tunnel barrier for half the Rabi oscillation, the electron will go from the left side to the right side of the qubit 212. Any other values uneven to the half-period will result into a splitting of the electron. The Bloch sphere 217 shows the electron 216 in the base state |B> for θ=180 degrees as indicated by the electron probability graph showing probability of one for the electron 216 to be in qdot $D_B$.

Figure 6D:
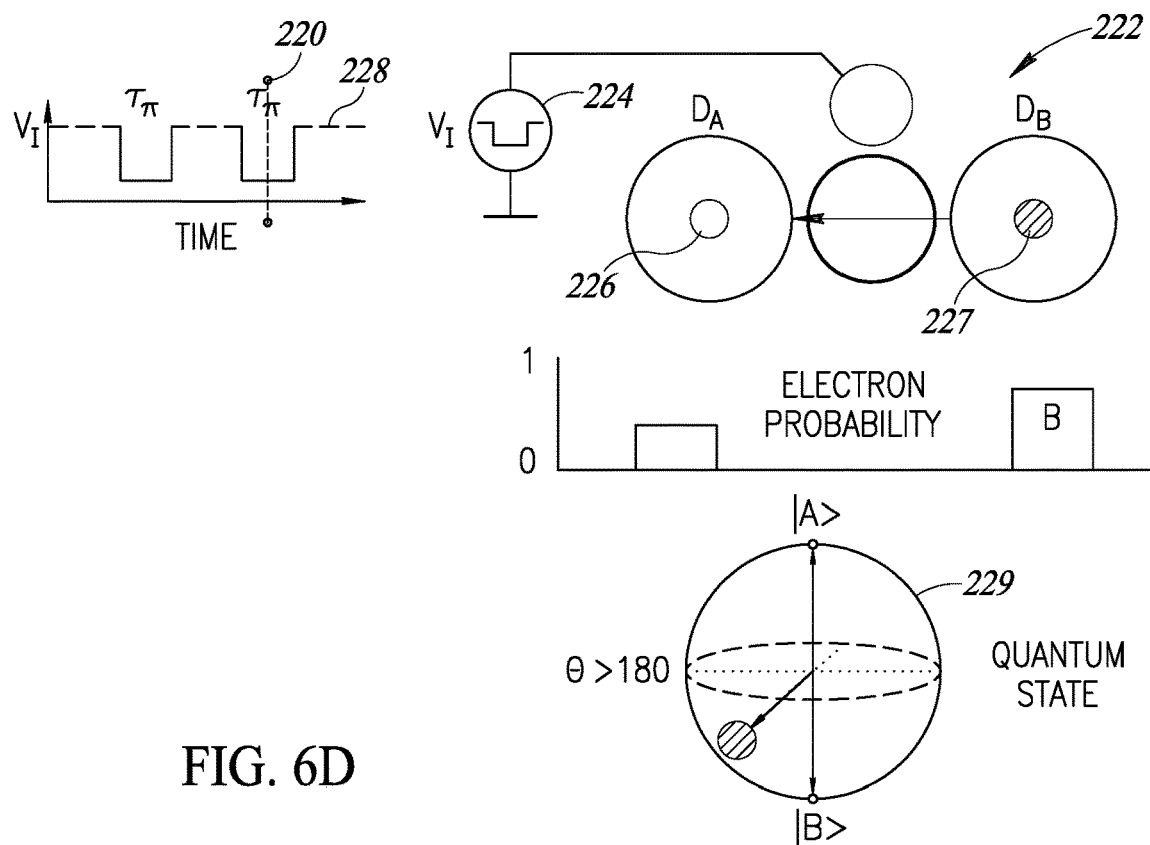
FIG. 6D is a diagram illustrating an example qubit with $\theta>180$ angle control.

Note that the control described herein works both on full electrons, which are called pure states, as well as on split states. Considering a qubit 222 in a split state, as shown in FIG. 6D, e.g., 25% on the left and 75% on the right, if a control pulse of $τ_π$ provided by control pulse generator $V_I$ 224 is applied to the control terminal, the electron in the two qdots will be split, i.e. 75% on the left and 25% on the right. The Bloch sphere representation 229 shows the electron 226/227 in a split state for θ>180 degrees. Thus, this type of control works not only with separated full electrons, it works with any kind of split electron which means a quantum state.

The control can be applied to single qubits as well as multiple qubits making up a quantum interaction gate, circuit or core. In this case, a control signal is supplied for each control terminal in the structure. And for each of those control signals, the amplitude and the pulse width is controlled in a given fashion to create a given functionality for the quantum structure.

With reference to the Bloch sphere, whether the electron is in the left or right qdot is determined by the θ angle which is the single angle that can be detected externally, although sometimes multiple measurements might be needed. Thus, if one puts a detector on the $D_B$ qdot in FIG. 6A, it can be detected that the electron is not present in the $D_A$ qdot. If the detector is placed on qdot $D_B$ in FIG. 6C, presence of the electron will be detected. In the split case, the split electron is only a quantum description. Whenever it is detected, the state collapses to a classic state. For example, considering FIG. 6B, qdot $D_A$ is detected as a split electron where 75% of the time it is detected, but whenever it is detected, an electron will be present or not present. Performing a large number of measurements consecutively, 75% of the time an electron will be present and 25% of the time it will not be present. With a larger number of detections, the results converge towards the probability split of the quantum state.

Figures 5B, 5C:
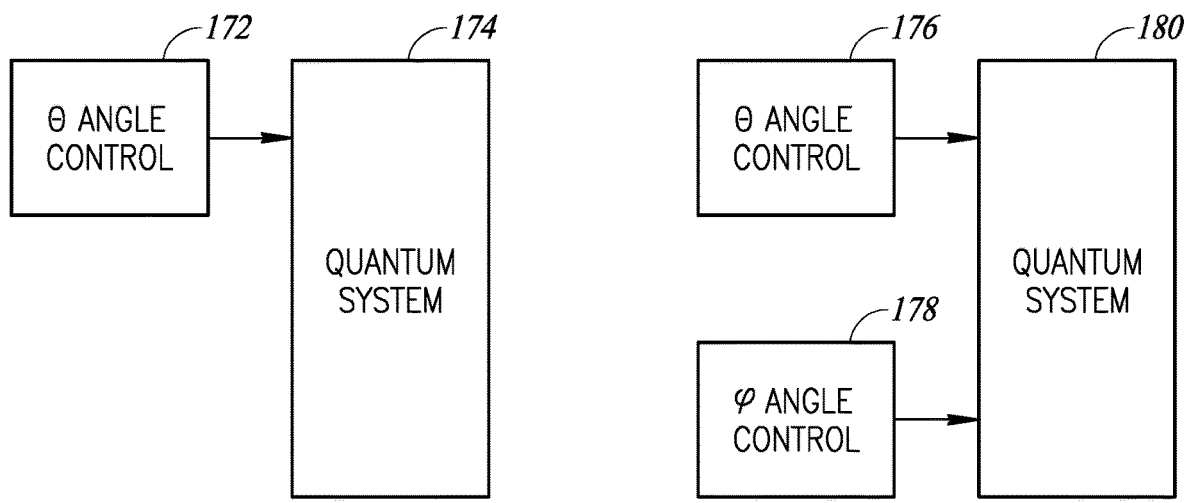
FIG. 5B is a diagram illustrating an example $\theta$ angle control circuit.
FIG. 5C is a diagram illustrating an example $\theta$ angle control and $\varphi$ angle control circuits.
Figure 5F:
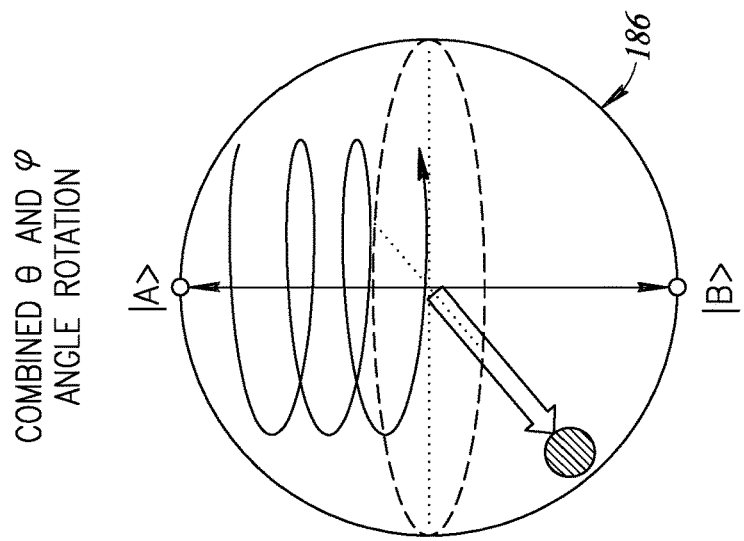
FIG. 5F is a diagram illustrating a Bloch sphere with combined $\theta$ and $\varphi$ angle rotation.
Figure 5E:
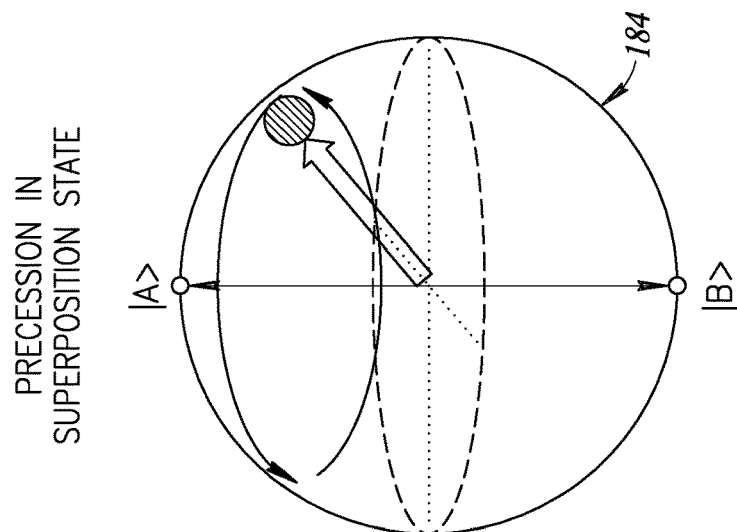
FIG. 5E is a diagram illustrating a Bloch sphere with precession in a superposition state.
Figure 5D:
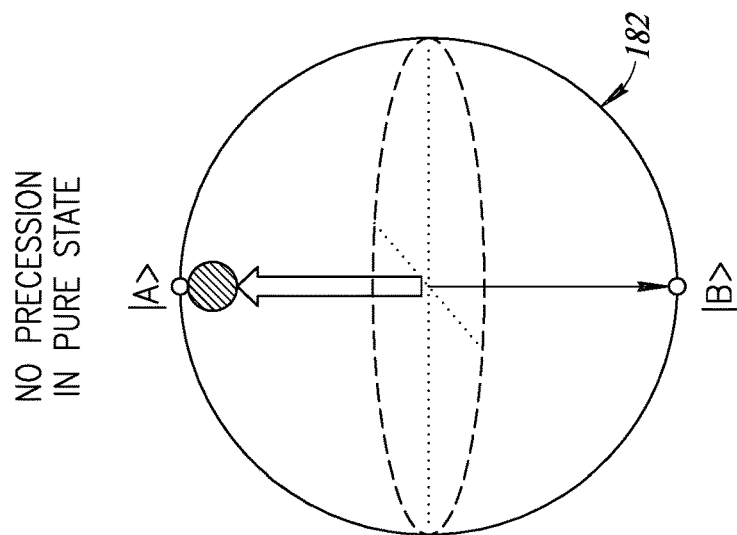
FIG. 5D is a diagram illustrating a Bloch sphere with no precession in a pure state.

Regarding notation for the pure or base states, when the electron is in the left side of the qubit, this is referred to as state 0 or A and it is represented by a vector that goes to the north pole as shown in FIG. 5D in Bloch sphere 182. When the electron is in the right qdot, this is referred to as state 1 or B and it is represented by a vector that goes to the south pole. By looking to the projection of a generalized quantum state it can be concluded if the state is completing on the left side or completing on the right side, which would be either the 0 or 1 state, or if it is a superposed case, it can be determined what percentage is in state 0 and what percentage is in state 1. This is the projection of the W quantum vector onto the z-axis in the Bloch sphere.

Note that the angle $\varphi$ cannot be directly measured. The $\varphi$ angle comes from the full complex Hilbert description of the quantum state. And it is a representation of the ground state in the quantum system. Having a ground state energy means that the energy level of the electron evolves over time although the projection on the z-axis is the same.

The electron is in one of the pure states as shown in FIG. 5D either A or B, 0 or 1 then the vector will stay fixed all the time. If the electron is in a superposed position, i.e. a percentage in state A and a percentage in state B, this means that the vector will be inclined at an angle as shown in FIG. 5E. In this case, what happens in time is the state in the Bloch sphere 184 will have a procession which is a rotation around the z-axis. The projection of the vector $\Psi$ on the z-axis is the same all the time so the electron for example is split in a given way. From the quantum representation in the Bloch sphere, however, it is rotated around the state which means that the angle $\varphi$ varies in time.

Consider starting from the state shown in FIG. 5E where the angle is rotated and it is desired to move to a different angle, which is the angle $\theta$ shown in FIG. 5F. What does not happen is that the electron simply jumps from one state to the other. Rather, the time representation of the state evolves over time which changes both the angle $\theta$ and the angle $\varphi$. This is represented on the Bloch sphere 186 as a spiral. Starting from the state in FIG. 5E, the electron proceeds to procession about the z-axis but at the same time the $\theta$ angle changes. The particle travels around the z-axis several times on a procession until arriving in the final desired state.

Similarly, this is what happens in the quantum interaction structures described herein. Applying a control signal to the control terminal, the electron splits meaning that the electron will go from one $\theta$ angle to another but at the same time performs a procession around the z-axis. The invention provides a quantum system with a means of controlling just the $\theta$ angles which from a position or a charge qubit is sufficient if the location of the electron is known. FIG. 5B shows a quantum system 174 with $\theta$ angle control 172 only. In this case, the $\varphi$ angle is unimportant.

Alternatively, a quantum system is provided where both the $\theta$ and $\varphi$ angles are controlled. This is shown in FIG. 5C which includes quantum system 180 with $\theta$ angle control 176 as well as $\varphi$ angle control 178. Note that considering a single qubit, the $\varphi$ angle typically is not critical because detection of a single electron yields the same results undifferentiated with respect to $\varphi$. The projection on the z-axis of the state vector with angle $\theta$ will always be the same regardless of where exactly in the procession the electron is. This is not the case, however, with a two or more qubit state. In this case, the $\varphi$ angles of each of the states matter. The absolute value angle $\varphi$ cannot be known or measured, but for two qubits, for example, the difference between $\varphi 1$ and $\varphi 2$ is important because it impacts the projection on the z-axis and therefore the final result. Thus, either the angle $\theta$ can be controlled or both $\theta$ and $\varphi$ can be controlled.

Figure 7A:
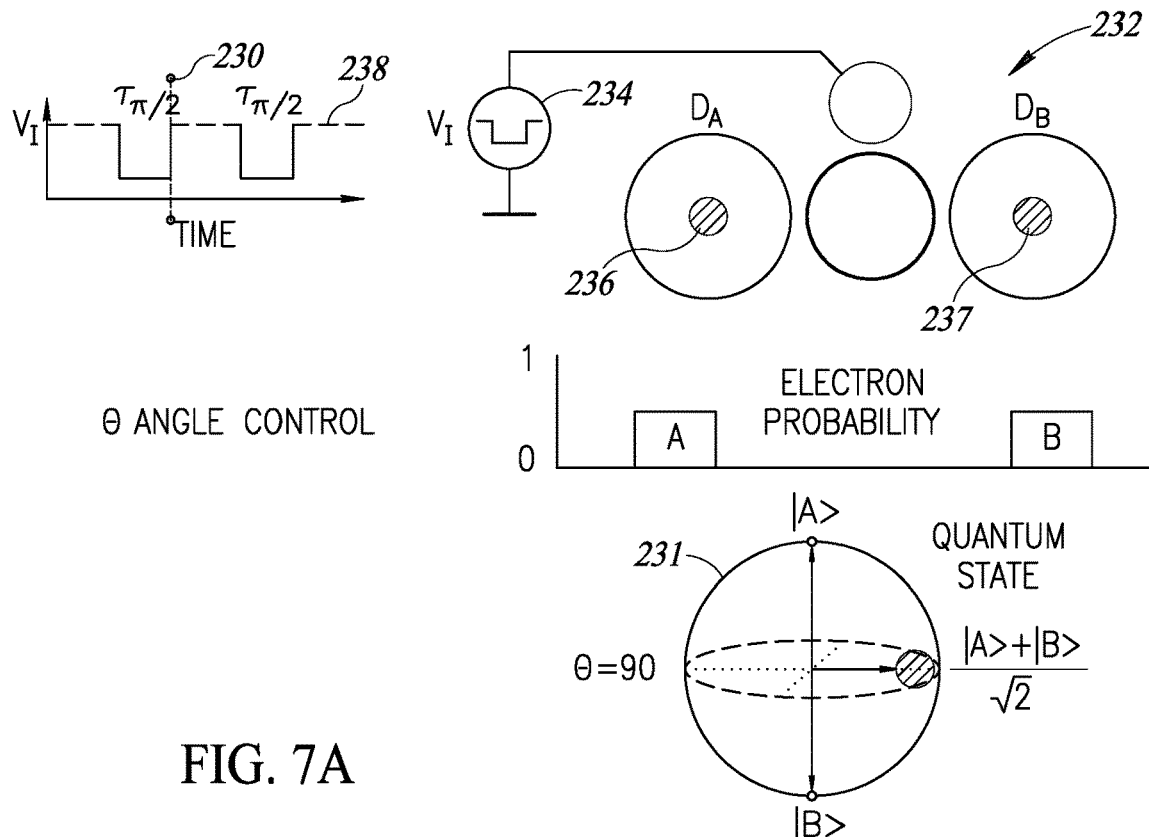
FIG. 7A is a diagram illustrating an example qubit with $\theta=90$ angle control.

A diagram illustrating an example qubit with $\theta$=90 degree angle control is shown in FIG. 7A. The qubit 232 comprises a left qdot $D_A$ and a right qdot $D_B$ with control pulse generator $V_I$ 234 providing a control signal 238 to the control terminal. The Bloch sphere representation 231 also shows the equal distribution state. As described supra, the electron can be in other than a base state. There is a middle point when the electron is equally split between the two sides. It is appreciated, however, that the electron 236, 237 is present all the time in both qdots or multiple qdots. It is only that the probability is split 50-50. When the electron is split 50-50 this is called a Hadamard gate result which is widely used in quantum computing. The Hadamard gate takes an electron and places it in an equal probability distribution. The Hadamard state is represented by a vector that is at 90 degrees. Since the Hadamard state is a split state, it also has a procession. The state travels on the Bloch sphere 231 all the time. And the speed of traveling is the speed of precession which is dependent on the base energy level. The higher the tunnel barrier energy the higher the procession speed. The lower the energy the lower the precession speed.

For the Hadamard gate, the pulse width $\tau_{\pi/2}$ of the control signal 238 applied is a quarter of the Rabi oscillation. With reference to FIGS. 6A, 6B, 6C, and 6D, the control signal pulse that was half the Rabi oscillation period was applied. Applying pulses that are half the Rabi oscillation period causes the electron to go from one side to the other. Applying pulses that are a quarter of the Rabi oscillation, causes the electron to pass through those states half-way and then stop. So for example, after the first $\pi/2$ pulse the electron is split equally 50-50 and is locked because the tunnel is stopped. This can then be used in the quantum computation such as in calculating quantum error correction.

Figure 7B:
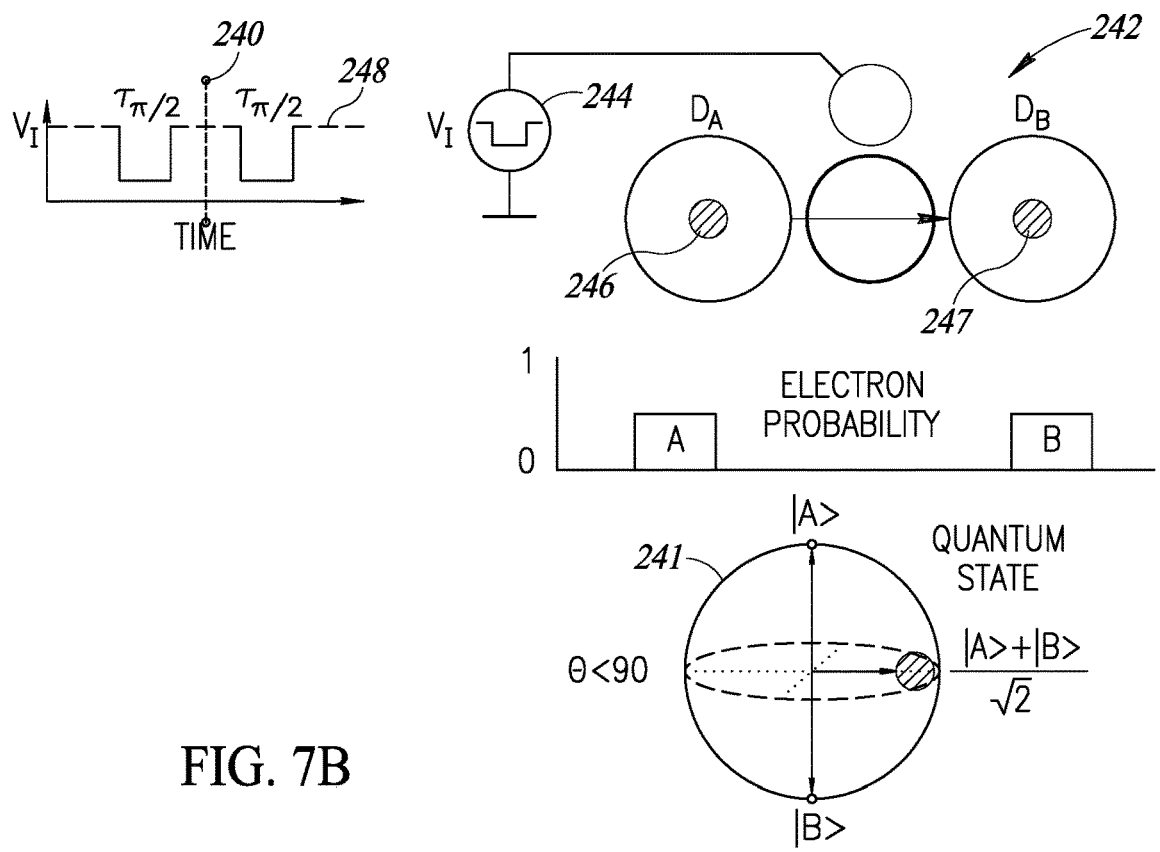
FIG. 7B is a diagram illustrating an example qubit with $\theta<90$ angle control.

A diagram illustrating an example qubit state at the time instance 240 is shown in FIG. 7B. The qubit 242 comprises a left qdot $D_A$ and a right qdot $D_B$ with control pulse generator $V_I$ 244 providing a control signal 248 to the control terminal. Since the tunnel barrier is still high, the electron 246, 247 remains since the time instance 230 in the equal distribution state as indicated in the Bloch sphere 241.

Figure 7C:
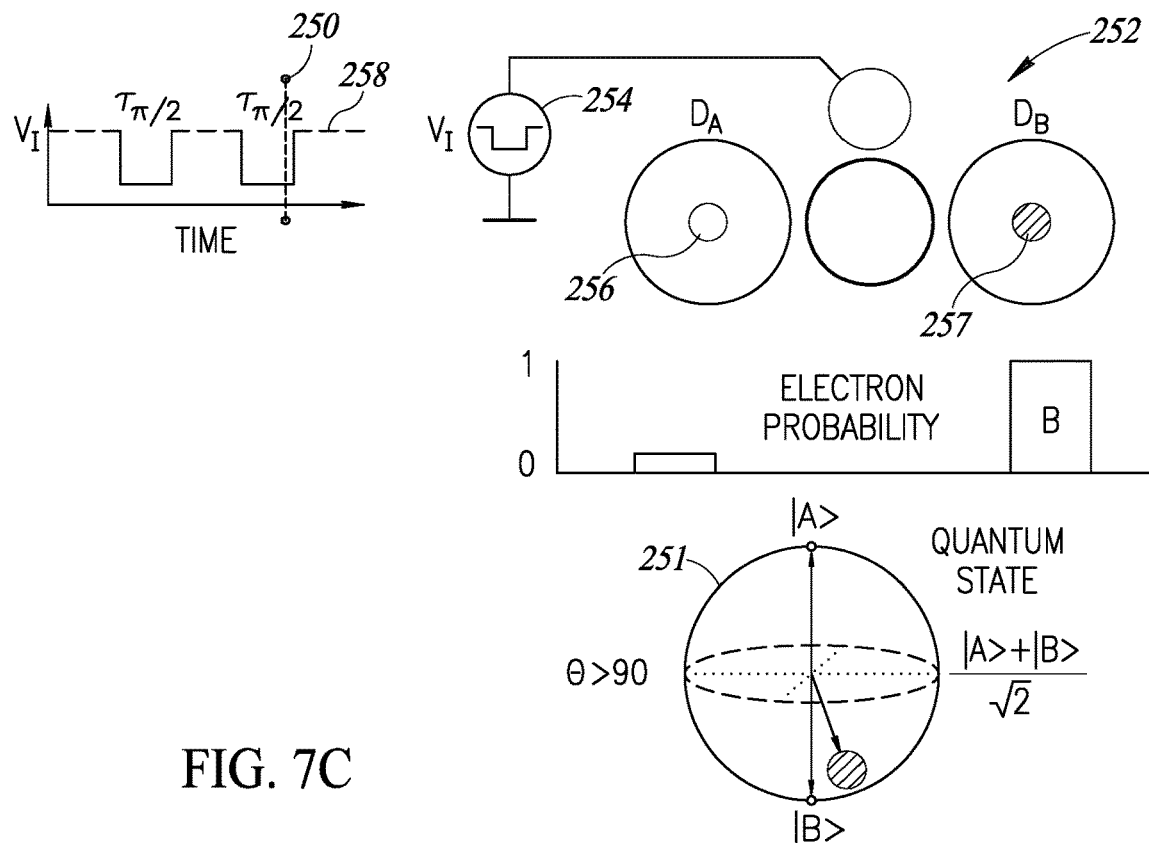
FIG. 7C is a diagram illustrating an example qubit with $\theta>90$ angle control.

A diagram illustrating an example qubit state at the time instance 250 is shown in FIG. 7C. The qubit 252 comprises a left qdot $D_A$ and a right qdot $D_B$ with control pulse generator $V_I$ 254 providing a control signal 258 to the control terminal. Since the time instance 240, the tunnel barrier got lowered and so in this case, the probability for the electron 256, 257 is split 15-85 as shown in the electron probability graph and the Bloch sphere representation 251.

Figure 7D:
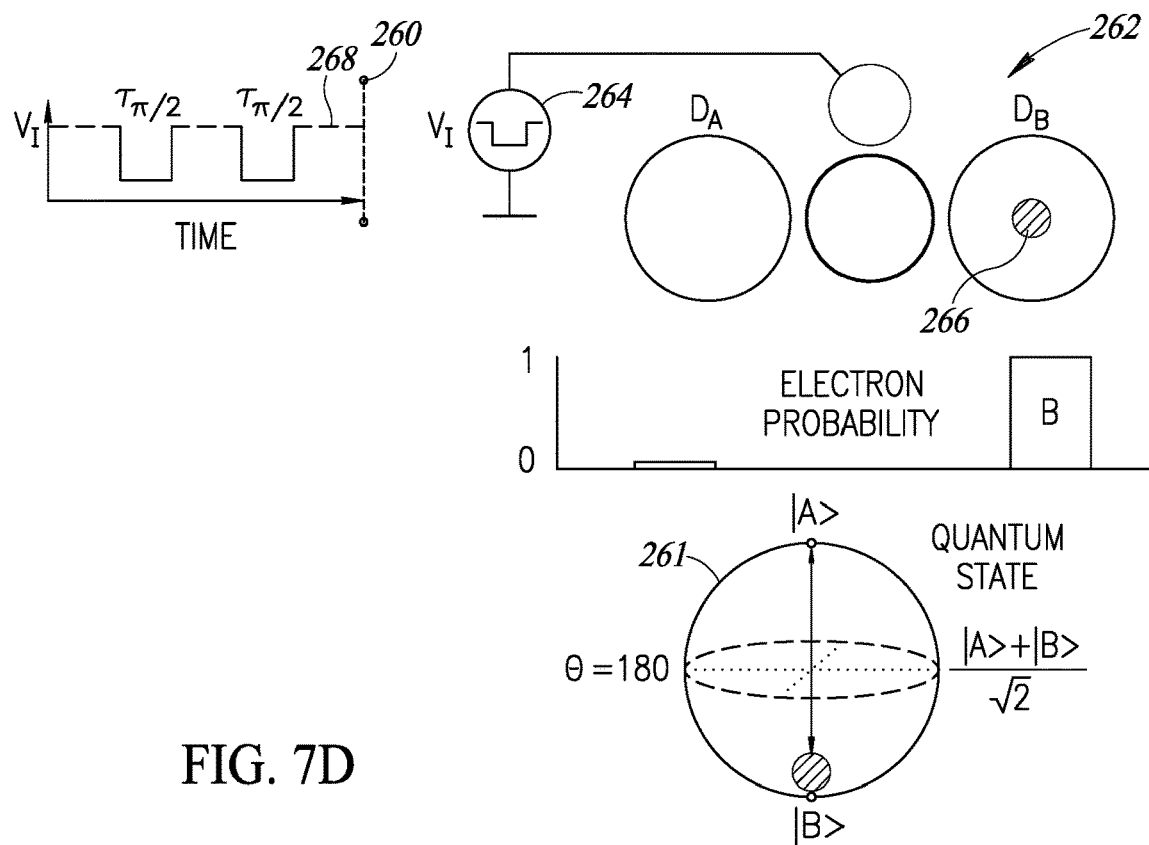
FIG. 7D is a diagram illustrating an example qubit with $\theta=180$ angle control.

A diagram illustrating an example qubit state at time instance 260 is shown in FIG. 7D. The qubit 262 comprises a left qdot $D_A$ and a right qdot $D_B$ with control pulse generator $V_I$ 264 providing a control signal 268 to the control terminal. The tunnel barrier was raised again after the time instance 250 and so in this case, the electron 266 is in the base state |B> as shown in the electron probability graph and the Bloch sphere representation 261.

Several different types of quantum interaction gates will now be described. A diagram illustrating an example pulsed Hadamard gate is shown in FIG. 8A. The Hadamard gate, generally referenced 270, as described supra represents the 50-50 equal distribution quantum state. It is represented by the notation "H" 272. A control pulse has a pulse width of one quarter of the Rabi oscillation and places the gate into the Hadamard state.

A diagram illustrating an example pulsed NOT gate is shown in FIG. 8B. The pulsed NOT gate, generally referenced 280, flips the initial base state from |0> to |1> or vice versa. It is represented by the notation "NOT" 282. A control pulse having a pulse width of one half the Rabi oscillation provides the pulsed NOT gate functionality.

A diagram illustrating an example pulsed rotation gate is shown in FIG. 8C. The pulsed rotation gate, generally referenced 290, functions to apply a rotation to the initial state. It is represented by the notation "R" 292. A control pulse having a pulse width not exactly equal to $n*T_{Rabi/4}$, where n is a positive integer, provides the pulsed rotation gate functionality.

A diagram illustrating an example pulsed repeater gate is shown in FIG. 8D. The pulsed repeater gate, generally referenced 300, maintains the initial state. It is represented by the notation "Rep" 302. A control pulse having a pulse width equal to the Rabi oscillation provides the pulsed repeater gate functionality.

A target semiconductor quantum interaction gate is defined as the quantum interaction gate that is to be controlled. A quantum interaction gate is generally a quantum structure having several qubits, e.g., one, two, three, four, etc. A semiconductor quantum interaction gate can be just a single qubit that can be controlled multiple ways. In one embodiment, an electric field provides the control that is created, for example, by a voltage applied to a control terminal. Note that there can be multiple electric control fields. In this case, there are multiple control terminals where different voltages are applied to each of them. In another embodiment, multiple quantum interaction gates can be used where the control terminals are appropriately controlled to realize different quantum functions.

A second way of controlling the quantum interaction gates is by using an inductor or resonator. In one embodiment, an electric field functions as the main control and an auxiliary magnetic field provides additional control on the control gate. The magnetic field is used to control different aspects of the quantum structure. The magnetic field has an impact on the spin of the electron such that the spin tends to align to the magnetic field. This means that applying a magnetic field to a charge qubit quantum gate can determine the carriers, e.g., the electrons, that are processed and what kind of spin orientation they have. Considering the position and the spin of the particle, both cannot be determined but each can be determined one at a time. If the spin of the electron is changed, however, that also impacts its position. In addition, changing the position of an electron impacts the spin although it cannot be measured.

Figure 9A:
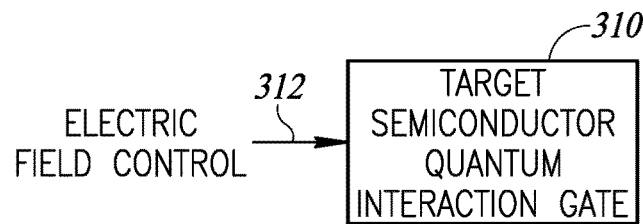
FIG. 9A is a diagram illustrating a target semiconductor quantum gate with electric field control.

A diagram illustrating a target semiconductor quantum gate with electric field control is shown in FIG. 9A. In one embodiment, electric field control 312 is applied to the target semiconductor quantum gate 310.

Figure 9B:
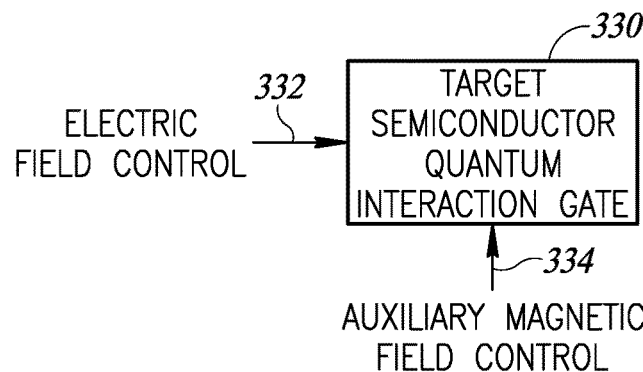
FIG. 9B is a diagram illustrating a target semiconductor quantum gate with electric and magnetic field control.

A diagram illustrating a target semiconductor quantum gate with electric and magnetic field control is shown in FIG. 9B. In another embodiment, electric field control 332 as well as auxiliary magnetic field control 334 are applied to the target semiconductor quantum gate 330.

Figure 9C:
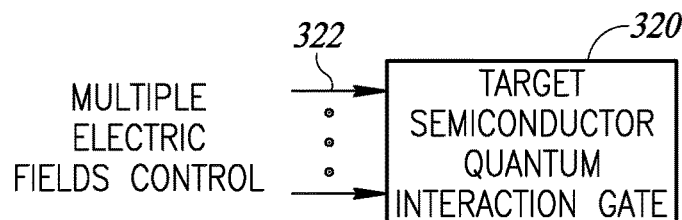
FIG. 9C is a diagram illustrating a target semiconductor quantum gate with multiple electric field control.

A diagram illustrating a target semiconductor quantum gate with multiple electric field control is shown in FIG. 9C. In another embodiment, multiple electric field controls 322 are applied to the target semiconductor quantum gate 320.

Figure 9D:
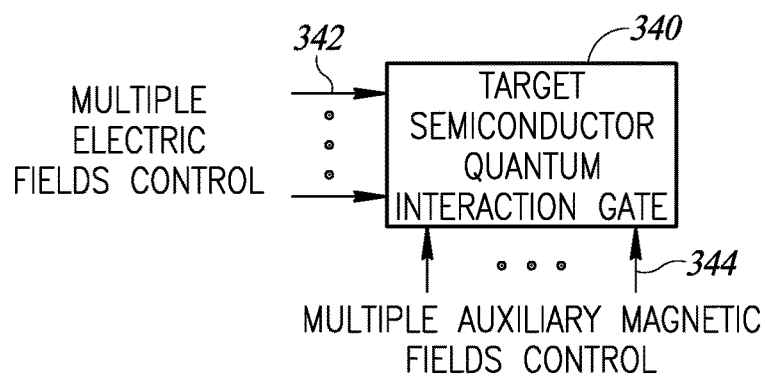
FIG. 9D is a diagram illustrating a target semiconductor quantum gate with multiple electric and multiple magnetic field control.

A diagram illustrating a target semiconductor quantum gate with multiple electric and multiple magnetic field controls is shown in FIG. 9D. In another embodiment, multiple electric field controls 342 as well as multiple auxiliary magnetic field controls 344 are applied to the target semiconductor quantum gate 340.

With reference to the target semiconductor quantum interaction gate, besides electric and magnetic field controls, there are additional two ways in which an electron can be controlled: classically and by another quantum state. Classical control uses, for example, a control voltage that is generated by a classic electronic circuit. A voltage is imposed that impacts the behavior of the electrons. Besides classic control, an electron can also be controlled by another electron. If that electron is in a quantum state, then the electron can be controlled using another quantum state. In addition, both classic and quantum control can be used at the same time.

Figure 10A:
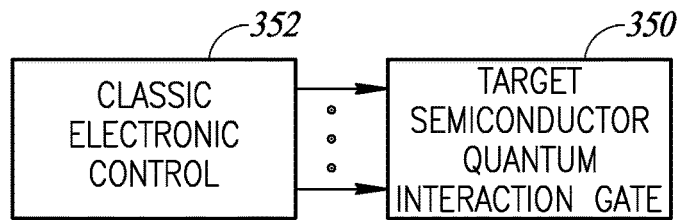
FIG. 10A is a diagram illustrating a target semiconductor quantum gate with classic electronic control.

A diagram illustrating a target semiconductor quantum gate with classic electronic control is shown in FIG. 10A. In one embodiment, classic electronic control 352 alone is used to control the target semiconductor quantum interaction gate 350.

Figure 10B:
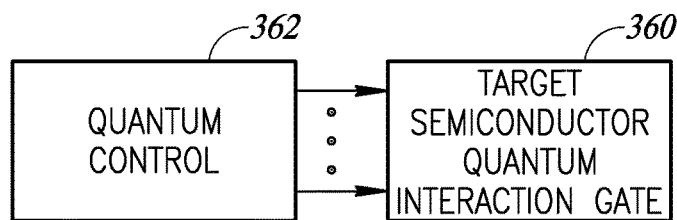
FIG. 10B is a diagram illustrating a target semiconductor quantum gate with quantum control.

A diagram illustrating a target semiconductor quantum gate with quantum control is shown in FIG. 10B. In another embodiment, quantum control 362 alone is used to control the target semiconductor quantum interaction gate 360.

Figure 10C:
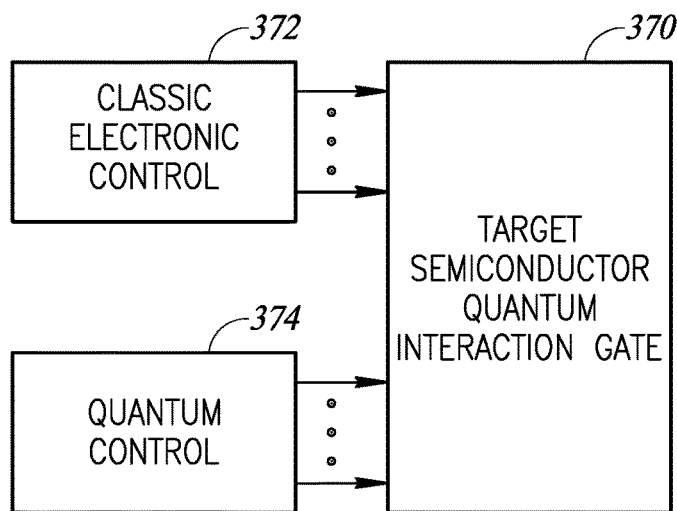
FIG. 10C is a diagram illustrating a target semiconductor quantum gate with both classic electronic control and quantum control.

A diagram illustrating a target semiconductor quantum gate with both classic electronic control and quantum control is shown in FIG. 10C. In another embodiment, both classic electronic control 372 as well as quantum control 374 are used to control the target semiconductor quantum interaction gate 370. In this case, the target semiconductor quantum gate comprises, for example, both a control gate for controlling the tunneling barrier but also uses quantum control whereby one or more additional electrons provide control. As described supra, the control voltage applied to the control gate impacts the Rabi oscillation frequency. In addition, bringing an electron into proximity of the target electron, also impacts the Rabi oscillation frequency.

Note that the way in which the quantum control NOT control gate as well of other common types of control gates, e.g., ancillary, Pauli, SWAP, etc. are realized, electrons are brought into close proximity along with use of classic electronic control circuits providing the control signal on the gate. It is also possible to control these gates with a quantum state of an electron.

Figure 11A:
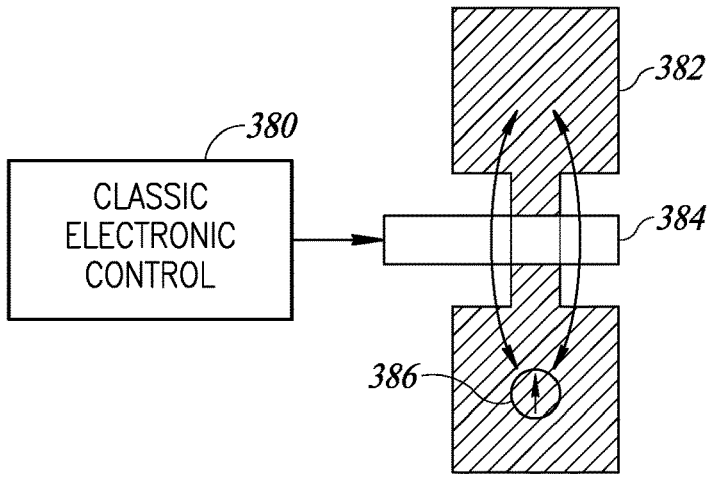
FIG. 11A is a diagram illustrating an example qubit with classic electronic control.

A diagram illustrating an example qubit with classic electronic control is shown in FIG. 11A. The qubit comprises two qdots 382 in a 'dog bone' configuration, particle 386, control gate 384 coupled to a classic electronic control circuit 380. As discussed supra, in one embodiment, a classic electronic circuit controls the voltage on the control gate of a qubit which changes its Rabi or occupancy oscillation thus impacting how fast the electron tunnels back and forth. Note that Rabi oscillation is the interference between two very high frequency eigenfunctions.

Figure 11B:
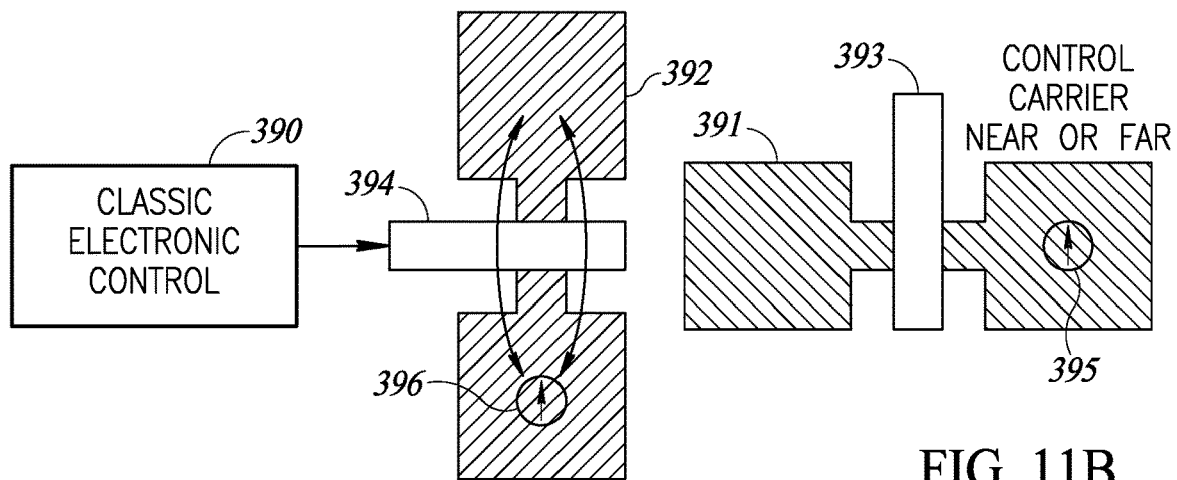
FIG. 11B is a diagram illustrating an example qubit with both classic electronic control and quantum control.

A diagram illustrating an example qubit with both classic electronic control and quantum control is shown in FIG. 11B. The target qubit comprises two qdots 392, particle 396, control gate 394 coupled to a classic electronic control circuit 390. In addition, a second qubit (control) having two qdots 391, particle 395, and control gate 393 is in relatively close proximity to the target qubit. The particle in the target qubit tunnels back and forth at the Rabi oscillation under the classic electronic control. Now, however, a control electron 395 is brought into proximity. If the electron is sufficiently far away, then the Rabi oscillation is faster. If the control electron is brought relatively close like it is in the case shown in FIG. 11C, the Rabi oscillation becomes slower (frequency $F_1$). Thus, the Rabi oscillation of the target qubit can be controlled by the proximity of another electron.

In one embodiment, classic electronic control means controlling the amplitude and pulse width of the control signal applied to the control gate. In another embodiment, this can be achieved without using any direct electronic control. The proximity of the neighboring control electron to the target qubit is used to control it. Note that this assumes the potential on the control gate of the target qubit is not floating but such that the tunneling barrier is lowered and the electron is free to move between the qdots. If the control gate voltage is stable, the electronic control does not impact the operation and just the quantum control dominates, i.e. the other electron impacts the operation of the target qubit. Thus, any combination of electronic control only, quantum control only, or both of them can be used.

Figure 11C:
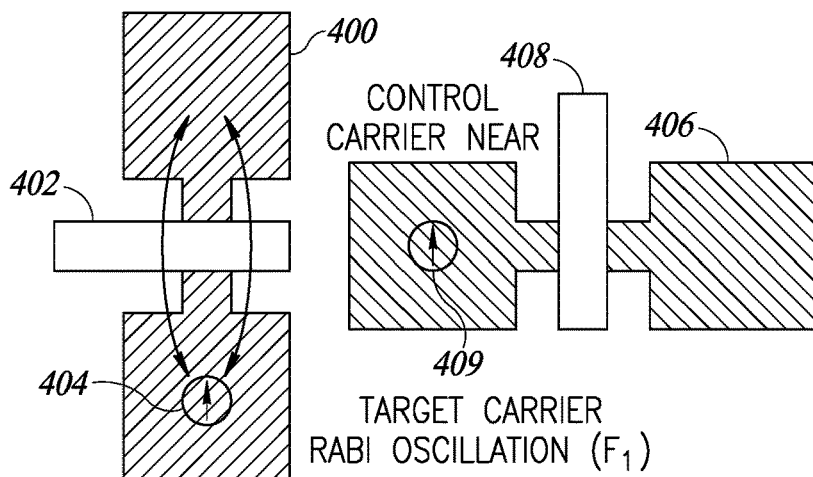
FIG. 11C is a diagram illustrating an example qubit having quantum control with the control carrier at a close distance.

A diagram illustrating an example qubit having quantum control with the control carrier at a close distance is shown in FIG. 11C. The target qubit comprises two qdots 400, particle 404, control gate 402 coupled to a classic electronic control circuit (not shown). In addition, a second qubit having two qdots 406, particle 409, and control gate 408 is in relatively close proximity to the target qubit. In this case, the control carrier is near the target qubit and provides control thereof.

Figure 11D:
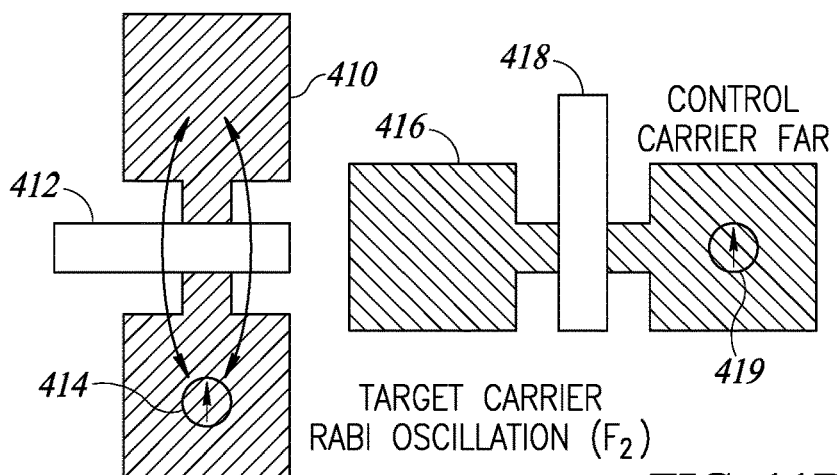
FIG. 11D is a diagram illustrating an example qubit having quantum control with the control carrier at a far distance.

A diagram illustrating an example qubit having quantum control with the control carrier at a far distance is shown in FIG. 11D. The target qubit comprises two qdots 410, particle 414, control gate 412 coupled to a classic electronic control circuit (not shown). In addition, a second qubit having two qdots 416, particle 419, and control gate 418 is in relatively far from the target qubit. In this case, the control carrier is far from the target qubit and has less impact thereon. In this case, the resultant Rabi oscillation is faster (frequency $F_2$).

Figure 12A:
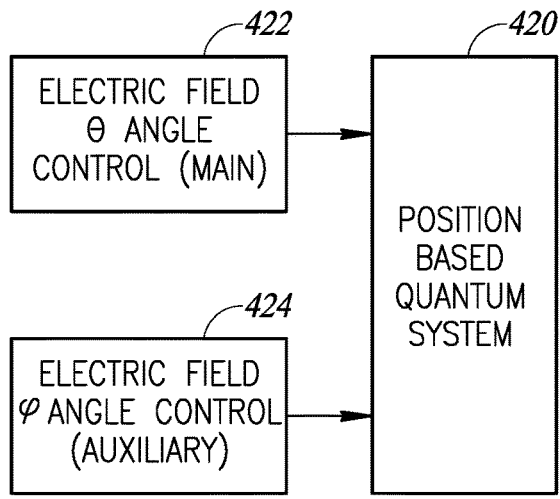
FIG. 12A is a diagram illustrating an example position based quantum system with θ angle and φ angle electric field control.

As described supra, a quantum state can be described by the two angles $\theta$ and $\varphi$. The angle $\theta$ determines the split between the two base states where $\theta$ represents the actual state of the electron, i.e. where it's probabilities are versus the two qdots of a qubit for example. The angle $\varphi$ represents the procession movement in the Bloch sphere. A diagram illustrating an example position based quantum system with $\theta$ angle and $\varphi$ angle electric field control is shown in FIG. 12A. In this embodiment, a more precise description of the system is provided, where in a position based quantum interaction system 420 an electric field is used to control the angle $\theta$ (block 422) and an electric field is used to control the angle $\varphi$ (block 424). Note that it is preferable to use electric fields for control because electric fields are generated by voltages and signals are transported on wires which can be easily produced by integrated circuits.

Figure 12B:
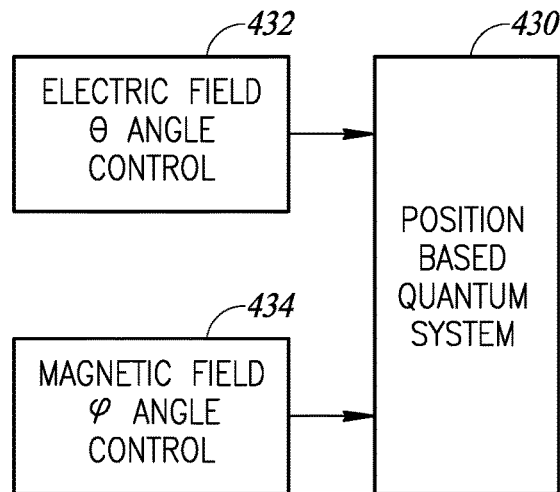
FIG. 12B is a diagram illustrating an example position based quantum system with θ angle electric field control and φ angle magnetic field control.

Inductors that create magnetic fields can also be fabricated in integrated circuits. A diagram illustrating an example position based quantum system with $\theta$ angle electric field control and $\varphi$ angle magnetic field control is shown in FIG. 12B. In this embodiment, an electric field is used to control the angle $\theta$, i.e. the position of the electron (block 432) and an auxiliary magnetic field is used to control the angle $\varphi$ of the quantum state (block 434) of a position based quantum interaction system 430.

Figure 12C:
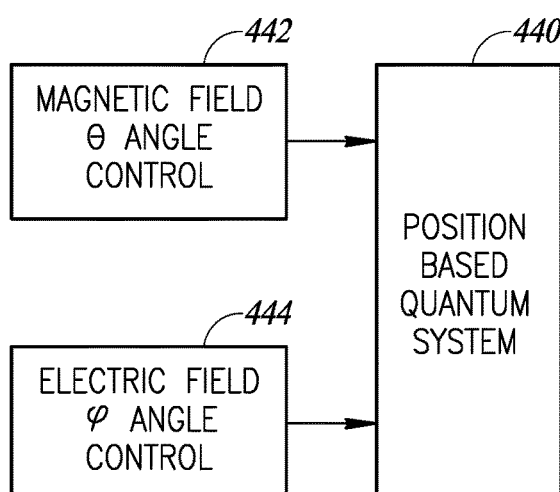
FIG. 12C is a diagram illustrating an example position based quantum system with θ angle magnetic field control and φ angle electric field control.

A diagram illustrating an example position based quantum system with $\theta$ angle magnetic field control and $\varphi$ angle electric field control is shown in FIG. 12C. The flip case is also possible where a magnetic field is used to control the angle $\theta$, i.e. the position of the electron (block 442) and an electric field is used to control the angle $\varphi$ of the quantum state (block 444) of a position based quantum interaction system 440.

Figure 12D:
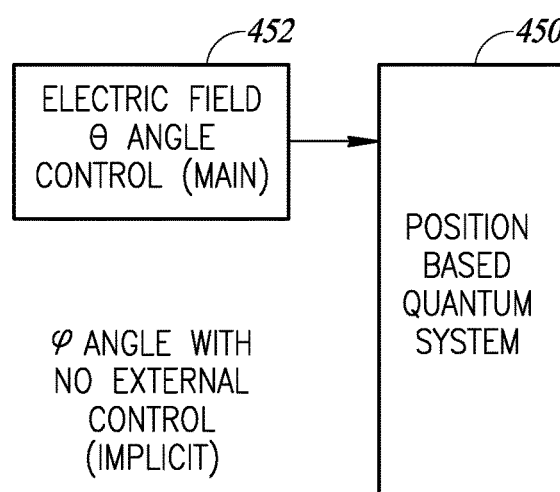
FIG. 12D is a diagram illustrating an example position based quantum system with θ angle electric field control and no φ angle external control.

A diagram illustrating an example position based quantum system with $\theta$ angle electric field control and no $\varphi$ angle external control is shown in FIG. 12D. In this embodiment, an electric field is used to control the angle $\theta$ (block 452) and no external control is used to control the angle $\varphi$ of a position based quantum interaction system 450. It is implied that angle $\varphi$ will be whatever the quantum system yields at a given point. Note that the angle $\varphi$ is not random but multiple qubits interacting may result in phases that are not synchronized. Thus, the difference $\varphi 1$ minus $\varphi 2$ between the electrons changes over time and this will impact the solution or the outcome of the quantum operation.

Figure 12E:
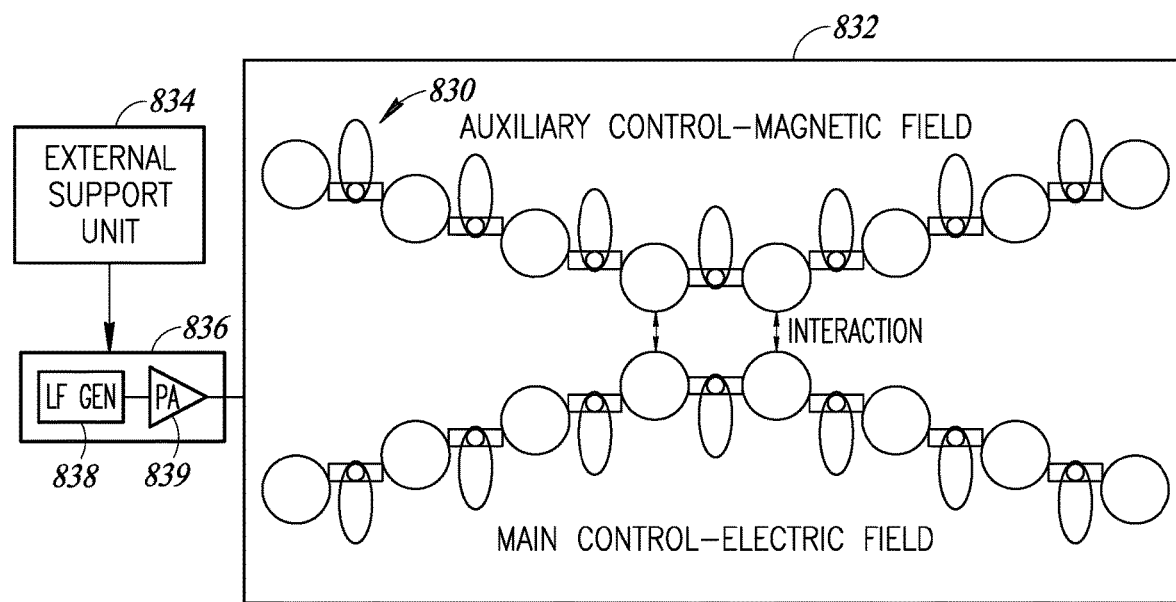
FIG. 12E is a diagram illustrating an example quantum interaction gate with electric field main control and magnetic field auxiliary control.

Most of the structures described supra use charge qubits and qdots that are electrically controlled via an electric field. A more general quantum structure can use hybrid electric and magnetic control. The magnetic field can be generated with an inductor or a resonator. A diagram illustrating an example quantum interaction gate with electric field main control and magnetic field auxiliary control is shown in FIG. 12E. The structure comprises a quantum interaction gate 830 located within an auxiliary magnetic control 832. The main control is electric. In this example, the hybrid electric and magnetic control is applied to a double-V structure using tunneling through local depleted regions. One or more gates can be under the control of a magnetic field generation structure. The control is local since only one interaction structure sees the strong magnetic field from the inductor (or resonator). Note that the size and shape of the magnetic field generator can vary. Note that the control for the electric and magnetic field generator is provided by the external support unit 834 and clock generator circuit 836 which includes a low frequency (LF) reference generator circuit 838 and power amplifier (PA) 839.

Figure 12F:
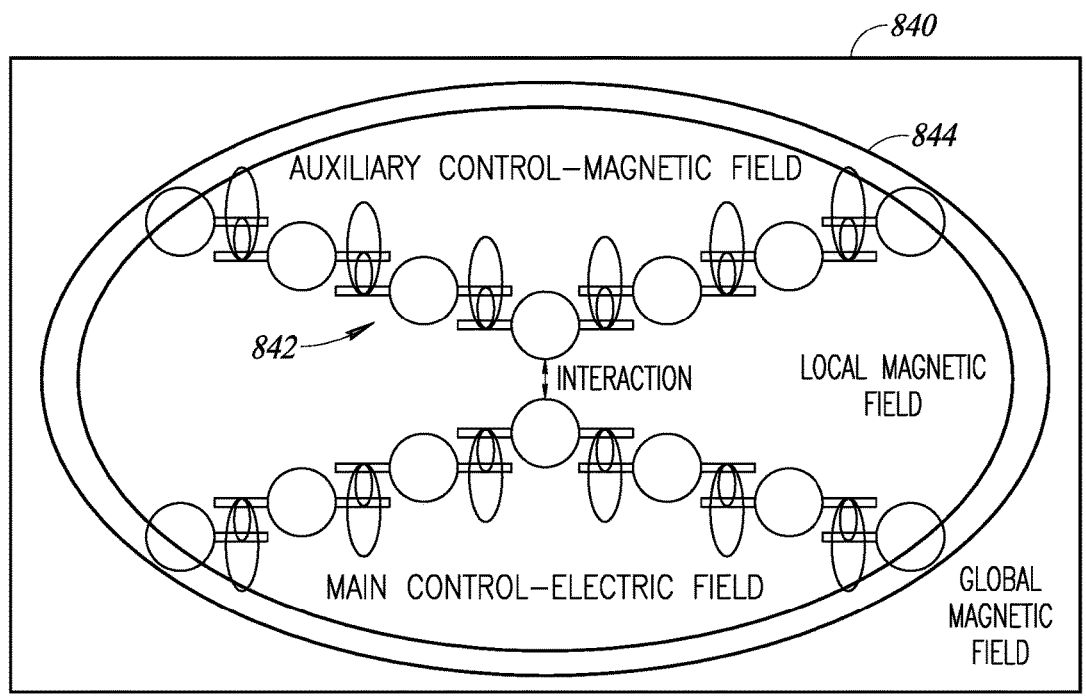
FIG. 12F is a diagram illustrating an example quantum interaction gate with electric field main control and local and global magnetic field auxiliary control.

A diagram illustrating an example quantum interaction gate with electric field main control and local and global magnetic field auxiliary control is shown in FIG. 12F. The structure comprises a quantum interaction gate 842 located within a magnetic control 844, and electric control 840. In this example, the hybrid electric and magnetic control is applied to a double-V structure using tunneling through local depleted regions with partial fin-to-gate overlap. One or more gates can be under the control of a magnetic field generation structure. The control is local since only one interaction structure is seeing the strong magnetic field from the inductor (or resonator). Note that the size and shape of the magnetic field generator can vary. Note that for clarity sake the external support unit and clock generation circuit are not shown but included in the circuit as in FIG. 12E.

Figure 12G:
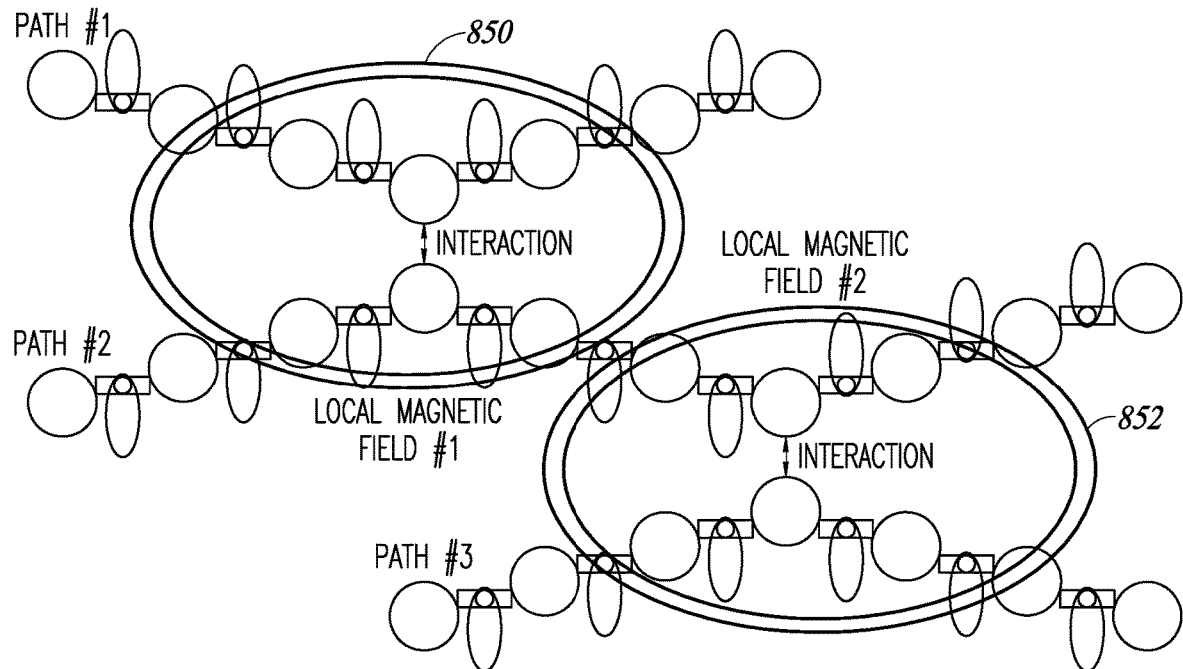
FIG. 12G is a diagram illustrating an example quantum interaction gate with local magnetic field control.

A diagram illustrating an example quantum interaction gate with local magnetic field control is shown in FIG. 12G. The structure comprises a quantum interaction gate with two local magnetic controls 850, 852 covering different portions of the interaction gate. In this example, both local magnetic controls are applied to a multiple-V structure using tunneling through local depleted regions. One or more gates can be under the control of a magnetic field generation structure. The control is local since only one interaction structure is seeing the strong magnetic field from the inductor (or resonator). Note that the size and shape of the magnetic field generator can vary. Note that for clarity sake the external support unit and clock generation circuit are not shown but included in the circuit as in FIG. 12E.

Figure 12H:
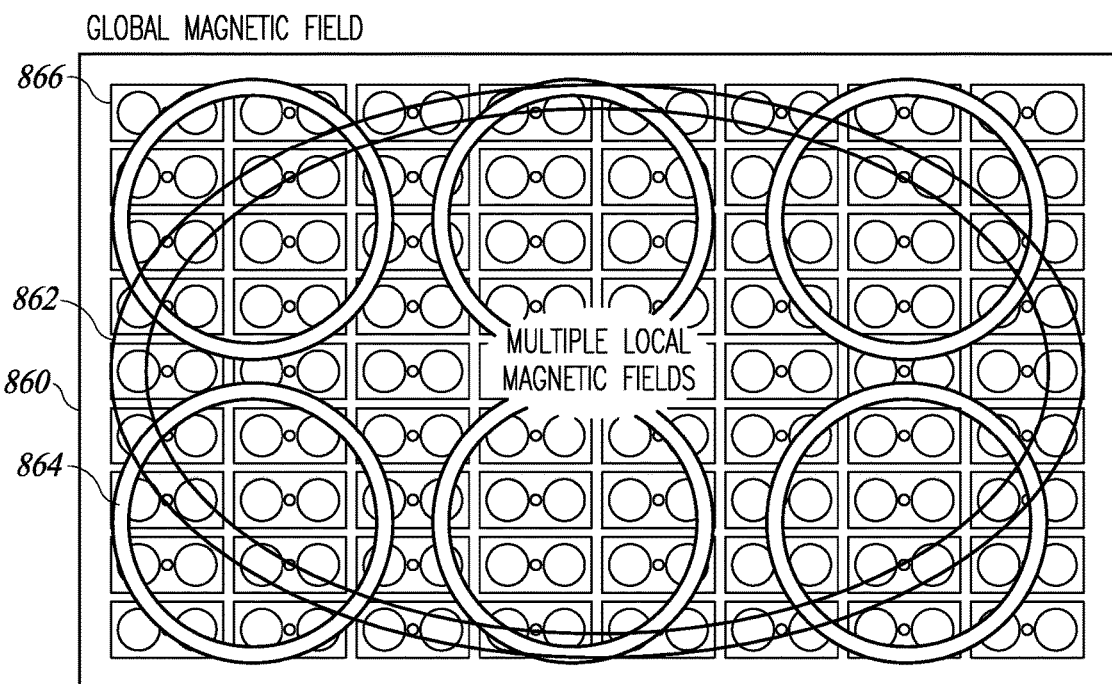
FIG. 12H is a diagram illustrating an example quantum interaction gate with global magnetic field control and a plurality of local magnetic fields control.

In the case of a larger quantum core, multiple inductors can be used to create local magnetic control fields. Alternatively, a global magnetic control can be used, which impacts two or more quantum structures at a time. A diagram illustrating an example grid array of programmable semiconductor qubits with both global and local magnetic fields is shown in FIG. 12H. The structure comprises a plurality of qubits 866 arranged in rows and columns, a plurality of local magnetic field controls 864 (per quantum gate or a small group of quantum gates), a global magnetic field control 862, and an electric control 860. With global magnetic control, multiple quantum structures are controlled by the same magnetic field. One example use for the magnetic field is to select the spin orientation of the particles that are loaded in the quantum structures/core.

Figure 13A:
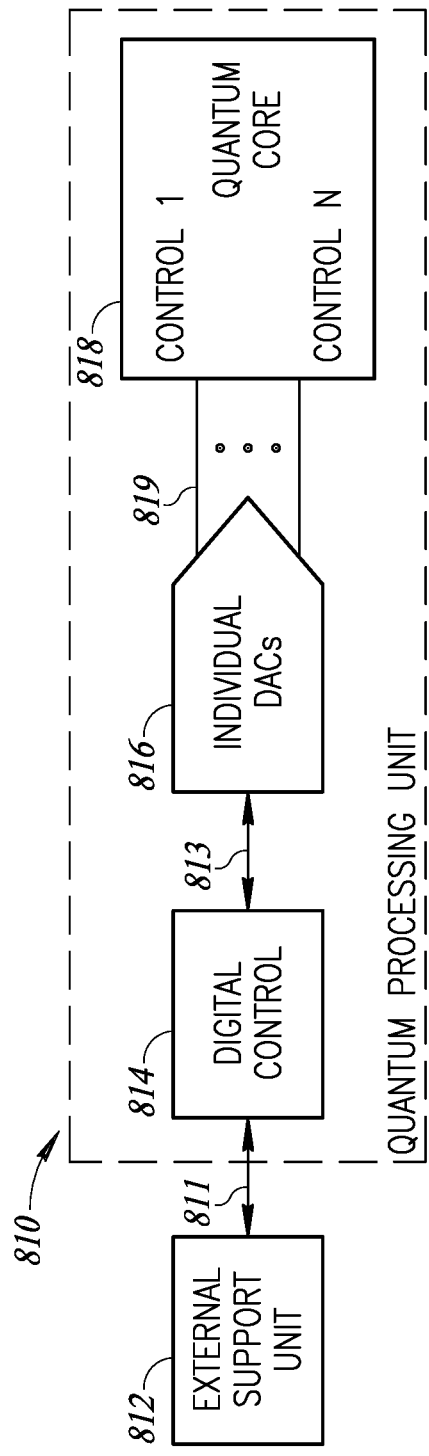
FIG. 13A is a diagram illustrating an example quantum processing unit incorporating a plurality of individual control signal DACs.

A diagram illustrating an example quantum processing unit incorporating a plurality of individual control signal DACs is shown in FIG. 13A. The quantum processing unit, generally referenced 810, comprises a digital control circuit 814, a plurality of individual DACs 816 whose analog control signal outputs are input to n control gates in quantum core 818. In operation, the quantum processing unit communicates with the external world via the external support unit 812. The external support unit may comprise a PC, a computer, an FPGA board, or any other kind of external electronic system or computing device. The external support unit interacts with the digital control 814. The quantum core 818 comprises a plurality of quantum circuits with quantum interaction gates and quantum wells with associated control terminals. A control signal for each control terminal is provided. This includes, for example, the control gates of the imposers, gates in the sources and the drains of the interface devices, etc. These circuits all need to have dedicated control signals which are generated in this embodiment by individual DACs 816.

Figure 13B:
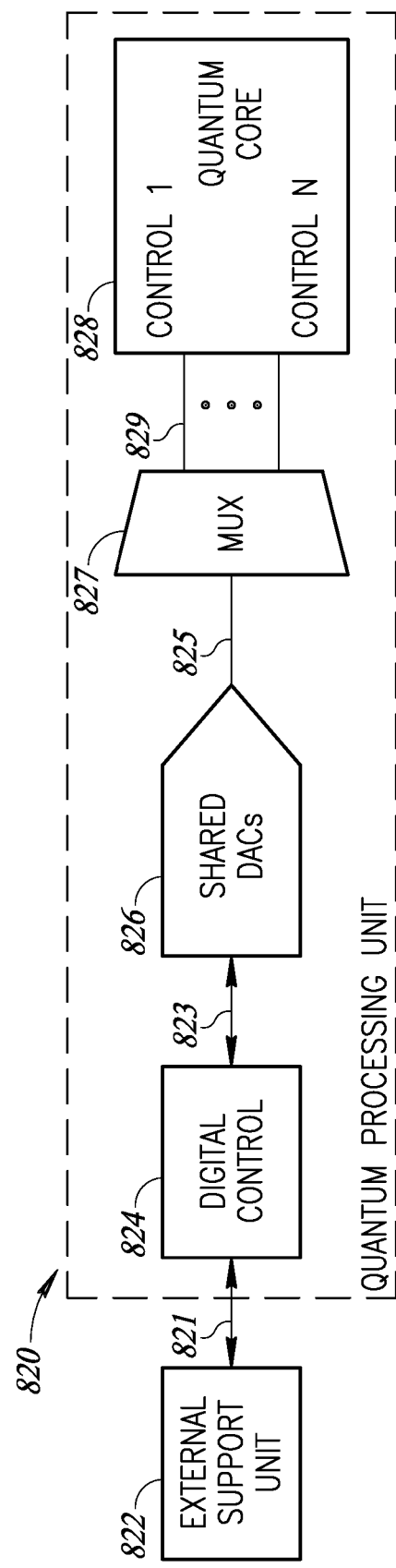
FIG. 13B is a diagram illustrating an example quantum processing unit incorporating shared control signal DACs.

A diagram illustrating an example quantum processing unit incorporating shared control signal DACs is shown in FIG. 13B. The quantum processing unit, generally referenced 820, comprises a digital control circuit 824, a plurality of shared DACs 826 whose analog control signal outputs are input via a multiplexer 827 to n control gates in quantum core 828. In this embodiment, the DACs are shared among the control gates in the quantum core. The digital control (e.g., DSP) functions to compute the controls needed which are converted to analog via an analog controller including the shared DACs. The result is a plurality of analog signals that go to the different control lines of the quantum core. Due to the relatively high number of control lines needed, the control circuit is shared between two or more ports thereby reducing the number of control signals.

In one example embodiment, 32 control circuits are required to control the different aspects of a single qubit. For two qubits, the number of control circuits doubles to 64. In the case of a thousand qubits, the number balloons to 32,000 control circuits. With higher numbers of qubits the control circuitry grows very quickly. Thus, sharing control circuits between different nodes using the same hardware is advantageous. Note that any control signals that must be controlled simultaneously cannot be shared. There is, however, some spatial distribution of quantum interaction gates whereby not all control signals need to be controlled at the same time.

Figure 14A:
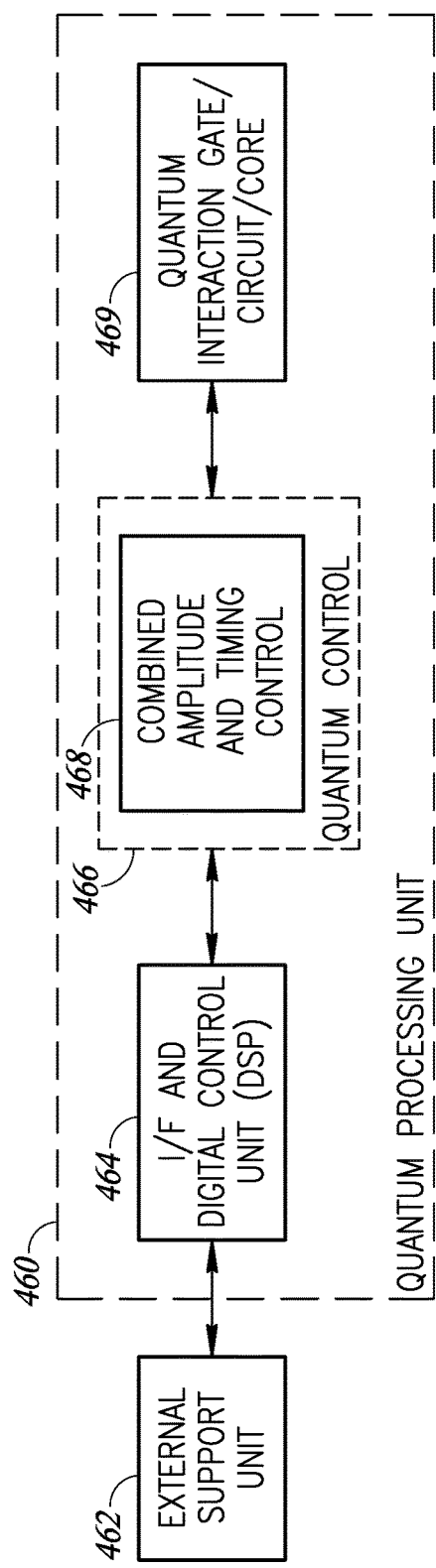
FIG. 14A is a diagram illustrating an example quantum processing unit incorporating a combined amplitude and timing circuit.

A diagram illustrating an example quantum processing unit incorporating a combined amplitude and timing circuit is shown in FIG. 14A. The quantum processing unit, generally referenced 460, comprises interface (I/F) and digital control unit (DSP) 464, quantum control block 466 including combined amplitude and timing (pulse width) circuit 468, and quantum interaction gate, circuit, or core 469. The quantum processing unit 460 interfaces with the outside world via the external support unit 462. The digital control unit functions to calculate the different control signals needed to create a given quantum operation. In one embodiment, the digital control unit is programmable. The interface receives commands that determine what kind of control signals and circuits are to be generated. Once determined, the digital control unit instructs the combined amplitude and timing control circuit 468 to generate the analog control signals required to perform the particular quantum operation in the quantum interaction gate, circuit, or core. The precise amplitude and timing (i.e. pulse width) is calculated for each control signal. Note that in this embodiment, the amplitude as well as the timing for the control signals are generated together via circuit 468.

Figure 14B:
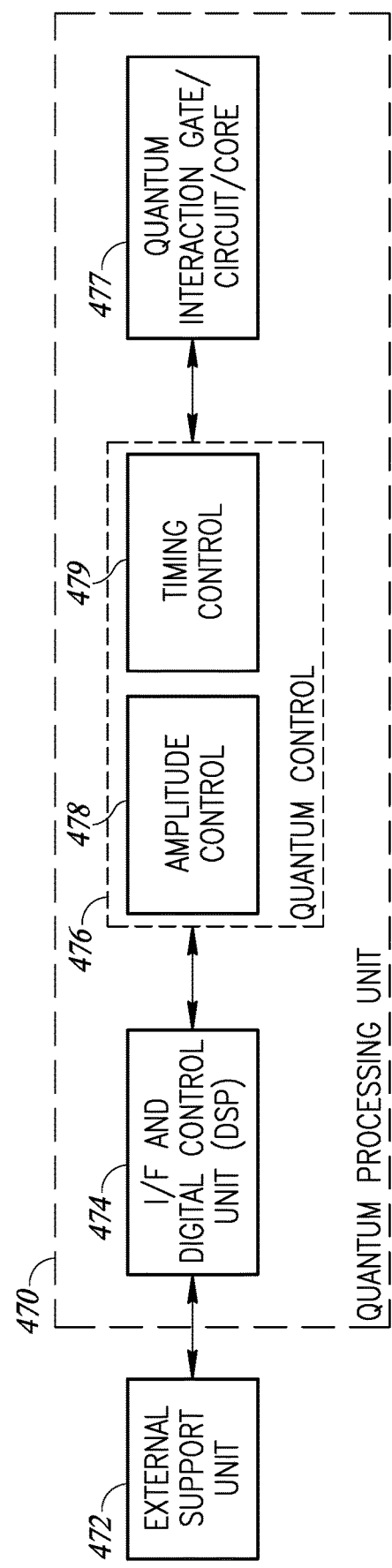
FIG. 14B is a diagram illustrating an example quantum processing unit incorporating separate amplitude and timing circuits.

Alternatively, the amplitude and timing can be generated separately. A diagram illustrating an example quantum processing unit incorporating separate amplitude and timing circuits is shown in FIG. 14B. The quantum processing unit, generally referenced 470, comprises interface (I/F) and digital control unit (DSP) 474, quantum control block 476 including separate amplitude control circuit 478 and timing control (i.e. pulse width) circuit 479, and quantum interaction gate, circuit, or core 477. The quantum processing unit 470 interfaces with the outside world via the external support unit 472. The digital control unit functions to calculate the different control signals needed to create a given quantum operation. In one embodiment, the digital control unit is programmable. The interface receives commands that determine what kind of control signals and circuits are to be generated. Once determined, the digital control unit instructs the separate amplitude control 478 and timing control 479 circuits to generate the analog control signals required to perform the particular quantum operation in the quantum interaction gate, circuit, or core. The precise amplitude and timing (i.e. pulse width) is calculated for each control signal.

Figure 15A:
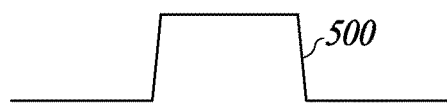
FIG. 15A is a diagram illustrating a first example control gate signal.
Figure 15B:
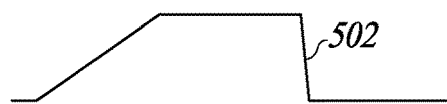
FIG. 15B is a diagram illustrating a second example control gate signal.
Figure 15C:
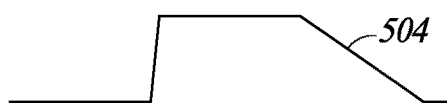
FIG. 15C is a diagram illustrating a third example control gate signal.
Figure 15D:
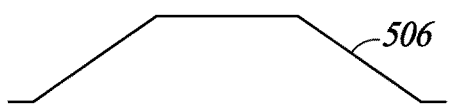
FIG. 15D is a diagram illustrating a fourth example control gate signal.

A description of the various types of control signals that can be applied to the control terminals will now be presented. A diagram illustrating a first example control gate signal is shown in FIG. 15A. The control signal 500 has a low value and a high value and transitions very quickly from low to high and high to low. Such control signals are useful for quantum switching operations and quantum switching machines. A diagram illustrating a second example control gate signal is shown in FIG. 15B. The control signal 502 has low and high values but a slow rise time and a quick fall time. A diagram illustrating a third example control gate signal is shown in FIG. 15C. The control signal 504 has low and high values but a quick rise time and a slow fall time. A diagram illustrating a fourth example control gate signal is shown in FIG. 15D. The control signal 506 has low and high values and slow rise and fall times. Control signals with slow rise and/or fall times are useful in realized annealing quantum interaction gates and quantum machines.

A mixture of control signals 500 and 506 can be used in quantum machines that do both annealing and switching operations, but not at the same time for a given qubit. Some qubits may be switching and some annealing. In addition a single qubit may have a hybrid operation using the control signals 502, 504. A slow rising edge means an adiabatic state change as Rabi oscillation tunneling is achieved. Stopping the Rabi oscillation, stops the tunneling sharply. So one edge is fast when one edge is slow. The opposite case is also possible, i.e. the rising edge is fast and the falling edge is slow. Enabling the Rabi oscillation quickly obviates adiabatic but switching it off enables adiabatic. Thus, control signals 500, 502, 504, 506 are four main control signals suitable for a switched quantum computer (500), annealing quantum computer (506), and hybrid switched annealing quantum computers (502, 504).

Figure 15E:
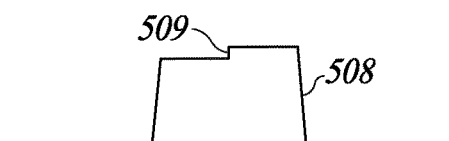
FIG. 15E is a diagram illustrating a fifth example control gate signal.

A diagram illustrating a fifth example control gate signal is shown in FIG. 15E. The control signal 508 comprises a pulse with quick rising and falling edges and a step 509 in the 'on' portion. As described supra, quantum tunneling is exponentially dependent on the tunneling barrier. If amplitude in the on state is changed even slightly this can impact the frequency of the Rabi oscillation quite significantly and therefore the frequency of the tunneling which can change the outcome of the quantum operation. The slight step 509 in the amplitude thus slightly impacts the frequency of the Rabi oscillation.

Figure 15F:
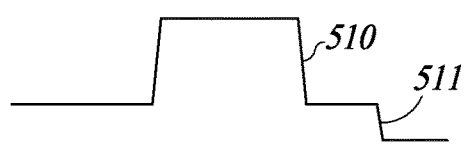
FIG. 15F is a diagram illustrating a sixth example control gate signal.
Figure 15G:
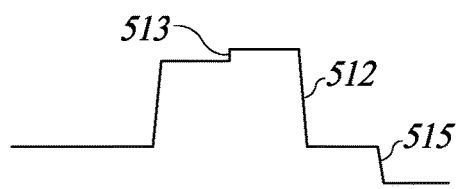
FIG. 15G is a diagram illustrating a seventh example control gate signal.

A diagram illustrating a sixth example control gate signal is shown in FIG. 15F. The control signal 510 in this case comprises a step 511 in the 'off' state. In this case, the on state is constant in amplitude but the off state changes. This is performed, for example, because the quantum system is very sensitive in the on state and very insensitive when in the off state. Thus, much higher amplitude changes in the off state are required to make any kind of change in the state of the system. A diagram illustrating a seventh example control gate signal is shown in FIG. 15G. The control signal may include changes in amplitude both for the on and off states. The control signal 512 in this case is a combination of the two control signals 508, 510 with a step 513 in the on state as well as a step 515 in the off state.

Figure 15H:
FIG. 15H is a diagram illustrating an eighth example control gate signal.

A diagram illustrating an eighth example control gate signal is shown in FIG. 15H. The control signal 514 comprises two pulses where the pulse widths are different. Thus, the control signal may comprise two or more pulses but they do not necessarily have to be the same width. Multiple pulses of different widths may be used.

Figure 15I:
FIG. 15I is a diagram illustrating a ninth example control gate signal.
Figure 15J:
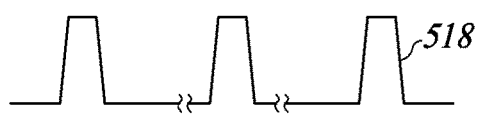
FIG. 15J is a diagram illustrating a tenth example control gate signal.

A diagram illustrating a ninth example control gate signal is shown in FIG. 15I. The control signal 516 comprises two pulses in this case. The amplitude and pulse width set in accordance with the desired quantum operation. A diagram illustrating a tenth example control gate signal is shown in FIG. 15J. The control signal 518 in this case comprises a plurality of pulses.

Figure 15K:
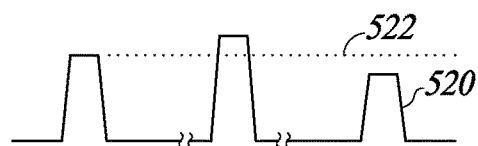
FIG. 15K is a diagram illustrating an eleventh example control gate signal.

A diagram illustrating an eleventh example control gate signal is shown in FIG. 15K. The control signal 520 comprises a train of pulses where the amplitude of each may be different. The dotted line 522 highlights the different amplitudes of the pulses.

Figure 15L:
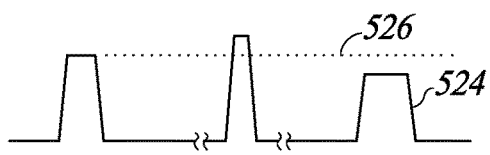
FIG. 15L is a diagram illustrating a twelfth example control gate signal.

A diagram illustrating a twelfth example control gate signal is shown in FIG. 15L. The control signal 524 comprises a train of pulses where the amplitude and pulse width of each may be different. The dotted line 526 highlights the different amplitudes of the pulses. This pulse train can be viewed as the most generalized pulse control signal.

A diagram illustrating a thirteenth example control gate signal is shown in FIG. 15M. The control signal 528 comprises a pulse having fast rising and falling edges and a sine wave 530 in the on portion of the pulse. In this case, the sine wave is in the on portion of the pulse but is not limited to this. In one embodiment, the sine wave is used to control the angle φ of a quantum interaction gate and a quantum structure. The base energy of a quantum state can be changed by having an oscillatory excitation for the control signal. Thus, using a sine wave an average of zero can be obtained or any desired average depending on how many cycles are selected.

A diagram illustrating a fourteenth example control gate signal is shown in FIG. 15N. The control signal 532 comprises a pulse having fast rising and falling edges and a sine wave 534 in a portion of the on state of the pulse. Note that the angle φ can be manipulated by using an oscillatory signal either on the entire state (control signal 528) or a part thereof (control signal 532).

A diagram illustrating a fifteenth example control gate signal is shown in FIG. 15O. The control signal 536 comprises a pulse with fast rise and fall times for the on state. An oscillatory signal 538, e.g., sine wave, is inserted in the off state.

A diagram illustrating a sixteenth example control gate signal is shown in FIG. 15P. The control signal 540 comprises two pulses each with fast rise and fall for the on states and an oscillatory signal 542 in the off state between them.

A diagram illustrating a seventeenth example control gate signal is shown in FIG. 15Q. The control signal 544 comprises two pulses where one has an oscillatory signal 546 in the on state of one of the pulses and an oscillatory signal 548 in the off state as well.

A diagram illustrating an eighteenth example control gate signal is shown in FIG. 15R. The control signal 550 comprises a plurality of pulses of different amplitudes and pulse widths where one or more pulses has an oscillatory signal 554 in the on state.

Note that the frequency of the oscillatory signals may vary from signal to signal and pulse to pulse. In addition, the control pulses may have different amplitudes and different widths. Further, any combinations of the above control signal features may be generated.

In the case where a quantum interaction gate comprises two qubits, typically two control signals are required, rather than one. The control signals are typically what determines the functionality of the quantum circuit. A diagram illustrating a first example pair of control gate signals $G_A$ and $G_B$ is shown in FIG. 16A. Control signal $G_A$ 560 comprises a pulse with fast rising and falling edges and control signal $G_B$ 562 remains static in the off state at least for the time that is observed. These control signals provide a control NOT functionality to the two qubits.

A diagram illustrating a second example pair of control gate signals $G_A$ and $G_B$ is shown in FIG. 16B. Control signal $G_A$ 564 comprises a pulse with fast rising and falling edges and control signal $G_B$ 566 comprises a pulse with fast rising and falling edges but skewed in time from $G_A$. Each gate of the qubits is pulsed one at a time.

A diagram illustrating a third example pair of control gate signals $G_A$ and $G_B$ is shown in FIG. 16C. Control signal $G_A$ 568 comprises a pulse with fast rising and falling edges and control signal $G_B$ 570 also comprises a pulse with fast rising and falling edges simultaneous with $G_A$. These control signals provide a quantum SWAP gate. Note that if both qubits are pulsed at the same time but with slow edges the quantum annealing structure can be realized.

A diagram illustrating a fourth example pair of control gate signals $G_A$ and $G_B$ is shown in FIG. 16D. Control signal $G_A$ 572 comprises a pulse with fast rising and falling edges and a first amplitude and control signal $G_B$ 574 comprises a pulse with fast rising and falling edges and a second different amplitude and simultaneous with $G_A$. The arrows in the x-direction indicate that the low state is the same for the two control signals. The amplitudes, however, are different. This means that the tunneling speed of the $G_A$ qubit will be different from the tunneling speed of $G_B$ qubit.

Figure 16E:
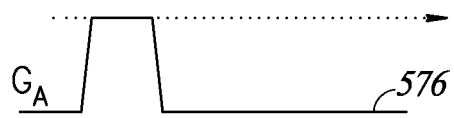
FIG. 16E is a diagram illustrating a fifth example pair of control gate signals $G_A$ and $G_B$.

A diagram illustrating a fifth example pair of control gate signals $G_A$ and $G_B$ is shown in FIG. 16E. Control signal $G_A$ 576 comprises a pulse with fast rising and falling edges and a first off state amplitude and control signal $G_B$ 578 comprises a pulse with fast rising and falling edges and a second different off state amplitude, simultaneous with $G_A$. In this case, the arrows in the x-dimension indicate that the on state amplitude of the two control signals are the same. The amplitude of the off state, however, is different. Thus, $G_A$ and $G_B$ fall differently, $G_A$ goes lower while $G_B$ goes less lower. This is called asymmetric control where the control signals are not the same.

Figure 16F:
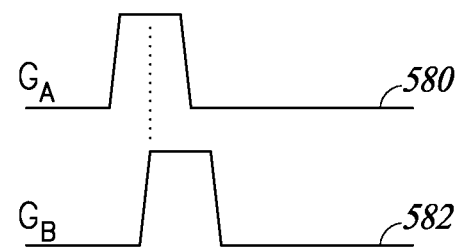
FIG. 16F is a diagram illustrating a sixth example pair of control gate signals $G_A$ and $G_B$.

A diagram illustrating a sixth example pair of control gate signals $G_A$ and $G_B$ is shown in FIG. 16F. Control signal $G_A$ 580 comprises a pulse with fast rising and falling edges and control signal $G_B$ 582 comprises a pulse with fast rising and falling edges with different timing than $G_A$. The two control signals partially overlap in time. This causes an initial phase shift when $G_A$ goes high. As $G_B$ quickly switches on it overlaps with $G_A$ resulting in a quantum SWAP operation. $G_A$ then finishes and $G_B$ continues resulting in another phase shift.

Figure 16G:
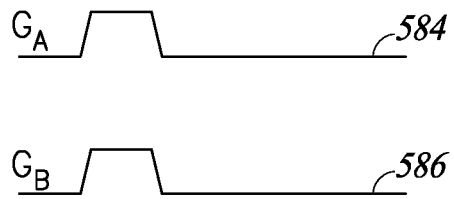
FIG. 16G is a diagram illustrating a seventh example pair of control gate signals $G_A$ and $G_B$.

A diagram illustrating a seventh example pair of control gate signals $G_A$ and $G_B$ is shown in FIG. 16G. Control signal $G_A$ 584 comprises a pulse with fast rising and falling edges and control signal $G_B$ 586 comprises a pulse with fast rising and falling edges, simultaneous with $G_A$. Note that large amplitude control signals are needed to achieve proper tunneling between quantum states. In this example, however, rather than achieve full tunneling, only a slight change of the angle of the state is achieved by applying a lower amplitude for both $G_A$ and $G_B$. This can be used, for example, in quantum error correction. Consider a quantum state where the electrons are interacting with each other. All the information is in the entangled quantum state, but errors occurred due to noise in the system, etc. Raising the gate voltages of the different gates by a small amount allows the state to readjust itself to compensate for the errors that were created but it does not change it fundamentally.

Figure 16H:
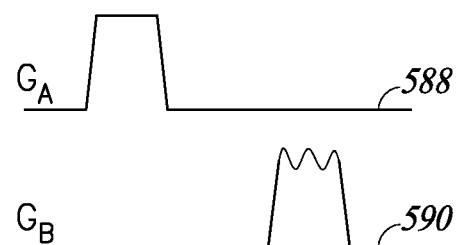
FIG. 16H is a diagram illustrating an eighth example pair of control gate signals $G_A$ and $G_B$.

A diagram illustrating an eighth example pair of control gate signals $G_A$ and $G_B$ is shown in FIG. 16H. Control signal $G_A$ 588 comprises a pulse with fast rising and falling edges and control signal $G_B$ 590 comprises a pulse skewed in time from $G_A$ with fast rising and falling edges and an oscillatory signal in the on state. In this example, the control signals provide a control NOT operation followed by an oscillatory signal on $G_B$ where the angle φ of rotation of one of the qubits or both of them is corrected.

Figure 16I:
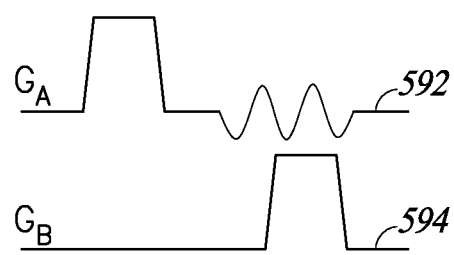
FIG. 16I is a diagram illustrating a ninth example pair of control gate signals $G_A$ and $G_B$.

A diagram illustrating a ninth example pair of control gate signals $G_A$ and $G_B$ is shown in FIG. 16I. Control signal $G_A$ 592 comprises a pulse with fast rising and falling edges with an oscillatory signal in the off state and control signal $G_B$ 594 comprises a pulse skewed in time from $G_A$ with fast rising and falling edges. In this example, the control signals provide a control NOT operation followed by an oscillatory signal on $G_B$ where the angle φ of rotation of one of the qubits or both of them is corrected.

Figure 17A:
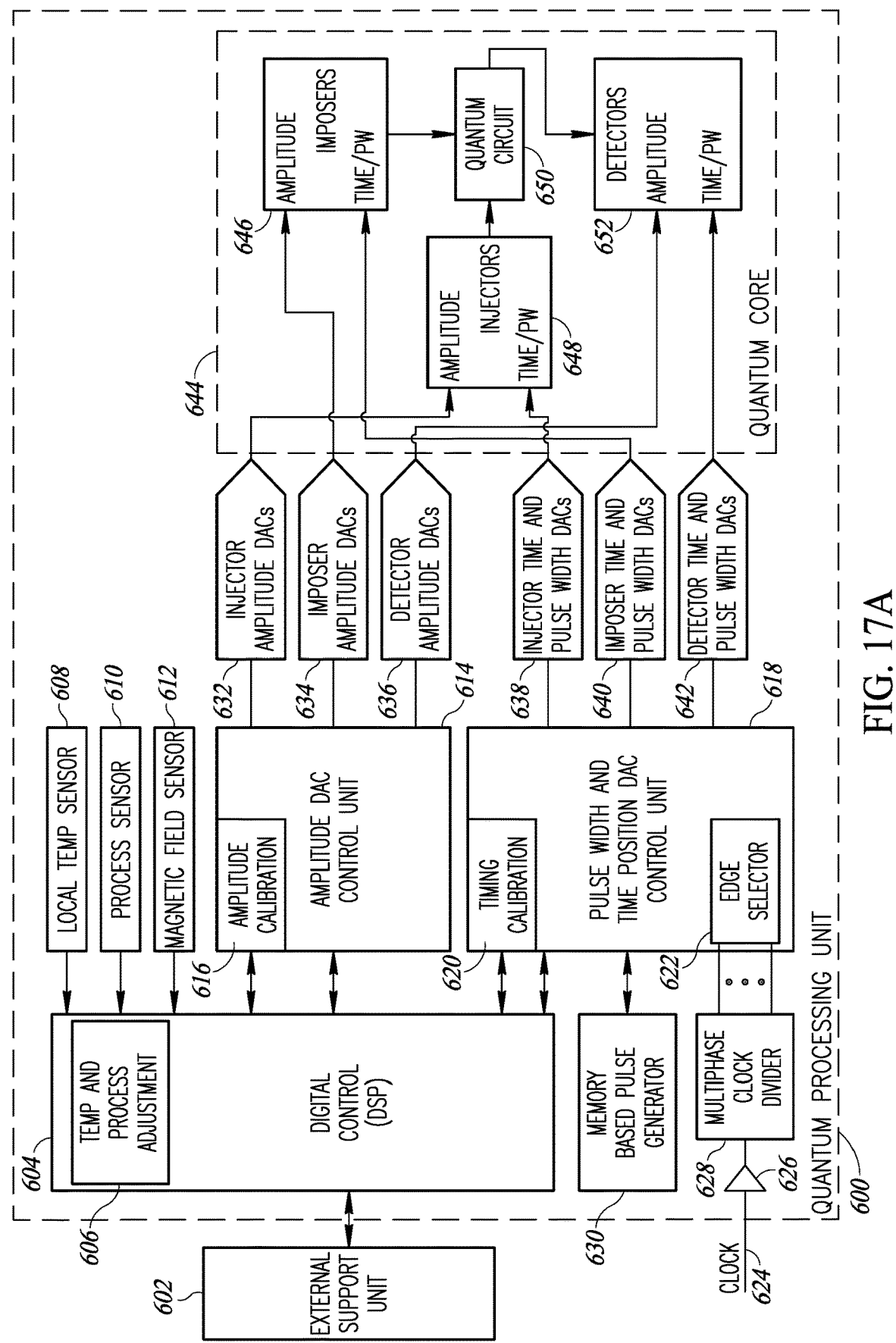
FIG. 17A is a diagram illustrating an example quantum processing unit with separate amplitude and time position control units.

A diagram illustrating an example quantum processing unit with separate amplitude and time position control units is shown in FIG. 17A. The quantum processing unit 600 comprises digital signal processing control (DSP) circuit 604, amplitude DAC control unit 614, pulse width and time position DAC control unit 618, injector amplitude DACs 632, imposer amplitude DACs 634, detector amplitude DACs 636, injector time and pulse width DACs 638, imposer time and pulse width DACs 640, detector time and pulse width DACs 642, and quantum core 644. The quantum core 644 comprises a quantum circuit 650, imposers 646, injectors 648, and detectors 652.

The quantum computing core 644 has a certain structure depending on the desired application along with injector, imposer, detector, and reset (not shown) circuits. The required control signals to these circuits are generated by the DACs electronic circuits in this example. It is appreciated that they can be generated not only with digital to analog control circuits but by using pure analog circuitry as well. Regardless of the mechanism, ultimately, analog control is required. The pulse shaping can be performed by an analog circuit, digital circuit, or a combination thereof.

Thus, a plurality of DACs provide the control signals that are input to the quantum structure. In one embodiment, 32 control signals, i.e. 32 DACs, are required for each qubit. Although the amplitude and timing can be controlled together, it is typically easier to control them separately as shown in FIG. 17A. Therefore, some DACs are dedicated to controlling amplitude and others are dedicated to controlling timing of the signals.

The quantum processing unit interfaces to the outside world via the digital control (DSP) 604 and the external support unit 602. In addition, each of the amplitude DAC control unit and the pulse width and time position DAC control unit comprise calibration circuits 616, 620, respectively. In one embodiment, calibration circuits (also referred to as calibration loops) are used to compensate for variations in the circuits and to enable generation of precise amplitude and timing. Without the calibration loops, the amplitude and timing of the control signals may be inaccurate due to process variability, temperature variability, and other environmental variabilities resulting in inaccuracies in the quantum structure.

In addition, the quantum processing unit receives a high frequency clock 624 that is provided externally. The clock is input to a clock buffer 626 followed by a multiphase clock divider 628. Using an edge selector 622, the multi-phase signal is used to create pulses that have various pulse widths and positions in time. A memory based pulse generator 630 functions to select a sequence to use for each of the control pulses.

Moreover, the quantum processing unit comprises several sensors, including a local temperature sensor 608, process sensor 610 to detect process corners for the chip, and magnetic field sensor 612 to detect the magnetic field of the earth or other perturbing electromagnetic fields in proximity, all connected to the digital control 604. For example, if a perturbation on the system is detected, a temperature process adjustment or an environmental adjustment that changes the digital control can be performed. This, in turn, will change the amplitude and the timing that goes into the DACs thereby changing the signals input to the quantum structure to compensate for those external factors.

Figure 17B:
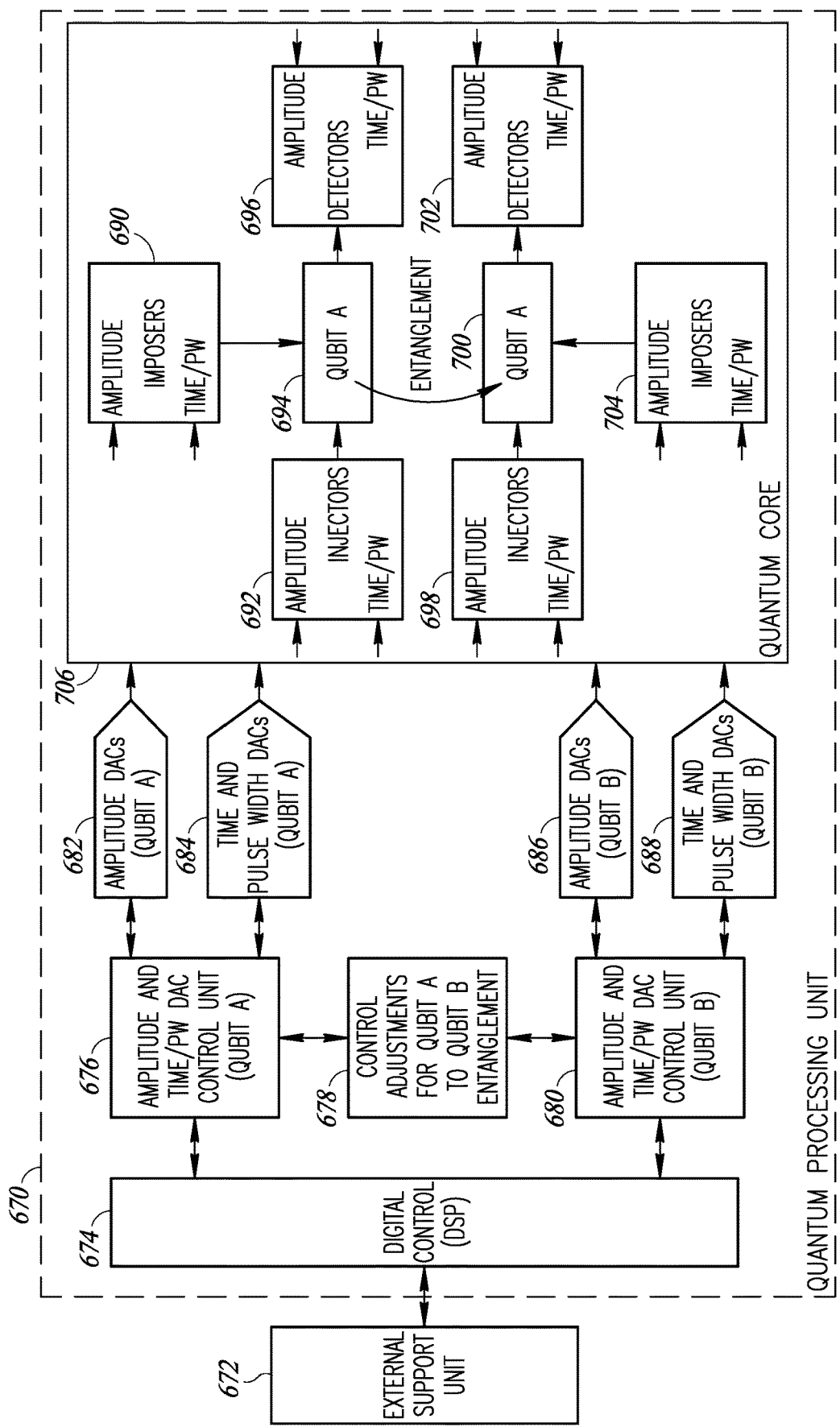
FIG. 17B is a diagram illustrating an example quantum processing unit with separate amplitude and time position control units and control adjustments for qubit entanglement.

A diagram illustrating an example quantum processing unit with separate amplitude and time position control units and control adjustments for qubit entanglement is shown in FIG. 17B. The quantum processing unit, generally referenced 670, comprises digital control (DSP) circuit 674, amplitude and time/pulse width (PW) DAC control unit for qubit A 676, amplitude and time/pulse width (PW) DAC control unit for qubit B 680, control adjustment circuit 678 for qubit A to qubit B entanglement, amplitude DACs 682 for qubit A, time and pulse width DACs 684 for qubit A, amplitude DACs 686 for qubit B, time and pulse width DACs 688 for qubit B, and quantum core 706. The quantum core 706 in this example comprises two qubits, namely qubit A 694 and qubit B 700. Associated with qubit A are injector circuits 692, imposer circuits 690, and detector circuits 696. Associated with qubit B are injector circuits 698, imposer circuits 704, and detector circuits 702. In addition, the digital control circuit 674 communicates with the external support unit 672. Note that for clarity sake, individual DACs for the injector, imposer, and detector circuits for both qubits as well as other circuitry are not shown in FIG. 17B. It is understood, however, that the quantum processor unit 670 is constructed similarly to the quantum processor unit 600 of FIG. 17A.

Note that the voltage of the control signals and timing levels for a single qubit are relatively known and have a certain value. Given two qubits, however, that are entangled, the voltage level needed to obtain a Rabi oscillation with multiple entangled electrons is slightly different from that for a separate electron. This is because the separate electron behaves differently but in a predictable way from entangled electrons. In addition, calibration of the system is generally straightforward for a single electron. With entangled electrons performing control adjustment is based on the number of qubits that are entangled. The control circuit 678 functions to change slightly the amplitude and the timing of the control signals to compensate for the fact that the two qubits are in entangled states.

As described supra, the quantum state can be represented by two phases $\theta$ and $\varphi$. The $\theta$ angle gives the split of the electron's wavefunction between two or more qubits. The $\varphi$ angle cannot be measured externally but can be impacted externally and thus be changed. Although $\varphi$ cannot be measured in a single qubit it can be measured in a two-qubit interaction resulting from the impact of the difference between the two $\varphi$ angles.

Figure 18A:
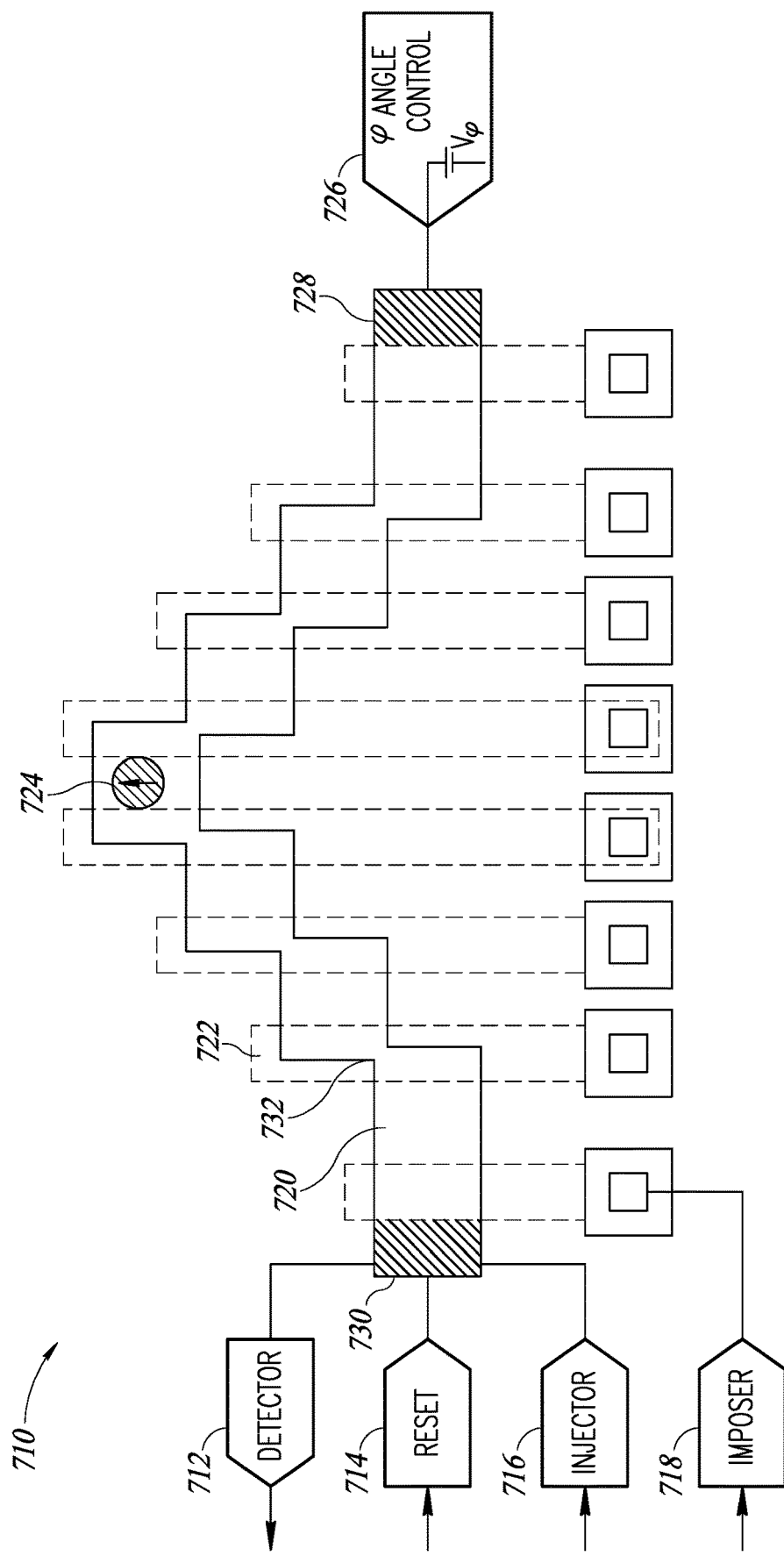
FIG. 18A is a diagram illustrating a first example qubit with φ angle control.

A diagram illustrating a first example qubit with $\varphi$ angle control is shown in FIG. 18A. The quantum interaction gate, generally referenced 710, is shown for illustration purposes only. It is appreciated that numerous other quantum structures may be used as well. The interaction gate comprises a continuous well 720, plurality of control gates 722, local depletion regions 732 for tunneling, interface devices/wells 730, 728, particle 724 which can be in the full or split state, reset circuit 714, injector circuit 716, imposer circuit 718, detector circuit 712, and $\varphi$ angle control circuit 726.

The angle $\varphi$ of the quantum state can be changed by applying an additional static voltage or potential $V_\varphi$. The $\varphi$ angle control circuit 726 provides a potential that is applied at one end of the quantum structure. Via the control gates this potential is propagated in close proximity to the particle. Note that the potential should come in close proximity to be effective. Once the $\varphi$ angle control potential is in close proximity to the electron it will impact the phase. For example, if a particle is split between two qdots, and a static control potential is brought in close proximity to a quantum state or an electron, this will impact the phase $\varphi$ thereof.

Figure 18B:
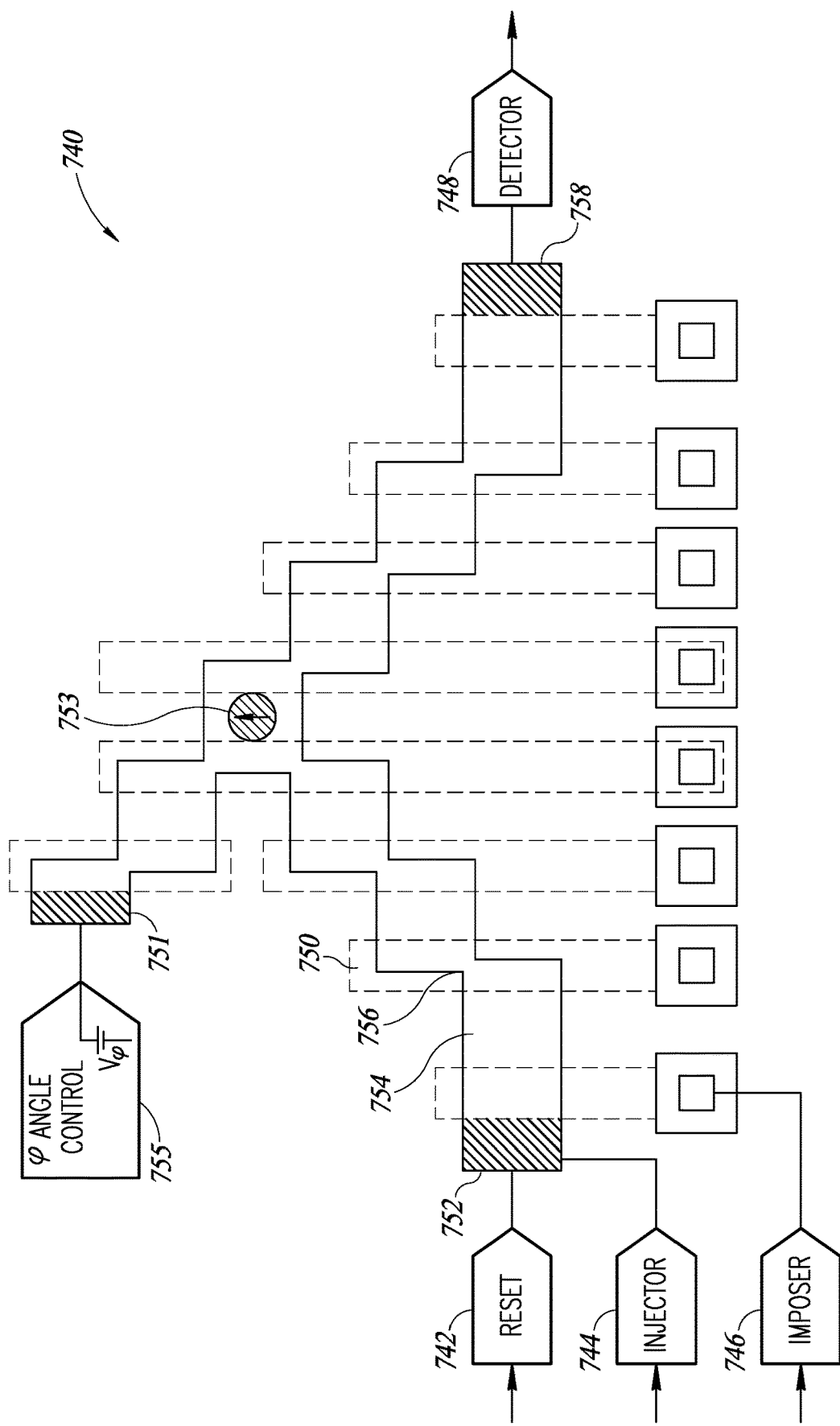
FIG. 18B is a diagram illustrating a second example qubit with φ angle control.

A diagram illustrating a second example qubit with $\varphi$ angle control is shown in FIG. 18B. The quantum interaction gate, generally referenced 740, comprises a continuous well 754, plurality of control gates 750, local depletion regions 756 for tunneling, interface wells/devices 752, 758, 751, particle 753 which can be in the full or split state, reset circuit 742, injector circuit 744, imposer circuit 746, detector circuit 748, and $\varphi$ angle control circuit 755.

In this alternative embodiment, the injector and reset circuits are on one end and the detector circuit the other. The electron is injected into the quantum well on the left side and exits on the right. In this case, the top interaction qdot has another quantum dot linked to it. A $\varphi$ angle control circuit 755 generates a static potential $V_\varphi$ that is applied to interface device 751 to control the potential on the two qdots adjacent to the quantum structure which functions to change the angle $\varphi$ of the quantum state.

Note that the $\varphi$ angle control voltage is not applied to a gate since that would affect the tunneling and impact the angle $\theta$. It is desired that the electron stays in exactly the split state it is in. Only the procession is to be affected and the procession is impacted by a static electric field. The static electric field is applied from something that is in close proximity. The well is the closest place to apply the voltage and this is done via an interface device coupled to a classic circuit. It is appreciated that the static control voltage can be applied via metal, poly or a well.

Figure 18C:
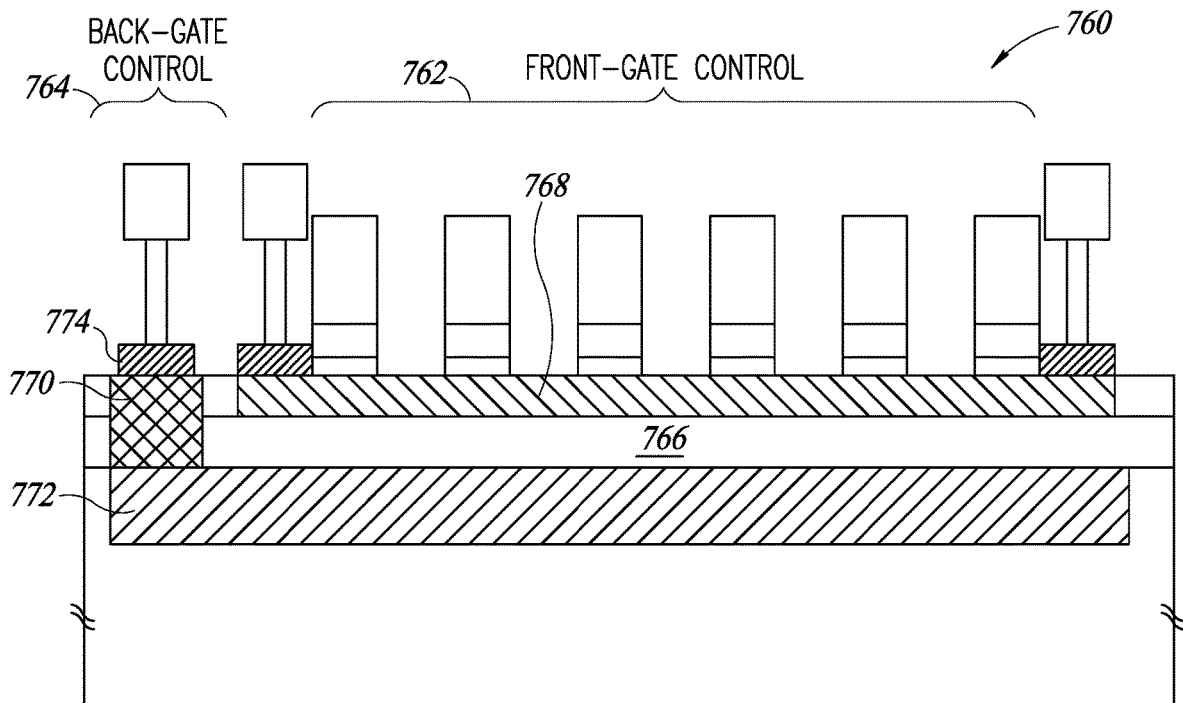
FIG. 18C is a diagram illustrating a third example qubit with φ angle control.

In another embodiment, the electrostatic field created by the $\varphi$ angle control voltage can be applied via one or more back gates rather than via front gates. A diagram illustrating a third example qubit with $\varphi$ angle control is shown in FIG. 18C. The example quantum interaction gate, generally referenced 760, comprises a continuous well layer 768, BOX oxide 766 and an additional layer 772 under the oxide 766 referred to as a back gate. In this embodiment, the interaction gate comprises both front gate control 762 and back gate control 764. The $\varphi$ angle control voltage is applied to the back gate control from the top side where it is electrically connected to back layer 772 via metal 774 and via well 770.

Note that the back gate under the quantum well 768 is reached via metal 774 and a portion of well 770 that penetrates through the oxide to a well 772 under the oxide 766. Thus by controlling the voltage at the back gate control terminal 764 the potential of the back gate well can be controlled which changes the angle $\varphi$ in the structure.

Figure 18D:
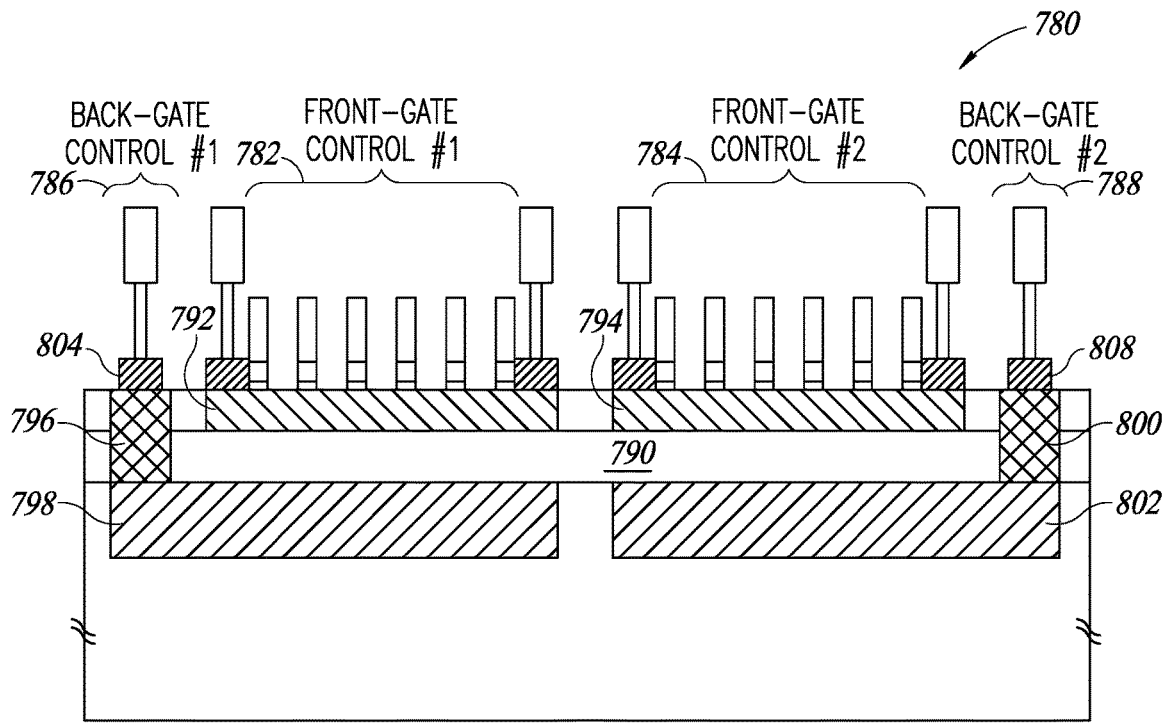
FIG. 18D is a diagram illustrating an example pair of qubits with φ angle control.

A diagram illustrating an example pair of qubits with $\varphi$ angle control is shown in FIG. 18D. The example quantum interaction gate, generally referenced 780, comprises two qubits. The left qubit comprises a continuous well layer 792, BOX oxide 790 and an additional layer back gate 798 under the oxide 790, front gate control #1 782, back gate control #1 786, metal 804, and well 796. The $\varphi$ angle control voltage is applied to the back gate control from the top side where it is electrically connected to back layer 798 via metal 804 and well 796. The right qubit comprises a continuous well layer 794, BOX oxide 790 and an additional layer back gate 802 under the oxide, front gate control #2 784, back gate control #2 788, metal 808, and well 800. The $\varphi$ angle control voltage is applied to the back gate control from the top side where it is electrically connected to back layer 802 via metal 808 and well 800.

Thus, in this embodiment, multiple quantum sections have separate backside connections. In this manner, the angle $\varphi$ can be impacted differently in the left qubit versus the right qubit. Note that what is important is the difference between $\varphi1$ and $\varphi2$ of the two qubits and not their absolute value. Therefore, if there is a difference in the angles that impacts the quantum results in a negative way, the $\varphi$ angle can be controlled via the back gate such that the two angles are aligned to a point where $\varphi1$ minus $\varphi2$ does not pose a problem for the quantum operation.

Figure 19A:
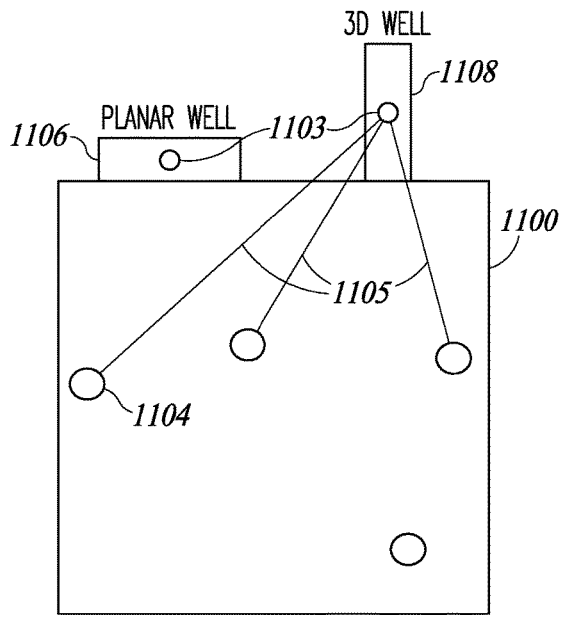
FIG. 19A is a diagram illustrating an example planar and 3D quantum well structure fabricated using bulk semiconductor processes.

A diagram illustrating an example planar and 3D quantum well structure fabricated using bulk semiconductor processes is shown in FIG. 19A. The quantum structure comprises a low doped substrate 1100 with sparse dopants 1104 far from each other on which a planar well 1106 is fabricated containing a quantum electron 1103 (i.e. an electron whose quantum features are distinct and can be exploited). Parasitic interactions 1105 typically occur between the dopants 1104 and quantum particle (e.g., electron, hole, etc.) 1103. In addition, a 3D well 1108 with quantum electron 1103 can be fabricated on the substrate. Note that a well is a semiconductor layer realized in a semiconductor physical structure as a result of the designated processing flow. The well can be undoped, i.e. intrinsic, or it can be doped. The lower the concentration of dopants in a well, the better suited it is for quantum applications since less dopants and free carriers are available to interact with the quantum particles which result in decohering quantum information. If the well sits directly on a semiconductor substrate, the process is referred as a bulk semiconductor process.

Figure 19B:
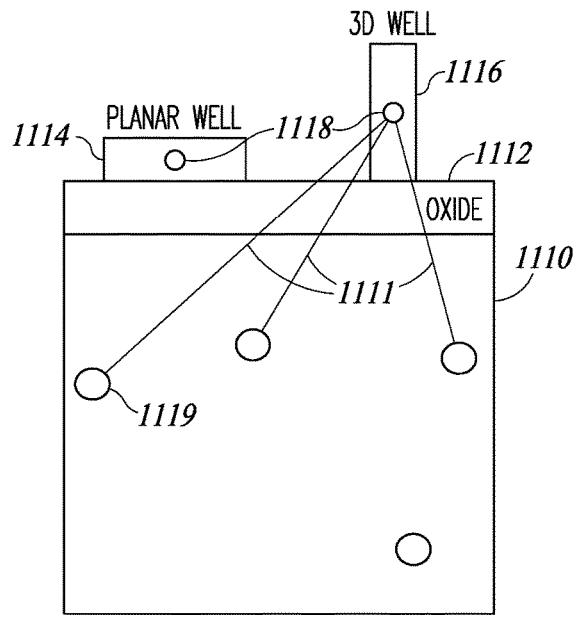
FIG. 19B is a diagram illustrating an example planar and 3D quantum well structure fabricated using silicon on insulator (SOI) semiconductor processes.

A diagram illustrating an example planar and 3D quantum well structure fabricated using silicon on insulator (SOI) semiconductor processes is shown in FIG. 19B. The quantum structure comprises a low doped substrate 1110 with sparse dopants 1119 far from each other, an oxide layer 1112 on which a planar well 1114 is fabricated containing a quantum electron 1118. Parasitic interactions 1111 typically occur between the dopants 1119 and quantum particle 1118. In addition, a 3D well 1116 with quantum electron 1118 can be fabricated on the oxide.

If the well is separated from the semiconductor substrate by an oxide layer, the technology process is referred to as silicon on insulator (SOI). Note that planar processes provide layers that extend mostly parallel with the substrate surface, while 3D processes provide layers that extend on a direction perpendicular to the substrate surface.

Figure 19C:
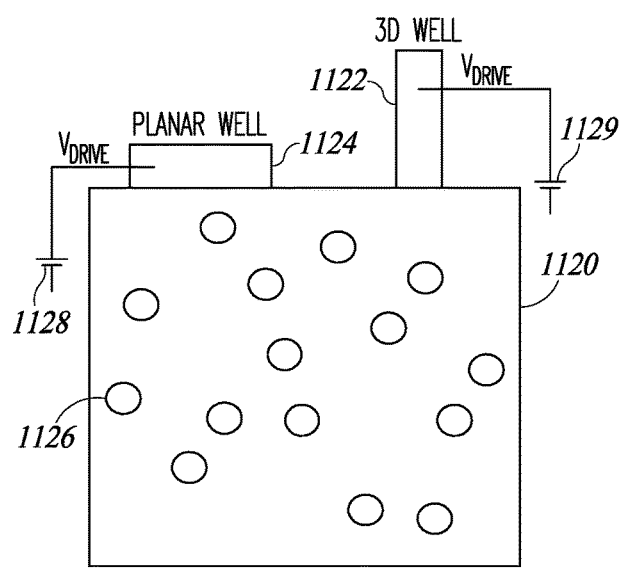
FIG. 19C is a diagram illustrating an example planar and 3D quantum well structure fabricated using bulk semiconductor processes and potential driven electrically.

In general, there are two ways in which a well can be controlled. One way is to drive or impose the well with a voltage potential. A diagram illustrating an example planar and 3D quantum well structure fabricated using bulk semiconductor processes and potential driven electrically is shown in FIG. 19C. The quantum structure comprises a substrate 1120 with dense and close dopants 1126 on which a planar well 1124 is fabricated coupled to a drive voltage $V_{drive}$ 1128. In addition, a 3D well 1122 coupled to drive voltage $V_{drive}$ 1129 can be fabricated on the substrate. The potential on the wells is determined by sources that drive them directly $V_{drive}$. Although the potential varies with time, it does not vary freely based on the position of a given electron or hole. The substrate of classic electronic circuits can have a large number of dopants or a moderate or lower number of dopants.

Figure 19D:
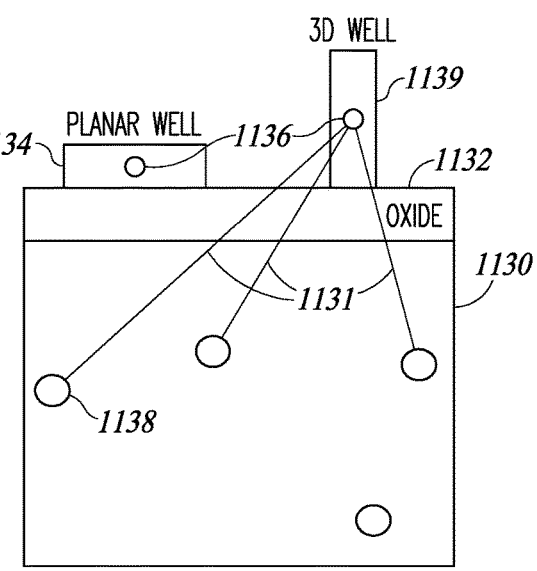
FIG. 19D is a diagram illustrating an example planar and 3D quantum well structure fabricated using silicon on insulator (SOI) semiconductor processes and floating potential dependent on quantum particles.

Another way to control a well is to have another quantum well having an electron in close proximity to the first well. A diagram illustrating an example planar and 3D quantum well structure fabricated using silicon on insulator (SOI) semiconductor processes and floating potential dependent on quantum particles is shown in FIG. 19D. The quantum structure comprises a low doped substrate 1130 with sparse dopants 1138 far from each other, an oxide layer 1132 on which a planar well 1134 is fabricated containing a quantum electron 1136. Parasitic interactions 1131 typically occur between the dopants 1138 and quantum particle 1136. In addition, a 3D well 1139 that can contain quantum electron 1136 can be fabricated on the oxide.

In this embodiment, the quantum wells are floating and their potential can change due to the presence of one or few quantum particles. Note that it is preferable to realize quantum semiconductor structures in SOI processes, since the oxide layer minimizes the de-coherence from the substrate. A high resistivity substrate, i.e. low doped substrate, helps further reduce the substrate de-coherence. In one embodiment, the semiconductor substrate is eliminated altogether and replaced with an insulating material. This eliminates the substrate de-coherence due to dopants.

Figure 19E:
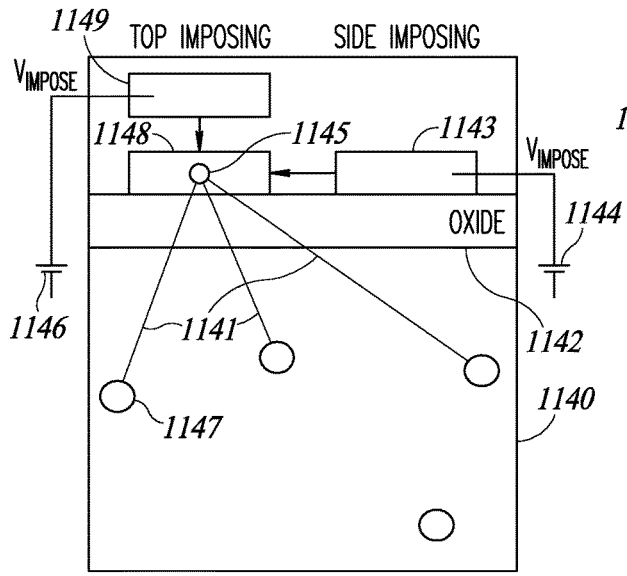
FIG. 19E is a diagram illustrating example imposing on the potential of a floating planar quantum well using an electrically driven adjacent layer.

A diagram illustrating example imposing on the potential of a floating planar quantum well using an electrically, i.e. voltage, driven adjacent layer is shown in FIG. 19E. The quantum structure comprises a low doped substrate 1140 with sparse dopants 1147 far from each other, an oxide layer 1142 on which a planar well 1148 is fabricated containing a quantum electron 1145. Parasitic interactions 1141 typically occur between the dopants 1147 and quantum particle 1145. In this embodiment, the potential of the quantum well has an imposing, i.e. control, applied from an adjacent side 1143 or top layer 1149 that has its potential driven with an electric source equivalent circuit 1146. Either way, the voltage can be imposed from a piece of metal, gate material, from another well, from a piece of poly, etc. Note that although SOI processes are shown, bulk processes can be used as well.

Figure 19F:
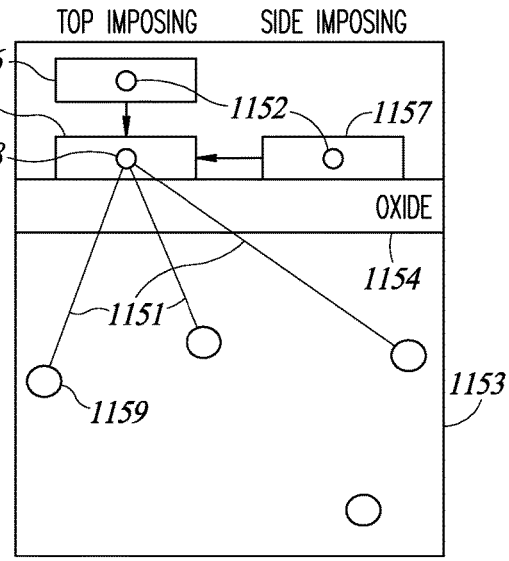
FIG. 19F is a diagram illustrating example imposing on the potential of a floating planar quantum well using a floating layers with quantum particles.

A diagram illustrating example imposing on the potential of a floating planar quantum well using a floating layers with quantum particles is shown in FIG. 19F. The quantum structure comprises a low doped substrate 1153 with sparse dopants 1159 far from each other, an oxide layer 1154 on which a planar well 1155 is fabricated containing a quantum electron 1158. Parasitic interactions 1151 typically occur between the dopants 1159 and quantum particle 1158.

In this case, top imposing is achieved using another quantum particle 1152 in a top layer 1156. Alternatively, side imposing is achieved using another quantum particle 1152 with a certain quantum state in a side layer 1157. Note that the goal is to change the field around the particle that is to be controlled. The other particles, e.g., 1152, function to create an electric field that influences the particle 1158. Imposing on a quantum particle from another particle results in entanglement which is the basis of the quantum computation.

Figure 19G:
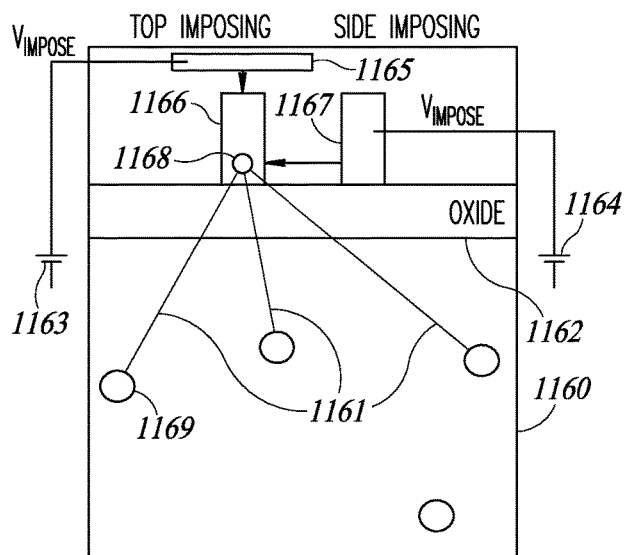
FIG. 19G is a diagram illustrating example imposing on the potential of a floating 3D quantum well using an electrically driven adjacent layer.

A diagram illustrating example imposing on the potential of a floating 3D quantum well using an electrically driven adjacent layer is shown in FIG. 19G. The quantum structure comprises a low doped substrate 1160 with sparse dopants 1169 far from each other, an oxide layer 1162 on which a 3D fin 1166 is fabricated containing a quantum electron 1168. Parasitic interactions 1161 typically occur between the dopants 1169 and quantum particle 1168. Note that although SOI implementations are shown, bulk processes may be used as well.

The potential of the 3D quantum fin 1166 has an imposing, i.e. control, from an adjacent side 1167 or top layer 1165 that in turn has its potential driven with an electric source 1163 equivalent circuit. The imposing layers may comprise gate material, metal, poly, other wells, etc.

Figure 19H:
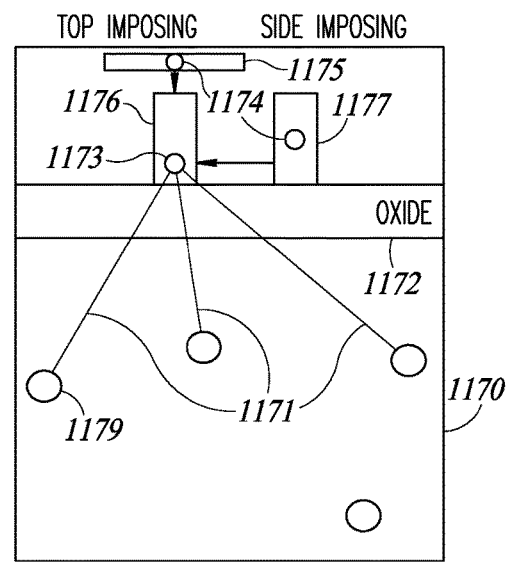
FIG. 19H is a diagram illustrating example imposing on the potential of a floating 3D quantum well using a floating layers with quantum particles.

A diagram illustrating example imposing on the potential of a floating 3D quantum well using floating layers with quantum particles is shown in FIG. 19H. The quantum structure comprises a low doped substrate 1170 with sparse dopants 1179 far from each other, an oxide layer 1172 on which a 3D fin 1176 is fabricated containing a quantum electron 1173. Parasitic interactions 1171 typically occur between the dopants 1179 and quantum particle 1173. Note that although SOI implementations are shown, bulk processes may be used as well.

In this embodiment, the imposing on the potential of the 3D quantum well 1176, i.e. fin, is realized by another quantum particle, i.e. quantum state. The imposing quantum particle 1174 is located on an adjacent side 1177 or top layer 1175. Imposing on a quantum particle 1173 from another particle 1174 results in entanglement, which is the basis of the quantum computation.

Figure 20A:
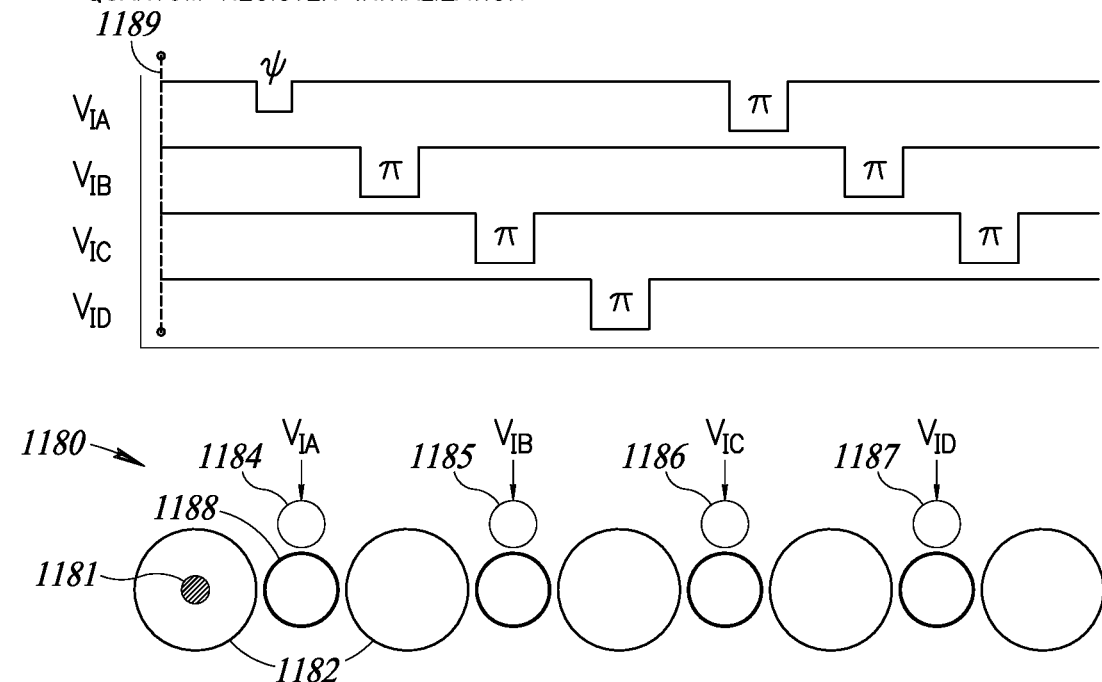
FIG. 20A is a diagram illustrating initialization of an example controlled semiconductor shift register.

The operation of the controlled quantum shift register will now be described in more detail. A diagram illustrating initialization of an example controlled semiconductor shift register (or quantum structure having bifurcation for transporting particles) is shown in FIG. 20A. The example quantum shift register, generally referenced 1180, comprises a plurality of planar qdots 1182 with tunneling path through oxide 1188 and arranged in sequential (daisy-chain) fashion one next to the other, control gate (or terminal) 1184, and particle 1181. Imposing voltage pulses $V_{IA}$, $V_{IB}$, $V_{IC}$, and $V_{ID}$, are applied to control gates 1184, 1185, 1186, and 1187, respectively. Note that any semiconductor process may be used to construct the quantum shift register. Note that the shift register is operative to transport both full quantum particles as well as split quantum particles (i.e. quantum state).

At time 1189, the shift register is in an initial state whereby a particle is situated in the left most qdot. Note that other positions may be assumed for the initial condition. A full particle or a split/entangled quantum state can be used as initial state. The control gates maintain the tunneling barriers high thereby keeping the particle 1181 in the left most qdot.

Note that in this example, lowering the imposing voltage lowers the tunneling barrier. Depending on the implementation, however, it may be the opposite where raising the imposing voltage lowers tunneling barrier. In addition, as described supra, if a pulse having a pulse width of $2\pi$ is applied, the particle will tunnel from one qdot to the other and then back. If a pulse having a pulse width of $\pi$ is applied, the particle travels from one qdot to the next and stops.

Figure 20B:
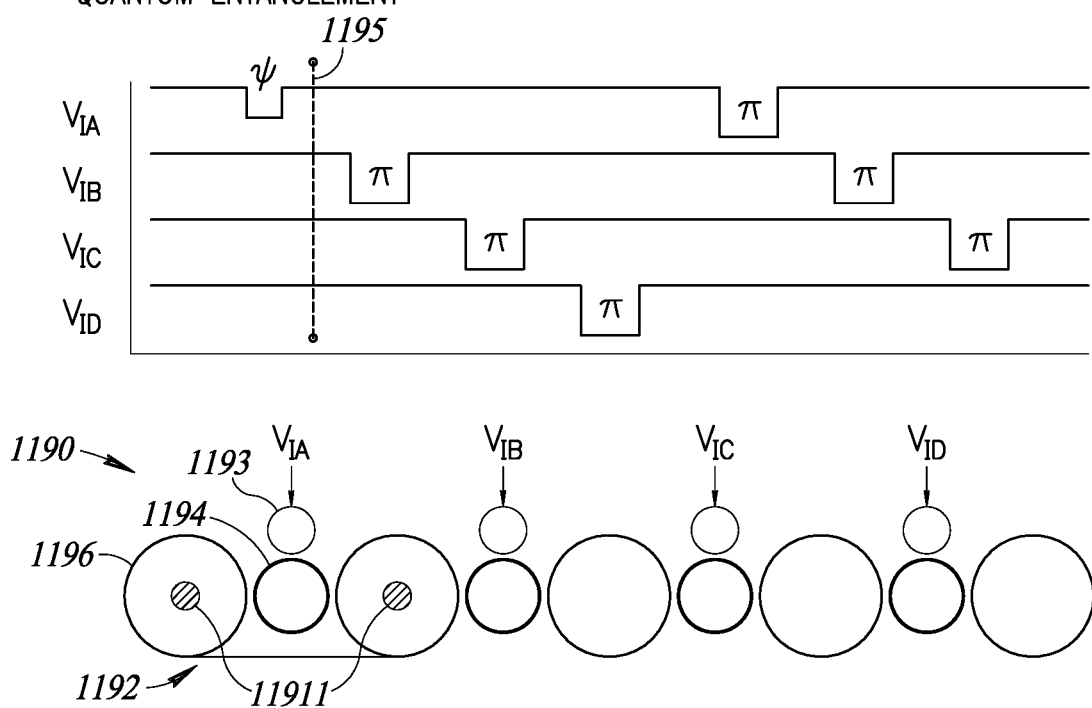
FIG. 20B is a diagram illustrating quantum superposition state of an example controlled semiconductor shift register.

A diagram illustrating quantum state superposition of an example controlled semiconductor shift register is shown in FIG. 20B. Before time 1195, the control signal $V_{IA}$ applied to the control gate 1193 determined the lowering of the tunneling path 1194 barrier for a given amount of time that corresponds to a phase rotation θ. The result was that the quantum particle 1191 was spread between the first two left-most qdots 1196, i.e. is in a quantum superposition state 1192. An equal distribution or an arbitrary one can be achieved with the appropriate control signals. Note that the split may comprise the Hadamard state if $\theta=\pi/2$. Otherwise, any split or rotation may be achieved.

Thus, after the leftmost qdot is initialized, a control gate pulse having a pulse width of θ is applied which is different from π or any multiple of π. This means the particle will be split. The full electron that initially was in the first qubit is now split between the first and the second qdot 1192. This is referred to as superposition state of the particle.

A diagram illustrating shifting of a first component of an example controlled semiconductor shift register is shown in FIG. 20C. At time 1206, The quantum state after a first π pulse $V_{IB}$, i.e. half the Rabi oscillation period, is applied to the second control 1202 terminal is shown. This determines the shifting of the split particle 1201, 1202 from the second qdot 1207 to the third qdot as indicated by the arrow 1208. The split particle component 1201 from the first qdot 1207 stays in the same position since the control signal $V_{IA}$ keeps its tunnel barrier high.

Note that subsequently, after applying the third control pulse $V_{IC}$, also of width 7C or half the Rabi oscillation period, the split particle 1202 will travel from the third qdot to the fourth qdot. In response to the fourth control pulse $V_{ID}$, the split particle will travel from the fourth qdot to the fifth qdot. The control signals are applied signals one after the other which causes the particle or split particle to travel from one qdot to the other.

A diagram illustrating shifting of a second component of an example controlled semiconductor shift register is shown in FIG. 20D. At time 1216, a second pulse $V_{IA}$ of duration π or half the Rabi oscillation period is applied to the first control gate 1211. The split particle 1212 which was left in the first qdot 1218, is shifted to the second qdot. The shifting continues by applying the remaining control pulses $V_{IB}$ and $V_{IC}$. The resulting action is that of a shift register whereby one or more particles or split particles are shifted as desired.

Note that although one control pulse was shown active at the given time in the present example, multiple control pulses may be active at the same time. For example, two control pulses may occur at the same time on different qdots depending on where the two qdots are located. The results of applying control pulses to two particles at the same time depends on the slope. If the slope is relatively steep, i.e. fast, the quantum swap action results. If the slope is gradual, i.e. slow, then the quantum annealing gate results. If the two particles are not adjacent to each other, two particles will shift at the same time. Thus, any combination of actions can be achieved.

Figure 21A:
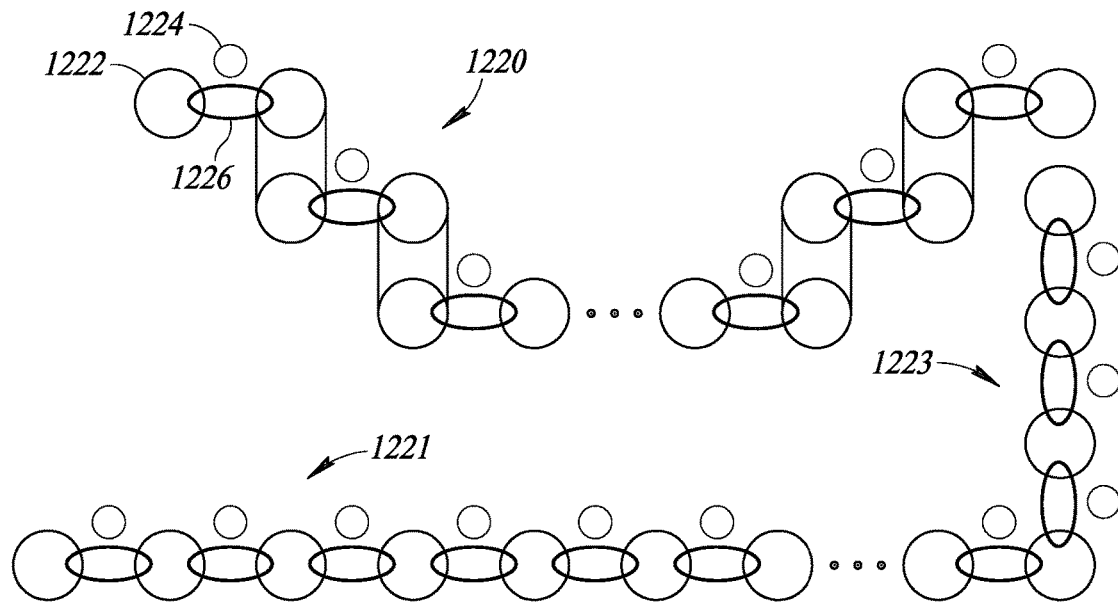
FIG. 21A is a diagram illustrating an example of linear, zig-zag, and angled controlled quantum shift registers with qubits using tunneling through oxide layer and planar semiconductor process.

A diagram illustrating an example of linear, zig-zag, and angled controlled quantum shift registers with qubits using tunneling through oxide layer and planar semiconductor process is shown in FIG. 21A. The quantum structures comprise a zig-zag or staircased shaped shift register 1220, linear shift register 1221, and perpendicular angled shift register 1223. The planar semiconductor quantum shift registers comprise a plurality of qdots 1222, tunneling 1226 through a thin gate oxide layer, and control gates 1224. The direction of transport of the zig-zag shift register is at an angle, forming a V-shape structure. This is advantageous, since it achieves a variable distance to a given location and allows strong interaction for some locations and weak or negligible interaction for other locations.

Figure 21B:
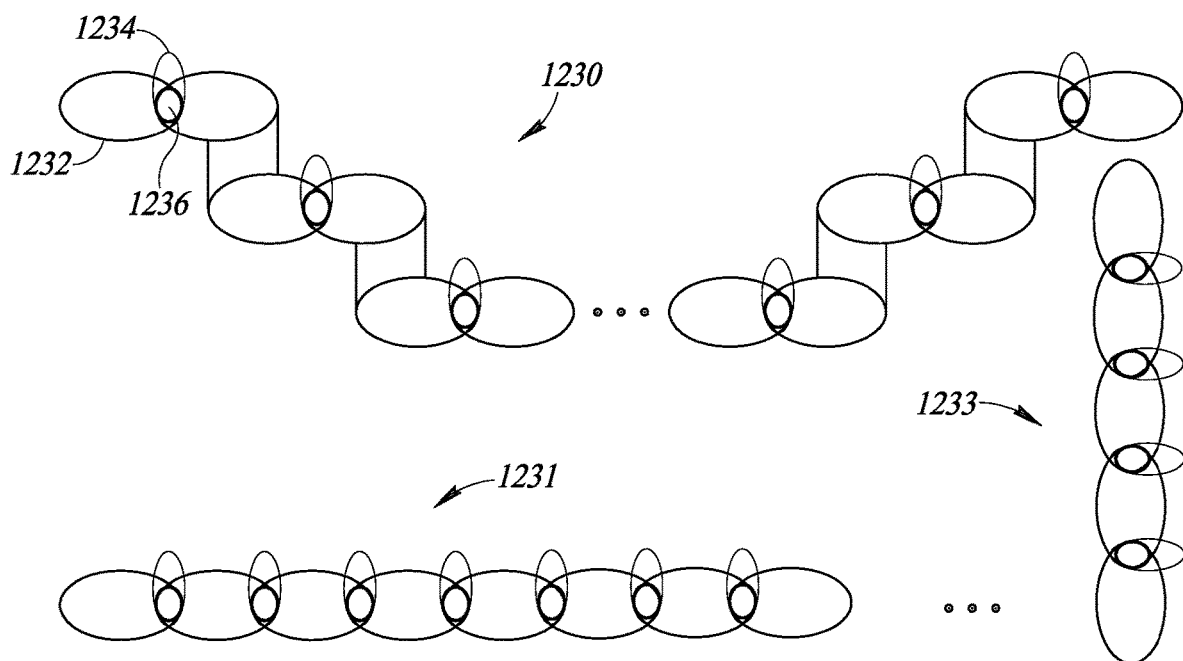
FIG. 21B is a diagram illustrating an example of linear, zig-zag, and angled controlled quantum shift registers with qubits using tunneling through local depleted region in a well and planar semiconductor process.

A diagram illustrating an example of linear, zig-zag, and angled controlled quantum shift registers with qubits using tunneling through local depleted region in a well and planar semiconductor process is shown in FIG. 21B. The quantum structures comprise a zig-zag or staircased shaped shift register 1230, linear shift register 1231, and perpendicular angled shift register 1233. The planar semiconductor quantum shift registers comprise a plurality of qdots 1232, tunneling 1236 through a local depletion region in a semiconductor well under control of a control gate 1234.

Figure 21C:
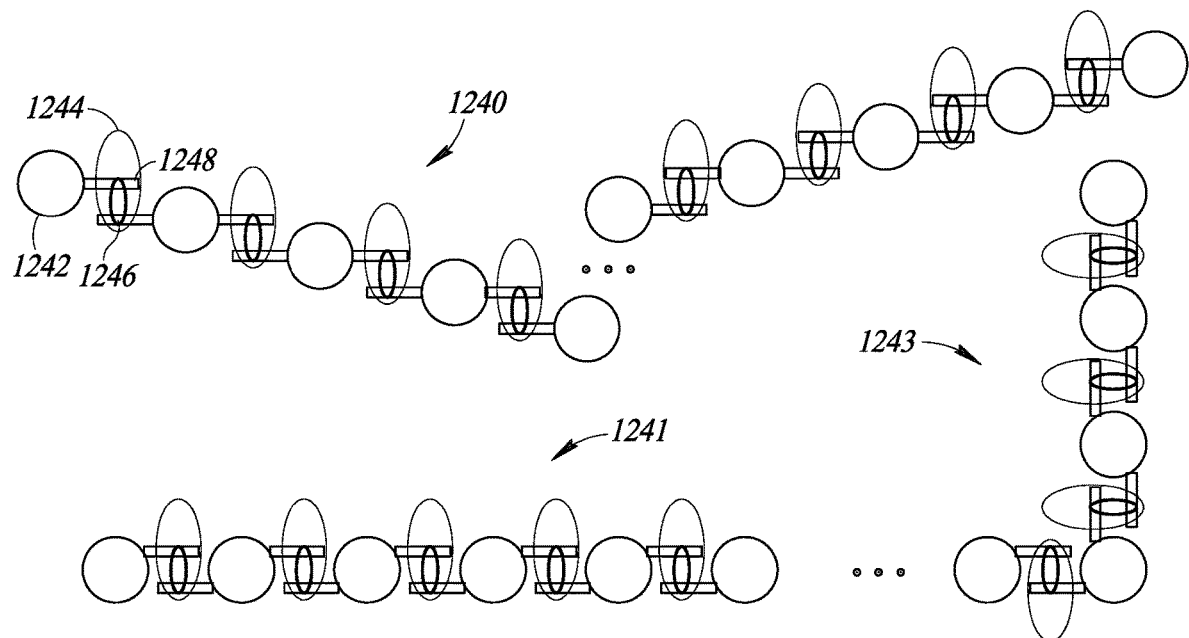
FIG. 21C is a diagram illustrating an example of linear, zig-zag, and angled controlled quantum shift registers with qubits using tunneling through oxide layer and 3D semiconductor process.

A diagram illustrating an example of linear, zig-zag, and angled controlled quantum shift registers with qubits using tunneling through oxide layer and 3D semiconductor process is shown in FIG. 21C. The quantum structures comprise a zig-zag or staircased shaped shift register 1240, linear shift register 1241, and perpendicular angled shift register 1243. The 3D semiconductor quantum shift registers comprise a plurality of qdots 1242 having fins (wells) 1248, tunneling 1246 through a thin gate oxide layer under control of a control gate 1244.

Figure 21D:
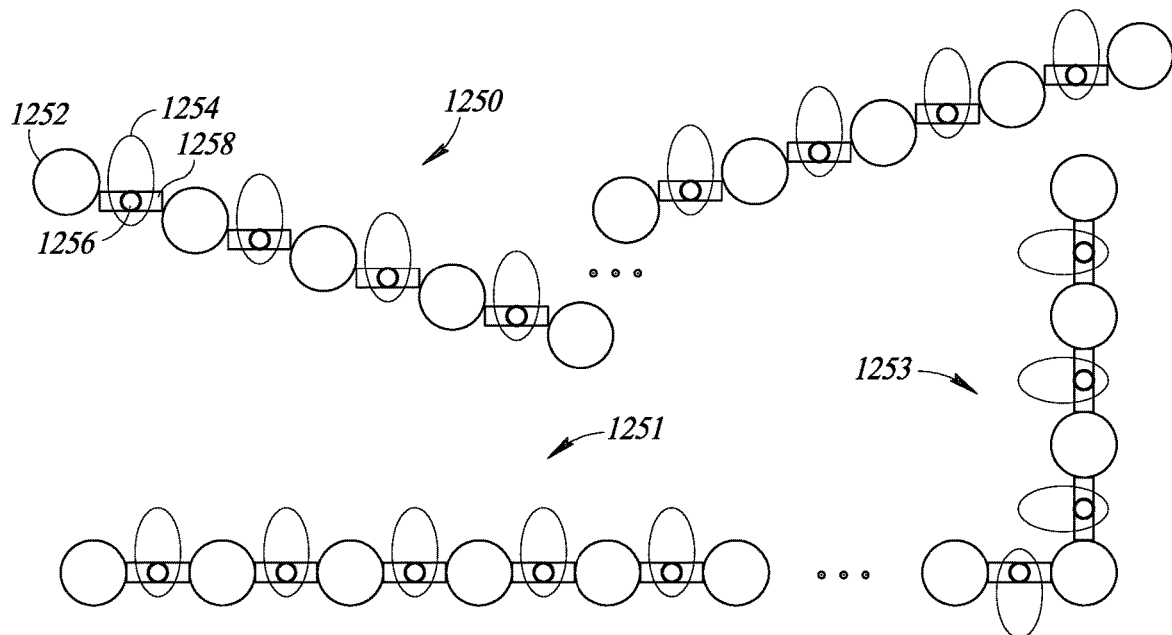
FIG. 21D is a diagram illustrating an example of linear, zig-zag, and angled controlled quantum shift registers with qubits using tunneling through local depleted region in a fin and 3D semiconductor process.

A diagram illustrating an example of linear, zig-zag, and angled controlled quantum shift registers with qubits using tunneling through local depleted region in a fin and 3D semiconductor process is shown in FIG. 21D. The quantum structures comprise a zig-zag or staircased shaped shift register 1250, linear shift register 1251, and perpendicular angled shift register 1253. The 3D semiconductor quantum shift registers comprise a plurality of qdots 1252 with fins (well) 1258, tunneling 1256 through a local depletion region in a semiconductor fin under control of a control gate 1254.

Note that shift registers having any geometric shape may be fabricated using the four semiconductor processes described supra depending on the constraints of the semiconductor process used, e.g., linear, rectangular, angular, staircase, V, X, I, H shaped, etc. and the available path for the 'registers'.

Figure 22:
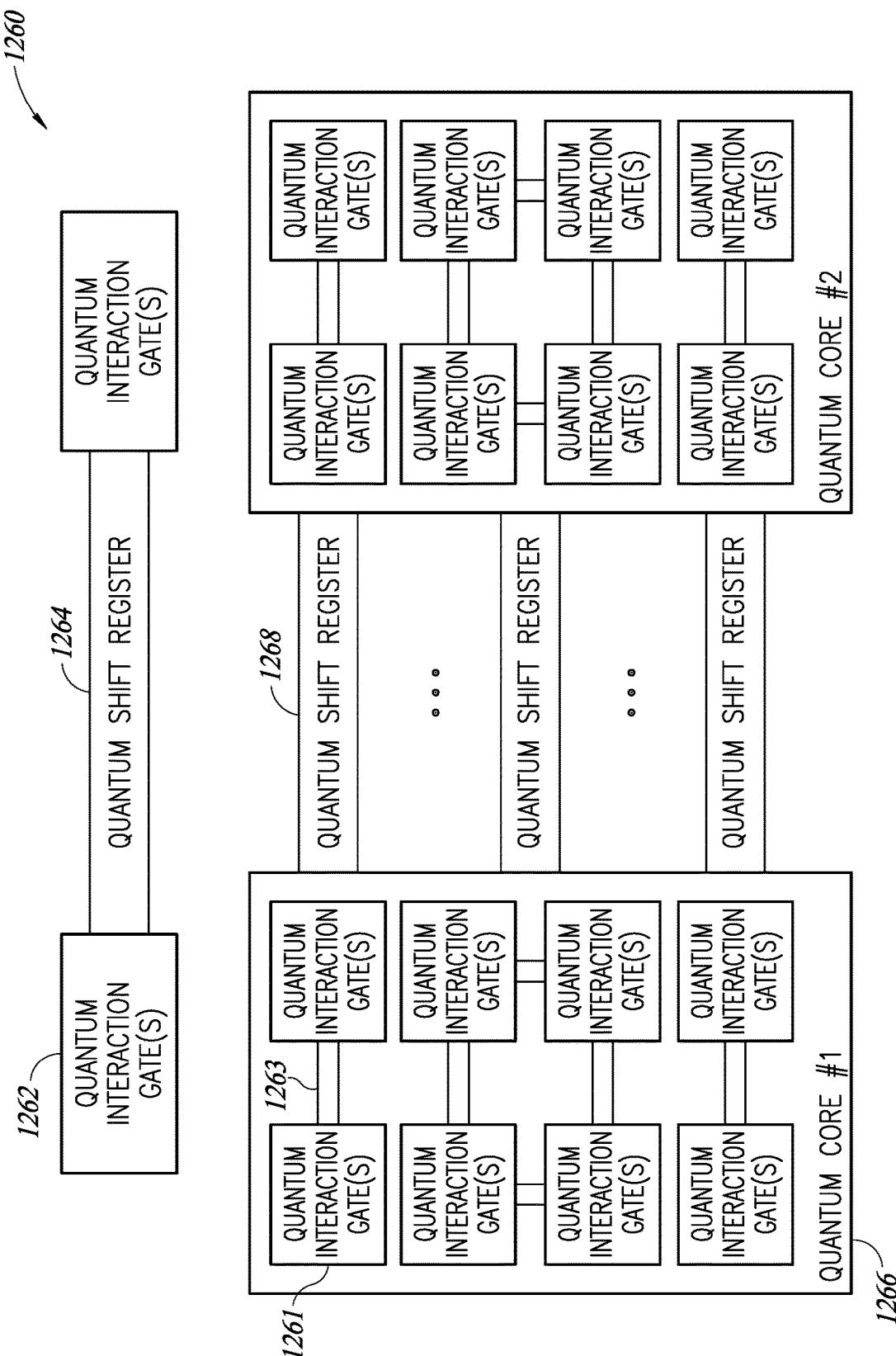
FIG. 22 is a diagram illustrating an example quantum shift register interconnecting quantum interaction gates.

A diagram illustrating an example quantum shift register interconnecting quantum interaction gates is shown in FIG. 22. A common use for quantum shift register is shown in this figure. The quantum circuit, generally referenced 1260, comprises quantum gates 1262 connected by a quantum shift register 1264. The circuit also comprises quantum cores 1266 connected by a plurality of quantum shift registers 1268. Each quantum core may comprise a plurality of quantum interaction gates 1261 also connected by quantum shift registers 1263.

Normally, quantum operations are performed in quantum interaction gates. The quantum particles/states need to be transported from one quantum interaction gate to another. This function is performed by quantum shift registers. Quantum shift registers are also used to transport quantum particles/states from one quantum core to another. Thus, both local and global transport quantum shift registers are provided.

For example, consider quantum interaction gate #1 and quantum interaction gate #2. Some particles interact in quantum interaction gate #1 and it is desired to move one of the particles to quantum interaction gate #2 to interact with other particles. A quantum shift register is used to link between different quantum interaction gates and thereby move particles. A quantum shift register also functions to link between the classic world and quantum interaction gates. Since the particle must be injected before any kind of interaction, it typically must be injected before being moved to an interaction qdot.

In the case of a plurality of quantum cores, where each comprises a plurality of quantum interaction gates, each of the quantum interaction gates is linked through shift registers that are relatively small sized. Moving from one quantum core to another, however, typically requires larger size quantum shift registers. For example, the distance particles are moved in localized quantum shift registers are in the range of microns. Moving from one quantum core to another, may involve distances of tens of microns or even hundreds of microns.

Figure 23A:
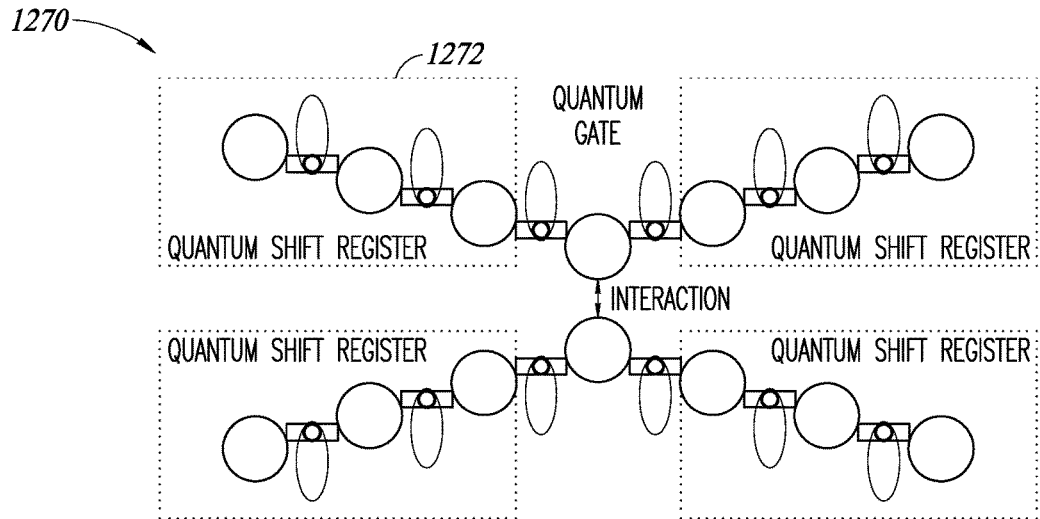
FIG. 23A is a diagram illustrating an example double V quantum structure incorporating quantum shift registers.

A diagram illustrating an example double V quantum structure incorporating quantum shift registers is shown in FIG. 23A. The quantum structure with tunneling through local depletion regions, generally referenced 1270, comprises a double V quantum interaction gate (e.g., CNOT) with four quantum shift registers 1272 and two interaction qdots. The four shift registers function only to transport the quantum particles/states in and out of the interaction qdots on either side of the quantum interaction gate, i.e. from a remote location to the closely spaced location where the interaction will take place. Thus, the quantum interaction gate comprises four ports.

Figure 23B:
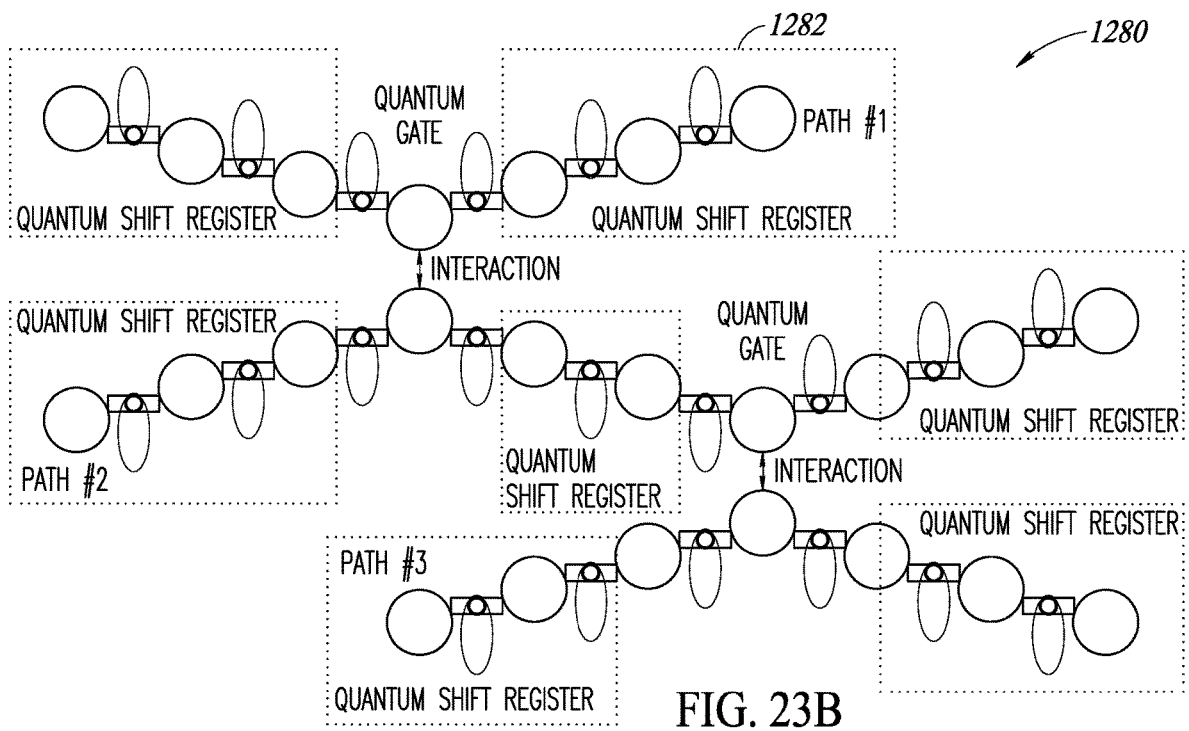
FIG. 23B is a diagram illustrating an example triple V quantum structure incorporating quantum shift registers.

In some cases it is desired to achieve interaction/entanglement between a plurality of particles/states. A diagram illustrating an example multiple V quantum structure incorporating quantum shift registers is shown in FIG. 23B. The quantum structure with tunneling through a local depletion region, generally referenced 1280, comprises a multiple V quantum interaction gate with a plurality of quantum shift registers 1282 and multiple interaction qdots in three paths. The multiple shift registers function to transport the quantum particles/states in and out of the interaction qdots, i.e. from a remote locations to the closely spaced locations where quantum interaction will take place. Note that this example includes two interaction locations or quantum gates. One between the first and second V shape quantum structure and a second between the second and the third V shape quantum structure. In this case an even larger number of quantum shift registers are used to transport the quantum particles/states between, to, and from the interaction locations.

Figure 23C:
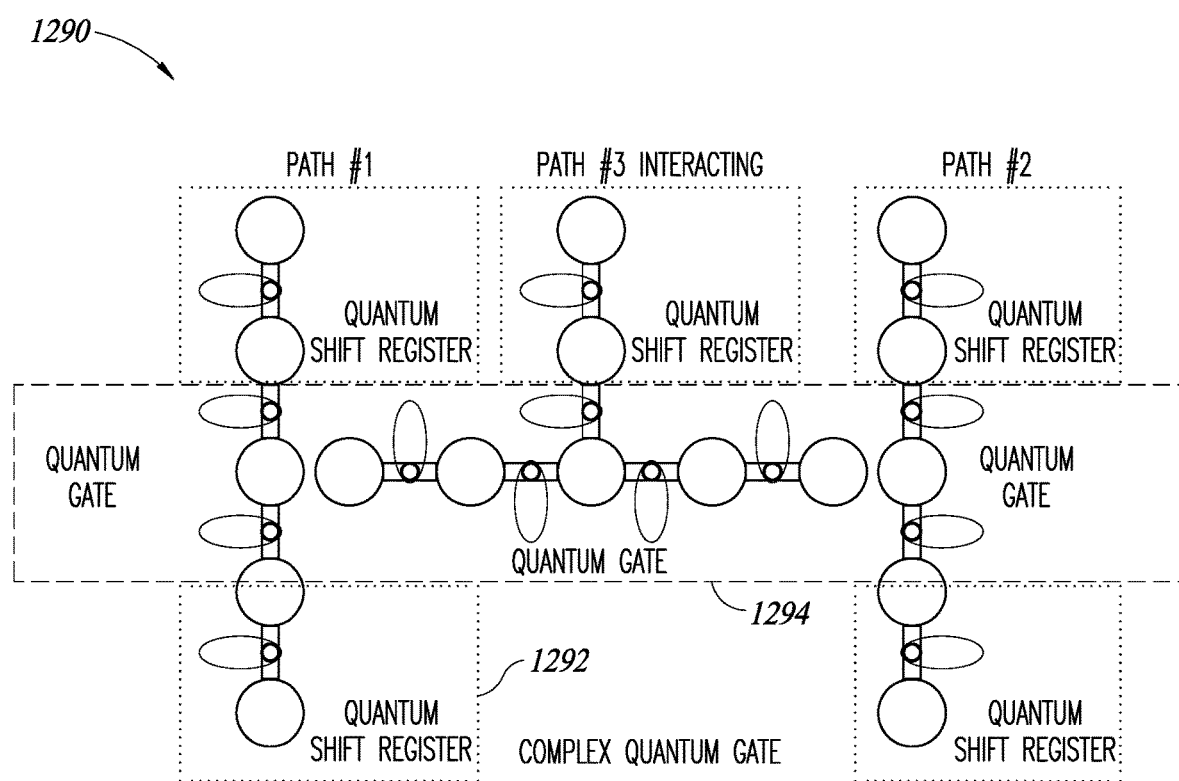
FIG. 23C is a diagram illustrating an example H interaction quantum flow path incorporating quantum shift registers.

A diagram illustrating an example H interaction quantum flow path incorporating quantum shift registers is shown in FIG. 23C. The 3D quantum structure with tunneling through a local depletion region, generally referenced 1290, comprises an H shaped quantum interaction gate with a plurality of quantum shift registers 1292 and multiple quantum gates 1294 interaction qdots in three paths. The multiple shift registers function to transport the quantum particles/states in and out of the interaction qdots, i.e. from a remote locations to the closely spaced locations where quantum interaction takes place.

The interaction gates include two qdots placed in close proximity. The rest of the circuitry are the quantum shift registers that are used to shift particles to and from the quantum gates. Note that quantum shift register interaction gates may be constructed having any desired shape, e.g., I, T, L shapes, orthogonal, vertical, horizontal, angled, etc.

Figure 24:
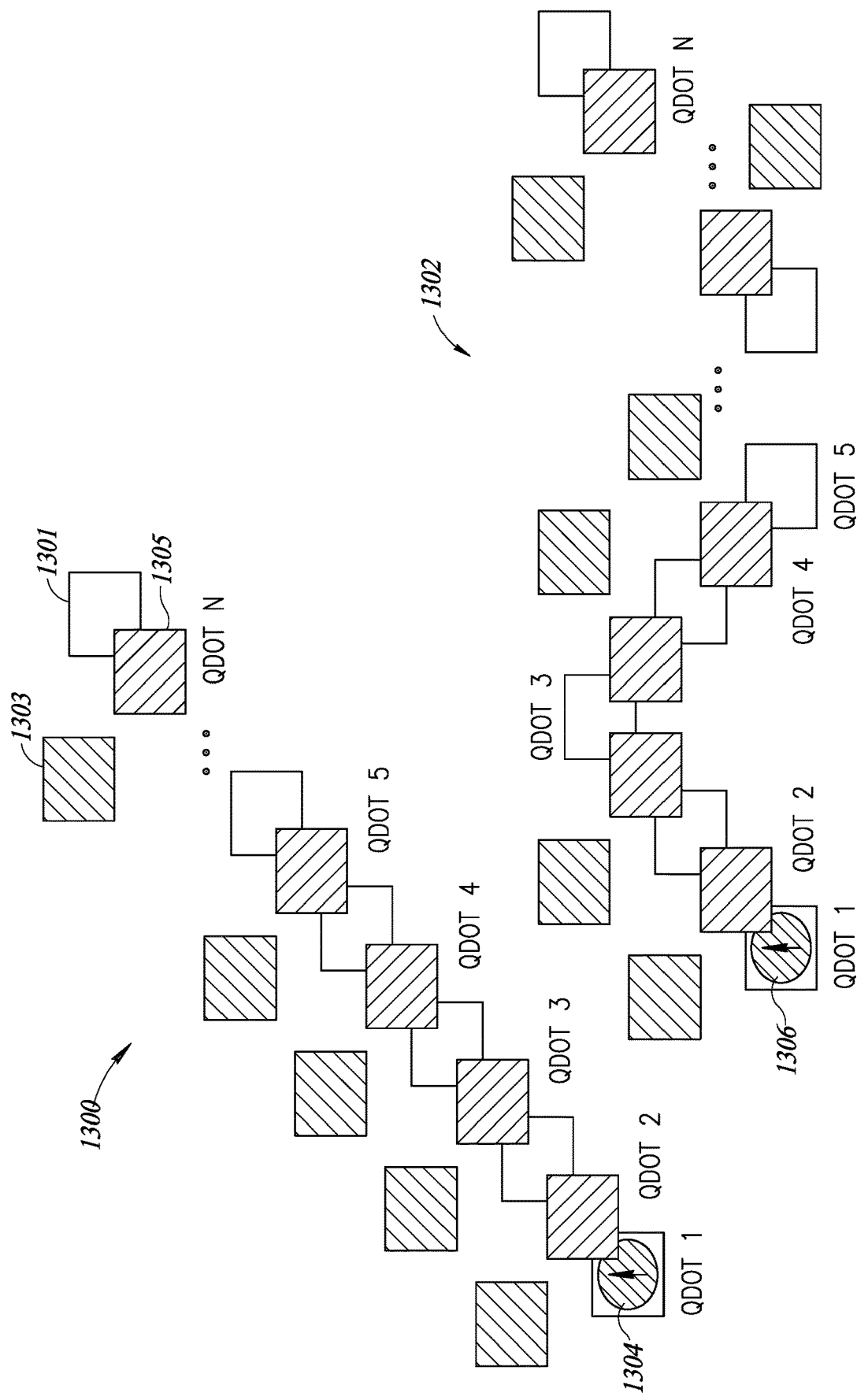
FIG. 24 is a diagram illustrating example linear and zig-zag controlled quantum shift registers using tunneling through separate oxide layer.

A diagram illustrating example linear and zig-zag controlled quantum shift registers using tunneling through separate oxide layer is shown in FIG. 24. The linear quantum shift register structure 1300 and zig-zag quantum shift register 1302 are implemented with tunneling through gate oxide. The wells are represented by the empty squares 1301 while the squares 1305 represent gates that overlap the wells in the corners and squares 1303 are the control gates. Note that the small overlap between the gate and the well is preferable because a small overlap results in a small capacitance which makes the Coulomb blockade voltage higher.

Figure 25:
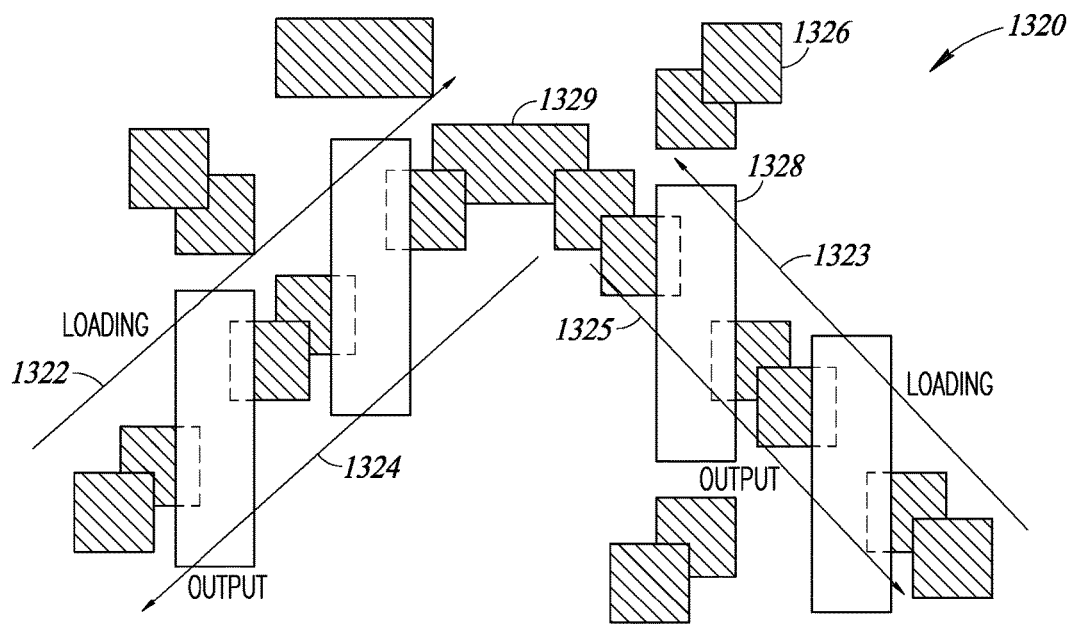
FIG. 25 is a diagram illustrating an example z shift register in planar semiconductor process using partial overlap of semiconductor well and control gate.

A diagram illustrating an example z shift register in planar semiconductor process using partial overlap of semiconductor well and control gate is shown in FIG. 25. The shift register, generally referenced 1320, comprises a plurality of wells 1326 that are separated and overlapping control gates 1328. The zig-zag quantum shift register uses tunneling through oxide and half gate length side overlap with hangover. The arrows 1322, 1323 indicate the loading of particles on one end that are shifted to the interaction qdot 1329. Arrow 1324, 1325 represent the path the particle takes after interaction away from the interaction qdot.

Regarding the semiconductor process of the quantum circuits in FIGS. 24 and 25, a particle in one of those qdots of the structure 1320 cannot travel laterally to other qdots because of thick oxide separating the wells, e.g., tens or hundreds of nanometers distance. The only way the particle can travel is via the gate that overlaps two wells. The thickness of the oxide between a well and a gate is very small, one or two nanometers in current advanced semiconductor processes. Thus, the lateral distance between two wells is tens or hundreds of times bigger than the vertical distance. Furthermore, the tunneling current depends exponentially on the thickness of the oxide. Given the gate oxide is around one or two nanometers and well to well distance is hundreds of nanometers, tunneling laterally from one well to the other is negligible. The electron can only tunnel from the well through the gate oxide to the gate then transport through the gate which conducts and then tunnel through to the other well.

It is noted that the particle, e.g., electron, can be made to tunnel up through the oxide through the gate and back down to the other well by appropriately controlling the voltages applied to the control gate and wells. For example, applying a more positive potential on the gate, the electron will tunnel from the well to the gate. The electron will continue to tunnel if a potential that is even more positive is applied to the well. The potential can be applied in several ways including with another well, a poly gate, metal that goes on top, etc.

Figure 26:
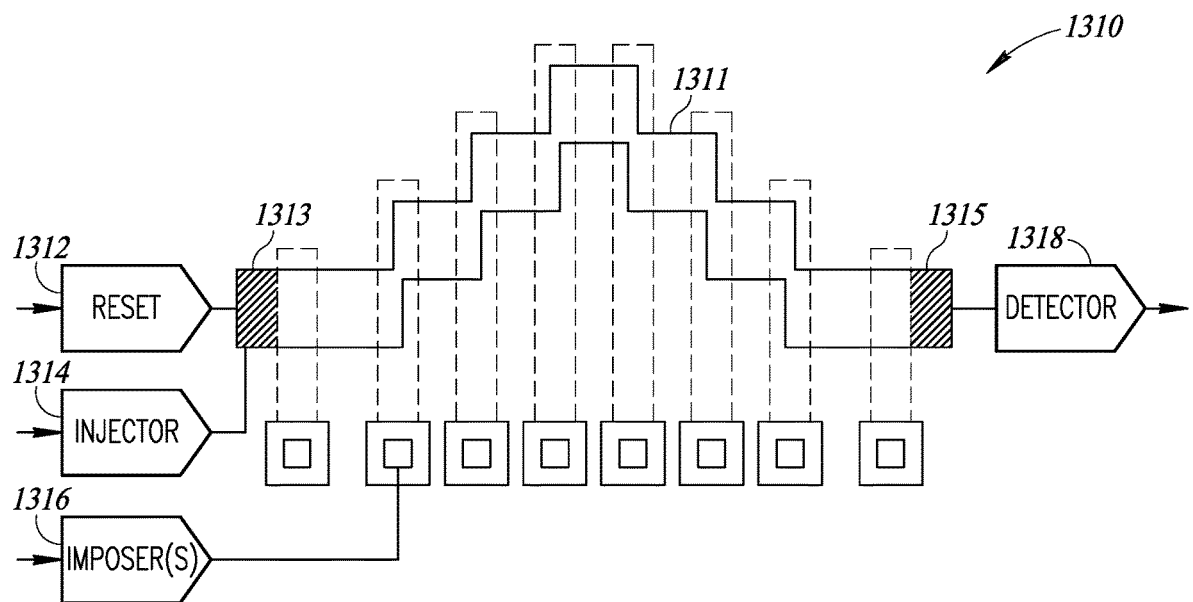
FIG. 26 is a diagram illustrating an example quantum shift register using qdots realized in a continuous well with local depletion and voltage driven imposing.

A diagram illustrating an example quantum shift register using qdots realized in a planar continuous well with local depletion region and voltage driven imposing is shown in FIG. 26. The quantum shift register, generally referenced 1310, comprises quantum structure 1311, reset circuit 1312, injector circuit 1314, imposer circuit 1316, and detector circuit 1318. The shift register also comprises interface devices/wells 1313, 1315 placed at the two ends of the continuous well to interface with classic electronic circuits.

Figure 27:
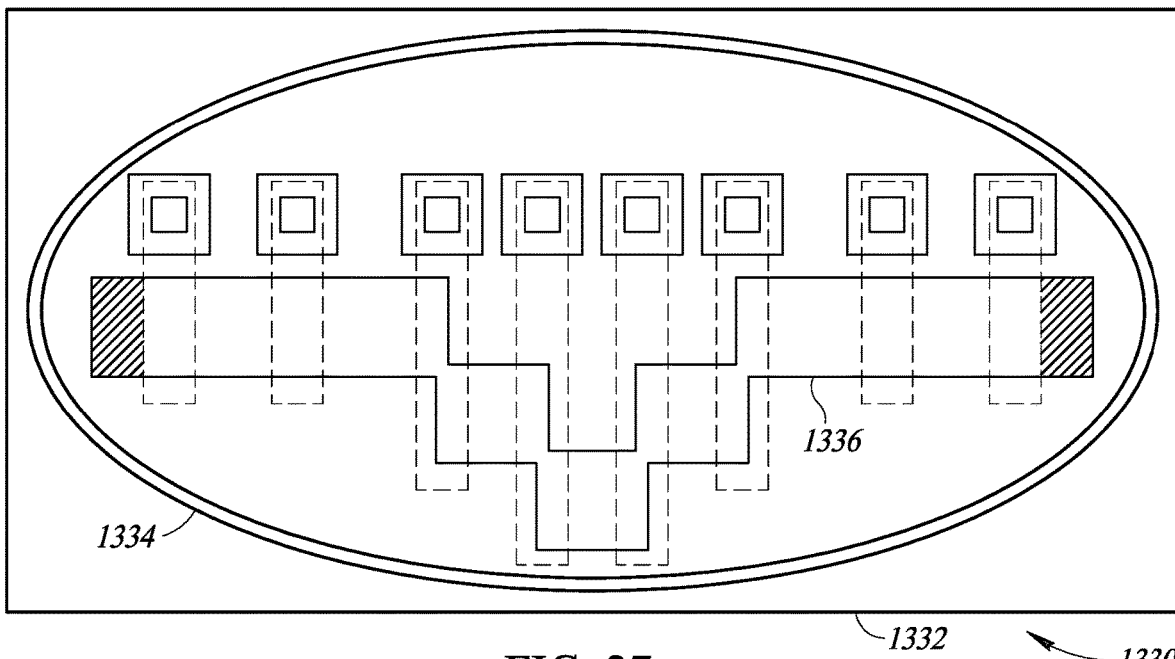
FIG. 27 is a diagram illustrating an example controlled quantum shift register with auxiliary magnetic field control.

A diagram illustrating an example controlled quantum shift register with auxiliary magnetic field control is shown in FIG. 27. The circuit, generally referenced 1330, comprises a quantum semiconductor shift register 1336 realized in a planar process using a long continuous well with multiple overlapping control gates that induce local depletion regions in the well. In addition, mixed electric and magnetic field control can be used. The magnetic field can be generated with an inductor 1334 or by a resonator 1332. Both local and global magnetic control and both static and ac magnetic fields can be used.

When RF current is passed through an inductor 1334, a magnetic field is created. This magnetic field can be used to control the quantum structure. A magnetic field can also be generated by placing the entire structure or the entire QPU chip in a cavity 1332. Exciting the metal cavity using an amplifier, a magnetic field is generated inside that can be used to control the quantum structure.

In operation, the depletion regions in the continuous well under the control gates are inducted and by modulating the potential with imposers, the tunnel barriers can be controlled high and low. This enables a particle to either tunnel or be blocked from tunneling. The potentials used to control the circuit are generated for example by DACs.

Figure 28A:
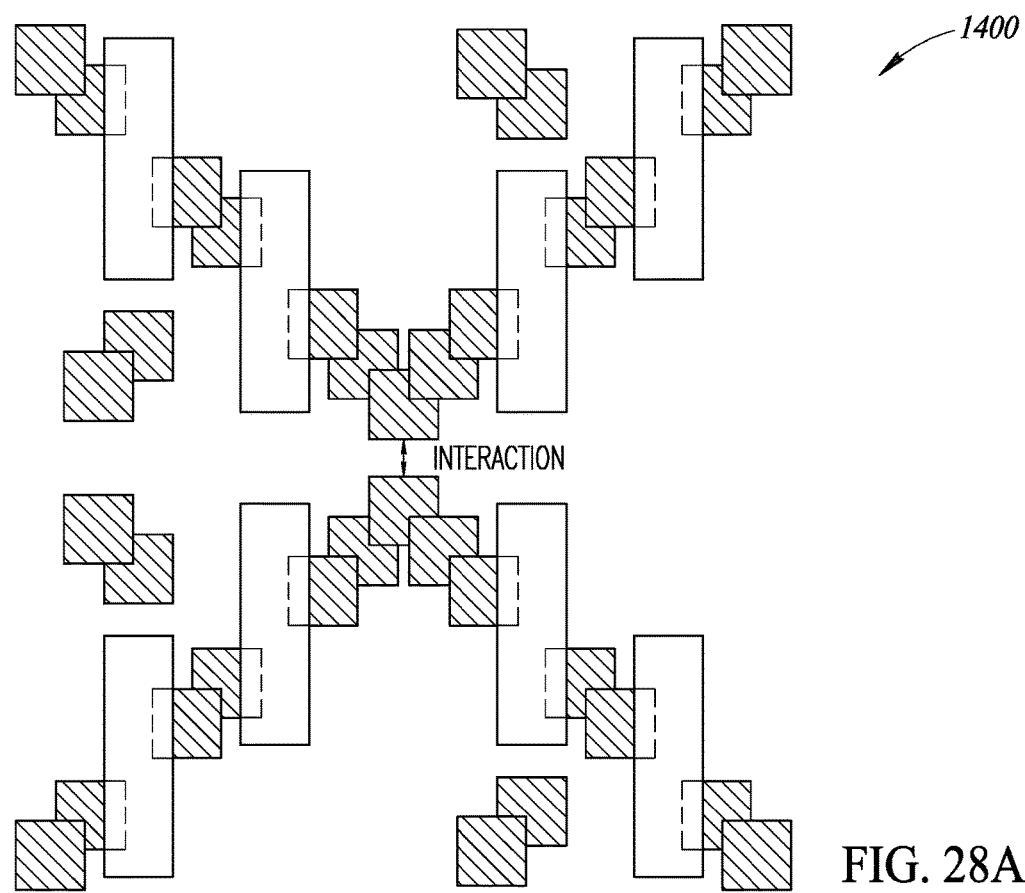
FIG. 28A is a diagram illustrating an example quantum shift register fabricated using planar semiconductor process using qubits with tunneling through separate layers.

A diagram illustrating an example quantum shift register fabricated using planar semiconductor process using qubits with tunneling through separate oxide layers is shown in FIG. 28A. The quantum structure, generally referenced 1400, comprises a double V shape with qdots that are completely separated, several quantum shift registers, and at least one interaction gate in the middle region. The shift registers function to shift the particles in and out of the quantum interaction gate.

Figure 28B:
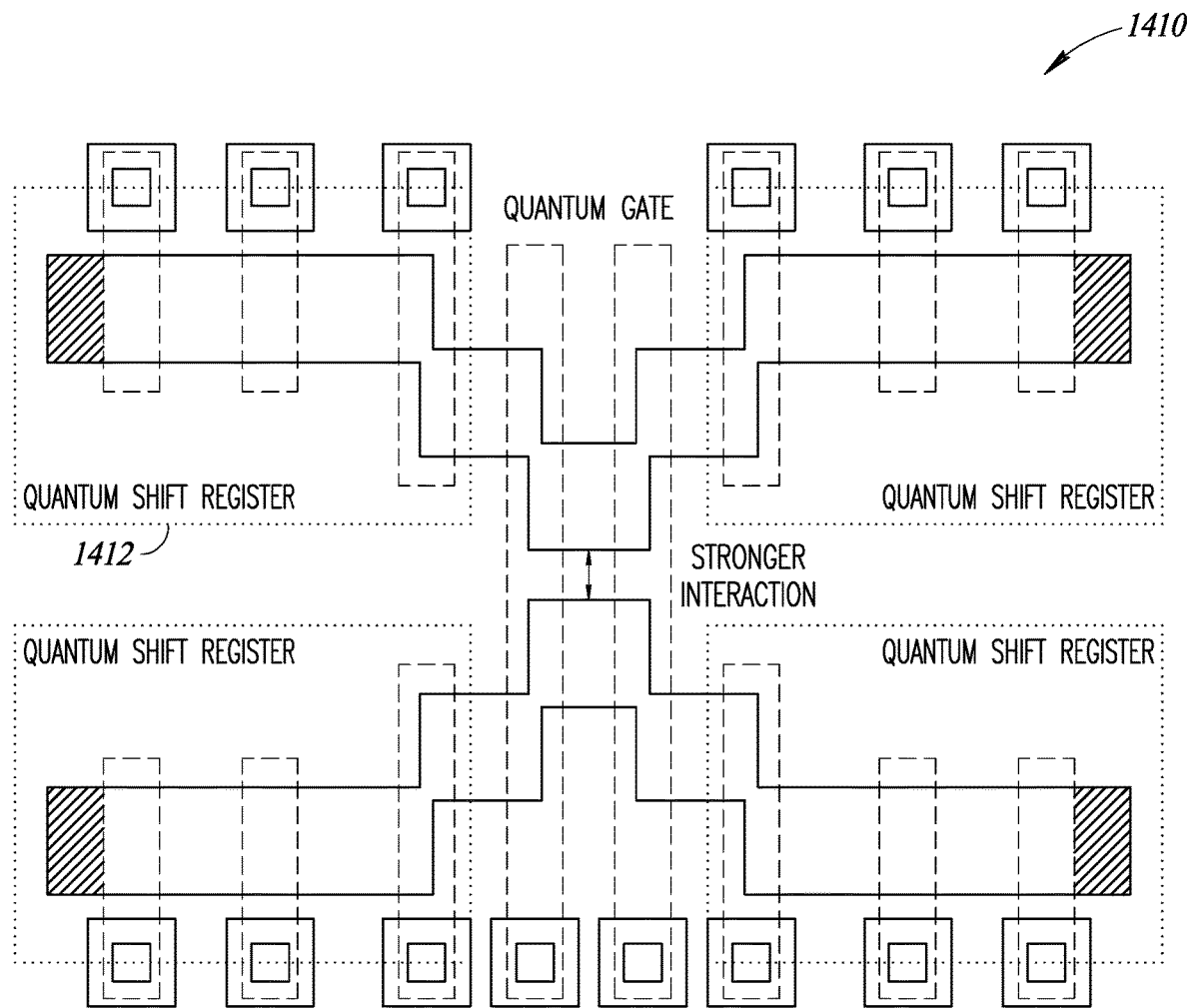
FIG. 28B is a diagram illustrating an example quantum shift register fabricated using planar semiconductor process using qubits with tunneling through local depleted wells.

A diagram illustrating an example quantum shift register fabricated using planar semiconductor process using qubits with tunneling through local depleted wells is shown in FIG. 28B. The quantum structure, generally referenced 1410, comprises a double V shape with qdots fabricated on continuous wells, several quantum shift registers, and at least one interaction gate in the middle region. The shift registers function to transport the particles in and out of the quantum interaction gate.

Figure 28C:
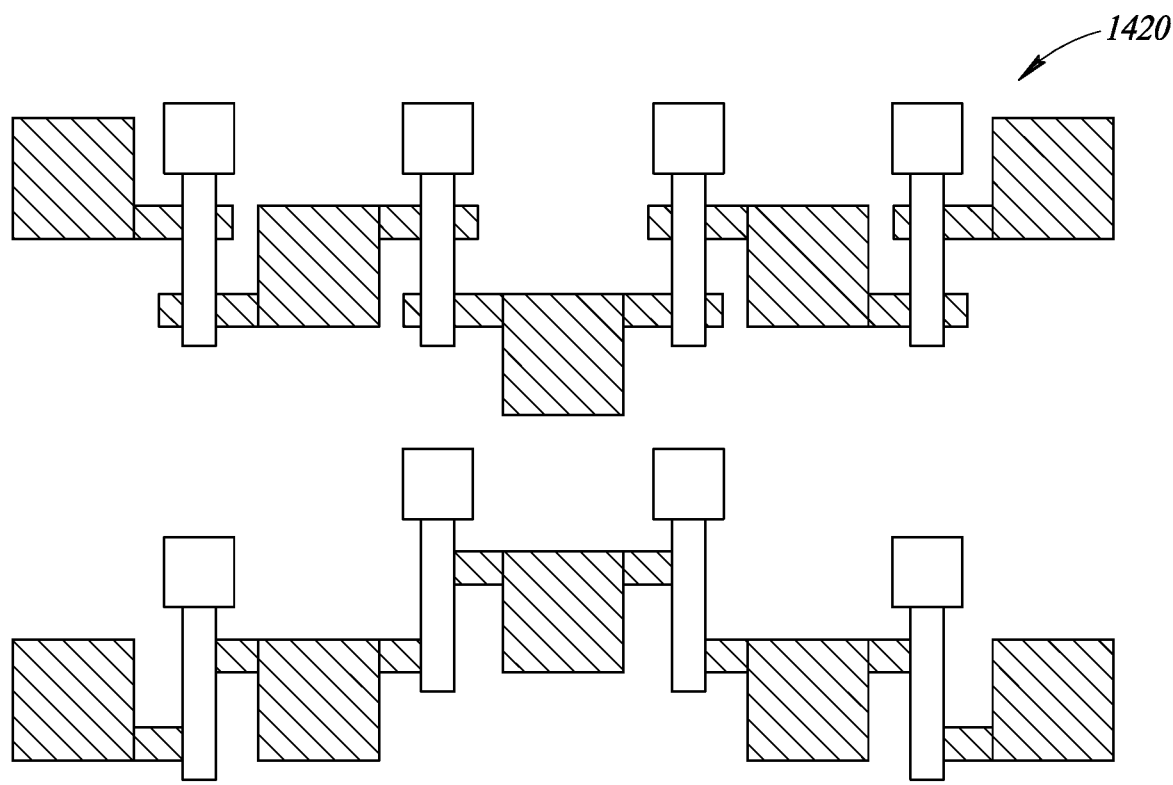
FIG. 28C is a diagram illustrating an example quantum shift register fabricated using 3D semiconductor process using qubits with tunneling through separate layers.

A diagram illustrating an example quantum shift register fabricated using 3D semiconductor process using qubits with tunneling through separate oxide layers is shown in FIG. 28C. The quantum structure, generally referenced 1420, comprises a double V shape with qdots having fins that are completely separated, several quantum shift registers, and at least one interaction gate in the middle region. The control gate overlaps two fins to allow tunneling from fin to fin through the thin gate oxide. The shift registers function to move the particles in and out of the quantum interaction gate.

Figure 28D:
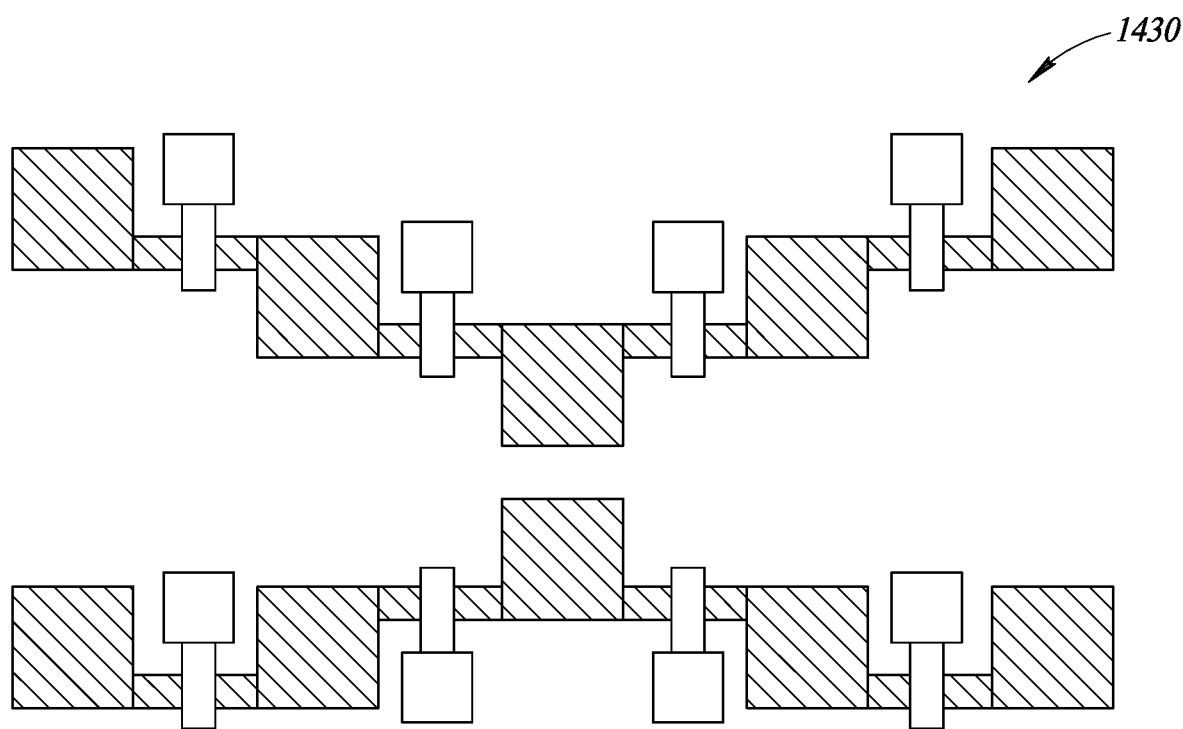
FIG. 28D is a diagram illustrating an example quantum shift register fabricated using 3D semiconductor process using qubits with tunneling through local depleted wells.

A diagram illustrating an example quantum shift register fabricated using 3D semiconductor process using qubits with tunneling through local depleted wells is shown in FIG. 28D. The quantum structure, generally referenced 1430, comprises a double V shape with qdots having fins, several quantum shift registers, and at least one interaction gate in the middle region. The control gate overlaps the fins to allow tunneling from fin to fin through a local depletion region in the fins under the control gate. The shift registers function to move the particles in and out of the quantum interaction gate.

As described supra, using the same quantum structure with qdots that are in close proximity and qdots that are far away, virtually any quantum operation can be achieved depending on how the control pulse signals are programmed. One of the operations, the ancillary, is useful for performing quantum error correction. The simplest ancillary state is the Hadamard state. Consider two qdots where a particle is split equally between those qdots. The result is an ancillary state that is Hadamard distributed, meaning it has 50% probability of being in each of the two qdots.

It is generally well known that a quantum state cannot be copied since once it is copied it is destroyed. Consider a quantum state having an angle $\varphi$ and an angle $\theta$. This state cannot be duplicated to another structure and have exactly the same angles $\varphi$ and $\theta$. One of the angles, however, can be replicated. In most cases, the angle replicated is the angle $\theta$ that gives the rotation about the z-axis. Thus, although the complete quantum state cannot be replicated, a portion of the quantum can be. This is termed a higher order ancillary.

Figure 29A:
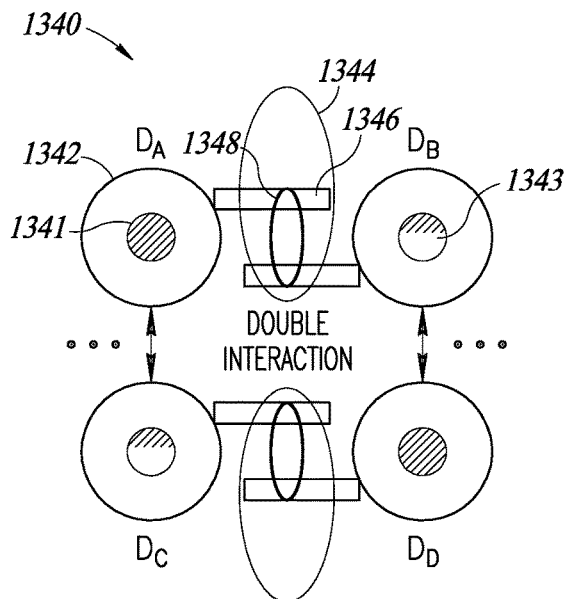
FIG. 29A is a diagram illustrating a first example double interaction quantum structure.

A diagram illustrating a first example double interaction quantum structure using a 3D semiconductor process with tunneling through gate oxide is shown in FIG. 29A. The quantum structure, generally referenced 1340, comprises two pairs of qdots 1342, namely $D_A$, $D_B$, $D_C$, and $D_D$, fins 1346, tunneling path 1348, and control gate 1344. Assume that qdots $D_A$ and $D_B$ have some split of electrons 1341, 1343 in a quantum state. It is desired that qdots $D_C$ and $D_D$ have exactly the same kind of split, meaning they have the same $\theta$ rotation of the vector that represents the quantum state. Since the angle $\varphi$ is not replicated, it will not be the same quantum state but it will have the $\theta$ same rotation. This can be achieved using a structure with four qdots and applying the appropriate control gate signals. If, for example, qdots $D_C$ and $D_D$ were initially in a Hadamard state, then they will end up being an inverse of the quantum state of qdots $D_A$ and $D_B$. Thus, from the perspective of 0 rotation, the qdots $D_A$ and $D_B$ are replicated. In actuality, the ancillary state of qdots $D_C$ and $D_D$ is made to correspond to that of qdots $D_A$ and $D_B$.

Figure 29B:
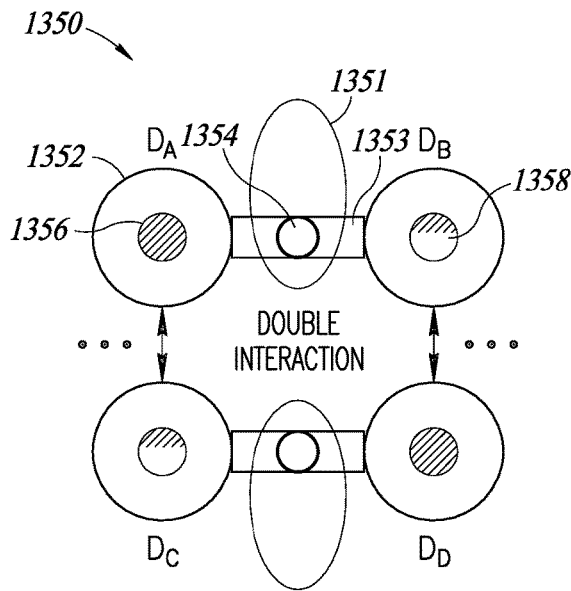
FIG. 29B is a diagram illustrating a second example double interaction quantum structure.

A diagram illustrating a second example double interaction quantum structure using a 3D semiconductor process with tunneling through local depletion region is shown in FIG. 29B. The quantum structure, generally referenced 1350, comprises two pairs of qdots 1352, namely $D_A$, $D_B$, $D_C$, and $D_D$, fins 1353, tunneling path 1354, and control gate 1351. Assume that qdots $D_A$ and $D_B$ have some split of electrons 1356, 1358 in a quantum state. This embodiment is similar to that of FIG. 29A where the double interaction yields a higher order ancillary that replicates the $\theta$ rotation of the vector that represents the quantum state.

Figure 29C:
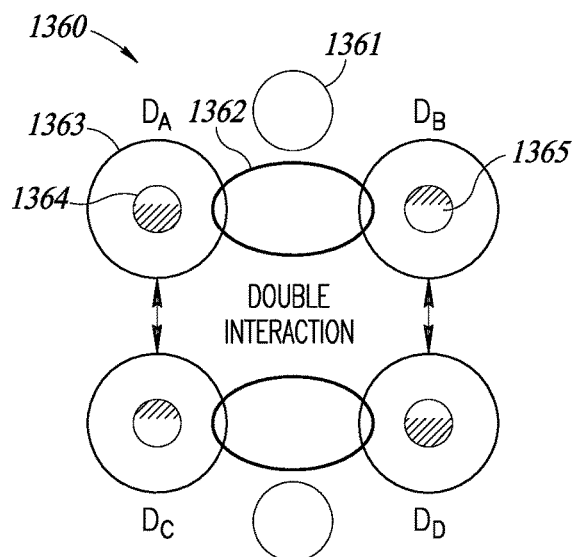
FIG. 29C is a diagram illustrating a third example double interaction quantum structure.

A diagram illustrating a third example double interaction quantum structure using a planar semiconductor process with tunneling through gate oxide is shown in FIG. 29C. The quantum structure, generally referenced 1360, comprises two pairs of qdots 1363, namely $D_A$, $D_B$, $D_C$, and $D_D$, tunneling path 1362, and control gate 1361. Assume that qdots $D_A$ and $D_B$ have some split of electrons 1364, 1365 in a quantum state. This embodiment is similar to that of FIG. 29A where the double interaction yields a higher order ancillary that replicates the θ rotation of the vector that represents the quantum state.

Figure 29D:
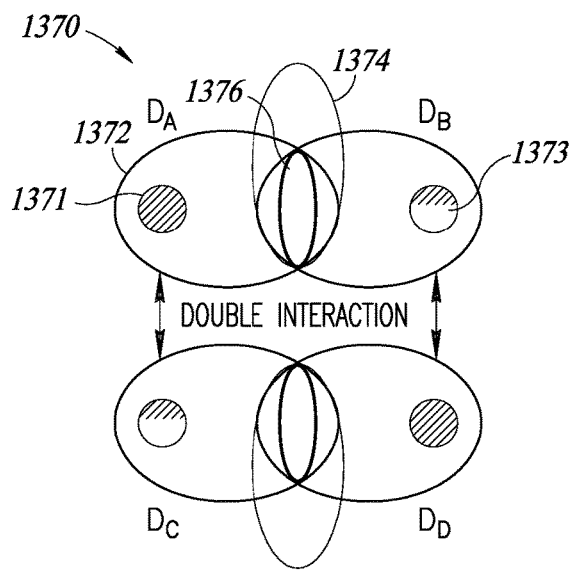
FIG. 29D is a diagram illustrating a fourth example double interaction quantum structure.

A diagram illustrating a fourth example double interaction quantum structure using a planar semiconductor process with tunneling through local depletion region is shown in FIG. 29D. The quantum structure, generally referenced 1370, comprises two pairs of qdots 1372, namely $D_A$, $D_B$, $D_C$, and $D_D$, local depletion region 1376, and control gate 1374. Assume that qdots $D_A$ and $D_B$ have some split of electrons 1371, 1373 in a quantum state. This embodiment is similar to that of FIG. 29A where the double interaction yields a higher order ancillary that replicates the θ rotation of the vector that represents the quantum state.

Figure 30:
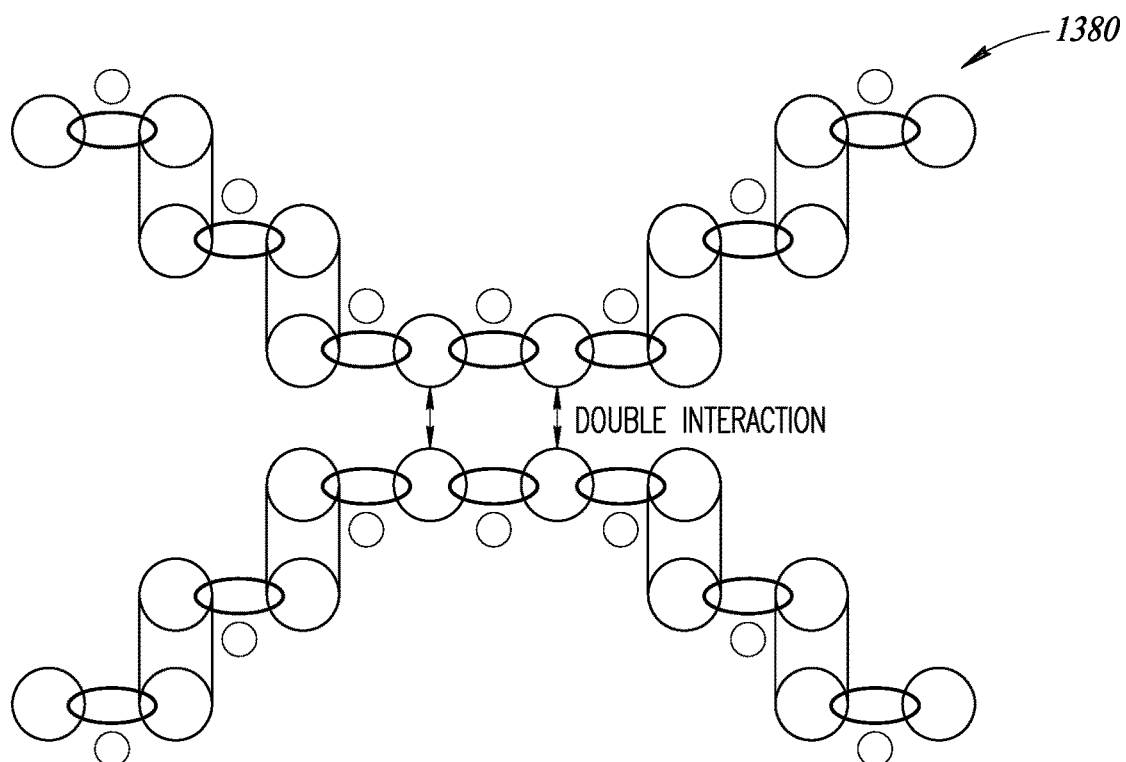
FIG. 30 is a diagram illustrating an example double V structure incorporating double interaction quantum shift register.
Figure 31:
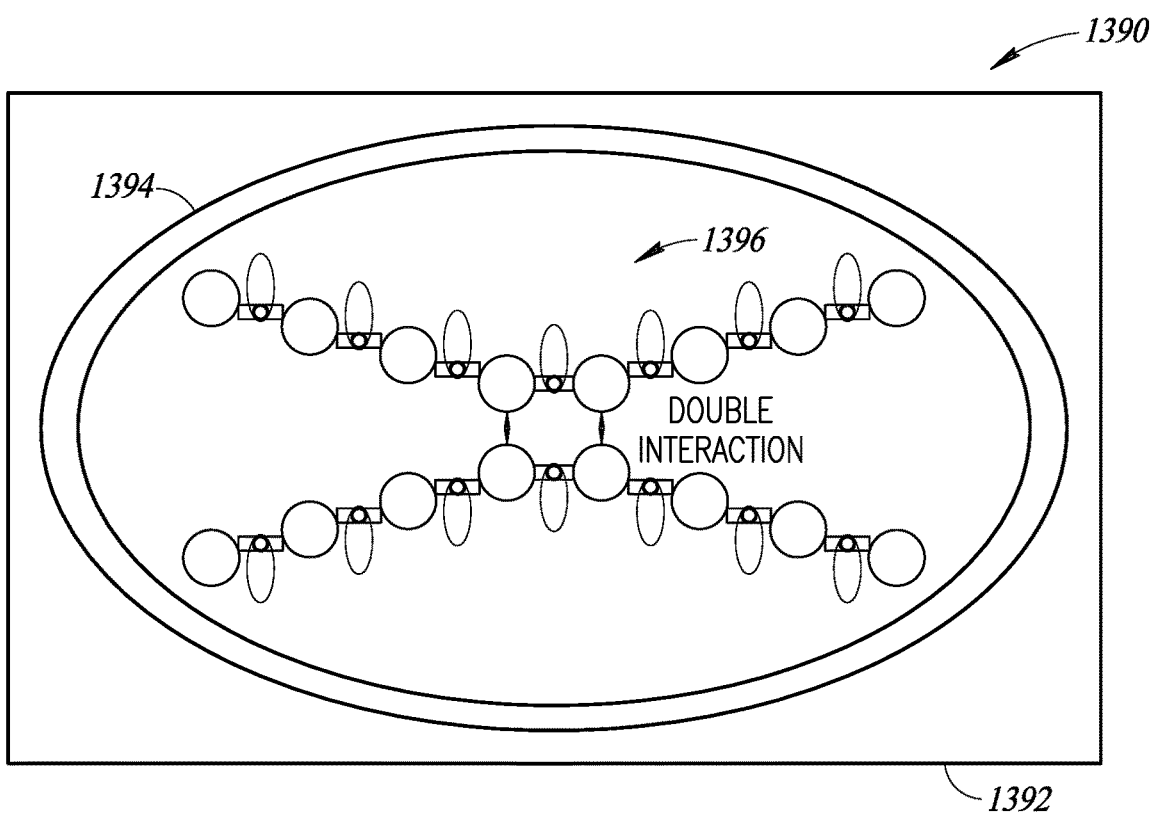
FIG. 31 is a diagram illustrating an example double V structure incorporating double interaction quantum shift register and auxiliary magnetic field control.

A diagram illustrating an example double V structure incorporating double interaction quantum shift register is shown in FIG. 30. The quantum structure, generally referenced 1380, comprises a double V shape structure using a planar semiconductor process with tunneling through gate oxide. In this embodiment, the control of the structure is electric, where appropriate control pulses are applied to achieve the desired quantum operation. Note that the structure in the middle is the quantum gate while the remaining qdots are the shift registers that transport the particle A diagram illustrating an example double V structure incorporating double interaction quantum shift register and auxiliary magnetic field control is shown in FIG. 31. The quantum structure, generally referenced 1390, comprises a double V shape structure 1396 using a planar semiconductor process with tunneling through local depletion region. In this embodiment, the control of the structure is both electric and magnetic, where appropriate electric control pulses as well as an auxiliary magnetic field are applied to achieve the desired quantum operation.

Figure 32:
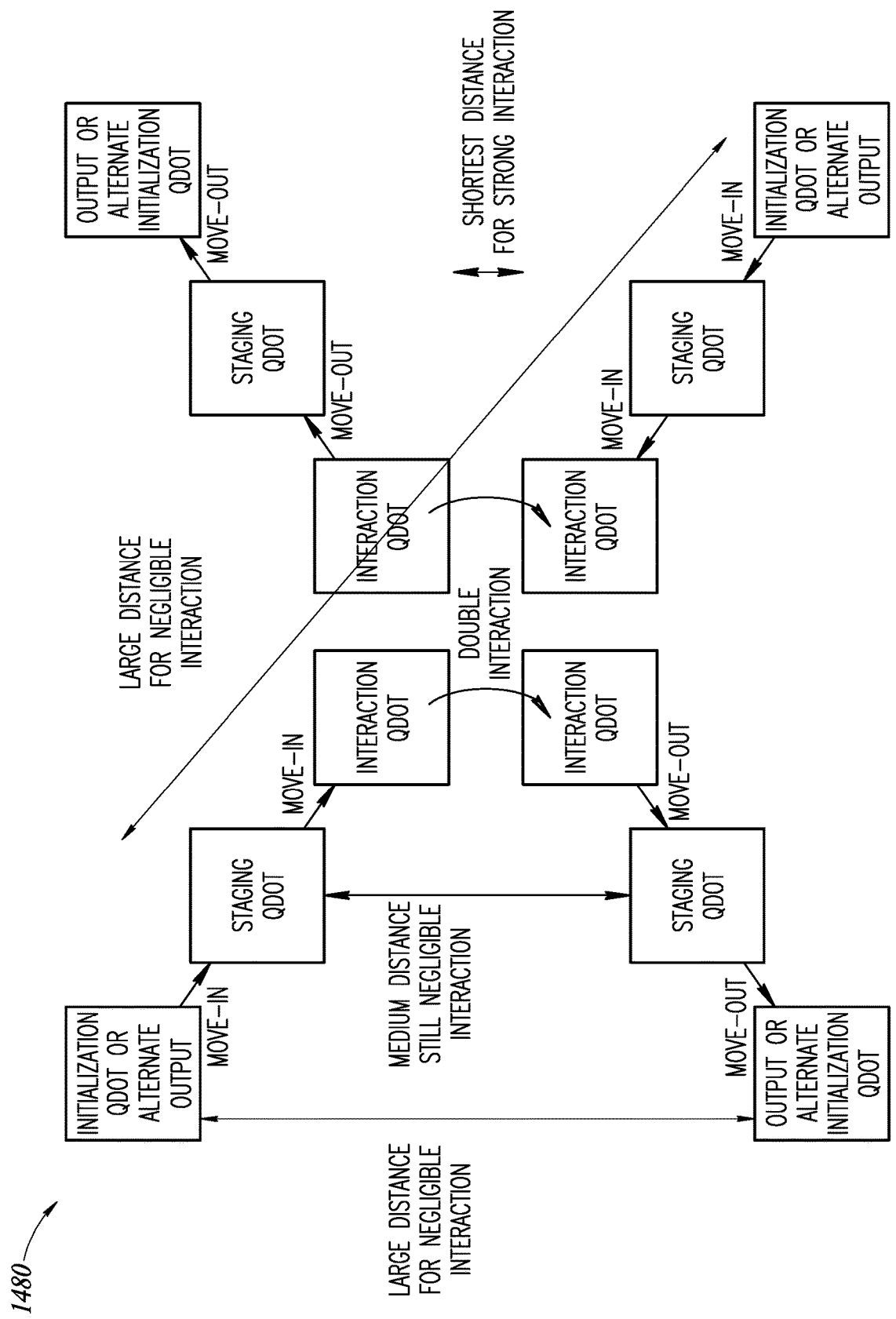
FIG. 32 is a diagram illustrating an example double V quantum structure with interaction qdots and shifting qdots.

Several example quantum structures incorporating double interaction gates are provided. A diagram illustrating an example double V quantum structure with interaction qdots and shifting qdots is shown in FIG. 32. The quantum structure, generally referenced 1480, comprises four interaction qdots in the middle of the structure and shifting qdots that are part of the quantum shift register that transport the particles in and out of the interaction qdots.

A diagram illustrating an example double interaction quantum structure using a planar semiconductor process with tunneling through gate oxide is shown in FIG. 33. The quantum structure, generally referenced 1490, comprises four interaction qdots $D_A$, $D_B$, $D_C$, and $D_D$ in the middle of the structure and shifting qdots that make up the quantum shift register that transports the particles in and out of the interaction qdots.

Note that typically a quantum interaction gate cannot be realized using only interaction qdots since a means of shifting the quantum state to and from them is required. If the quantum state is not shifted, then the particles in the interaction qdots remain in strong interaction and the quantum state cannot be processed. To process the quantum state, there is a need to move the particles further away from each other where interaction is negligible. Thus, the particles are first moved into close proximity and then the control gates are exercised to allow them to interact, then they are moved away.

A diagram illustrating an example double interaction quantum structure with planar semiconductor process using tunneling through oxide is shown in FIG. 34A. The quantum structure, generally referenced 1500, comprises four interaction qdots in the middle of the structure. Shifting qdots can be added on either side of the core qdots that form the quantum shift register that transport the particles in and out of the interaction qdots.

A diagram illustrating an example double interaction quantum structure with planar semiconductor process using tunneling through local depletion region is shown in FIG. 34B. The quantum structure, generally referenced 1510, comprises four interaction qdots in the middle of the structure. Shifting qdots can be added on either side of the core qdots that form the quantum shift register that transport the particles in and out of the interaction qdots.

Figure 35:
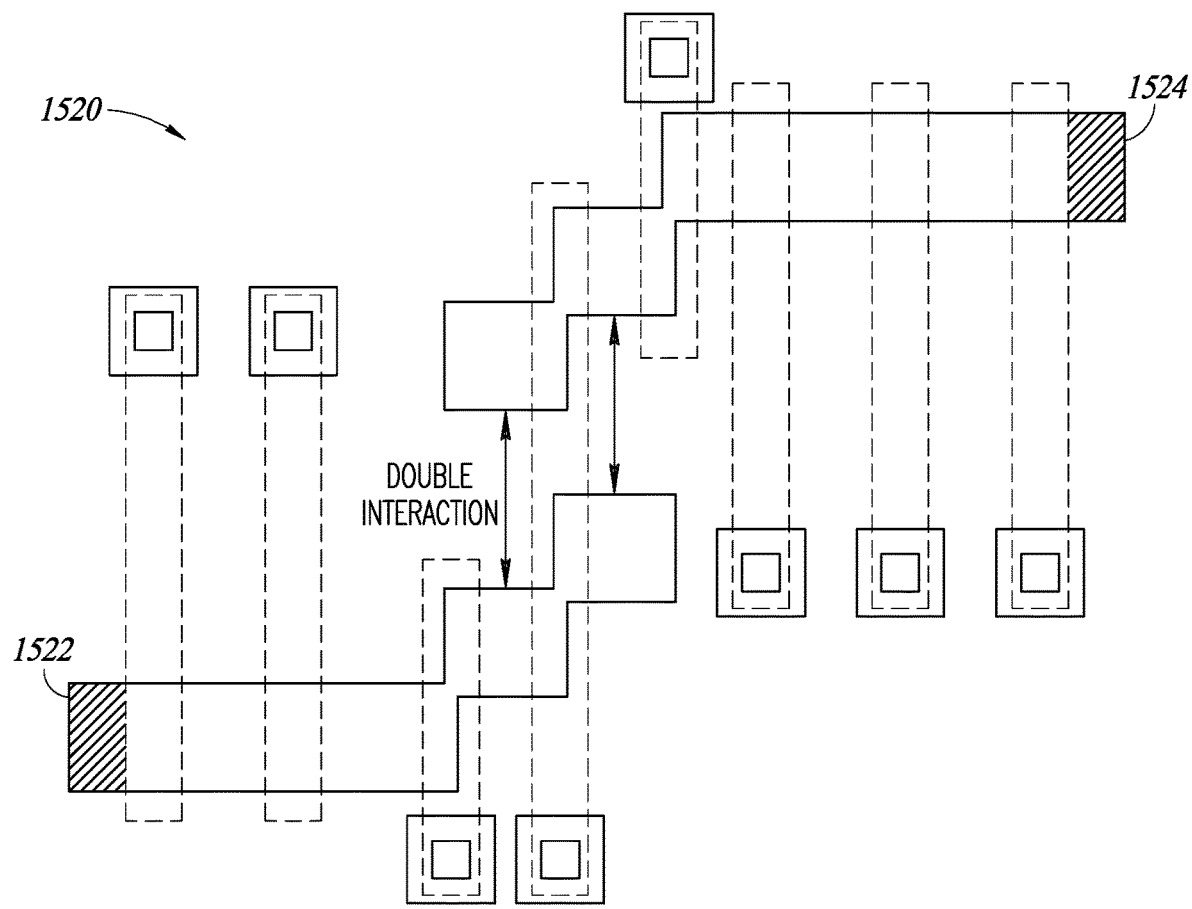
FIG. 35 is a diagram illustrating an example quantum interaction gate with double interaction and interface devices on either end.

A diagram illustrating an example quantum interaction gate with double interaction and interface devices on either end is shown in FIG. 35. The quantum structure with planar semiconductor process using tunneling through local depletion region, generally referenced 1520, comprises four interaction qdots in the middle of the structure. Shifting qdots created by the additional control gates fabricated on the continuous well are located on either side form the quantum shift register that transport the particles in and out of the interaction qdots. In addition, interface devices 1522, 1524 are located at the left and right ends of the structure.

Figure 36A:
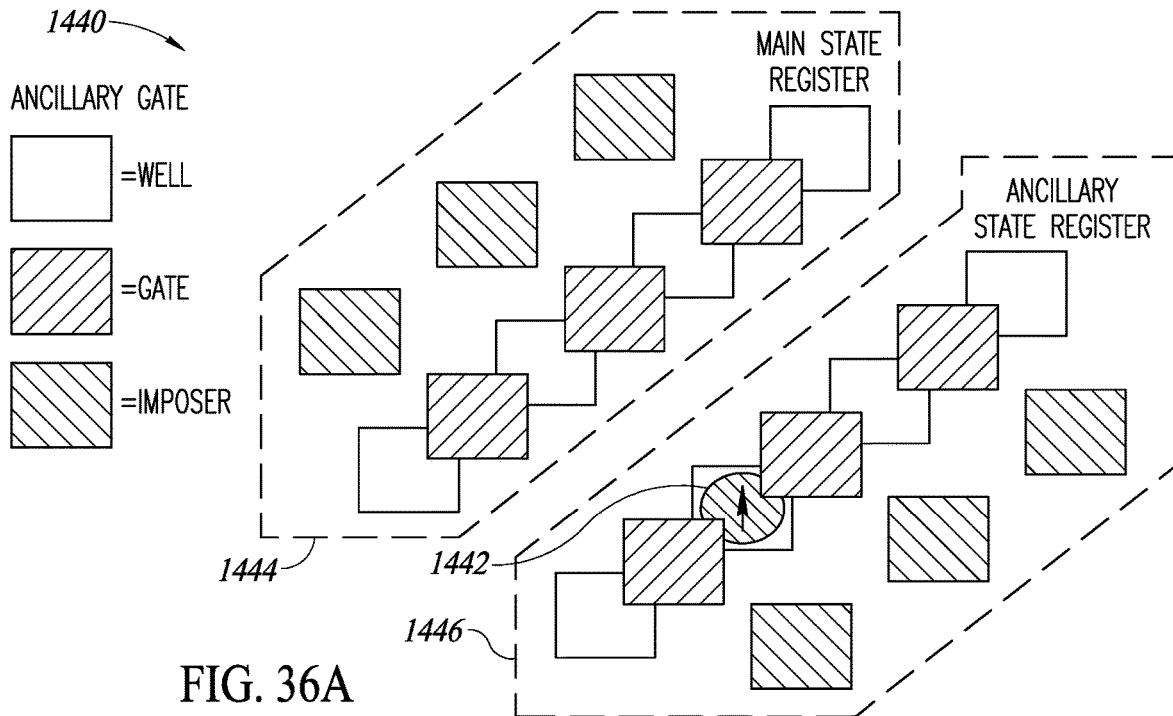
FIG. 36A is a diagram illustrating an example controlled quantum shift register incorporating ancillary gate.
Figure 36B:
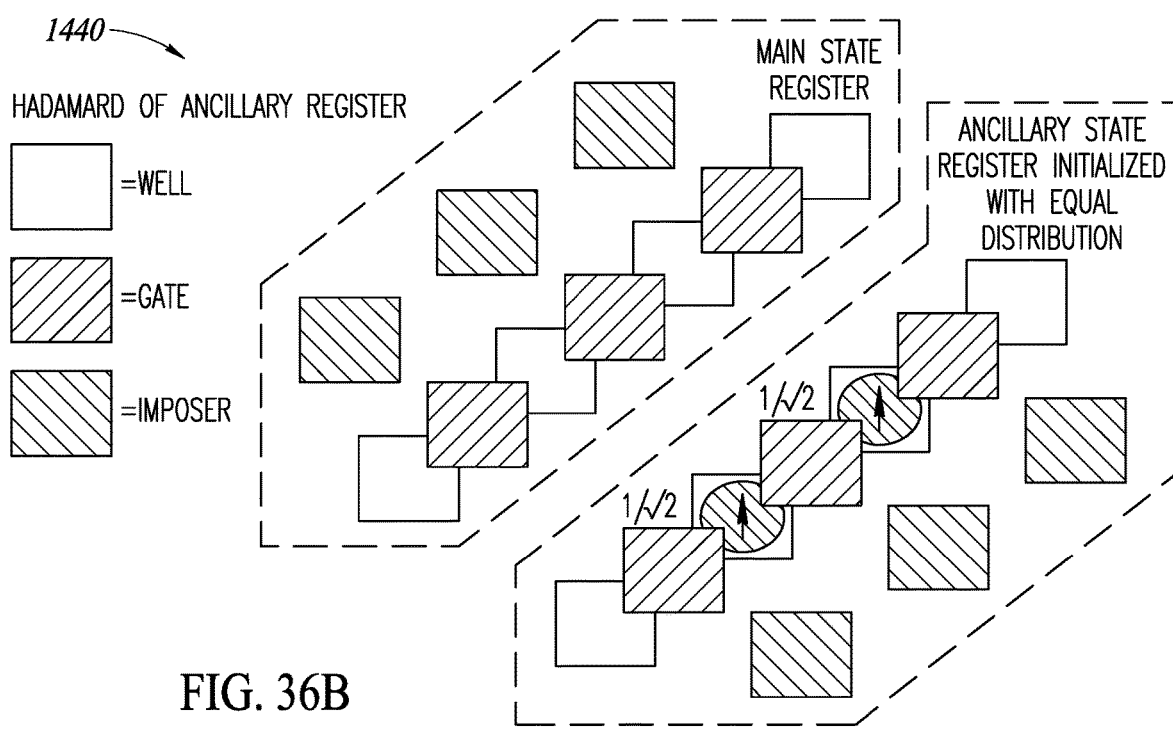
FIG. 36B is a diagram illustrating an example controlled quantum shift register with Hadamard of the ancillary register.
Figure 36C:
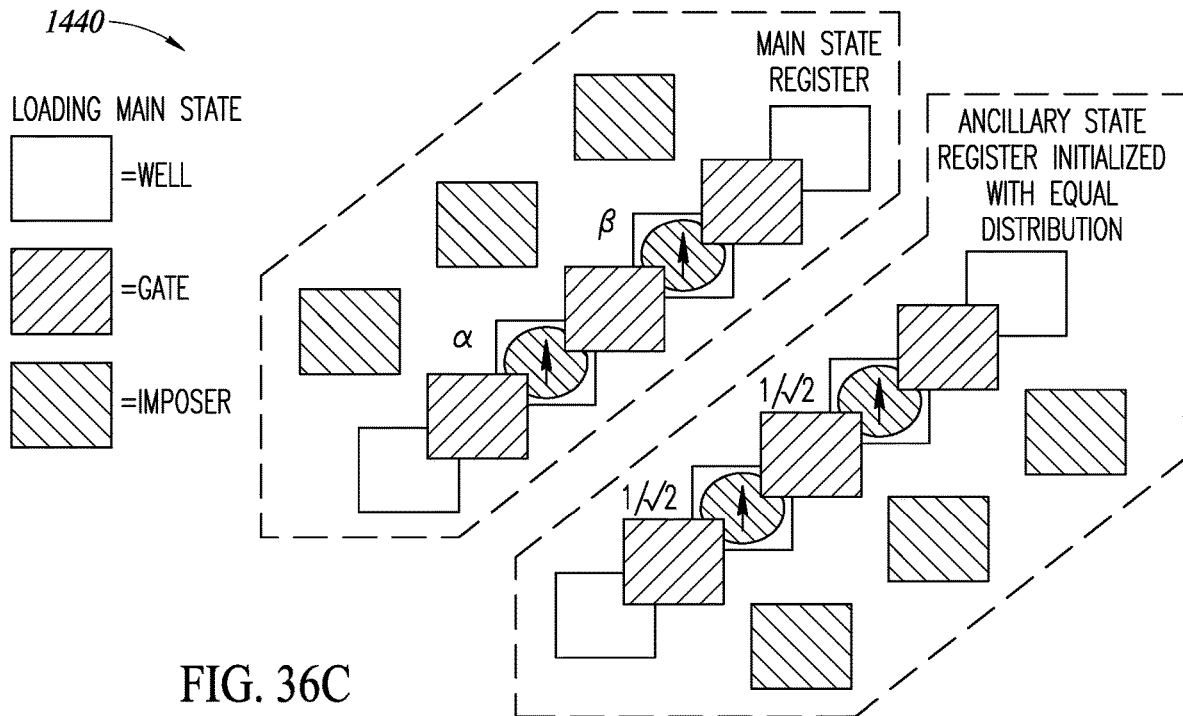
FIG. 36C is a diagram illustrating an example controlled quantum shift register with loading of the main state.
Figure 36D:
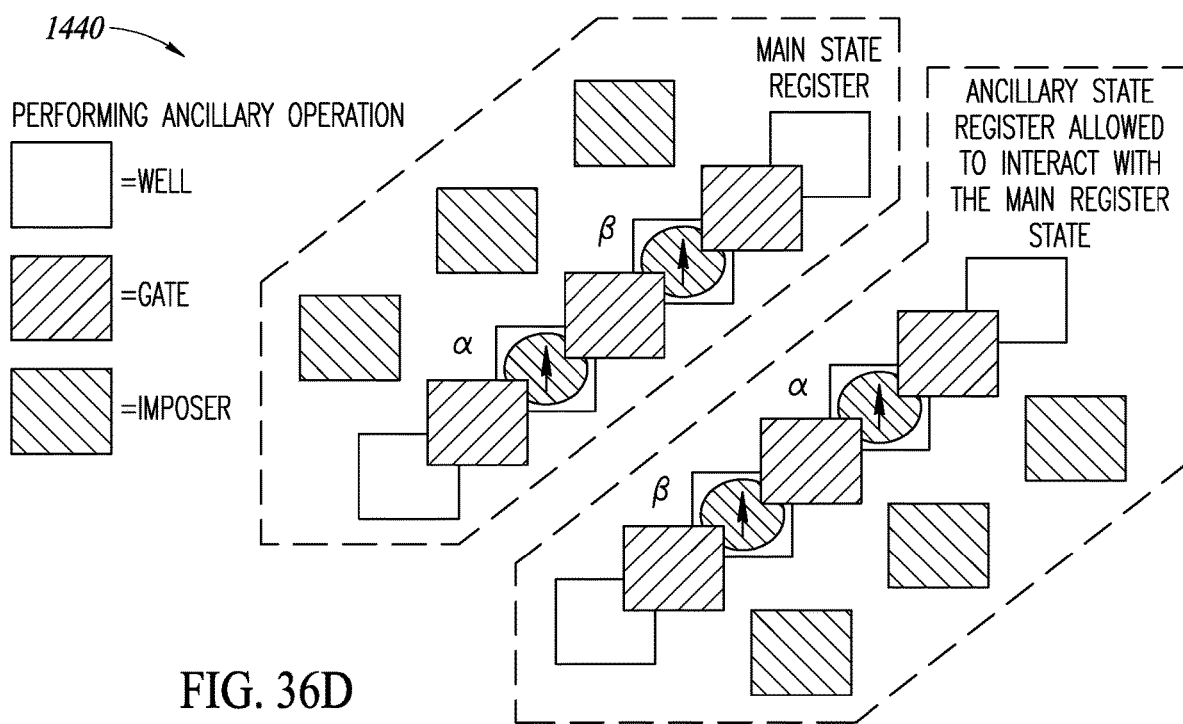

A diagram illustrating an example controlled quantum shift register incorporating ancillary gate is shown in FIG. 36A. A diagram illustrating an example controlled quantum shift register with Hadamard of the ancillary register is shown in FIG. 36B. A diagram illustrating an example controlled quantum shift register with loading of the main state is shown in FIG. 36C. A diagram illustrating an example controlled quantum shift register performing the ancillary operation is shown in FIG. 36D.

With reference to FIGS. 36A, 36B, 36C, and 36D, the quantum structure, generally referenced 1440, comprises a main state shift register 1444 and an ancillary state shift register 1446. Both comprise linear shift registers parallel to each other. To achieve the ancillary function in a shift register, one full particle 1442 is loaded in one of the shift registers. Then appropriate controls are applied such that the full particle is split Hadamard in the ancillary state shift register. Then, in the main state shift register, a given superposition quantum state α and β is shifted. One of the shift registers is Hadamard and the other one is a precise quantum state α and β, i.e. the target state. Releasing the controls for the lower ancillary state shift register causes it to generate an image corresponding to the θ rotation of the upper main state shift register. This results in quantum states α and β in the upper main state shift register and β and α in the lower ancillary state shift register. Thus, using two shift registers, an ancillary function is achieved.

Figure 37A:
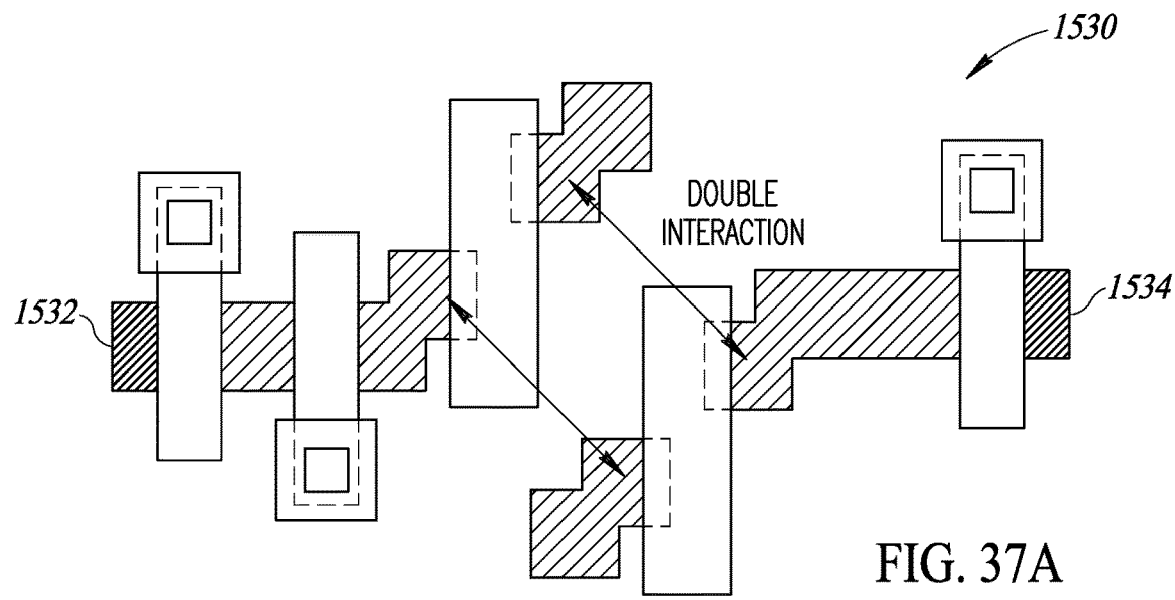

Several additional embodiments of quantum shift registers that provide the ancillary function will now be presented. A diagram illustrating an example quantum structure with double interaction using planar semiconductor qdots with tunneling through oxide layer is shown in FIG. 37A. The quantum structure, generally referenced 1530, comprises four interaction qdots in the middle of the structure. Shifting qdots created by the additional control gates located on either side form the quantum shift registers that transport the particles in and out of the interaction qdots. In addition, interface devices 1532, 1534 are located at the left and right ends of the structure. In operation, the two shift registers interact to provide an ancillary gate function. Note that this structure is similar to structure 1520 (FIG. 35) described supra.

Figure 37B:
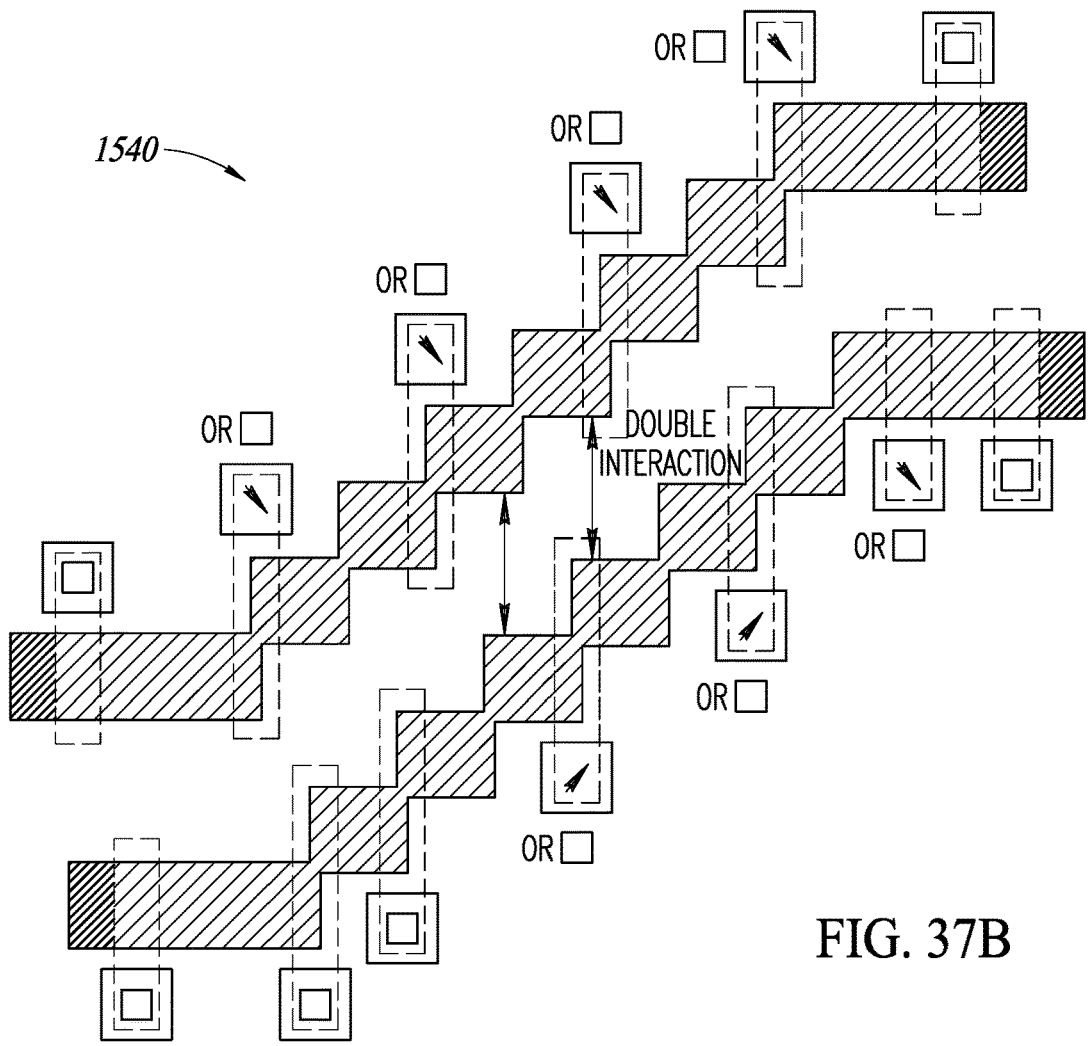

A diagram illustrating an example quantum structure with double interaction using planar semiconductor qdots with tunneling through local depletion region is shown in FIG. 37B. The quantum structure, generally referenced 1540, comprises a plurality of interaction qdots in the middle of the structure. Shifting qdots created by the additional control gates fabricated on the continuous well located on either side form the quantum shift registers that transport the particles in and out of the interaction qdots. In addition, interface devices are located at the left and right ends of the structure. In operation, the two shift registers interact to provide an ancillary gate function.

Note that although the shift registers shown are relatively long, the same ancillary function is provided in the middle. The particles are shifted left and right so they are further away to reduce interaction.

Figure 37C:
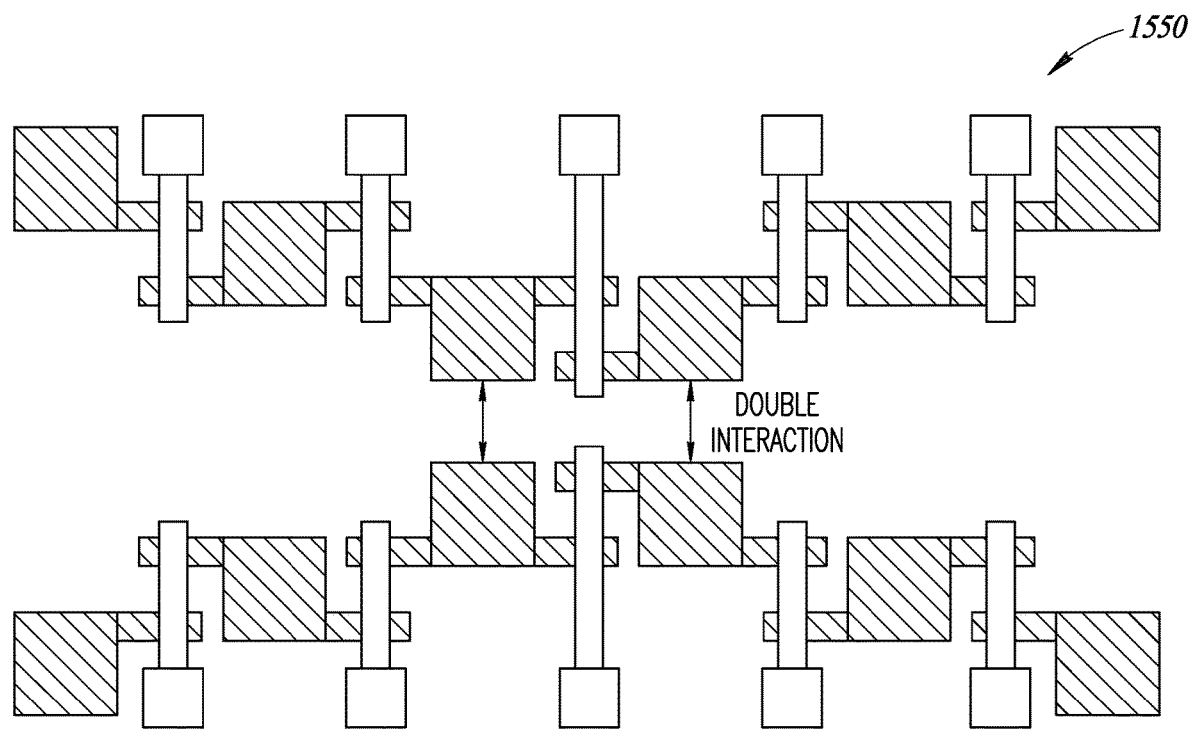

A diagram illustrating an example double V quantum structure with double interaction using 3D semiconductor qdots with tunneling through oxide layer is shown in FIG. 37C. The quantum structure, generally referenced 1550, comprises four interaction qdots in the middle of the structure. Shifting qdots created by the additional control gates located on either side form the quantum shift registers that transport the particles in and out of the interaction qdots. In operation, the two shift registers interact to provide an ancillary gate function.

Note that the double V structure can be used to create a CNOT quantum interaction gate. It can be viewed as two shift registers having two locations in close proximity that create an ancillary function. If the double V structure, however, has two double qdots in close proximity, they preferably have symmetric distribution in order to create the image quantum state and ancillary function.

Thus, the main difference between the double V structure shown here and the CNOT double V structure is that the CNOT structure has only two qdots in close proximity. The structure here has four qdots in close proximity in a symmetric distribution. This creates two shift registers that perform the ancillary function in the middle.

Figure 37D:
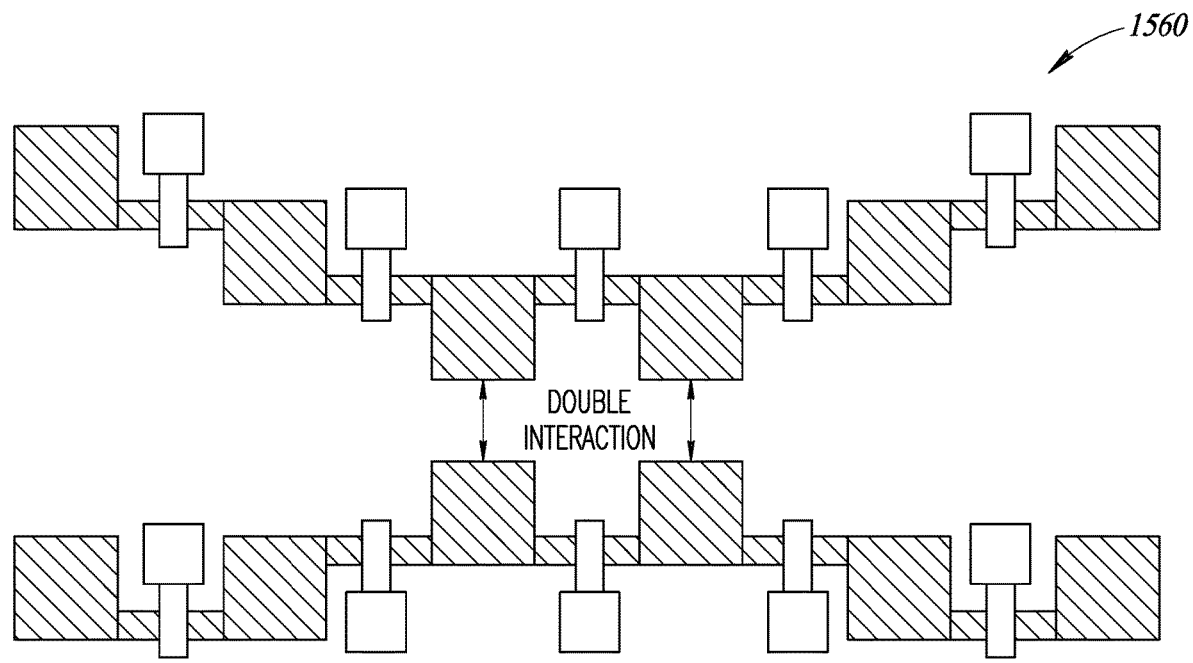

A diagram illustrating an example double V quantum structure with double interaction using 3D semiconductor qdots with tunneling through local depletion region is shown in FIG. 37D. The quantum structure, generally referenced 1560, comprises four interaction qdots in the middle of the structure. Shifting qdots created by the additional control gates located on either side form the quantum shift registers that transport the particles in and out of the interaction qdots. In operation, the two shift registers interact to provide an ancillary gate function.

In one embodiment, the shift register is split which enables the electron to go in multiple paths rather than a single path. A simple split qdot is shown fabricated in various semiconductor processes in the following figures. In each example embodiment, three qdots are shown. In a shift register with three qdots and a gate that overlaps all three, an electron that tunnels the gate can travel in any of the three paths depending on an additional control signal.

Figure 38A:
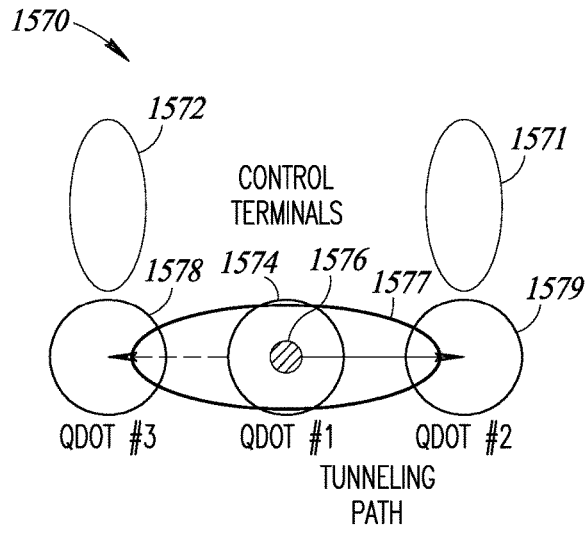

A diagram illustrating an example quantum bifurcation gate using planar semiconductor qdots with tunneling through oxide layer and potential imposing on the qdot well is shown in FIG. 38A. The quantum structure, generally referenced 1570, comprises three qdots, namely qdot #1 1574, qdot #2 1579, qdot #3 1578, control gates 1572, 1571, tunneling path 1577, and particle 1576 which can travel to either qdots #2 or #3.

Figure 38B:
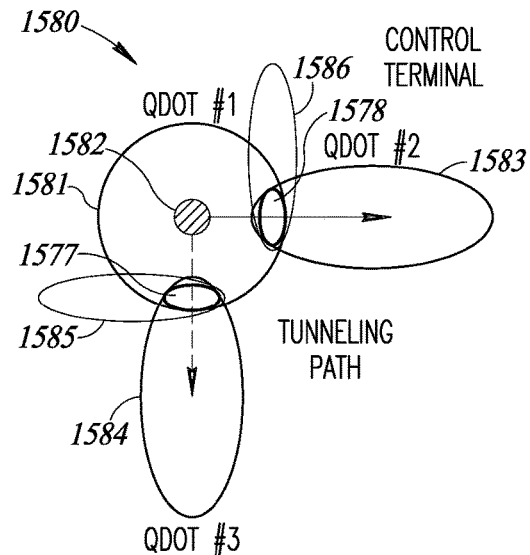

A diagram illustrating an example quantum bifurcation gate using planar semiconductor qdots with tunneling through local depletion region induced by overlapping control gate is shown in FIG. 38B. The quantum structure, generally referenced 1580, comprises three qdots, namely qdot #1 1581, qdot #2 1583, qdot #3 1584, control gates 1585, 1586, depletion regions 1577, 1578, and particle 1582 which can travel to either qdots #2 or #3. In this embodiment, the second and third qdots share the well in which two (or more) depletion regions are created. Once the electron 1582 is in position, it can travel from qdot #1 to qdot #2 or from qdot #1 to qdot #3 depending on control voltages applied to the two control gates. Thus, the shift registers are split into two or more paths.

Figure 38C:
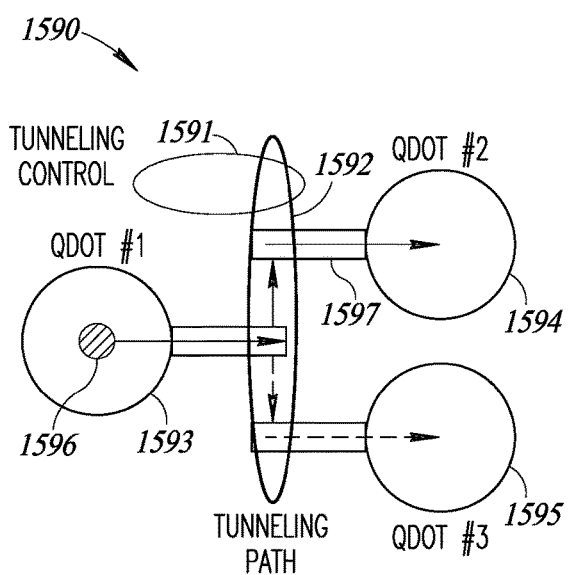

A diagram illustrating an example quantum bifurcation gate using 3D semiconductor qdots with tunneling through oxide layer and potential imposing on the qdot well (or tunneling path) is shown in FIG. 38C. The quantum structure, generally referenced 1590, comprises three qdots, namely qdot #1 1593, qdot #2 1594, qdot #3 1595, control gate 1591 that overlaps all three fins, tunneling path 1592, and particle 1596 which can travel to either qdots #2 or #3. In this embodiment, the electron can enter the shift register on the top and continue traveling to qdot #2 or it can continue on an alternate shift register path to qdot #3.

Figure 38D:
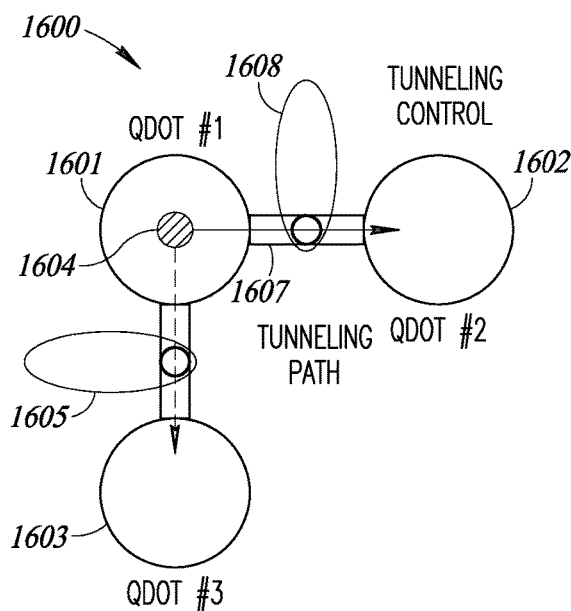

A diagram illustrating an example quantum bifurcation gate using 3D semiconductor qdots with tunneling through local depletion region induced by an overlapping control gate is shown in FIG. 38D. The quantum structure, generally referenced 1600, comprises three qdots, namely qdot #1 1601, qdot #2 1602, qdot #3 1603, control gates 1605, 1606 that overlap fins 1607, and particle 1604 which can travel to either qdots #2 or #3.

Figure 39:
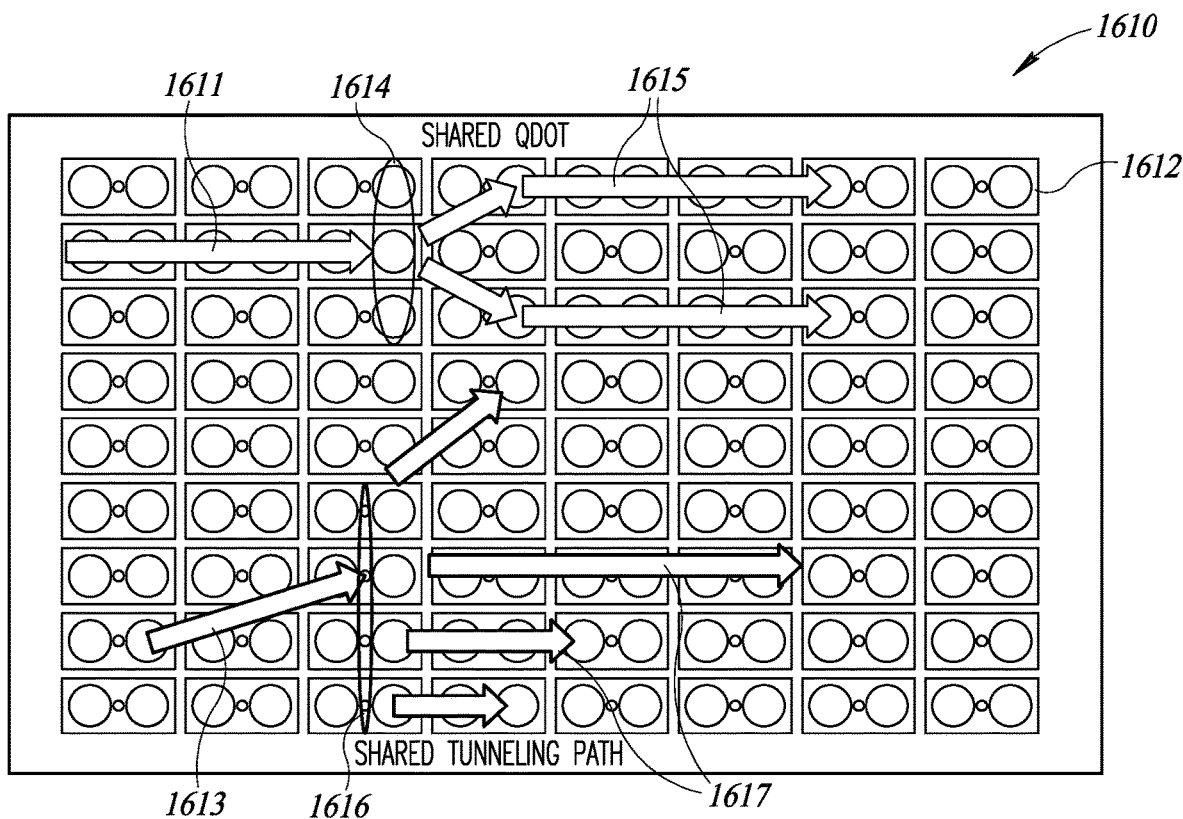

One of the most efficient ways to build a quantum core or fabric is using a grid configuration in which the qdots are arranged in rows and columns. A diagram illustrating an example grid based matrix or fabric quantum computation unit using quantum path merger and/or bifurcation implemented with a shared qdot and shared tunneling path is shown in FIG. 39. The re-configurable/reprogrammable grid based quantum computing structure, generally referenced 1610, comprises a plurality of qubits 1612 arranged in rows and columns and associated control circuitry including control signal generator (not shown). One path comprises input path 1611, shared qdot 1614, and multiple output paths 1615. A second path comprises input path 1613, shared tunneling path 1616, and multiple output paths 1617. Note that the grid array of qubits can be re-programmed to implement other structures and configurations in accordance with the particular application.

Note that numerous configurations of shift register can be configured using a matrix of qdots which form qubits by proper selection. A split or bifurcated shift register can be configured where the an active qdot can be shared between multiple qubits in the upper path. Alternatively, bifurcation can be achieved by sharing a tunneling path (i.e. control gate) between multiple qubits. Thus, there are shift registers that share either a quantum well or a quantum gate (i.e. tunneling path) which allows the quantum operation to split.

Figure 40:
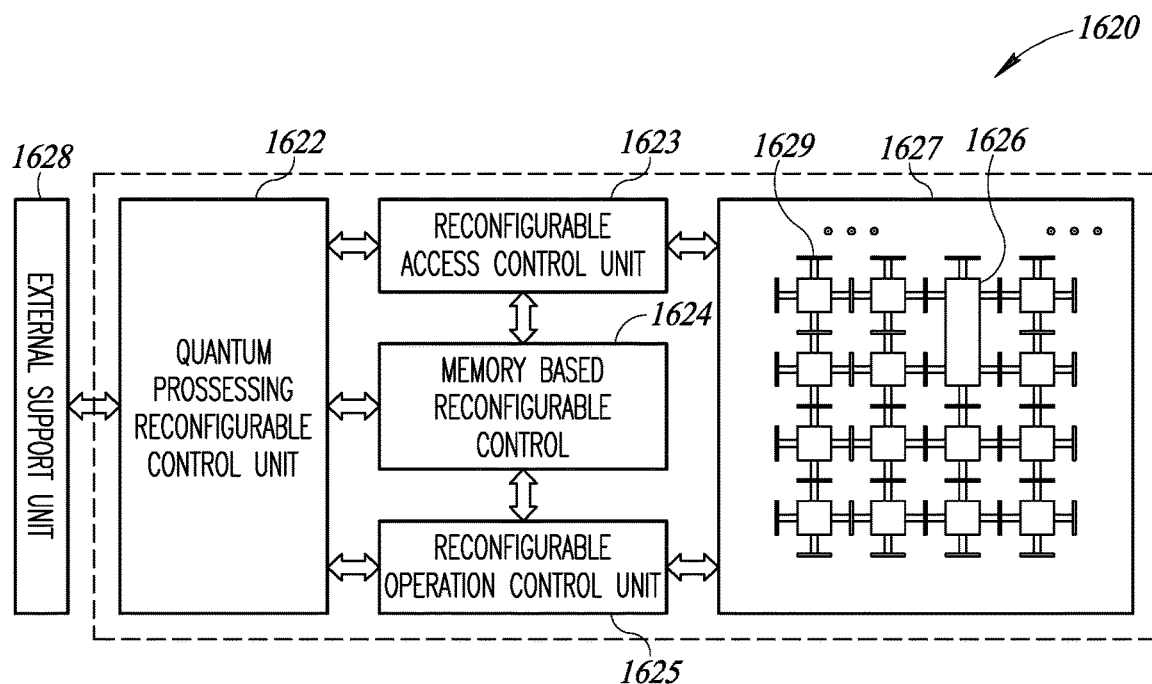

A diagram illustrating an example reconfigurable quantum computing unit using memory based reconfiguration control for both reconfigurable access control and reconfigurable operation is shown in FIG. 40. The quantum processing unit, generally referenced 1620, comprises a digital control (DSP)/quantum processing reconfigurable control unit 1622 in communication with the external support unit (ESU) 1628, reconfigurable access control unit 1623, reconfigurable operation control unit 1625, memory based reconfigurable control unit 1624, and quantum fabric 1627 incorporating access control gates 1629 and one or more bifurcations 1626.

In operation, consider an algorithm to be executed in the quantum fabric that is a sequence of quantum operations. The memory based reconfigurable control unit is loaded with instructions that indicate what controls are needed to be active and when in order to select and configure the appropriate qubits in the quantum fabric or matrix. The memory unit stores all the iterations that are required that will act on the amplitude and pulse width controls as well as the access control gates of the fabric. The reconfigurable access control unit functions to provide the control signals to the access control gates in the quantum fabric. The reconfigurable operation control unit functions to provide control signals to the qdots and qubits in the quantum fabric. Note that the quantum fabric or matric may comprise any combination of quantum structures.

Figure 41:
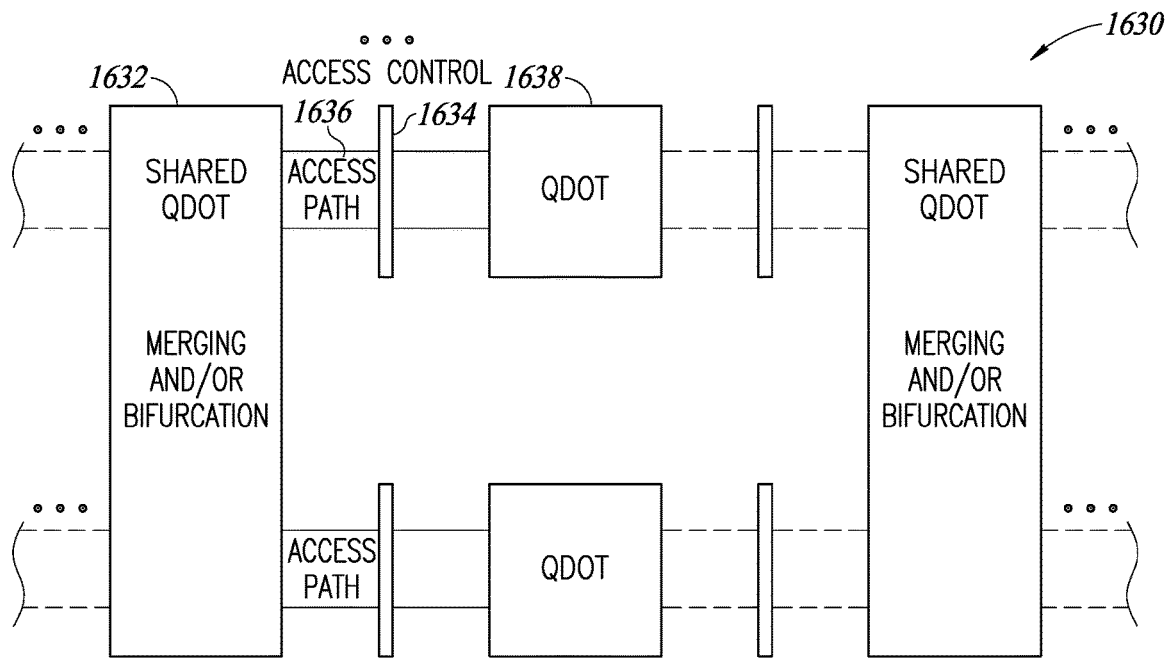

In accordance with the invention, to create a bifurcation in a shift register, either (1) a qdot is shared or (2) a tunneling path (i.e. control gate) is shared. A diagram illustrating example quantum computing paths incorporating multiple merging and bifurcations is shown in FIG. 41. The quantum structure, generally referenced 1630, comprises shared qdots 1632, qdots 1638, access control gates 1634, and access paths 1636. In this embodiment, the shared qdots provide cross connect functionality to the quantum fabric. Note that any combination of merging and bifurcations is possible. In addition, any number of branches and bifurcation/quantum demultiplexing and merging/quantum multiplexing can be realized.

A diagram illustrating an example quantum computation path bifurcation and/or merger using a shared access path and indirect potential imposing on the quantum wells to determine the bifurcation/merger function is shown in FIG. 42. The quantum structure, generally referenced 1640, comprises shared qdots 1644, shared tunneling path 1642, potential imposing wells 1646, and access control gates 1648.

In order to branch a quantum computation path (i.e. bifurcation or merging), a qdot needs to be shared amongst multiple paths. Either a quantum well is shared or a quantum tunneling path is shared. In this embodiment, an example of quantum computation path bifurcation and/or merger using a shared access path (e.g. tunneling path) and indirect potential imposing on the quantum wells to determine the bifurcation/merger function is provided. The potential imposing on the quantum dots sets the height of the tunneling barriers and the corresponding tunneling behavior and the resulting quantum operation.

Similar to the embodiments presented supra where the tunneling path was shared between two or more quantum computation paths, a given well can also be shared between multiple quantum computation paths. A diagram illustrating an example quantum computation path bifurcation and/or merging using planar semiconductor qdots with tunneling through oxide layer is shown in FIG. 43. The quantum structure, generally referenced 1650, comprises potential imposing wells 1656, 1658, particle 1654, shared tunneling path (control gate) 1652. The structure provides quantum computation path bifurcation and/or merging using planar semiconductor qdots with tunneling through an oxide layer using a shared quantum well that has multiple overlapping gates (tunneling paths).

In this embodiment, the bifurcation is realized in the shift registers including a main shift register that goes for example from lower left to the upper right. The gate 1652 is shared and another segment of shift register goes from the center to the lower right. Depending on the control signal pulses applied to the imposing potential wells 1656, 1658, the particle 1654 can travel from the center to the upper path or from the center to the bottom path. In this manner, a splitting or a bifurcation in a shift register is obtained.

A diagram illustrating an example quantum computation path bifurcation and/or merging using planar semiconductor qdots with tunneling through an oxide layer using shared quantum well with multiple overlapping gates is shown in FIG. 44. The quantum structure, generally referenced 1660, comprises potential imposing wells 1664, 1666, and shared qdot 1662. In this embodiment, the quantum well is shared. Once the particle is in the center shared qdot, the particle can move along the shift register either up or down in accordance with the control signal applied to the two gates 1661, 1663.

In some semiconductor processes a continuous well may split in multiple directions. Depending on the design rules and the minimum distances allowed, a larger quantum well is needed for the shared qdot or a single smaller region can be shared. A diagram illustrating a first example quantum computation path bifurcation/merging using tunneling through depletion region and a continuous well that extends in more than two directions is shown in FIG. 45A. The quantum structure, generally referenced 1670, comprises a bifurcation/merger path, shared qdot 1672, and particle 1674 which can either go up or down. In this example, the appropriate control pulses are applied to the shared qdot to steer the particle in the upward direction as indicated by arrow 1676.

A diagram illustrating a second example quantum computation path bifurcation/merging using a continuous well that extends in more than two directions is shown in FIG. 45B. The quantum structure, generally referenced 1680, comprises a bifurcation/merger path, shared qdot 1682, and particle 1684 which can either go up or down. In this example, the appropriate control pulses are applied to the shared qdot to steer the particle in the downward direction as indicated by arrow 1686.

In the more general case a given quantum path may have both bifurcation and merging from the same shared qdot. A diagram illustrating an example quantum computation path with both bifurcation and merging using a continuous well that extends in more than two directions is shown in FIG. 46. The X shaped quantum shift register structure, generally referenced 1690, comprises reset circuit 1694, injection circuit 1696, imposing circuits 1698 that go to the different terminals to control the structure, detector circuits 1691, and interface devices 1693. The quantum well in the center of the X shaped structure is shared to create the bifurcation.

In one embodiment, more than three quantum paths may be merged or split. A diagram illustrating an example X shaped (i.e. 4-way) quantum computation path with bifurcation and/or merging using planar semiconductor qdots with tunneling through oxide layer and a common tunneling path shared by multiple quantum wells is shown in FIG. 47. The quantum shift register, generally referenced 1700, comprises gate sharing where the long gate 1702 overlaps multiple qdots 1704. Once the particle tunnels to the gate, it can go in the direction of any of the other qdots depending on the potential applied to those qdots. Note that numerous shapes can be used when merging or splitting four or more quantum paths.

More than three paths can also be merged or split using a commonly shared well. A diagram illustrating an example X shaped quantum computation path with bifurcation and/or merging using planar semiconductor qdots with tunneling through oxide layer and a common well shared by multiple tunneling paths is shown in FIG. 48. The quantum shift register, generally referenced 1710, comprises a shared qdot 1712 as opposed to the gate. Here too, the particle can go in the direction of any of the other qdots depending on the potential applied to those qdots.

A diagram illustrating an example X shaped quantum computation path with bifurcation and/or merging using planar semiconductor qdots with tunneling through local depletion region and a common well shared by multiple tunneling paths is shown in FIG. 49. The quantum shift register, generally referenced 1720, comprises a shared qdot 1722. The particle can go in the direction of any of the other qdots depending on the potential applied to those qdots.

A diagram illustrating an example multiple X shaped quantum computation path with bifurcation and/or merging using planar semiconductor qdots with tunneling through local depletion region and a common well shared by multiple tunneling paths is shown in FIG. 50. The quantum shift register, generally referenced 1730, comprises shared qdots 1732, 1734. In this more complex embodiment, the particle can go in the direction of any of the other qdots depending on the potential applied to those qdots.

Note the distinction between interaction gates and shift registers. The interaction gates are formed by multiple paths that are separated. An electron cannot travel from one path to the other due to the gaps between them. In a shift register, on the other hand, an electron travels through a path as shown in the example X structures described herein. Bifurcation is implemented in the shift register. The particle can have any trajectory. A shift register just transports the particles without any interaction.

Interaction can occur, however, if a gate is blocked a gate. In this case, two of the wells will be in relatively close proximity. With reference to FIG. 49, although a shift register with bifurcation is shown, if the particle is not allowed to the middle by keeping the inner two gates low all the time (i.e. the tunneling barriers are high) then four qdots are formed that are linked as indicated by arrows 1725, 1726, and interactions may occur there. Thus, interaction can be achieved between any two or more qdots if they are in sufficiently close proximity. Both shifting of the quantum state and quantum interaction are possible in a shift register as long as the qdots are in close proximity. The particle must go further out to the extremities of the shift register to no longer have any significant interaction.

Thus, a key differentiator between shift register structures and interaction structures is that the interaction structures are not linked. The X structure shift register with a center well and bifurcation provides paths whereby the electron can be shifted from any qdot to any other qdot. The structure that is not linked is the interaction gate whereby two or more electrons interact. If access to certain locations in a shift register are restricted, however, a quantum interaction gate can be created.

A diagram illustrating an example quantum computation path with bifurcation/merging using 3D semiconductor qdots and tunneling through oxide layer is shown in FIG. 51A. The structure, generally referenced 1740, comprises three qdots 1741, namely qdot #1, qdot #2, qdot #3, potential imposing wells 1747, fins 1743, and control gate 1744. The structure shares a tunneling path with potential imposing on the well where electrical control of the tunneling causes bifurcation to the upper path as indicated by arrow 1746. Potential imposing for the tunnel barrier height setting can be done in a number of ways. In this example embodiment, an adjacent well potential imposing is used. The three fins 1743 comprise narrow pieces of semiconductor perpendicular to the substrate. The three fins are connected to three or more wells with one control gate 1744 that overlaps all of them. Once an electron 1742 has tunneled to the gate, it will travel to one of the fins in accordance with the control signal pulses and potentials applied to the qdots and control gate.

A diagram illustrating an example quantum computation path with bifurcation/merging using 3D semiconductor qdots and tunneling through oxide layer is shown in FIG. 51B. The structure, generally referenced 1750, comprises three qdots 1751, namely qdot #1, qdot #2, qdot #3, potential imposing wells 1757, fins 1754, and control gate 1756. The structure shares a tunneling path with potential imposing on the well where electrical control of the tunneling causes bifurcation to the lower path as indicated by arrow 1758. Once the electron 1752 tunnels to the control gate, it may then go in the upper or lower direction depending on the well imposing electrical control signals.

As described supra, semiconductor quantum structures can be controlled with electric signal or can be controlled with both electric and magnetic signals. A diagram illustrating an example magnetically controlled quantum bifurcation 3D semiconductor quantum gate with tunneling though oxide layer is shown in FIG. 52A. The structure, generally referenced 1760, comprises three qdots 1765, namely qdot #1, qdot #2, qdot #3, potential imposing wells (not shown), fins 1769, and control gate 1763. In this embodiment, an inductor 1764 or resonator 1762 is used to create the control magnetic field (arrow 1768) to cause tunneling of the electron 1761 to the upper path as indicated by arrow 1766. The bifurcation and merging in this case can be controlled by an electric filed and/or magnetic field. The particle split or the path in the shift register can be controlled with a magnetic signal. The quantum structure is placed in an inductor or it a cavity that creates a magnetic field. Depending on the direction of the magnetic field (e.g., into the page), the electron will go on the upper direction in accordance with the magnetic field.

A diagram illustrating an example magnetically controlled quantum bifurcation 3D semiconductor quantum gate with tunneling though oxide layer is shown in FIG. 52B. The structure, generally referenced 1770, comprises three qdots 1775, namely qdot #1, qdot #2, qdot #3, potential imposing wells (not shown), fins 1779, and control gate 1773. In this embodiment, an inductor 1774 or resonator 1772 is used to create the control magnetic field (arrow 1778) to cause tunneling of the electron 1771 to the lower path as indicated by arrow 1776. The bifurcation and merging in this case can be controlled by an electric field and/or magnetic field. The particle split or the path in the shift register can be controlled with a magnetic signal. The quantum structure is placed in an inductor or it a cavity that creates a magnetic field. Depending on the direction of the magnetic field (e.g., out of the page), the electron will go on the lower direction in accordance with the magnetic field.

A diagram illustrating an example quantum computation path with bifurcation/merging using 3D semiconductor qdots and tunneling through oxide layer is shown in FIG. 53. The structure, generally referenced 1780, comprises qdots 1782 and control gates 1784. It uses both shared tunneling paths and shared semiconductor fin 1786.

A diagram illustrating an example quantum computation path with bifurcation/merging using 3D semiconductor qdots and tunneling through oxide layer is shown in FIG. 54. The structure, generally referenced 1790, comprises qdots 1799, control gates 1791, 1792, 1793, metal contacts 1798. It uses shared tunneling paths with potential imposing on the tunneling path (i.e. control gate) and has several fins with control gates overlapping them.

Note that a similar quantum structure is also possible with potential imposing on the well. Note also that each gate needs to have connectivity (not shown) for the auxiliary classic electronic circuits that perform reset, inject, impose and detect functions of the quantum states as well as interface devices.

A diagram illustrating an example quantum computation path merging/bifurcation gate using 3D semiconductor qdots with tunneling through oxide layer is shown in FIG. 55. The quantum shift register structure, generally referenced 1800, comprises a plurality of qdots 1802, fins 1806, control gates 1804, and central shared qdot 1802.

A diagram illustrating an example quantum computation path with both merging and bifurcation gates using 3D semiconductor qdots with tunneling through local depletion region is shown in FIG. 56. The quantum shift register structure, generally referenced 1810, comprises a plurality of qdots 1816, fins 1817, control gates 1818, bifurcation qdot 1812, and merging qdot 1814.

A diagram illustrating an example controlled quantum shift register with bidirectional flow is shown in FIG. 57. The I shaped linear shift register, generally referenced 1820, is implemented with planar semiconductor process using tunneling through oxide and comprises qdots 1824, gate oxide 1823, interaction qdots 1825, and control terminals 1822 (potential well imposing). In this embodiment, the shift register operates as an interaction as well as a shift register. A barrier placed in the middle of the shift register is configured to always be high. Thus, shifting particles 1821 from either end towards the interaction qdots allows them to interact in the middle. After interacting, the particles are then shifted away.

A diagram illustrating an example multiple V controlled quantum shift register structure is shown in FIG. 58. The quantum shift register structure, generally referenced 1830, is fabricated using 3D semiconductor process using tunneling through local depletion region. In this embodiment, the shift register includes multiple interactions between different shift registers.

A diagram illustrating an example double V controlled quantum shift register in a resonator or inductor based magnetic field control is shown in FIG. 59. The quantum shift register structure, generally referenced 1840, is fabricated using planar semiconductor process using tunneling through local depletion region and comprises two shift registers 1846, inductor 1844, and resonant cavity 1842. In this embodiment, interaction between the shift registers occurs which is controlled both electrically and by an auxiliary magnetic field generated by the inductor and/or cavity.

A diagram illustrating an example double V controlled quantum shift register using planar semiconductor process with tunneling through oxide layer is shown in FIG. 60. The quantum shift register structure, generally referenced 1850, comprises interaction in a quantum gate and a plurality of quantum transport qdots.

A diagram illustrating an example controlled quantum shift register using planar semiconductor process with tunneling through local depleted well is shown in FIG. 61. The quantum shift register structure, generally referenced 1860, comprises multiple quantum interaction gates 1862, 1864 and multiple quantum transport qdots 1866 creating a plurality of flow paths. It is appreciated that the structure can have any kind of shape and the shift registers can be realized with relatively arbitrary, non-uniform shapes.

A diagram illustrating an example controlled quantum shift register using planar semiconductor process with tunneling through oxide layer is shown in FIG. 62. The quantum shift register structure, generally referenced 1870, comprises multiple quantum interaction gates and multiple quantum transport qdots creating a plurality of flow paths.

A diagram illustrating an example controlled quantum shift register using 3D semiconductor process with tunneling through local depleted well is shown in FIG. 63. The quantum shift register structure, generally referenced 1880, comprises multiple quantum interaction gates, multiple quantum transport qdots creating a plurality of flow paths, and one or more quantum bifurcation qdots.

A diagram illustrating an example controlled quantum shift register using 3D semiconductor process with tunneling through oxide layer is shown in FIG. 64. The quantum shift register structure, generally referenced 1890, comprises multiple quantum interaction gates, multiple quantum transport qdots creating a plurality of flow paths, and one or more quantum bifurcation qdots.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A quantum structure having bifurcation operation, comprising:
   a semiconductor substrate;
   a plurality of qdots fabricated on said substrate and arranged sequentially;
   a bifurcation extending said plurality of qdots into at least a first path of one or more qdots and a second path of one or more qdots;
   a plurality of control gates fabricated on said substrate for controlling quantum transport between said plurality of qdots and said bifurcation; and
   a plurality of electric control gate pulses applied to said control gates, said control gate pulses configured such that one or more quantum particles and/or one or more quantum states within said qdots are transported sequentially from one qdot to another as well as to at least said first path and/or said second path.

2. The quantum structure according to claim 1, wherein said bifurcation comprises a qdot shared between at least said first path and said second path.

3. The quantum structure according to claim 1, wherein said bifurcation comprises a tunneling path shared between at least said first path and said second path.

4. The quantum structure according to claim 1, wherein said plurality of electric control gate pulses are generated by electronic circuitry.

5. The quantum structure according to claim 4, wherein said electronic circuit comprises one or more digital to analog converters (DACs).

6. The quantum structure according to claim 1, further comprising one or more quantum gates, at least one quantum gate in relatively close proximity to another quantum gate in a same or separate quantum structure to enable quantum interaction between particles therebetween.

7. The quantum structure according to claim 1, further comprising one or more barriers to prevent interaction between one or more quantum gates.

8. The quantum structure according to claim 1, wherein said plurality of qdots are constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

9. A quantum shift register, comprising:
   a semiconductor substrate;
   a plurality of qdots fabricated on said substrate and arranged sequentially;
   a bifurcation extending said plurality of qdots into at least a first path of one or more qdots and a second path of one or more qdots;
   a plurality of control gates fabricated on said substrate for controlling quantum transport between said plurality of qdots and said bifurcation;
   an auxiliary magnetic field covering at least said plurality of qdots; and
   a plurality of electric control gate pulses applied to said control gates, said control gate pulses and said auxiliary magnetic field operative to transport one or more quantum particles and/or one or more quantum states within said qdots sequentially from one qdot to another as well as to at least said first path and/or said second path.

10. The shift register according to claim 9, wherein said bifurcation comprises a qdot shared between at least said first path and said second path.

11. The shift register according to claim 9, wherein said bifurcation comprises a tunneling path shared between at least said first path and said second path.

12. The shift register according to claim 9, wherein said auxiliary magnetic field is generated utilizing one or more inductors and/or one or more resonators.

13. The shift register according to claim 9, wherein said plurality of electric control gate pulses are generated by electronic circuitry.

14. The shift register according to claim 9, wherein said auxiliary magnetic field in a vicinity of said plurality of qdots provides further control of said quantum structure such that said one or more quantum particles and/or said one or more quantum states are transported sequentially between said plurality of qdots as well as to at least one of said first path and said second path.

15. The shift register according to claim 9, wherein said plurality of qdots are constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

16. A quantum shift register method, comprising:
   providing a substrate;
   fabricating on said substrate a plurality of qdots arranged in sequential fashion;
   bifurcating said plurality of qdots into at least a first path of one or more qdots and a second path of one or more qdots;

fabricating on said substrate a plurality of control gates for controlling quantum transport between said plurality of qdots and said bifurcation; and generating and applying electric control gate pulses to said control gates such that one or more quantum particles and/or one or more quantum states within said qdots are transported sequentially from one qdot to another as well as to at least said first path and/or said second path.

17. The method according to claim 16, wherein said bifurcation comprises a qdot shared between at least said first path and said second path.

18. The method according to claim 16, wherein said bifurcation comprises a tunneling path shared between at least said first path and said second path.

19. The method according to claim 16, further comprising generating an auxiliary magnetic field in a vicinity of said plurality of qdots to provide further control of said quantum structure such that said one or more quantum particles and/or one or more quantum states within said qdots are transported sequentially from one qdot to another as well as to at least said first path and/or said second path.

20. The method according to claim 16, wherein said plurality of qdots are constructed using a semiconductor process selected from a group consisting of: a planar quantum structure using tunneling through an oxide layer, a planar quantum structure using tunneling through a local depleted well, a 3D quantum structure using tunneling through an oxide layer, and a 3D quantum structure using tunneling through a local depleted fin.

* * * * *